US011211563B2

(12) United States Patent
Suh et al.

(10) Patent No.: US 11,211,563 B2
(45) Date of Patent: Dec. 28, 2021

(54) ORGANIC LIGHT EMITTING DEVICE

(71) Applicant: LG CHEM, LTD., Seoul (KR)

(72) Inventors: Sang Duk Suh, Daejeon (KR); Sung Kil Hong, Daejeon (KR); Seong So Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 429 days.

(21) Appl. No.: 16/327,749

(22) PCT Filed: Mar. 8, 2018

(86) PCT No.: PCT/KR2018/002778
§ 371 (c)(1),
(2) Date: Feb. 22, 2019

(87) PCT Pub. No.: WO2018/164512
PCT Pub. Date: Sep. 13, 2018

(65) Prior Publication Data
US 2019/0198766 A1 Jun. 27, 2019

(30) Foreign Application Priority Data
Mar. 9, 2017 (KR) ........................ 10-2017-0030170

(51) Int. Cl.
*H01L 51/00* (2006.01)
*H01L 51/50* (2006.01)
*C09K 11/06* (2006.01)

(52) U.S. Cl.
CPC .......... *H01L 51/0052* (2013.01); *C09K 11/06* (2013.01); *H01L 51/0058* (2013.01);
(Continued)

(58) Field of Classification Search
None
See application file for complete search history.

(56) References Cited

U.S. PATENT DOCUMENTS

2004/0251816 A1 12/2004 Leo et al.
2011/0121268 A1 5/2011 Nagao et al.
(Continued)

FOREIGN PATENT DOCUMENTS

EP 3048654 A2 7/2016
JP 2009184987 A 8/2009
(Continued)

*Primary Examiner* — Robert S Loewe
(74) *Attorney, Agent, or Firm* — Dentons US LLP

(57) ABSTRACT

The present invention relates to an organic light emitting device comprising a light emitting layer including a compound represented by Chemical Formula 1 and an electron transport region including a compound represented by Chemical Formula 2, and having improved driving voltage, efficiency, and lifetime.

[Chemical Formula 1]

(Continued)

-continued

[Chemical Formula 2]

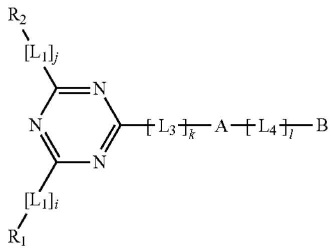

15 Claims, 2 Drawing Sheets

(52) U.S. Cl.
CPC ...... *H01L 51/0067* (2013.01); *H01L 51/0073* (2013.01); *H01L 51/0074* (2013.01); *H01L 51/5012* (2013.01); *H01L 51/5096* (2013.01); *H01L 51/5072* (2013.01)

(56) References Cited

U.S. PATENT DOCUMENTS

2013/0299794 A1* 11/2013 Jung .................. H01L 51/0072 257/40
2014/0183517 A1 7/2014 Huh et al.
2014/0197402 A1 7/2014 Huhm et al.
2014/0231774 A1 8/2014 Huh et al.
2014/0367645 A1 12/2014 Seo
2015/0162543 A1 6/2015 Lee et al.
2015/0364693 A1 12/2015 Ito et al.
2016/0013427 A1 1/2016 Kim et al.
2016/0043325 A1 2/2016 Gorohmaru et al.
2016/0043327 A1 2/2016 Yoo et al.
2016/0118590 A1 4/2016 Ito et al.
2016/0141514 A1* 5/2016 Lee ..................... C07D 401/10 257/40
2016/0293852 A1* 10/2016 Huh .................... H01L 51/0054
2016/0351817 A1 12/2016 Kim et al.
2016/0351818 A1 12/2016 Kim et al.
2017/0117485 A1 4/2017 Cho et al.
2018/0053900 A1 2/2018 Eum et al.
2018/0066180 A1 3/2018 Huh et al.
2019/0221751 A1* 7/2019 Cho .................... H01L 51/0073

FOREIGN PATENT DOCUMENTS

JP 2013-179320 A 9/2013
KR 2000-0051826 A 8/2000
KR 10-2014-0009919 A 1/2014
KR 10-2014-0043048 A 4/2014
KR 10-1433822 B1 8/2014
KR 10-1508424 B1 4/2015
KR 10-2015-0108330 A 9/2015
KR 10-2015-0134923 A 12/2015
KR 10-2015-0142822 A 12/2015
KR 10-2016-0007967 A 1/2016
KR 10-2016-0018332 A 2/2016
KR 10-2016-0022081 A 2/2016
KR 10-2016-0036159 A 4/2016
KR 10-2016-0126862 A 11/2016
KR 10-2016-0141359 A 12/2016
KR 10-2017-0016906 A 2/2017
KR 20180032496 A * 3/2018 ......... H01L 51/0073
TW 201326149 A 7/2013
TW 201329064 A 7/2013
WO 03012890 A2 2/2003

* cited by examiner

【FIG. 1】
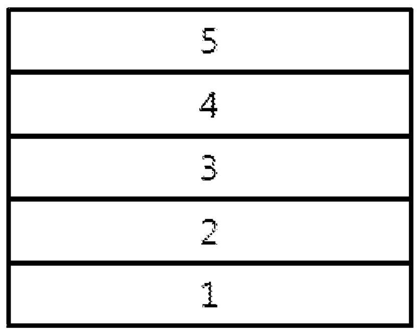
【FIG. 2】
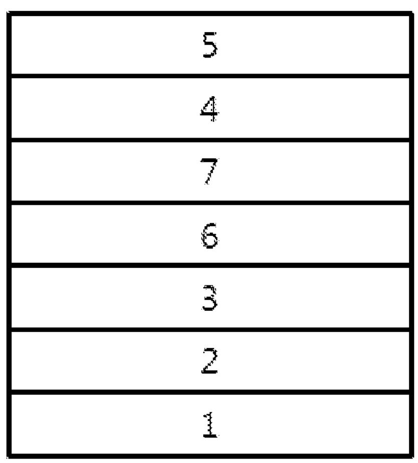

【FIG. 3】
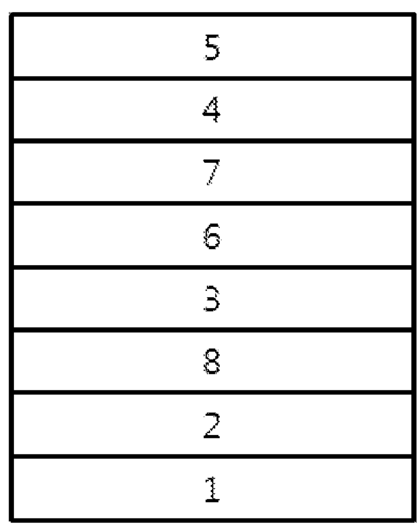

ORGANIC LIGHT EMITTING DEVICE

CROSS-REFERENCE TO RELATED APPLICATION(S)

This application is a National Stage Entry of International Application No. PCT/KR2018/002778, filed on Mar. 8, 2018, and claims the benefit of and priority to Korean Application No. 10-2017-0030170, filed on Mar. 9, 2017, all of which are hereby incorporated by reference in their entirety for all purposes as if fully set forth herein.

BACKGROUND ART

In general, an organic light emitting phenomenon refers to a phenomenon where electrical energy is converted into light energy by using an organic material. The organic light emitting device using the organic light emitting phenomenon has characteristics such as a wide viewing angle, excellent contrast, a fast response time, excellent luminance, driving voltage, and response speed, and thus many studies have proceeded.

The organic light emitting device generally has a structure which includes an anode, a cathode, and an organic material layer interposed between the anode and the cathode. The organic material layer frequently has a multilayered structure that includes different materials in order to enhance efficiency and stability of the organic light emitting device, and for example, the organic material layer may be formed of a hole injection layer, a hole transport layer, a light emitting layer, an electron transport layer, an electron injection layer, and the like. In the structure of the organic light emitting device, if a voltage is applied between two electrodes, the holes are injected from an anode into the organic material layer and the electrons are injected from the cathode into the organic material layer, and when the injected holes and the electrons meet each other, an exciton is formed, and light is emitted when the exciton falls to a ground state again.

There is a continuing demand for developing an organic light emitting device having improved driving voltage, efficiency, and lifetime.

PRIOR ART LITERATURE

Patent Literature (PATENT LITERATURE 0001) Korean Patent Laid-open Publication No. 10-2000-0051826

(PATENT LITERATURE 0002) Korean Patent Laid-open Publication No. 10-2016-0126862

(PATENT LITERATURE 0003) Korean Patent No. 10-1508424

DETAILED DESCRIPTION OF THE INVENTION

Technical Problem

The present invention provides an organic light emitting device including:

an anode;

a cathode;

a light emitting layer disposed between the anode and the cathode; and an electron transport region between the cathode and the light emitting layer, wherein the light emitting layer includes a compound represented by Chemical Formula 1 below, and the electron transport region includes a compound represented by Chemical Formula 2 below:

[Chemical Formula 1]

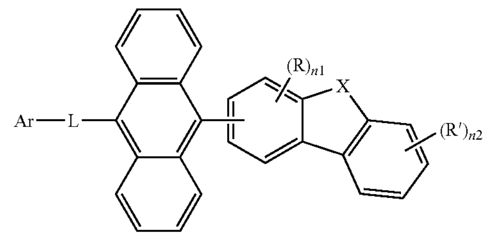

in Chemical Formula 1,

X is O or S,

L is a bond; or a substituted or unsubstituted $C_{6-60}$ arylene,

Ar is a substituted or unsubstituted $C_{6-60}$ aryl,

R and R' are each independently hydrogen; deuterium; a halogen; a cyano; a nitro; an amino; a substituted or unsubstituted $C_{1-60}$ alkyl; a substituted or unsubstituted $C_{3-60}$ cycloalkyl; a substituted or unsubstituted $C_{2-60}$ alkenyl group; a substituted or unsubstituted $C_{6-60}$ aryl; or a substituted or unsubstituted $C_{2-60}$ heteroaryl containing at least one heteroatom selected from the group consisting of N, O, and S, n1 is an integer of 0 to 3, and n2 is an integer of 0 to 4,

[Chemical Formula 2]

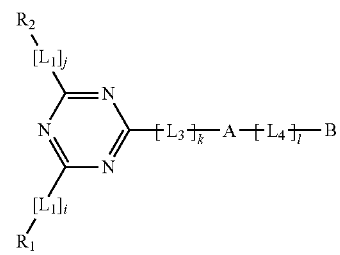

in Chemical Formula 2, $R_1$ and $R_2$ are each independently a substituted unsubstituted $C_{6-60}$ aryl, or a substituted or unsubstituted. $C_{2-60}$ heteroaryl containing at least one heteroatom selected from the group consisting of N, O, and S, $L_1$, $L_2$, $L_3$, and $L_4$ are each independently a substituted or unsubstituted $C_{6-60}$ arylene, A is a substituted or unsubstituted naphthylene, B is a $C_{6-60}$ aryl substituted with at least one cyano group; or a substituted or unsubstituted $C_{2-60}$ heteroaryl containing 1 to 3 nitrogen atoms, and i, j, k, l are each independently 0 or 1.

Advantageous Effects

The organic light emitting device described above is excellent in driving voltage, efficiency, and lifetime.

BRIEF DESCRIPTION OF DRAWINGS

FIG. 1 shows an example of an organic light emitting device including a substrate 1, an anode 2, a light emitting layer 3, an electron transport region 4, and a cathode 5.

FIG. 2 shows an example of an organic light emitting device including a substrate 1, an anode 2, a light emitting layer 3, a hole blocking layer 6, an electron transport later 7, and a cathode 5.

FIG. 3 shows an example of an organic light emitting device including a substrate 1, an anode 2, a hole transport layer 8, a light emitting layer 3, a hold blocking layer 6, an electron transport layer 7, and a cathode 5.

DETAILED DESCRIPTION OF THE EMBODIMENTS

Hereinafter, the present invention will be described in more detail to help understanding of the invention.

In the present specification,

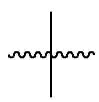

means a bond connected to another substituent group.

As used herein, the term "substituted or unsubstituted" means that substitution is performed by one or more substituent groups selected from the group consisting of deuterium; a halogen group; a cyano group; a nitro group; a hydroxyl group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; or a heteroaryl group containing at least one of N, O and S atoms, or there is no substituent group, or substitution is performed by a substituent group where two or more substituent groups of the exemplified substituent groups are linked or there is no substituent group. For example, the term "substituent group where two or more substituent groups are linked" may be a biphenyl group. That is, the biphenyl group may be an aryl group, or may be interpreted as a substituent group where two phenyl groups are connected.

In the present specification, the number of carbon atoms in a carbonyl group is not particularly limited, but is preferably 1 to 40. Specifically, the carbonyl group may be compounds having the following structures, but is not limited thereto.

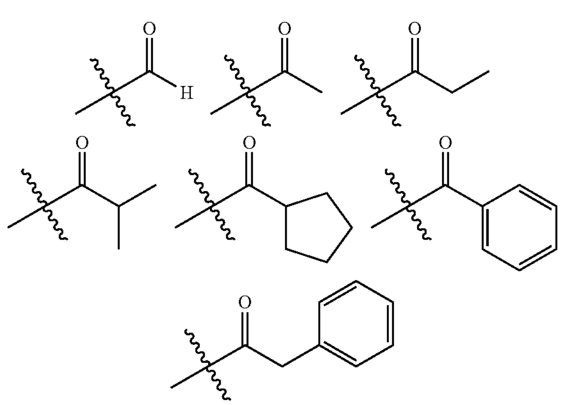

In the present specification, the ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be compounds having the following structures, but is not limited thereto.

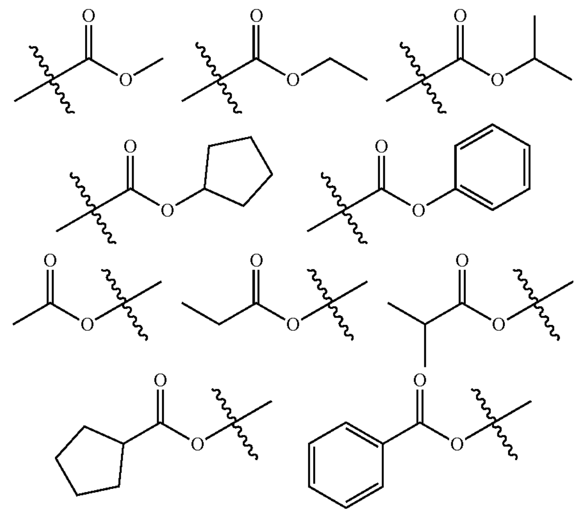

In the present specification, the number of carbon atoms in an imide group is not particularly limited, but is preferably 1 to 25. Specifically, the imide group may be compounds having the following structures, but is not limited thereto.

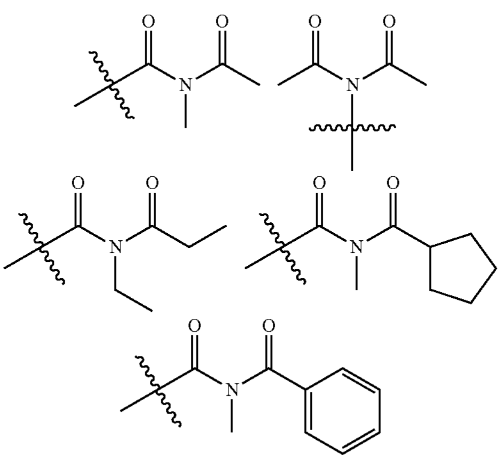

In the present specification, the silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but is not limited thereto.

In the present specification, the boron group specifically includes a trimethylboron group, a triethylboron group, a t-butyldimethylboron group, a triphenylboron group, a phenylboron group, and the like, but is not limited thereto.

In the present specification, examples of a halogen group include fluorine, chlorine, bromine, and iodine.

In the present specification, the alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present specification, the alkenyl group may be a straight chain or a branched chain, and the number of carbon atoms thereof is not particularly limited, but is preferably 2 to 40. According to one embodiment, the alkenyl group has 2 to 20 carbon atoms. According to another embodiment, the alkenyl group has 2 to 10 carbon atoms. According to still another embodiment, the alkenyl group has 2 to 6 carbon atoms. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, the cycloalkyl group is not particularly limited, but the number of carbon atoms thereof is preferably 3 to 60. According to one embodiment, the cycloalkyl group has 3 to 30 carbon atoms. According to another embodiment, the cycloalkyl group has 3 to 20 carbon atoms. According to another embodiment, the cycloalkyl group has 3 to 6 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the aryl group is not particularly limited, but preferably has 6 to 60 carbon atoms, and may be a monocyclic aryl group or a polycyclic aryl group. According to one embodiment, the aryl group has 6 to 30 carbon atoms. According to one embodiment, the aryl group has 6 to 20 carbon atoms. The aryl group may be a phenyl group, a biphenyl group, a terphenyl group, or the like as the monocyclic aryl group, but is not limited thereto. Examples of the polycyclic aryl group include a naphthyl group, an anthracenyl group, a phenanthryl group, a pyrenyl group, a perylenyl group, a chrycenyl group, a fluorenyl group, or the like, but is not limited thereto.

In the present specification, a fluorenyl group may be substituted, and two substituent groups may be linked with each other to form a Spiro structure. In the case where the fluorenyl group is substituted,

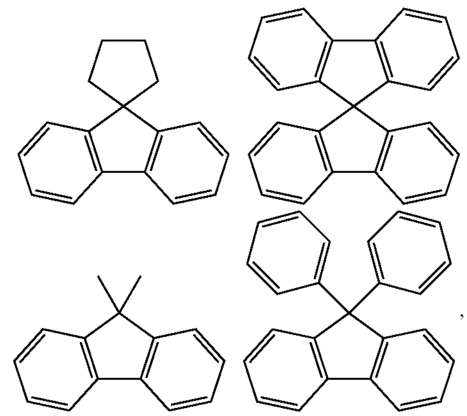

and the like can be formed. However, the structure is not limited thereto.

In the present specification, the heteroaryl group is a heteroaryl group containing at least one of O, N, Si, and S as a heteroatom, and the number of carbon atoms thereof is not particularly limited, but is preferably 2 to 60. Examples of the heteroaryl group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazol group, an acridyl group, a pyridazine group, a pyrazinyl group, a quinolinyl group, a quinazolinyl group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an isoxadiazolyl group, a thiadiazolyl group, a benzothiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group, and the alkylamine group is the same as the aforementioned examples of the alkyl group. In the present specification, the heteroaryl in the heteroarylamine can be applied to the aforementioned description of the heteroaryl group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heteroaryl group can be applied except that the heteroarylene is a divalent group. In the present specification, the aforementioned description of the aryl group or cycloalkyl group can be applied except that the hydrocarbon ring is not a monovalent group but is formed by combining two substituent groups.

Hereinafter, the present invention will be described in detail for each configuration.

Anode and Cathode

The anode and cathode used in the present invention are electrodes used in an organic light emitting device.

As the anode material, generally, a material having a large work function is preferably used so that holes can be smoothly injected into the organic material layer. Specific examples of the anode material include metals such as vanadium, chrome, copper, zinc, gold, and alloys thereof; metal oxides such as zinc oxides, indium oxides, indium tin oxides (ITO), and indium zinc oxides (IZO); a combination of metals and oxides, such as ZnO:Al or $SNO_2$:Sb; conductive polymers such as poly(3-methylthiophene), poly[3,4-(ethylene-1,2-dioxy)thiophene](PEDOT), polypyrrole, polyaniline; and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, lead, and alloys thereof; a multilayered structure material such as LiF/Al or $LiO_2$/Al; and the like, but are not limited thereto.

Hole Injection Layer

The organic light emitting device according to the present invention may further include a hole injection layer between the anode and the hole transport layer described later.

The hole injection layer is a layer injecting holes from an electrode, and the hole injection material is preferably a compound which has an ability to transport the holes, a hole injection effect in the anode, and an excellent hole injection effect to the light emitting layer or the light emitting material, prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer.

Specific examples of the hole injection material include a metal porphyrin, an oligothiophene, an arylamine-based organic material, a hexanitrilehexaazatriphenylene-based organic material, a quinacridone-based organic material, a perylene-based organic material, anthraquinone, polyaniline, a polythiophene-based conductive polymer, and the like, but are not limited thereto.

Hole Transport Region

The hole transport region used in the present invention is a region that receives holes from an anode or a hole injection layer formed on the anode and transports the holes to the light emitting layer.

The hole transport region includes a hole transport layer, or includes a hole transport layer and an electron blocking layer. When the hole transport region includes the hole transport layer and the electron blocking layer, preferably, the light emitting layer and the electron blocking layer are positioned adjacent to each other.

The hole transport material included in the hole transport region is suitably a material having large mobility to the holes, which may receive holes from the anode or the hole injection layer and transfer the holes to the light emitting layer.

Specific examples thereof include an arylamine-based organic material, a conductive polymer, a block copolymer in which a conjugate portion and a non-conjugate portion are present together, and the like, but are not limited thereto.

Light Emitting Layer

The light emitting layer used in the present invention means a layer that can emit light in the visible light region by combining holes and electrons transported from the anode and the cathode, and is preferably a material having good quantum efficiency for fluorescence or phosphorescence.

Generally, the light emitting layer includes a host material and a dopant material, and the present invention includes the compound represented by Chemical Formula 1 as a host.

In Chemical Formula 1, L may be a bond, phenylene, biphenylene, or naphthylene.

Further, Ar may be a $C_{6-20}$ aryl. Specifically, Ar may be phenyl, biphenylyl, terphenylyl, naphthyl, or phenanthrenyl.

Further, R and R' may each independently be hydrogen, deuterium, phenyl, biphenylyl, or naphthyl.

Representative examples of the compound represented by Chemical Formula 1 are as follows.

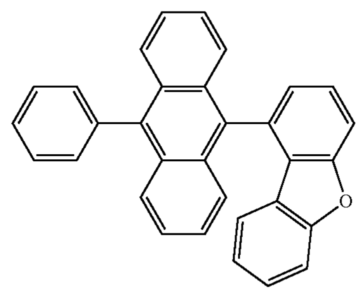

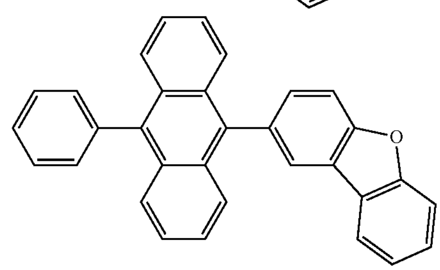

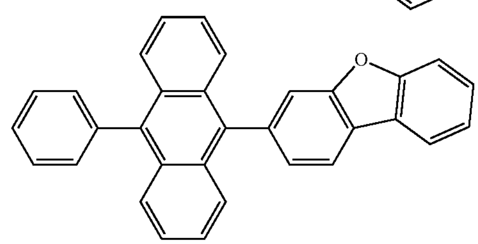

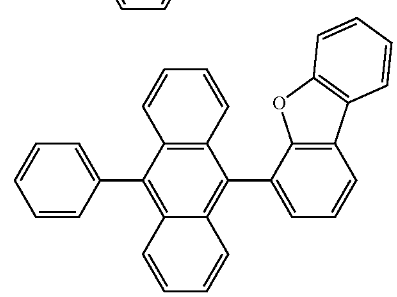

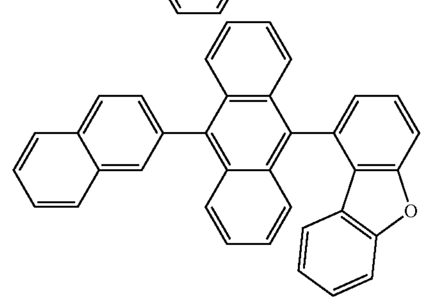

-continued
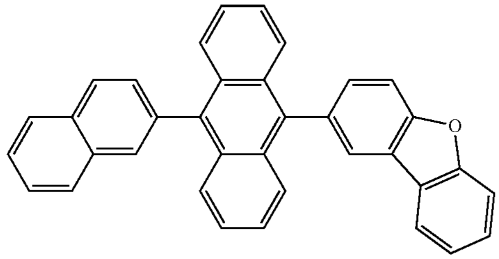
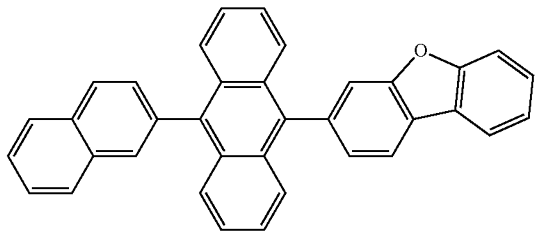
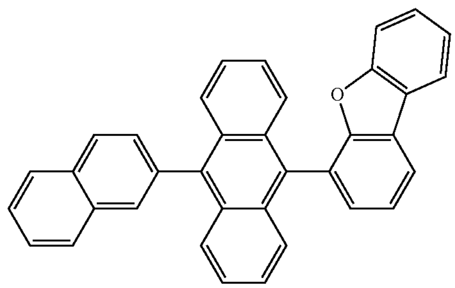
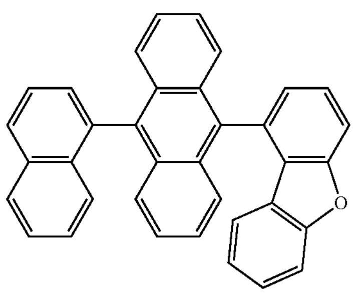
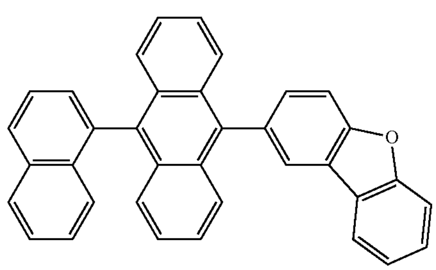
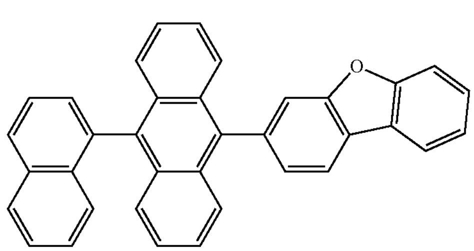
-continued
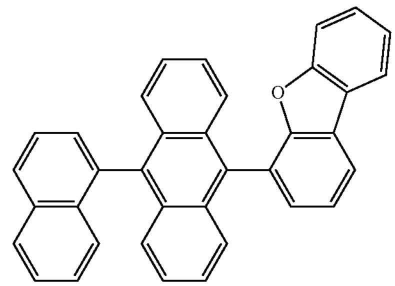
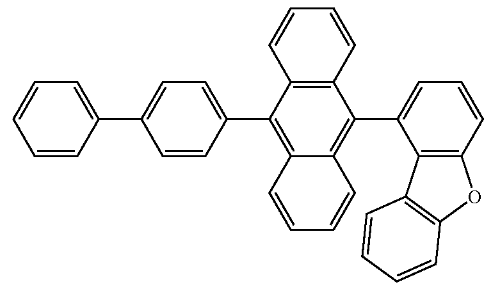
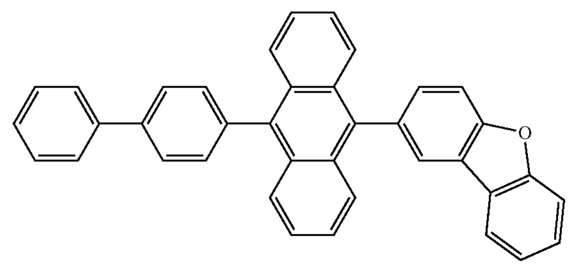
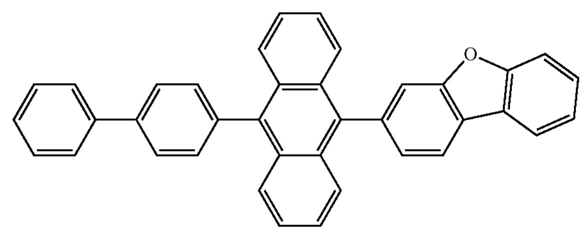
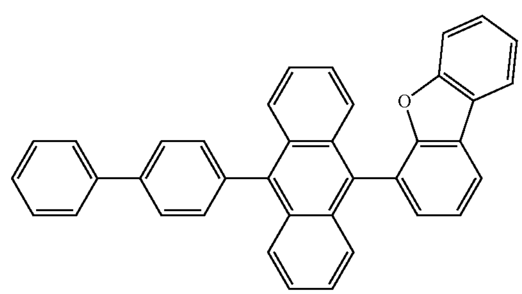
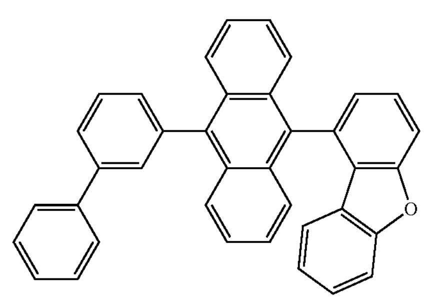

-continued
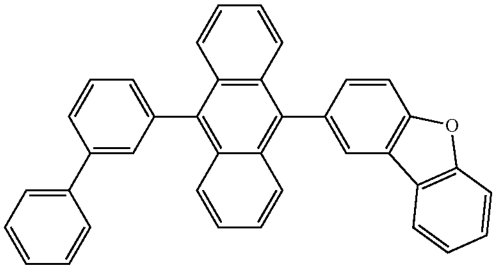
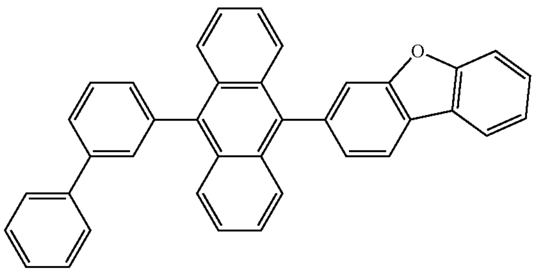
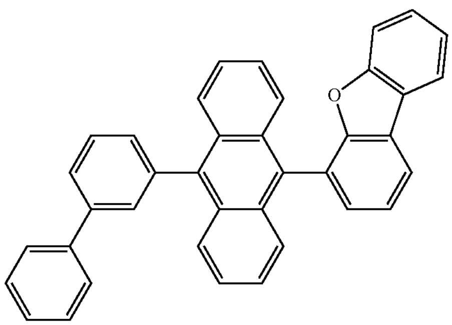
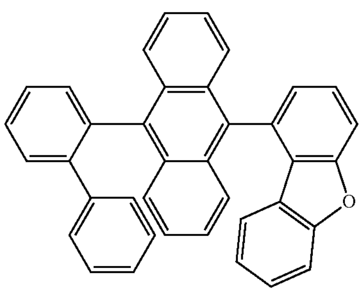
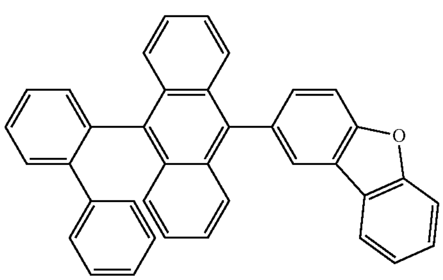
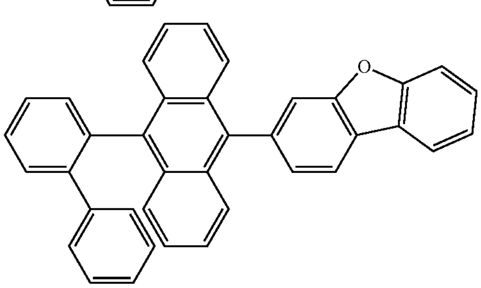
-continued
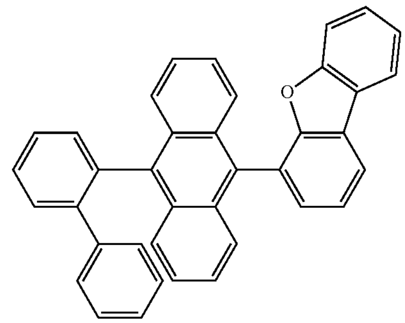
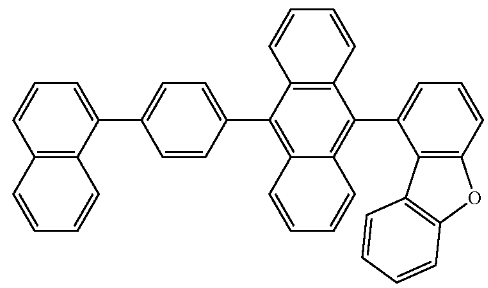
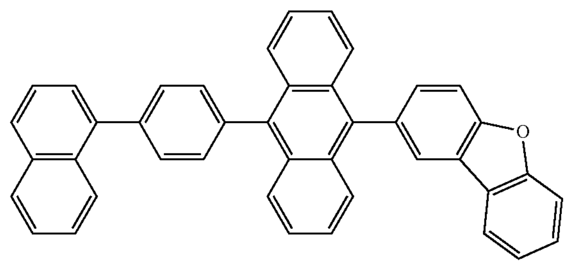
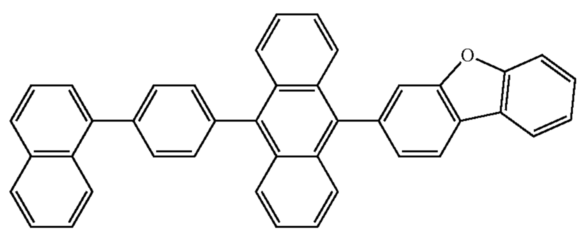
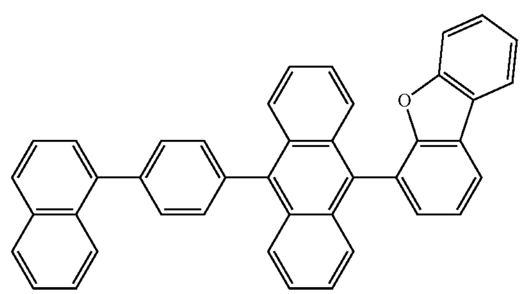
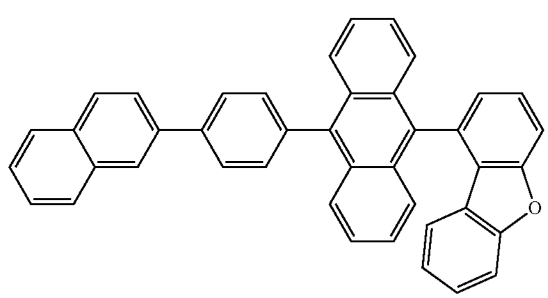

-continued
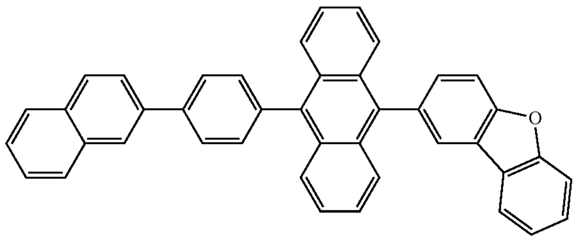
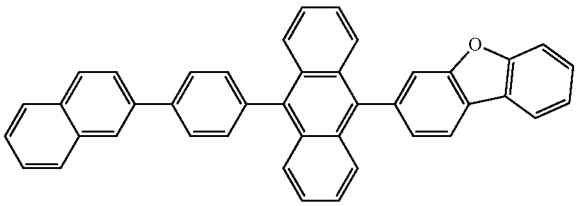
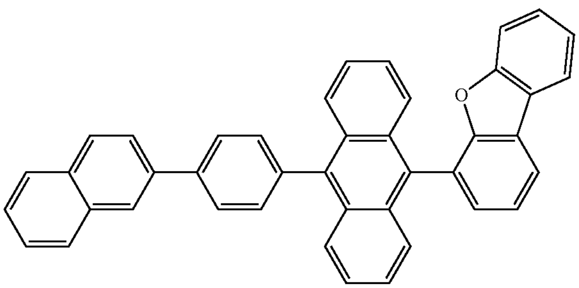
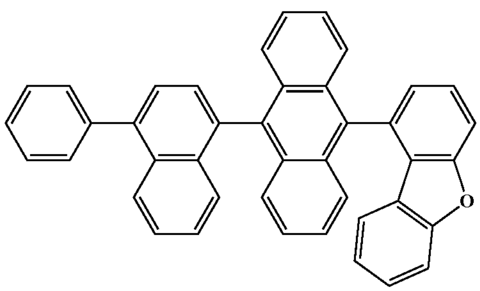
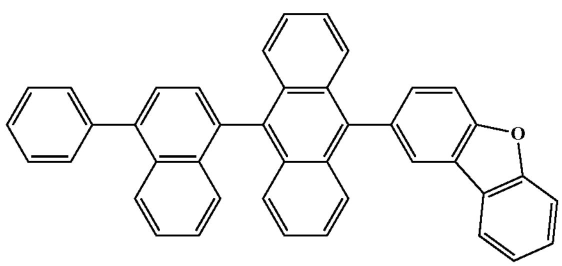
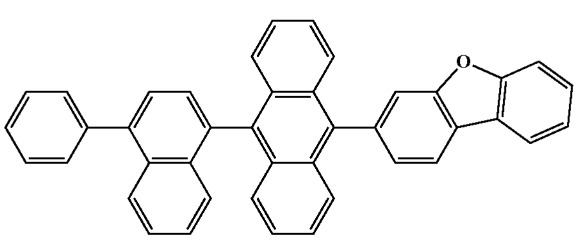
-continued
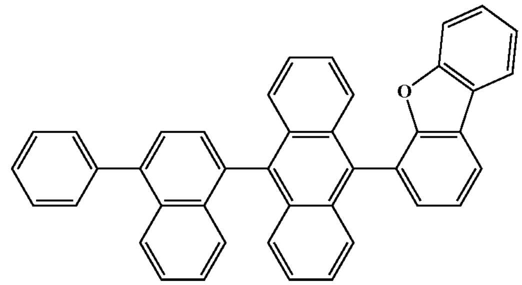
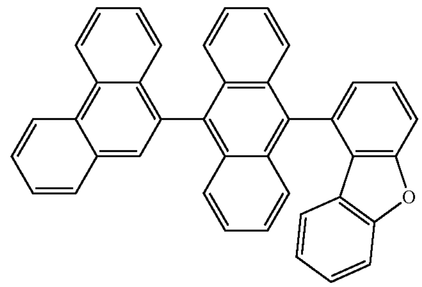
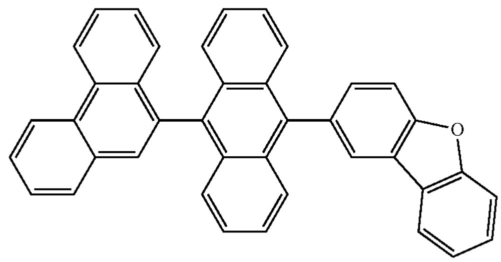
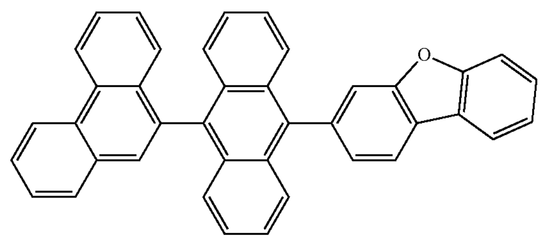
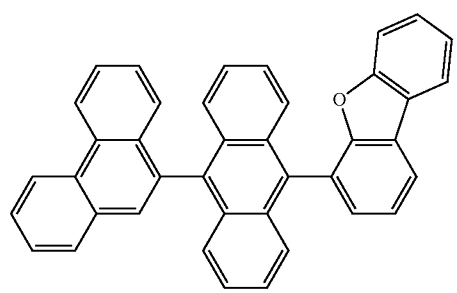
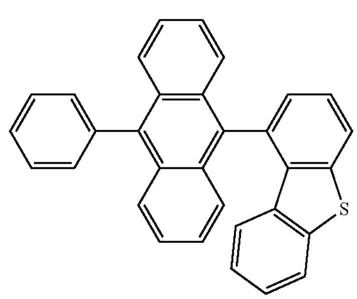

-continued
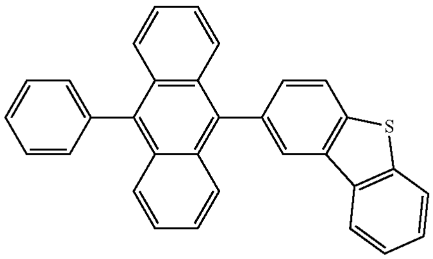
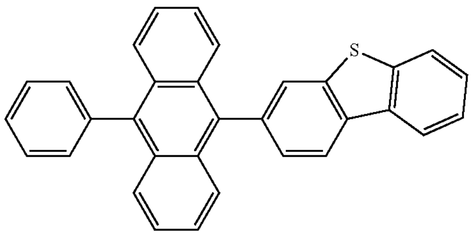
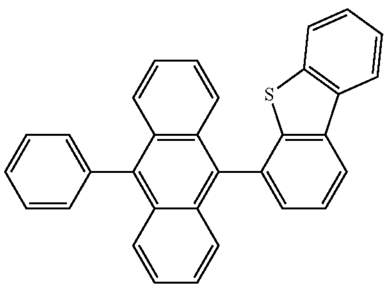
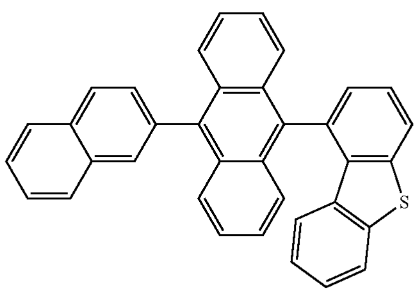
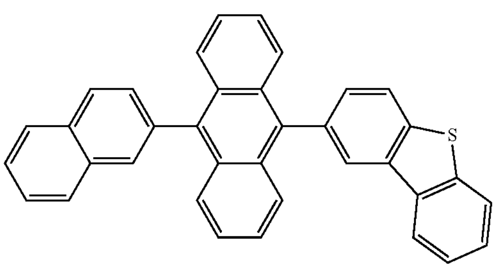
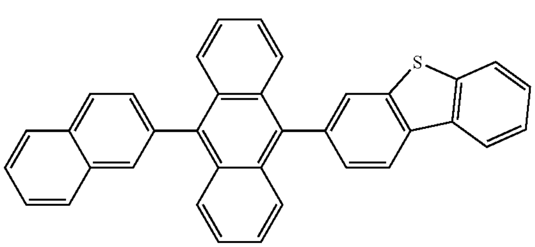
-continued
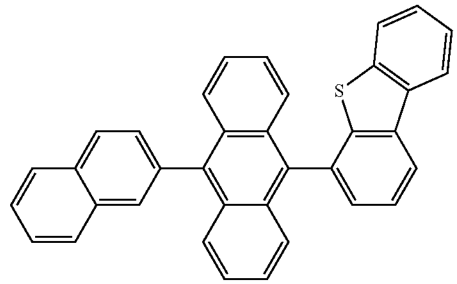
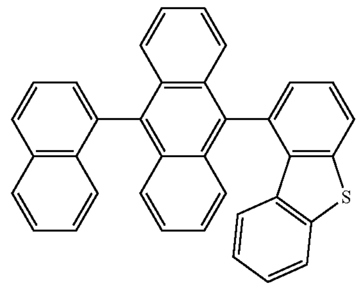
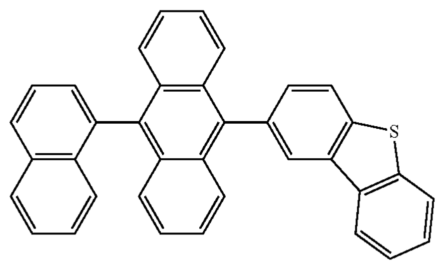
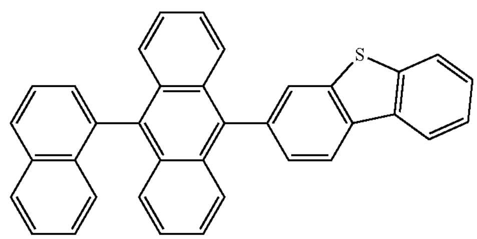
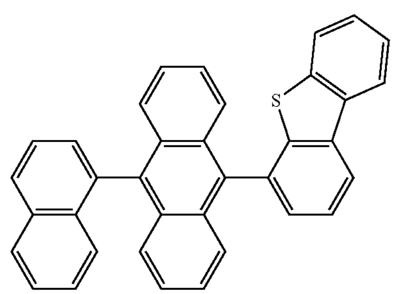
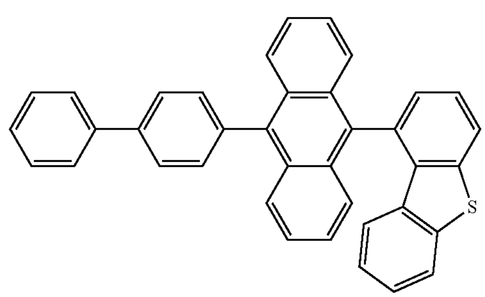

-continued
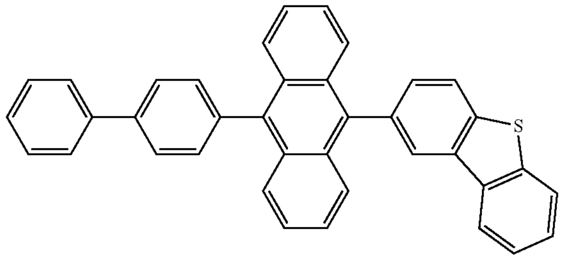
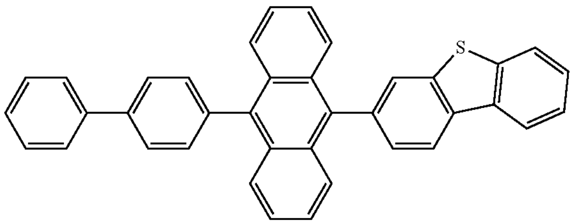
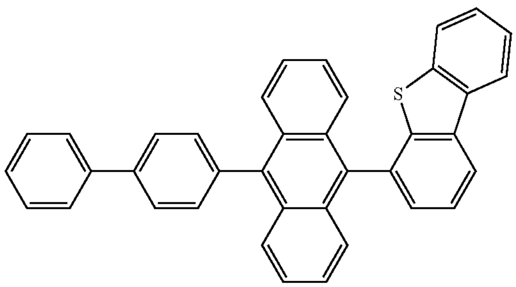
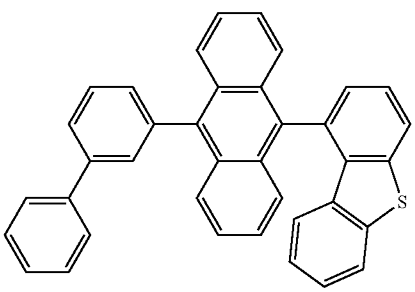
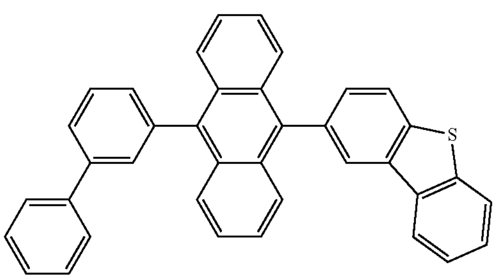
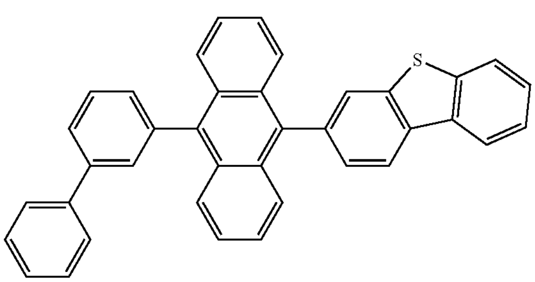
-continued
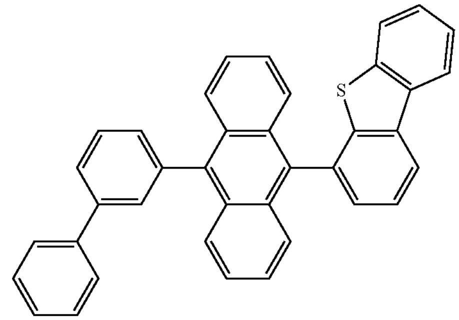
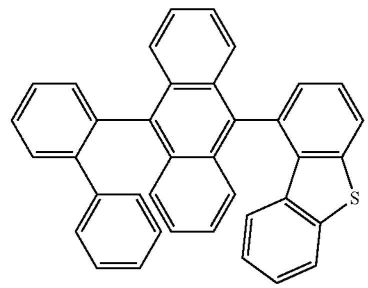
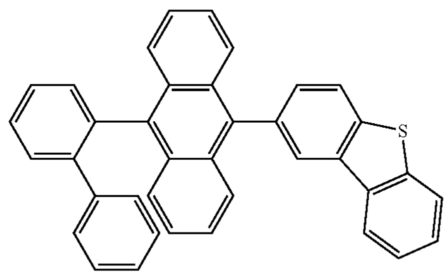
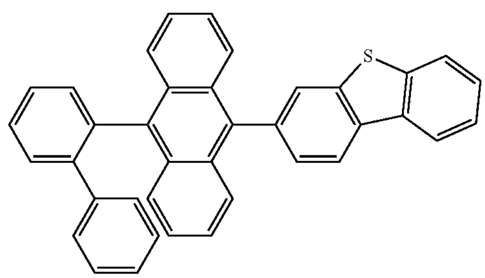
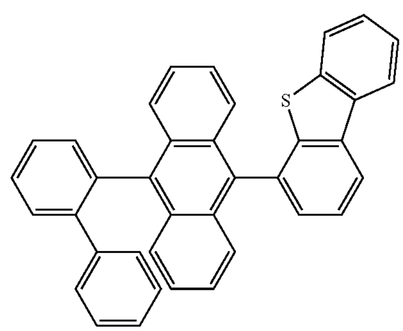

-continued
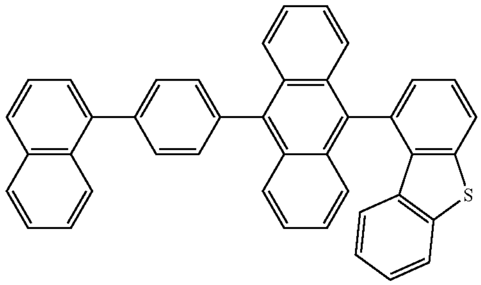
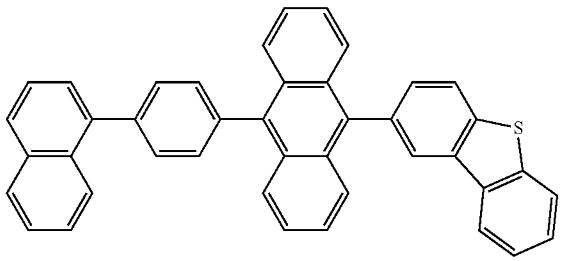
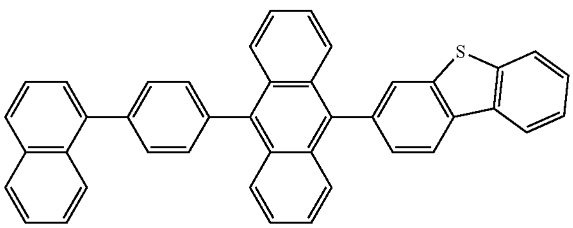
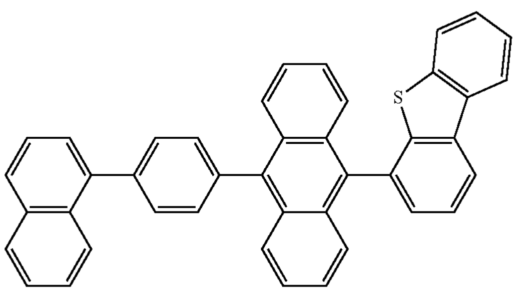
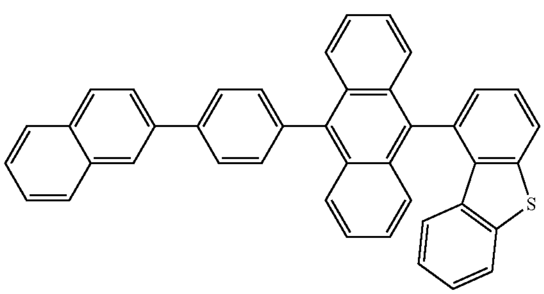
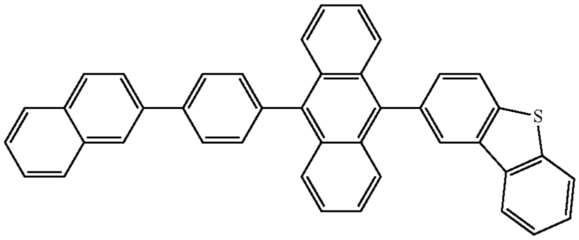
-continued
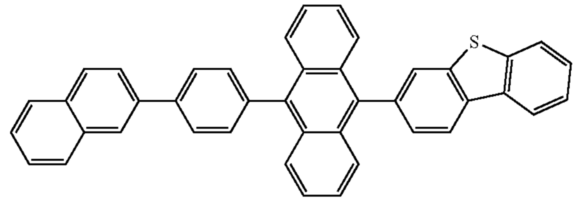
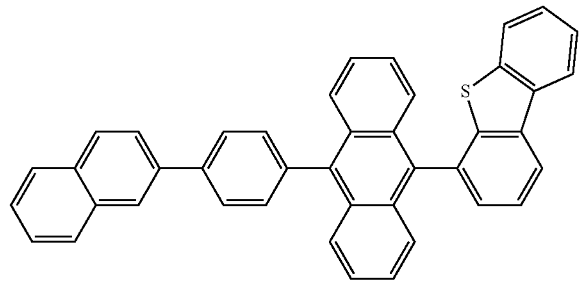
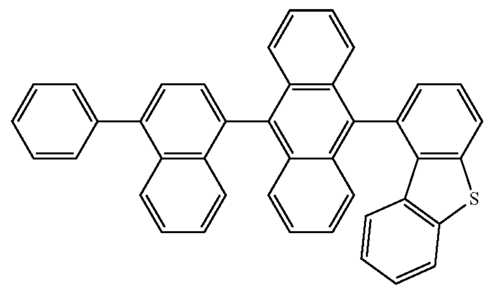
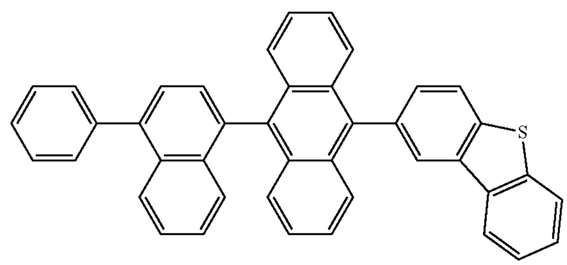
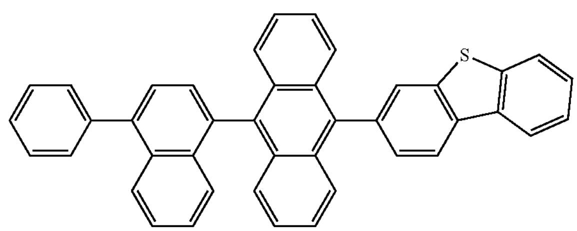
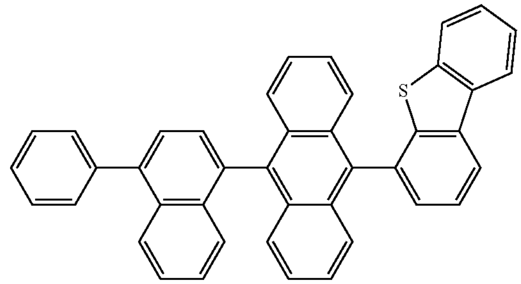

-continued
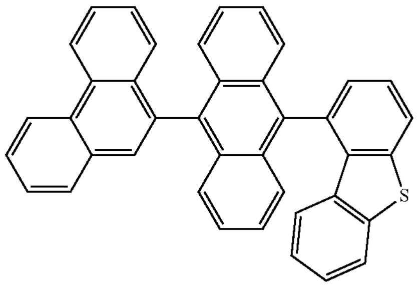
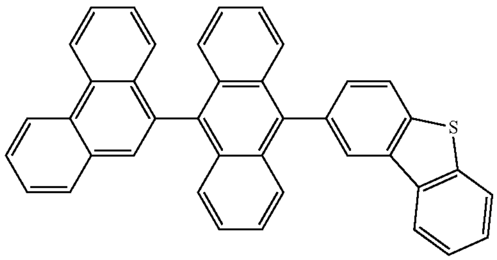
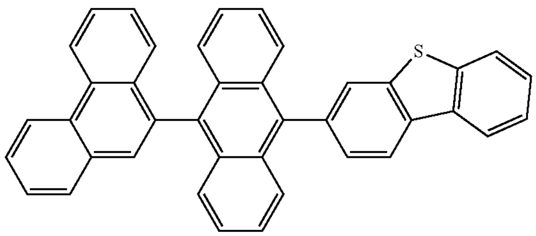
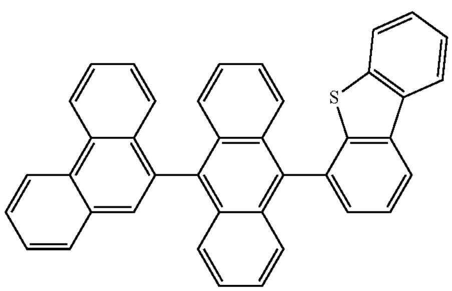
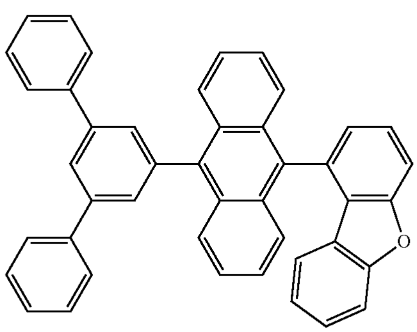
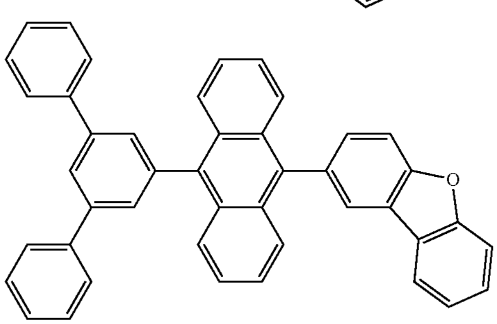
-continued
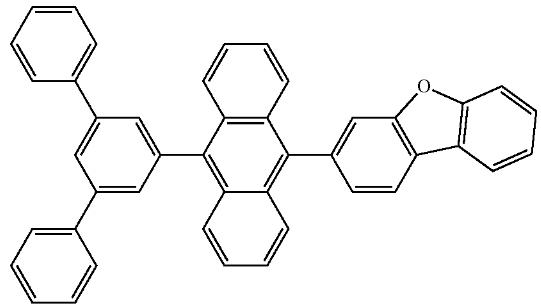
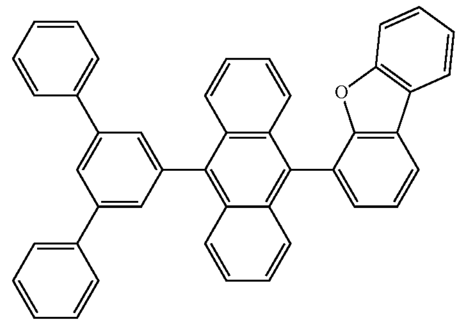
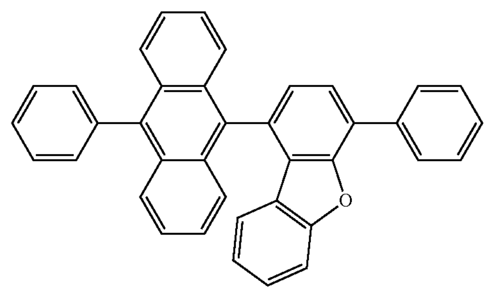
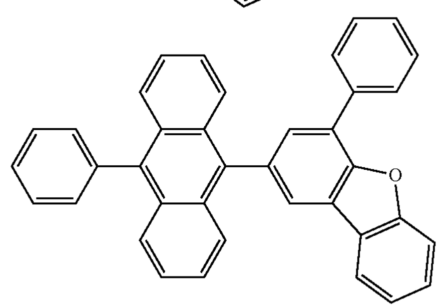
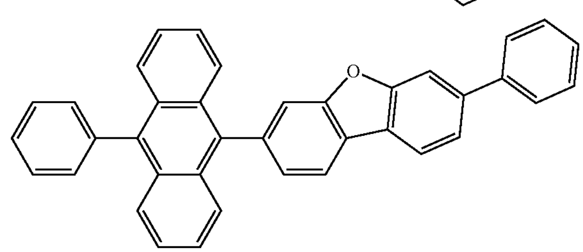
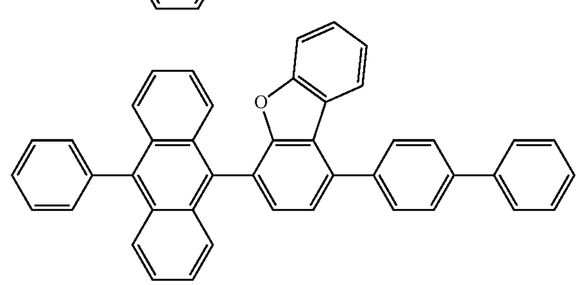

-continued
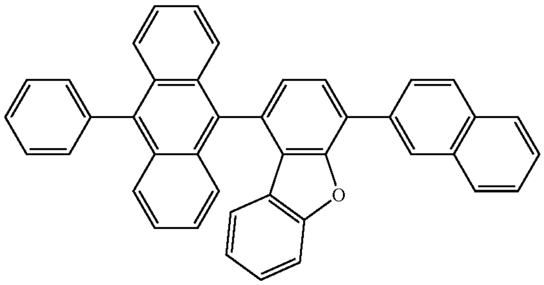
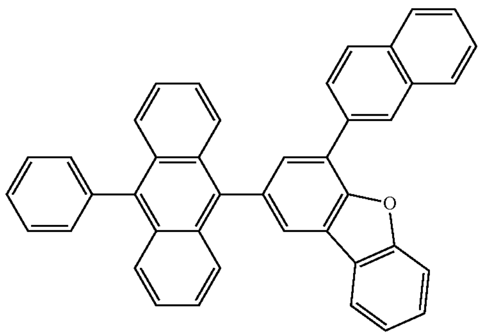
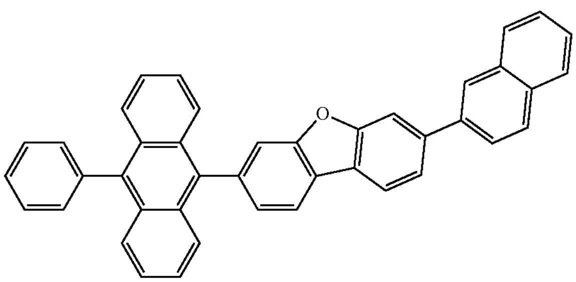
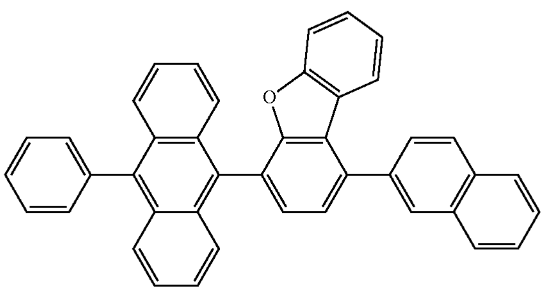
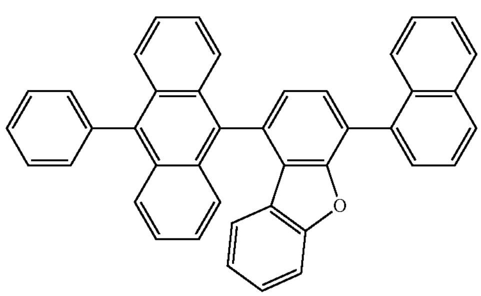
-continued
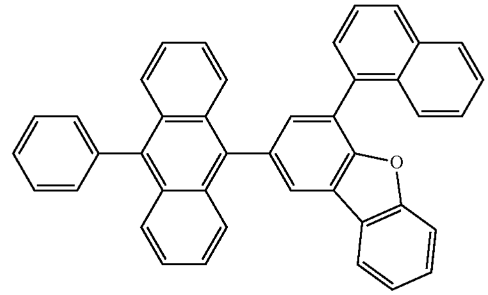
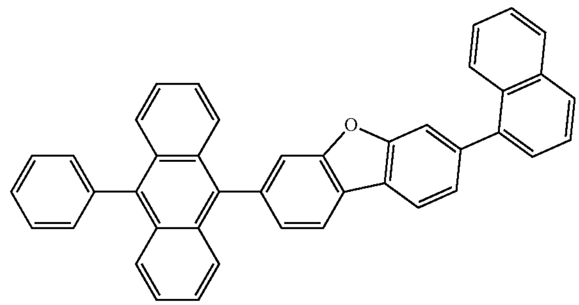
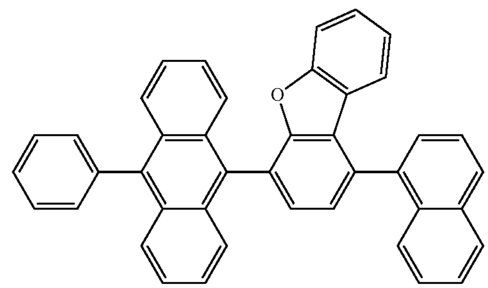
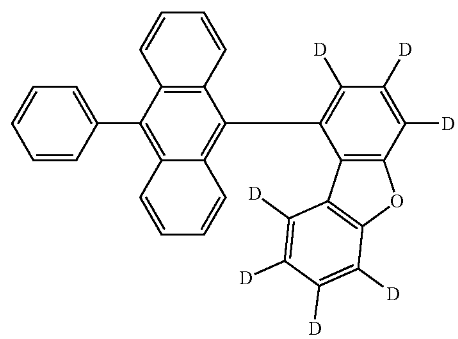
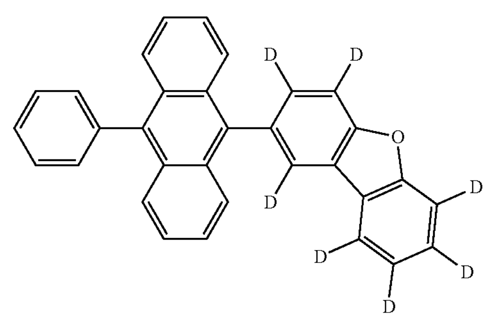

-continued
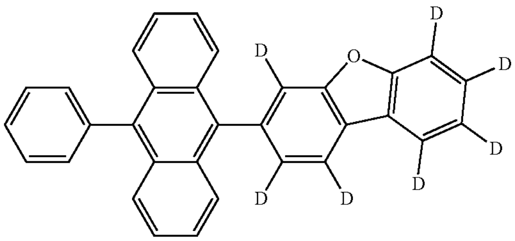
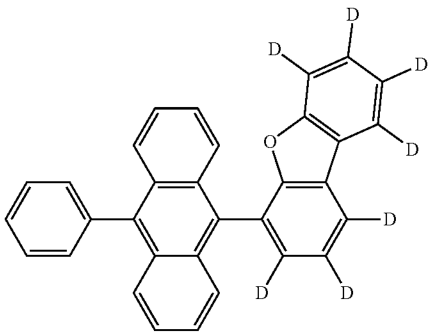
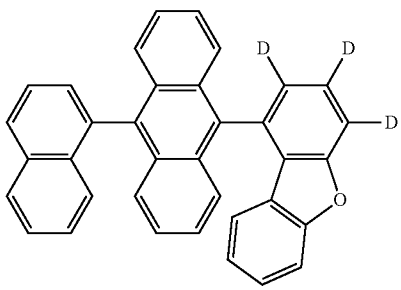
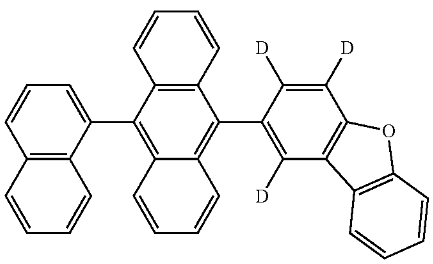
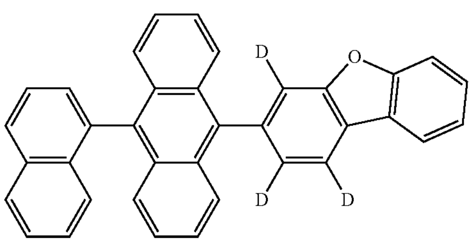
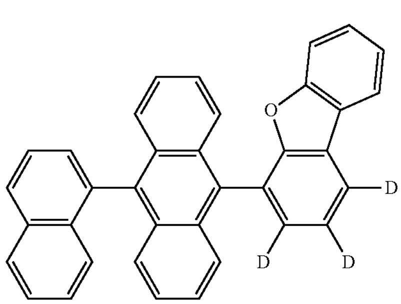
-continued
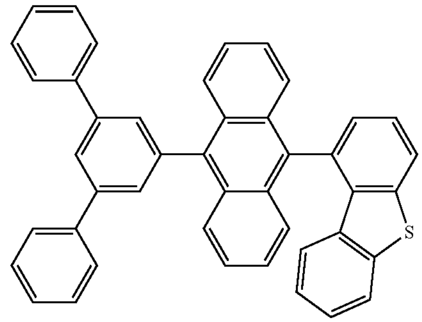
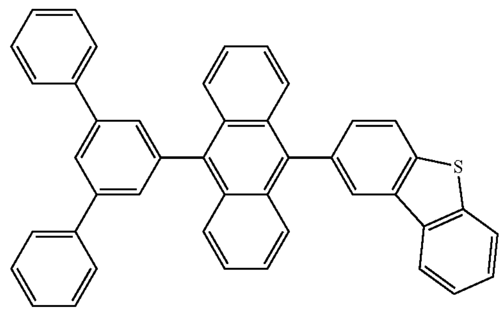
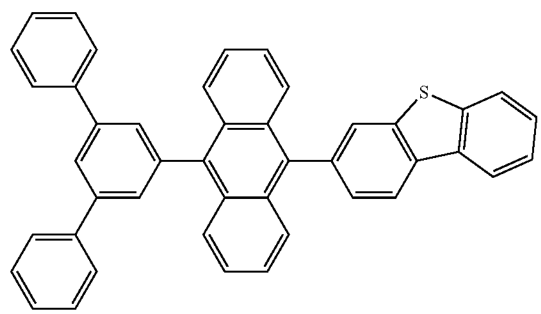
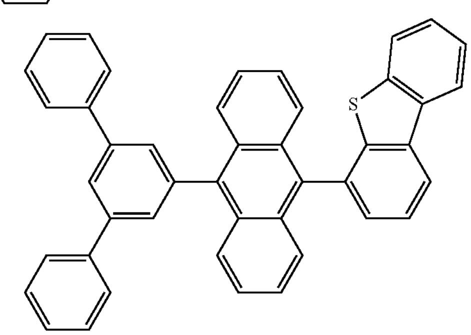
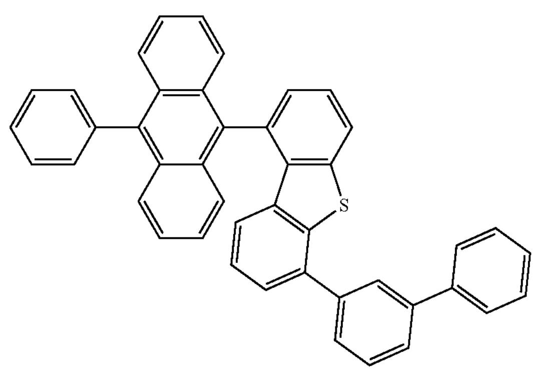

-continued
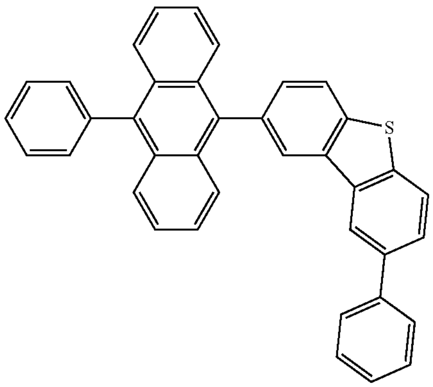
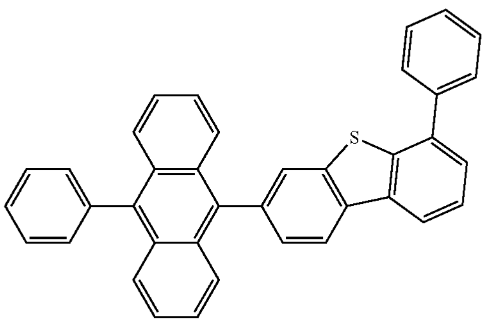
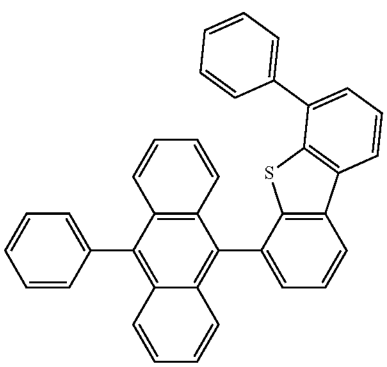
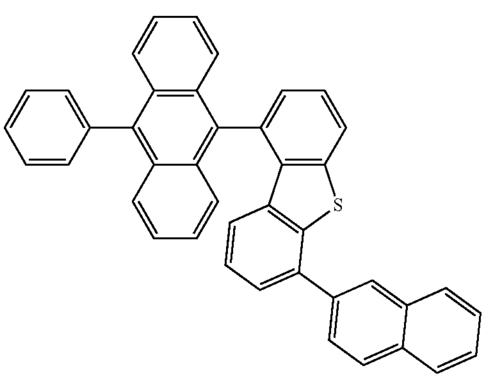
-continued
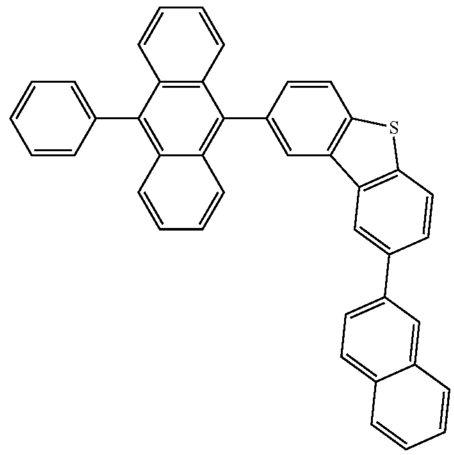
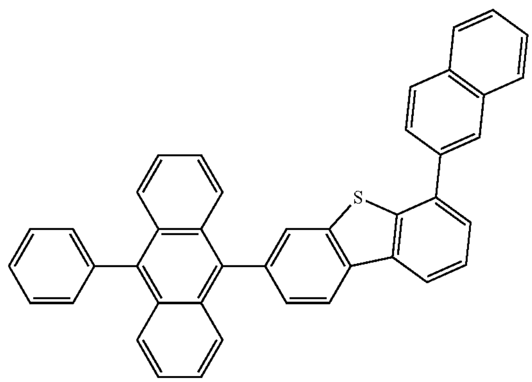
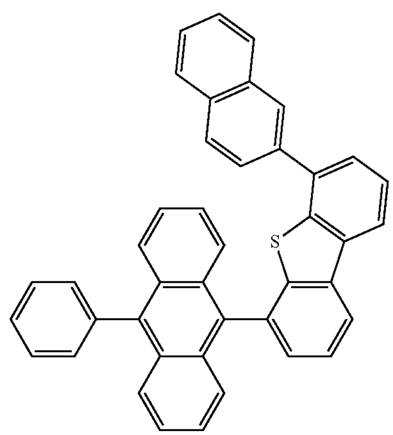
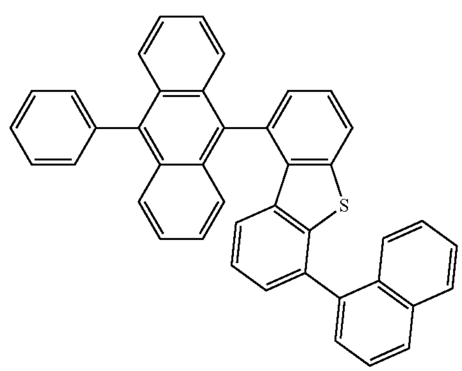

-continued
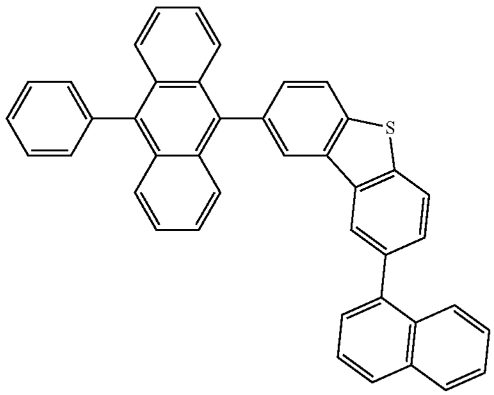
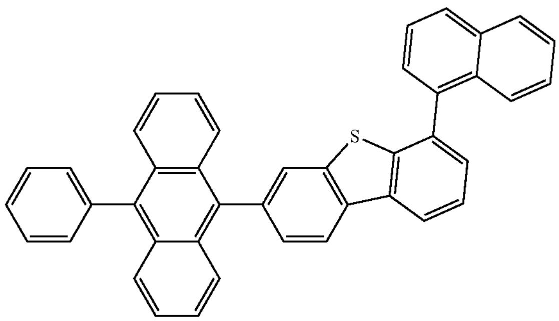
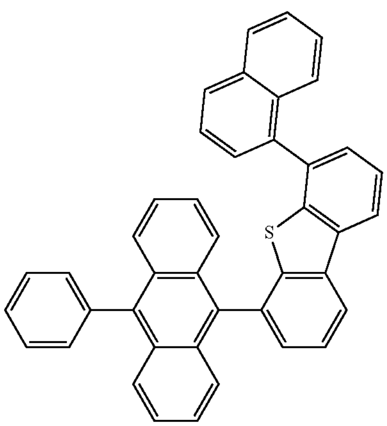
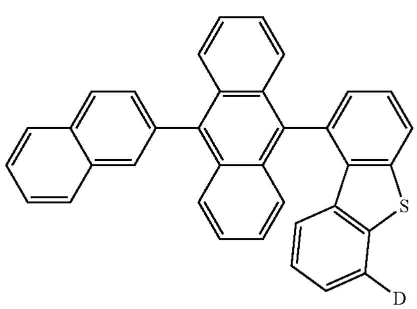
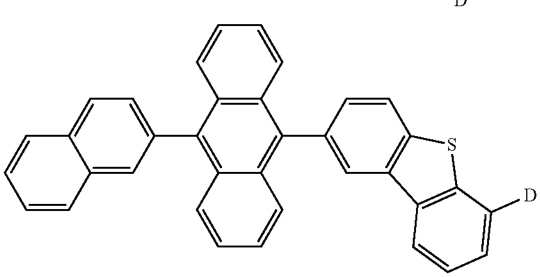
-continued
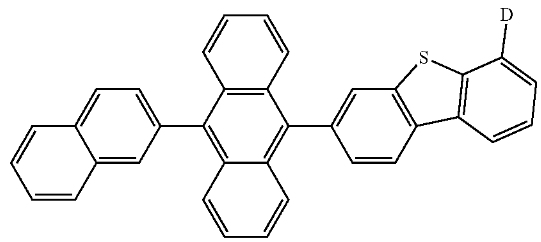
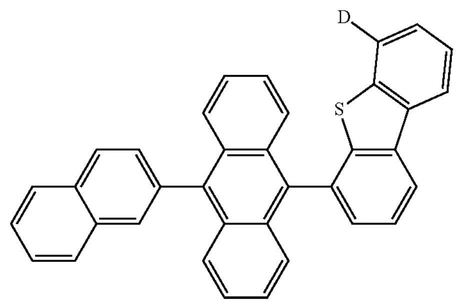
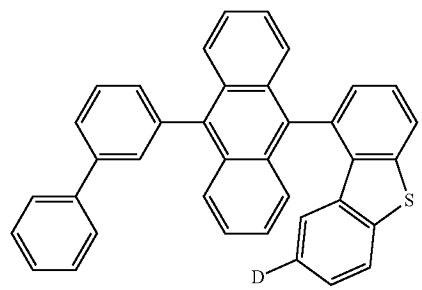
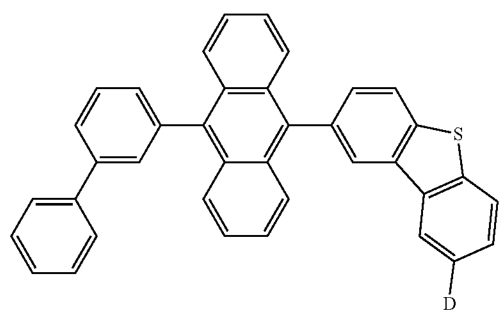
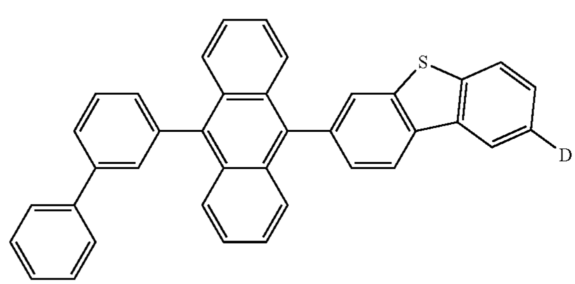

-continued
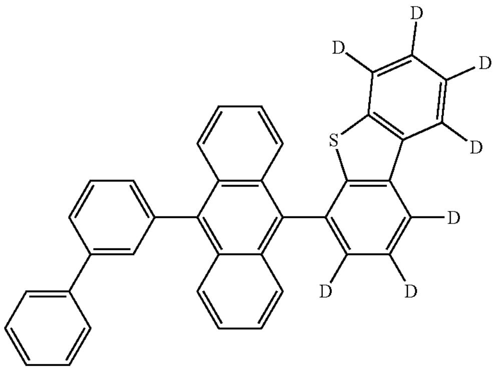
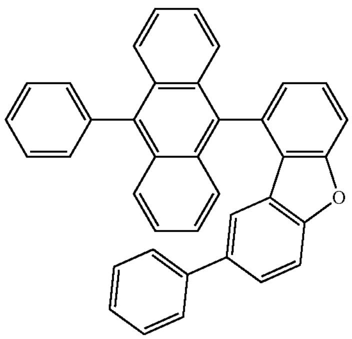
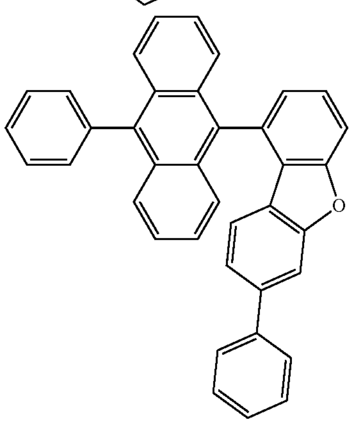
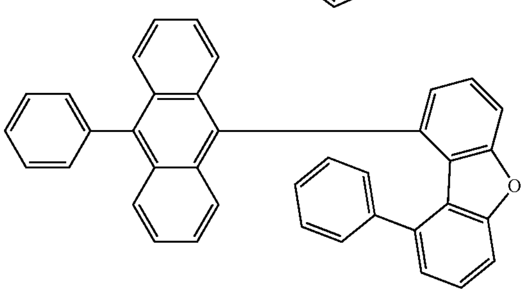
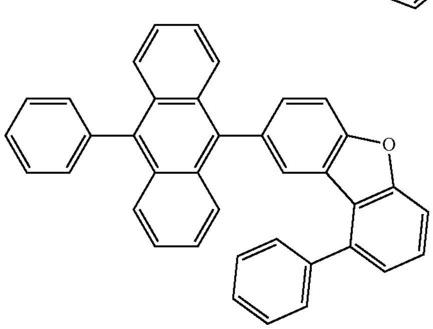
-continued
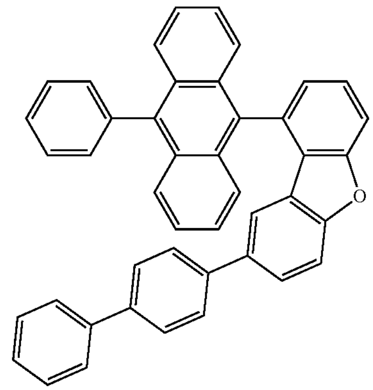
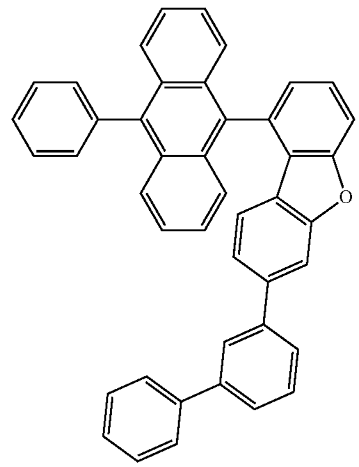
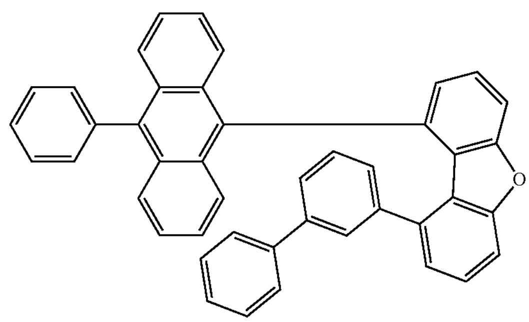
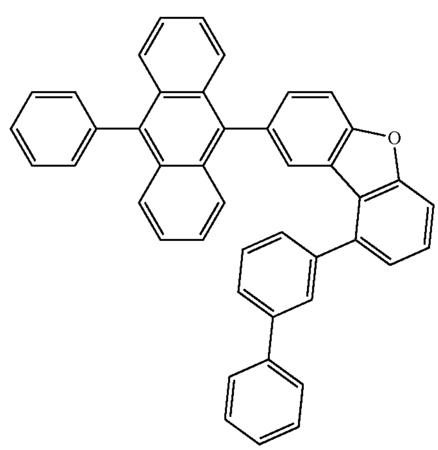

-continued
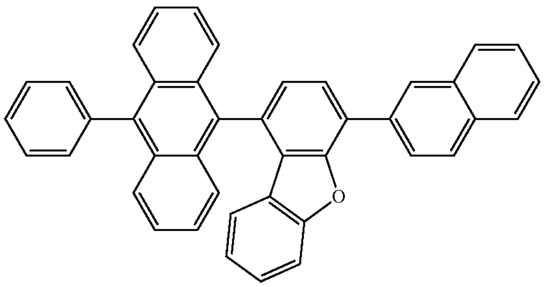
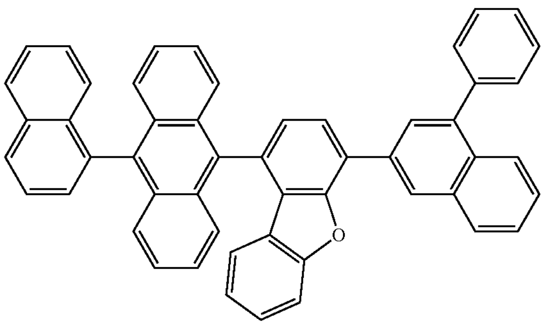
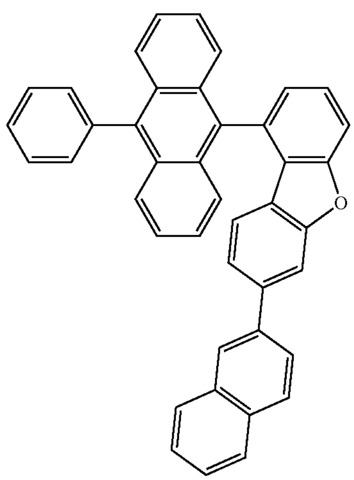
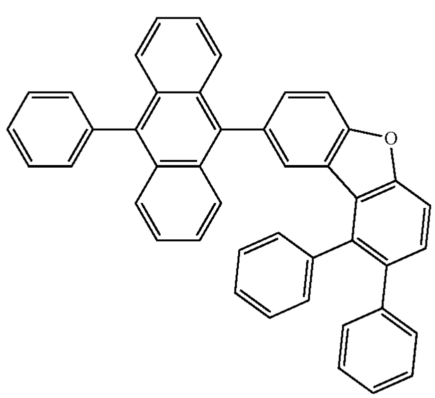
-continued
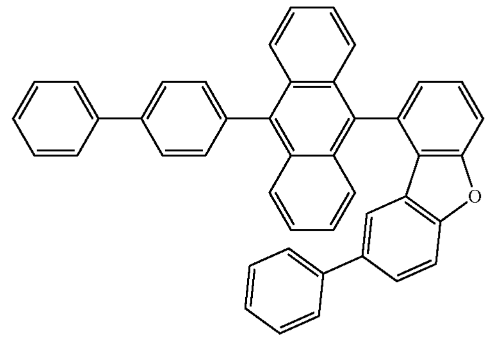
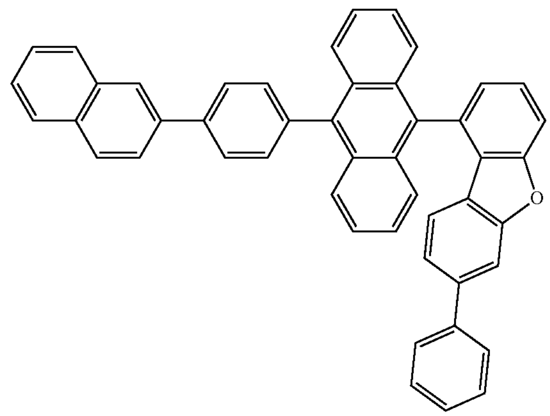
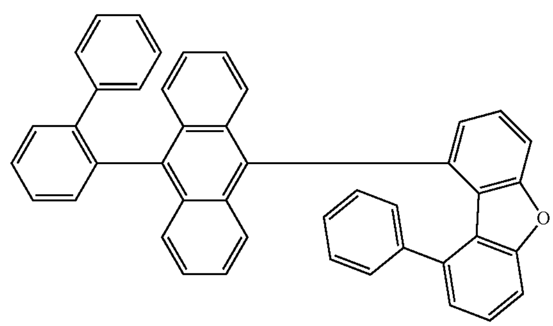
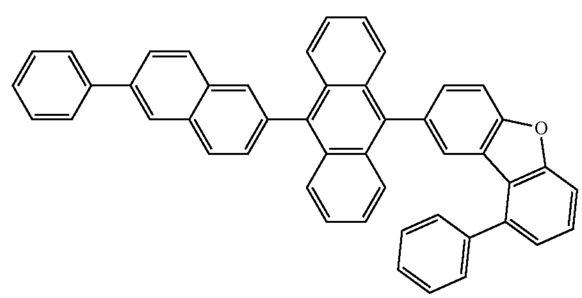

-continued
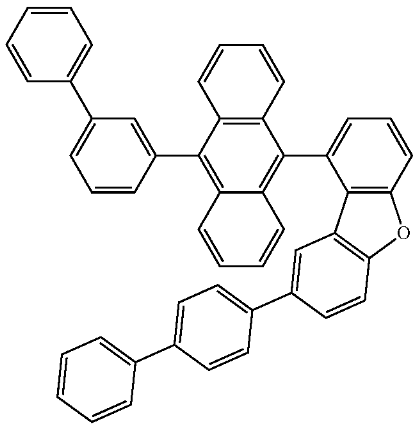
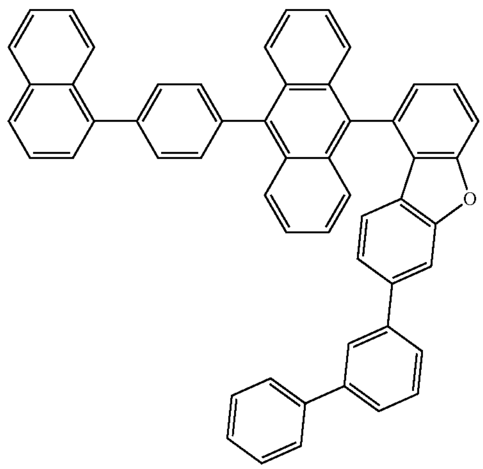
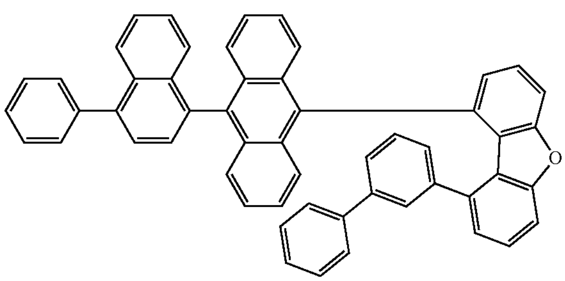
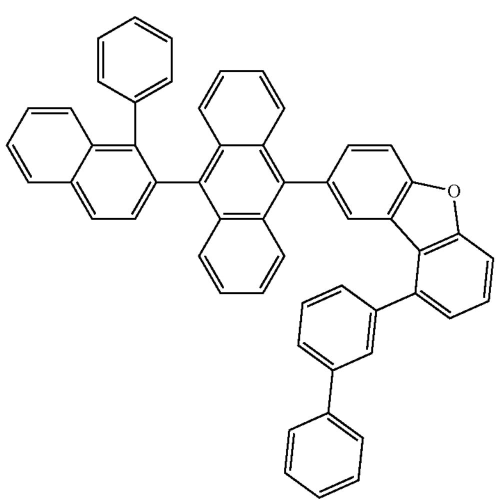
-continued
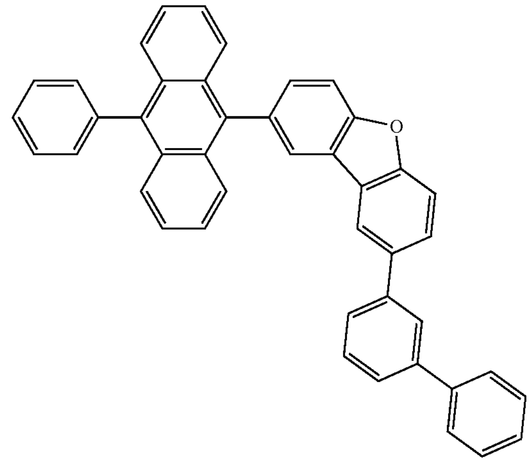
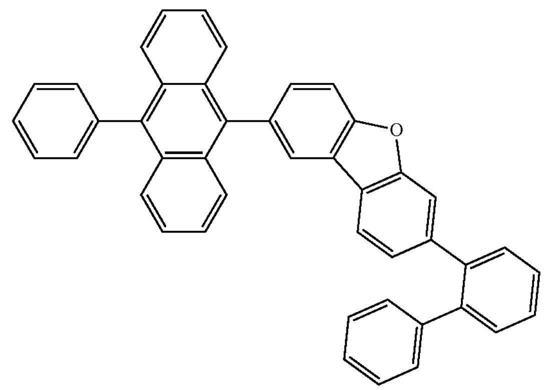
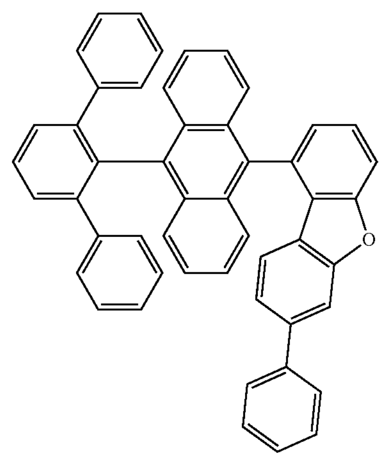
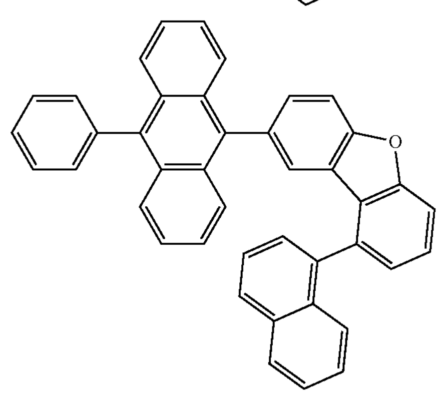

-continued
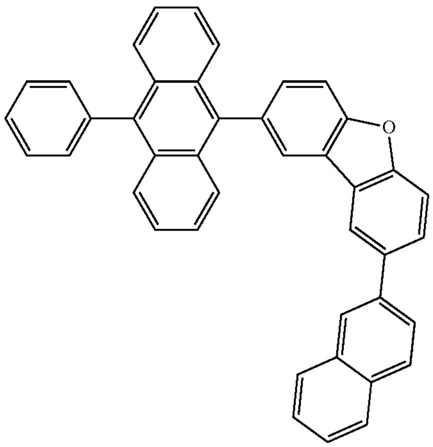
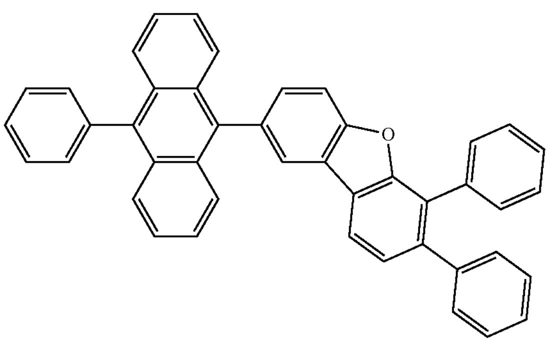
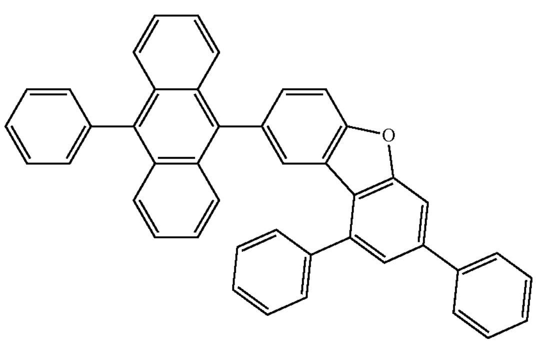
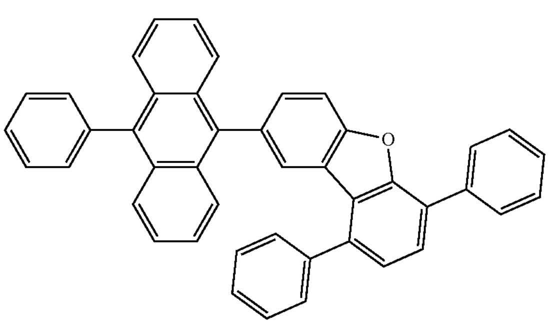
-continued
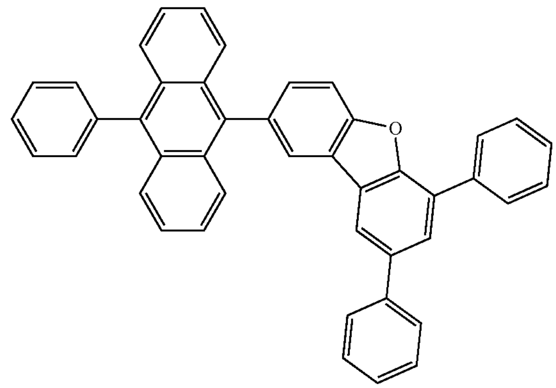
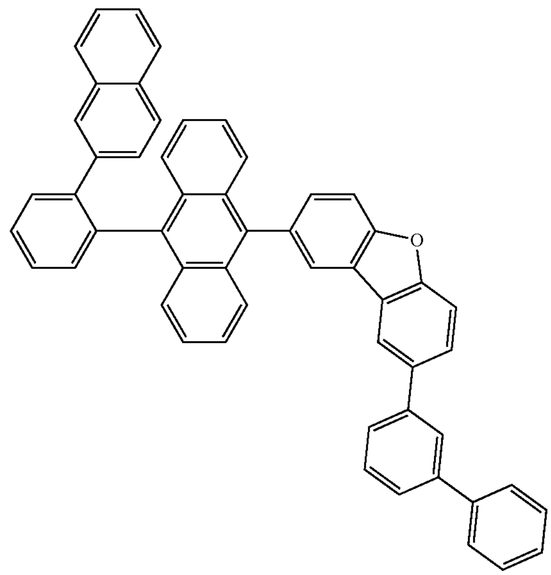
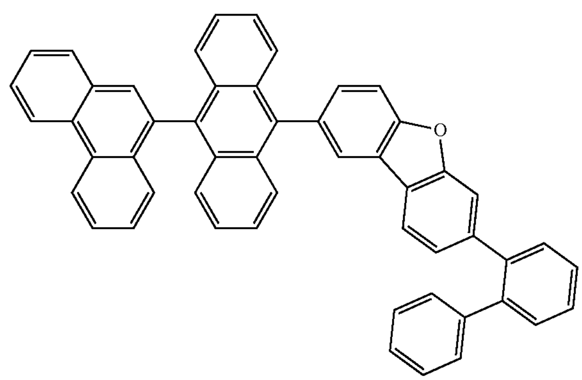
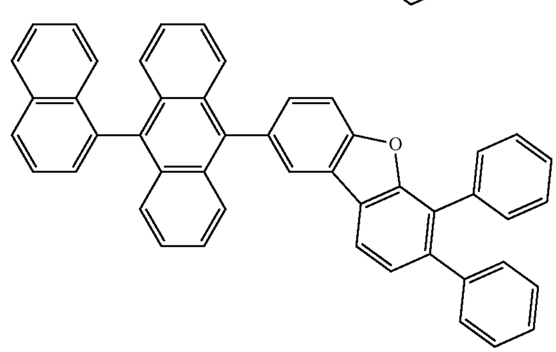

-continued

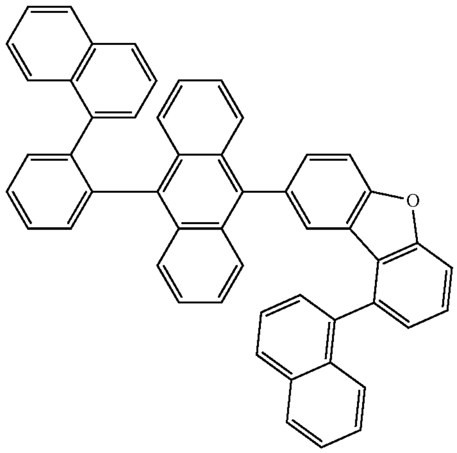

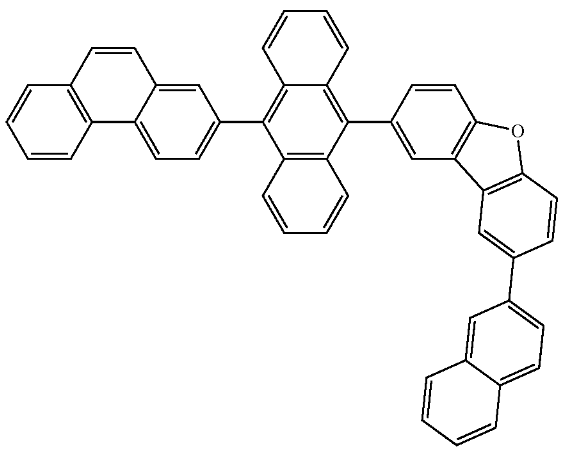

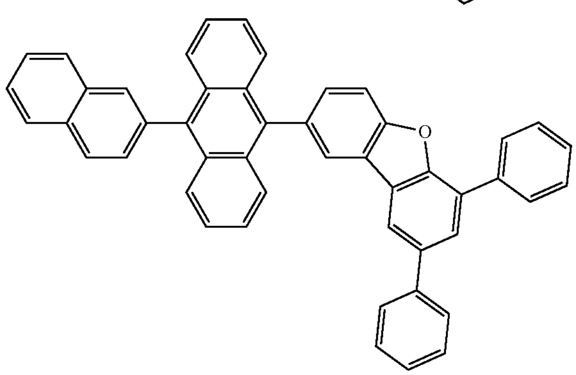

The compound represented by Chemical Formula 1 can be prepared by a preparation method as shown the following Reaction Scheme 1.

[Reaction Scheme 1]

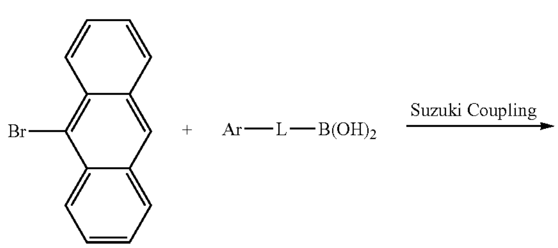

-continued

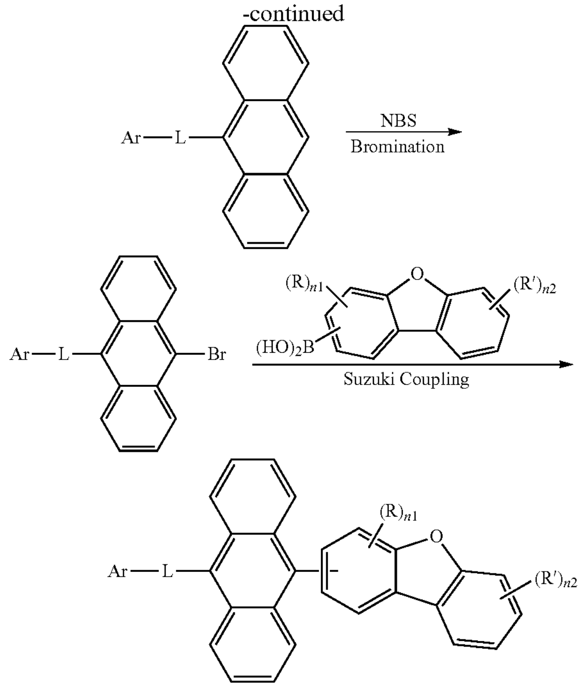

1
(X = O)

In Reaction Scheme 1, L, Ar, R, R', n1, and n2 are as defined in Chemical Formula 1.

The above reaction is a Suzuki coupling reaction, and can be further specified in the preparation examples described later.

The dopant material is not particularly limited as long as it is a material used for the organic light emitting device. Examples of the dopant material include an aromatic amine derivative, a styrylamine compound, a boron complex, a fluoranthene compound, a metal complex, and the like. Specific examples of the aromatic amine derivatives include substituted or unsubstituted fused aromatic ring derivatives having an arylamino group, and examples thereof include pyrene, anthracene, chrysene, and periflanthene having the arylamino group, and the like. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

Electron Transport Region

The electron transport region used in the present invention means a region that receives electrons from a cathode or an electron injection layer formed on the cathode and transports the electrons to the light emitting layer, and that suppresses the transfer of holes from the light emitting layer.

The electron transport region includes an electron transport layer, or includes an electron transport layer and a hole blocking layer. When the electron transport region includes the electron transport layer and the hole blocking layer, preferably, the light emitting layer and the hole blocking layer are positioned adjacent to each other. Therefore, the electron transport region includes an electron transport layer, and the electron transport layer includes the compound represented by Chemical Formula 2, or the electron transport region includes an electron transport layer and a hole blocking layer, and the hole blocking layer includes a compound represented by Chemical Formula 2.

In Chemical Formula 2, $R_1$ and $R_2$ may be phenyl.

Further, $L_1$, $L_2$, $L_3$, and $L_4$ may each independently be a bond or phenylene.

Further, i and j may be 0, and k and l may each independently be 0 or 1.

Further, i+j may be 0, and k+l may be 1 or 2.

Further, A may be any one selected from the group consisting of:

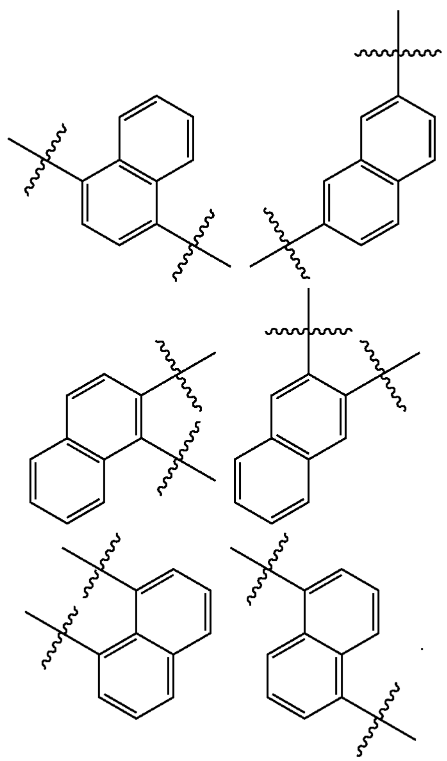

Further, B is a $C_{6-20}$ aryl substituted with at least one cyano group; or a substituted or unsubstituted $C_{2-60}$ heteroaryl containing 1 to 3 nitrogen atoms.

Specifically, B is phenyl substituted with a cyano group, dimethylfluorenyl substituted with a cyano group, pyridinyl, pyrazinyl, pyrimidinyl, pyridazinyl, isoindolyl, indolyl, indazolyl, quinolinyl, isoquiriolinyl, benzoquinolinyl, quinoxalinyl, quinazolinyl, phthalazinyl, or triazinyl substituted with phenyl.

Specifically, for example, B may be any one selected from the group consisting of:

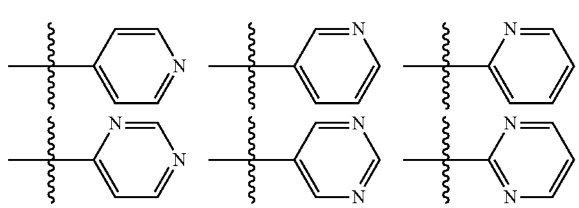

-continued

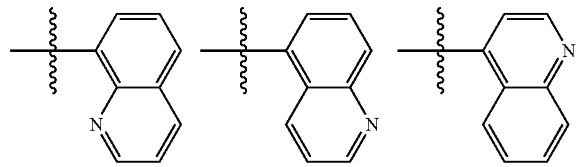

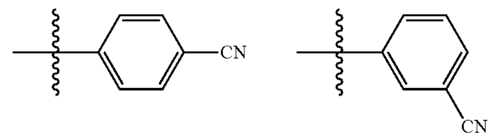

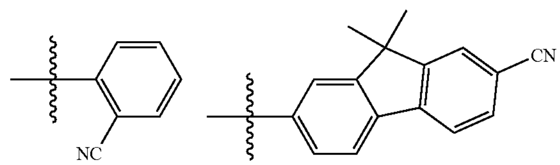

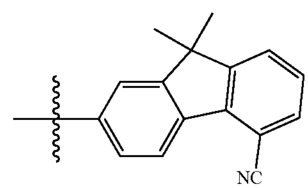

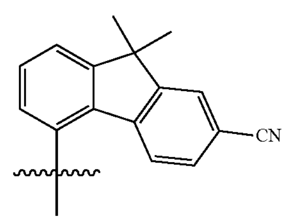

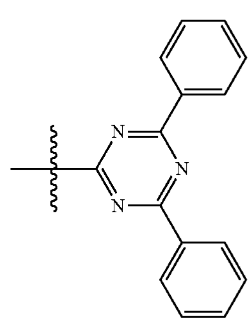

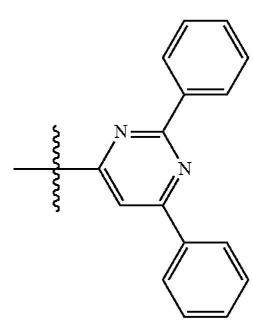

-continued
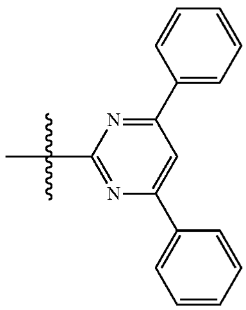
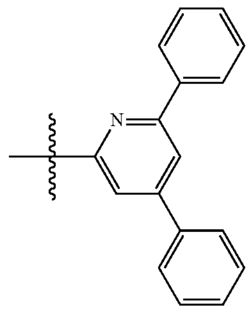
-continued
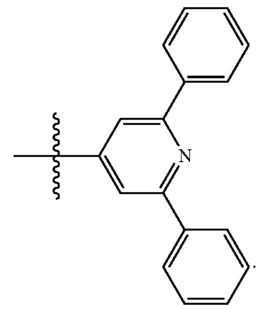 [SMILES: *c1cc(-c2ccccc2)nc(-c2ccccc2)c1]
Representative examples of the compound represented by Chemical Formula 2 are as follows.
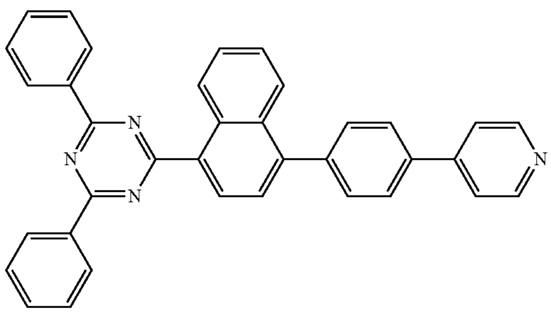
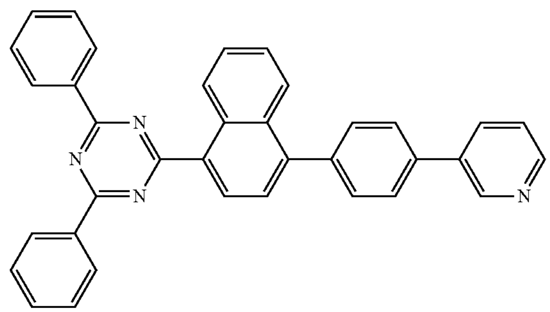
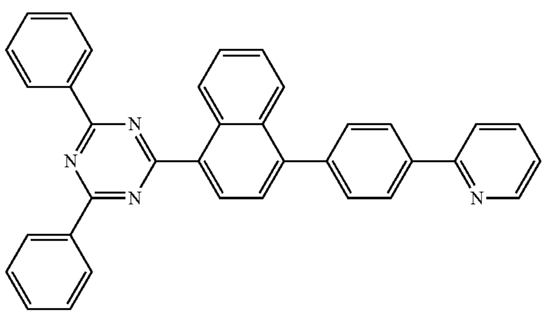
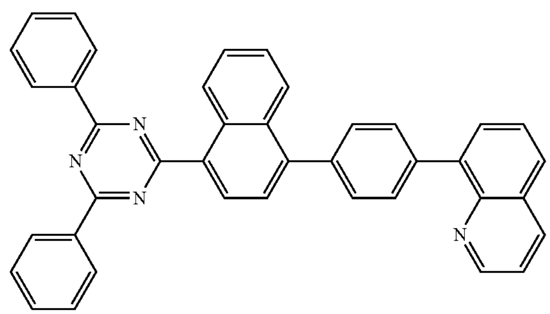
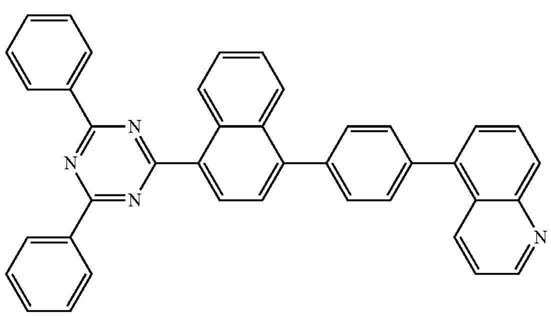
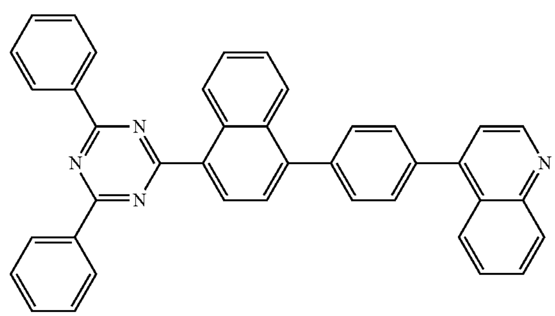
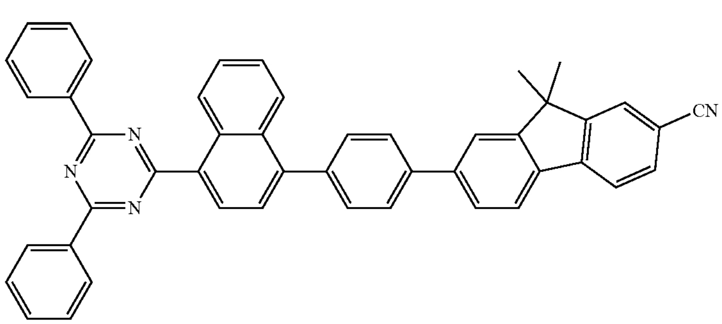

-continued
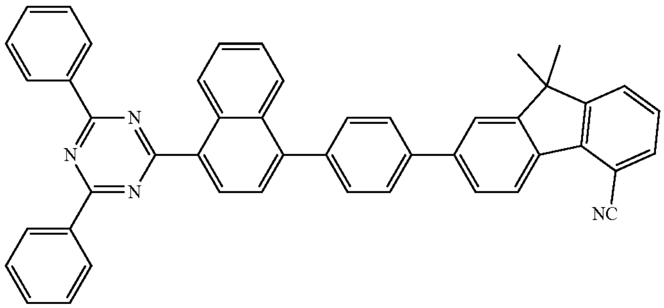
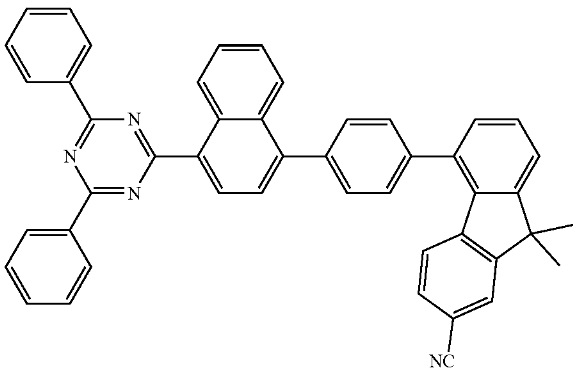
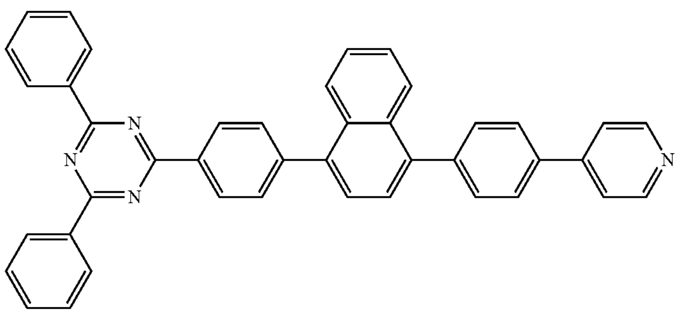
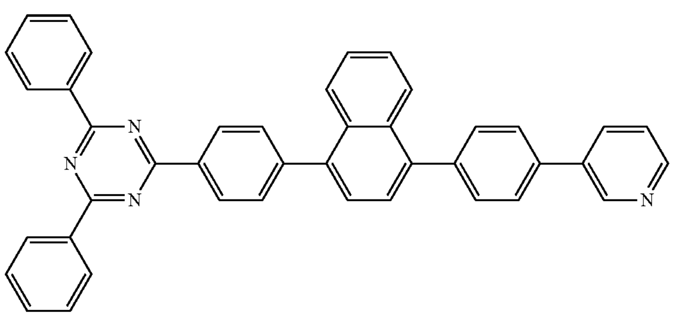
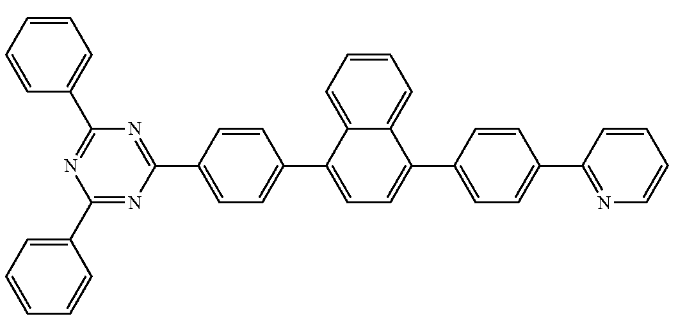

-continued
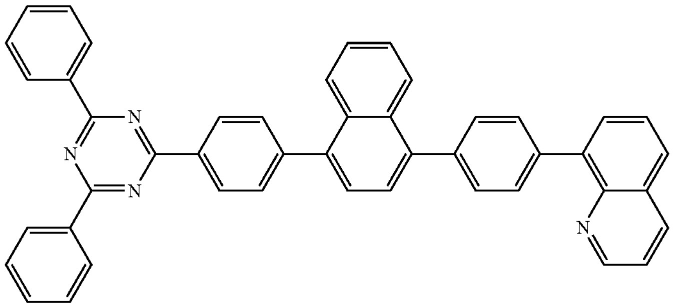
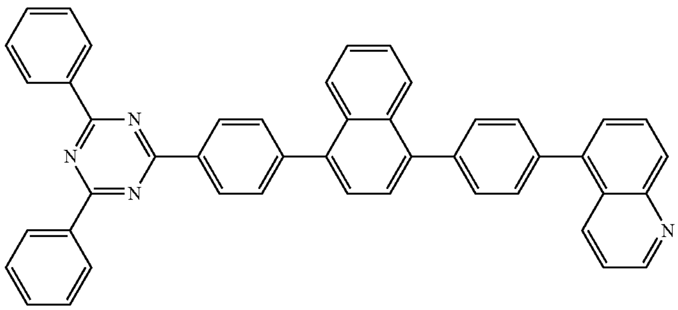
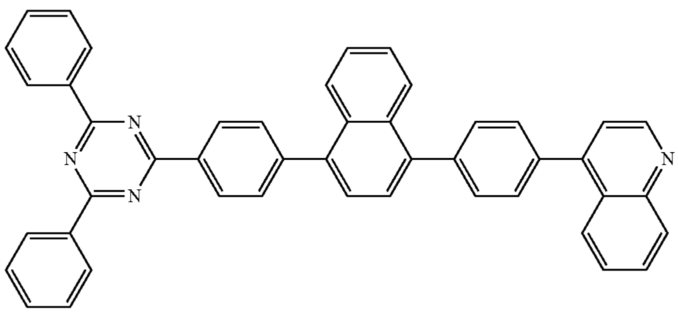
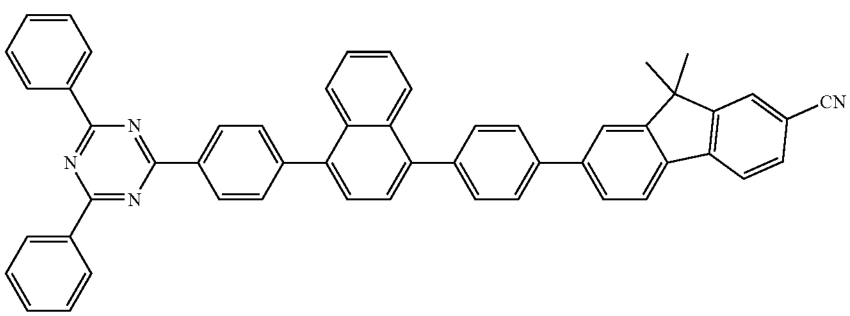
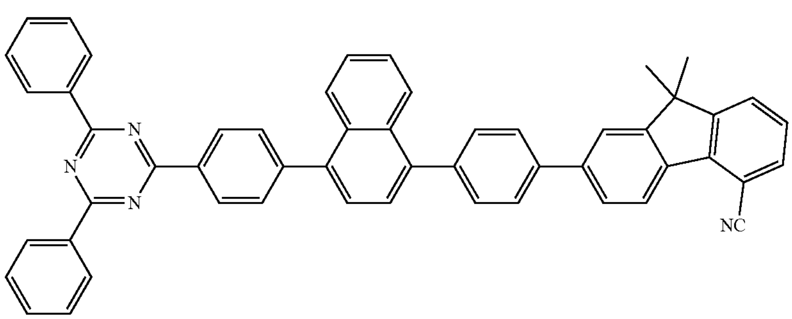

-continued
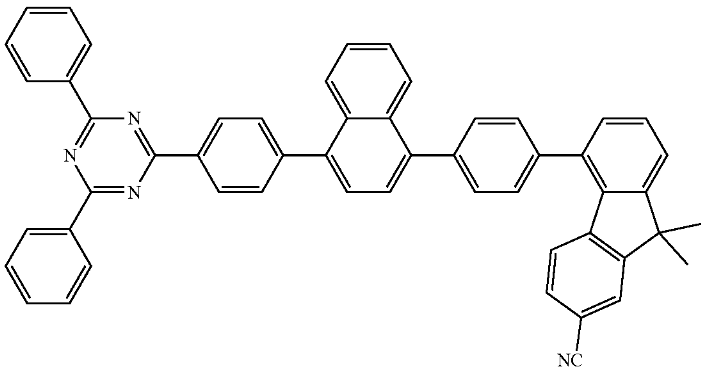
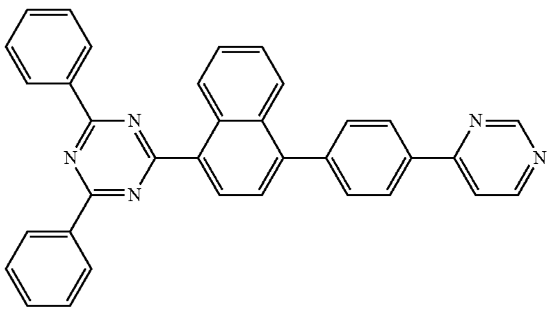
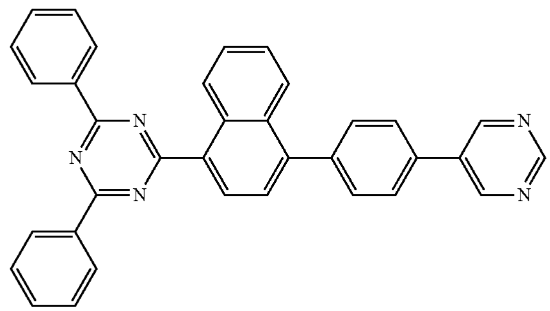
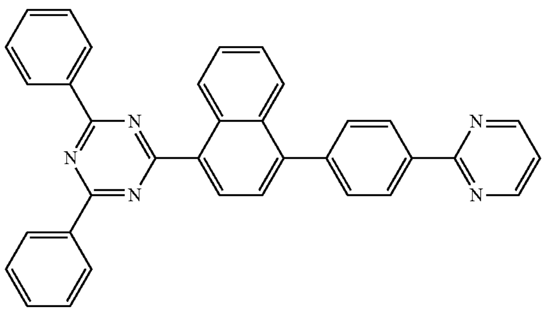
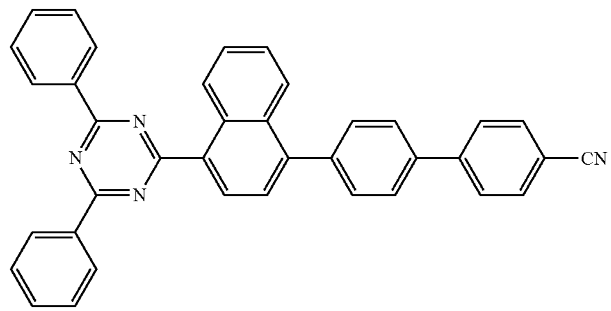
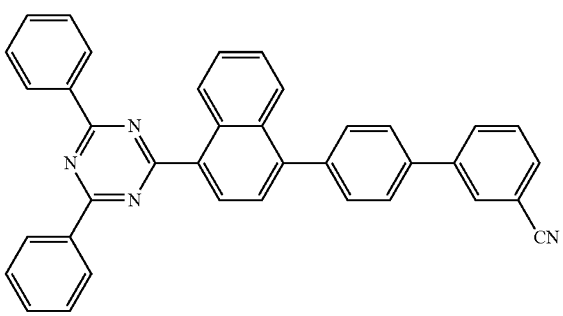
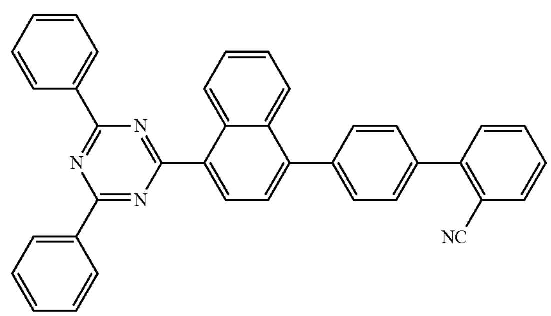
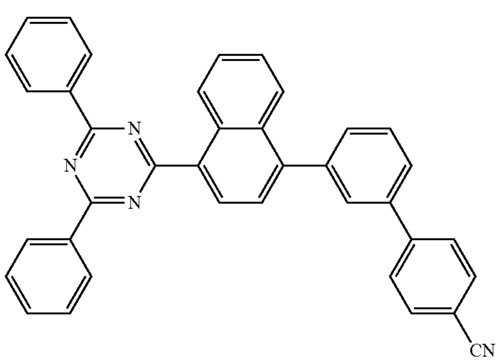
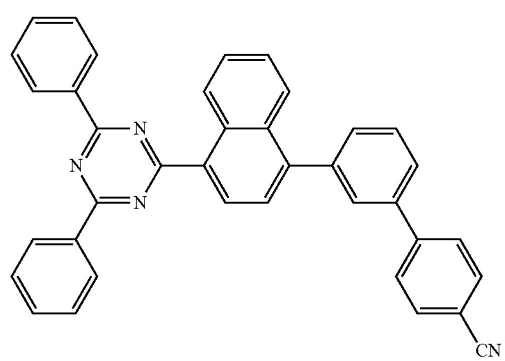

-continued
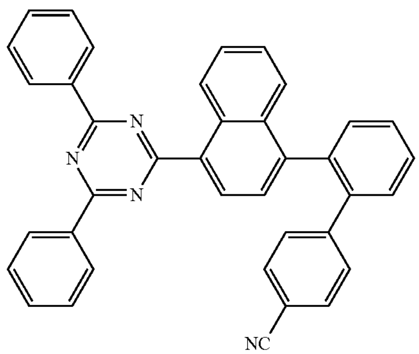
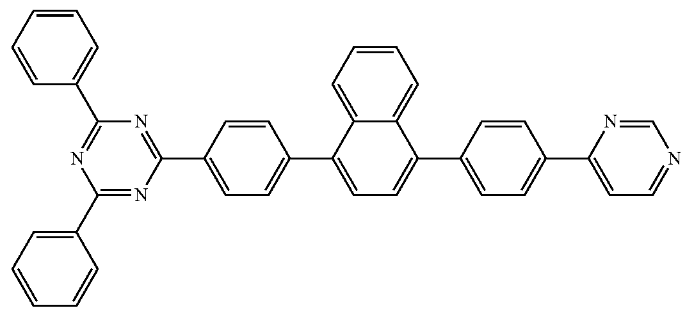
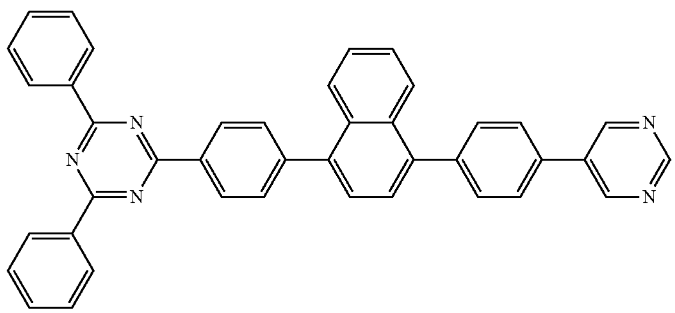
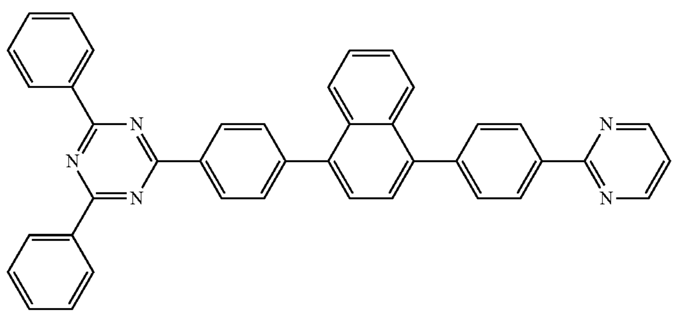
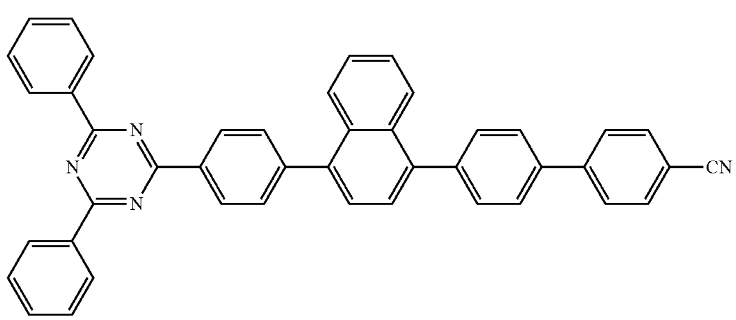
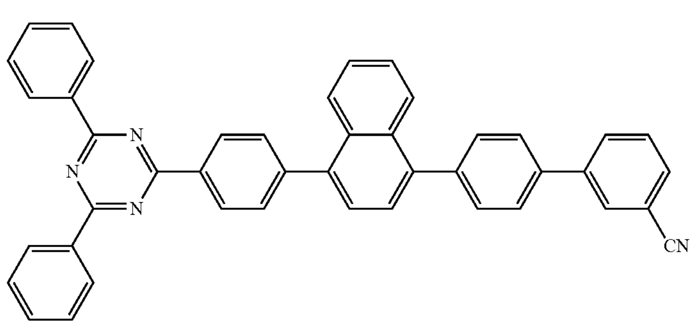

-continued
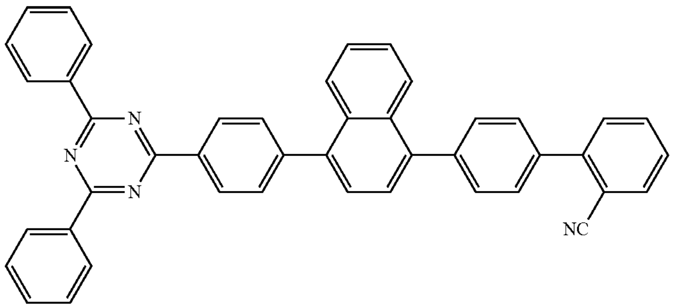
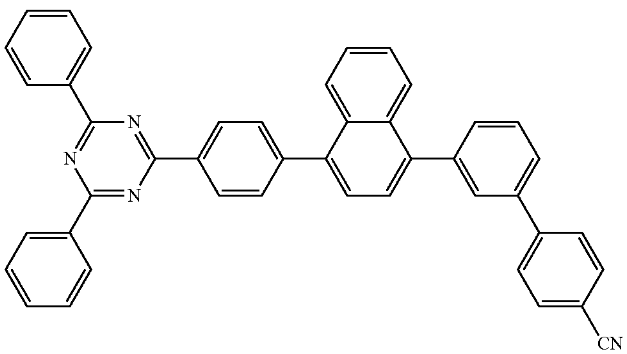
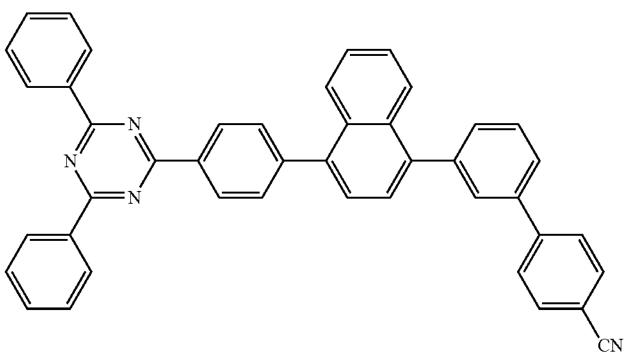
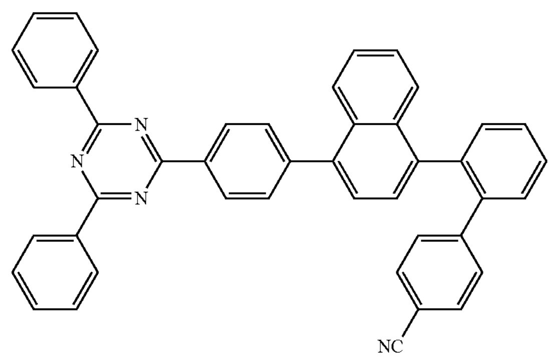
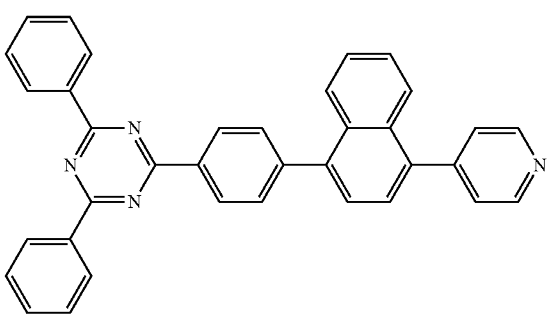
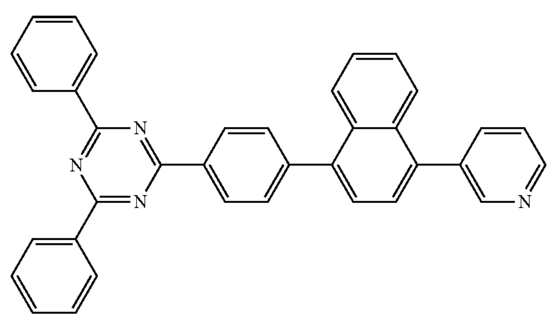
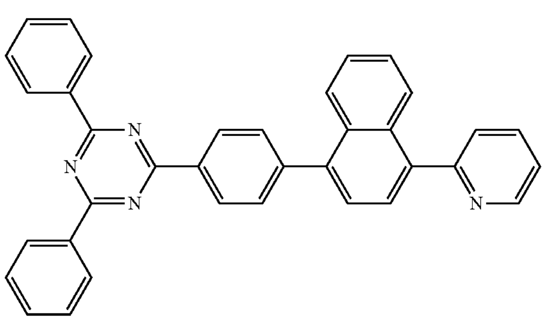
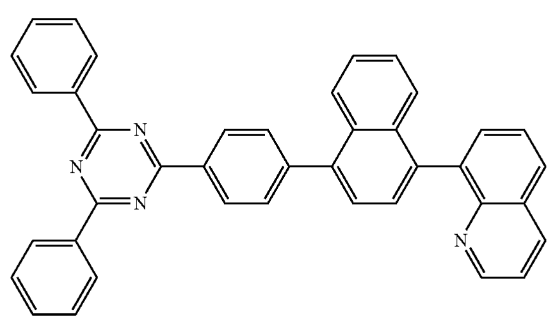

-continued
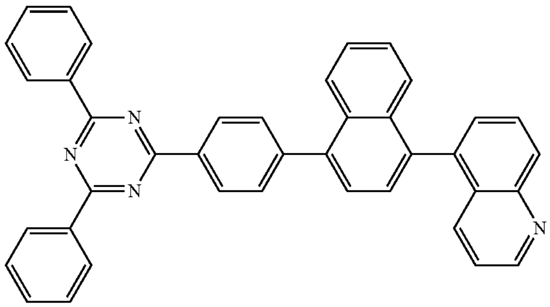
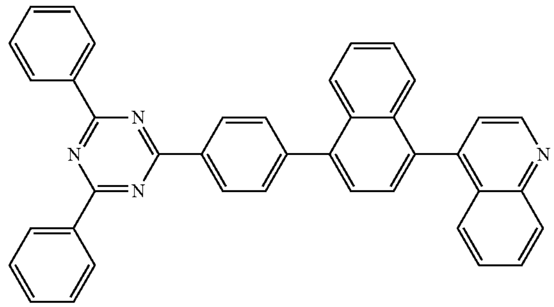
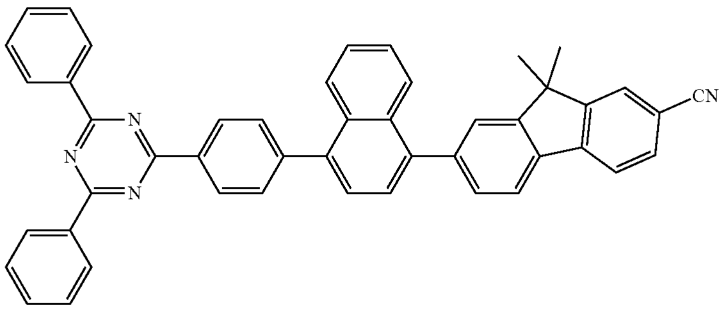
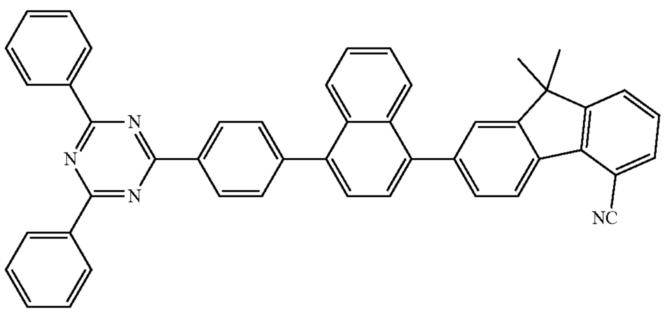
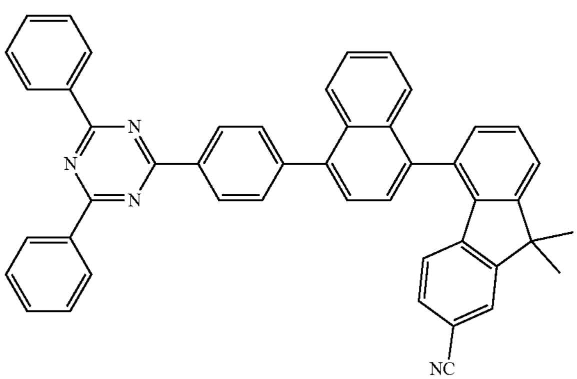
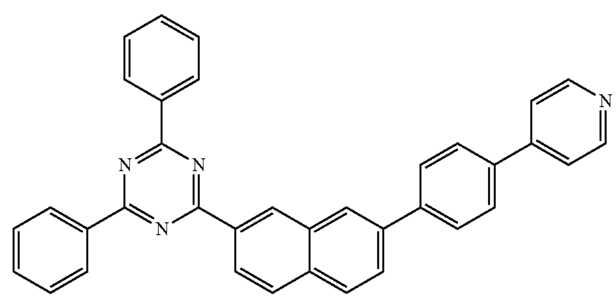
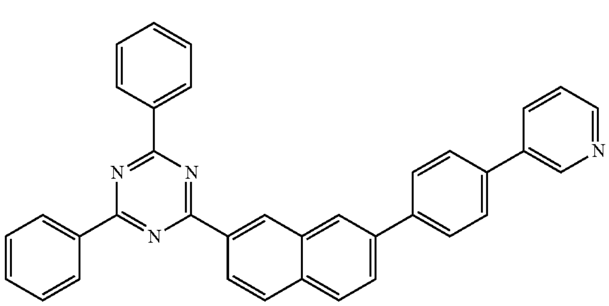

-continued
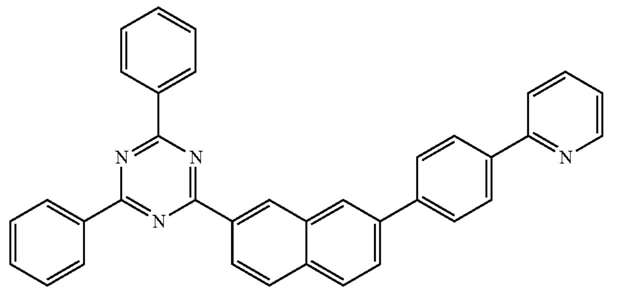
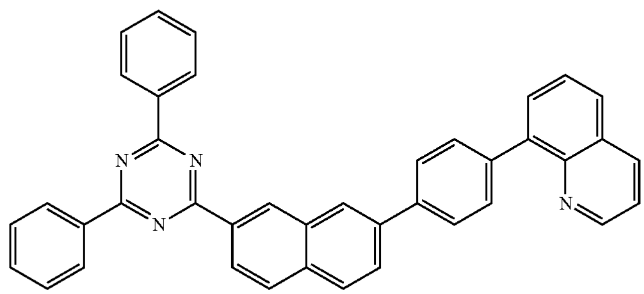
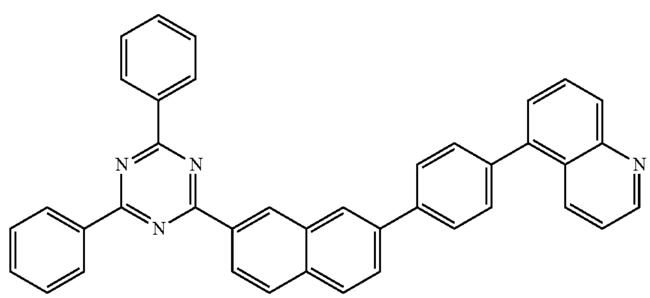
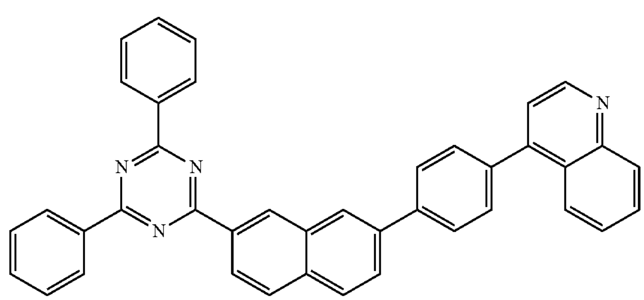
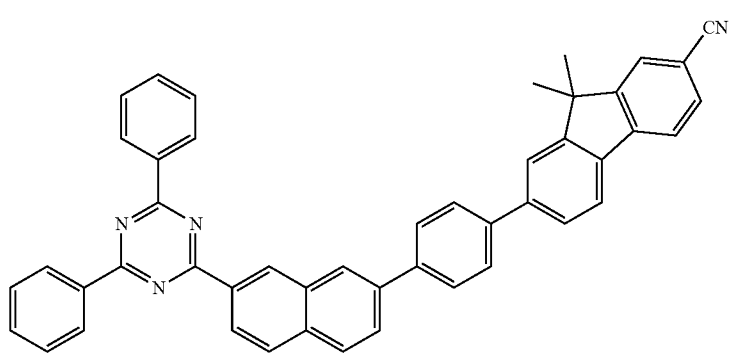

-continued
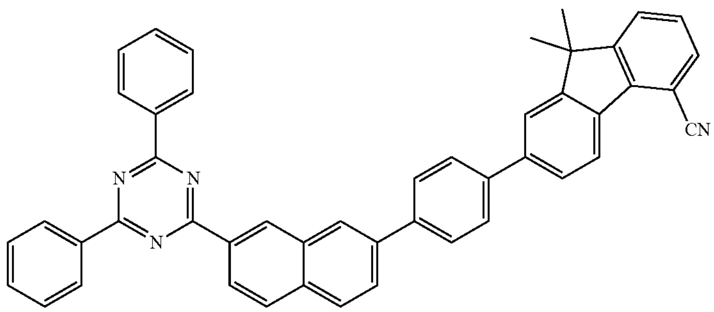
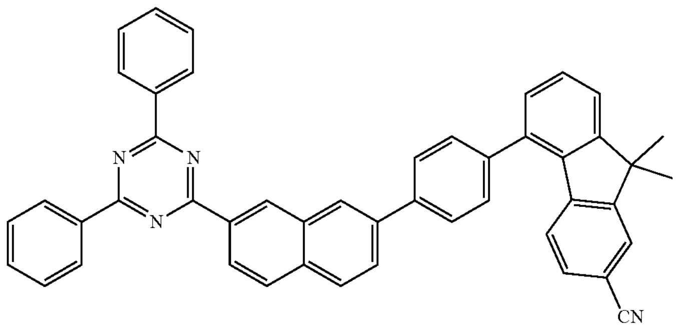
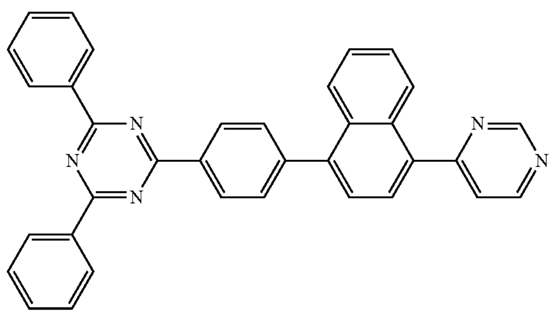
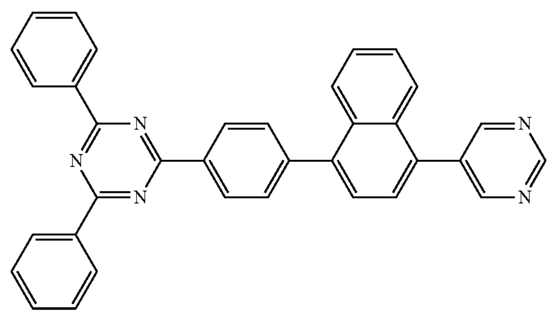
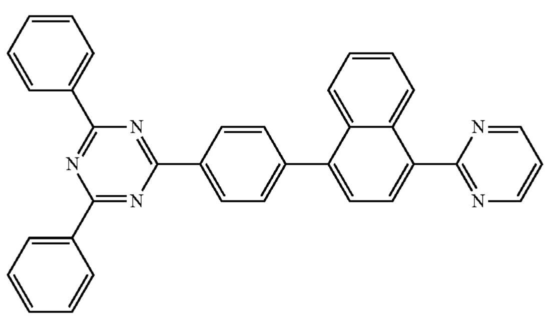
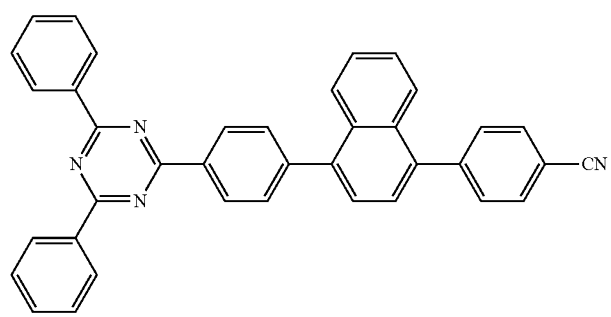
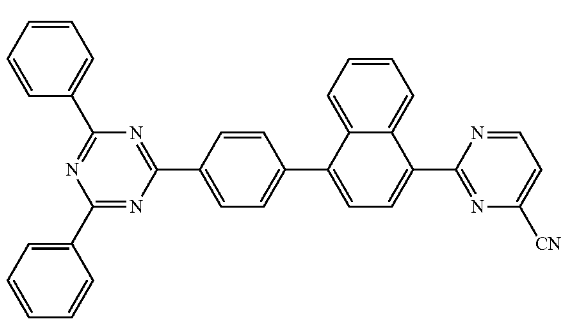
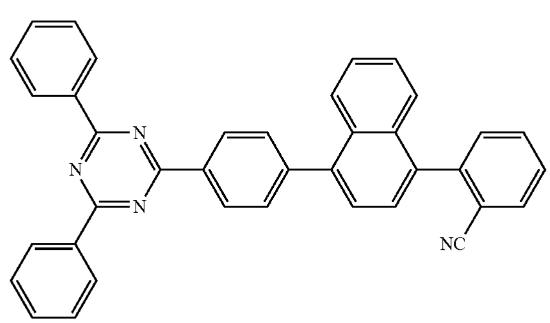

-continued
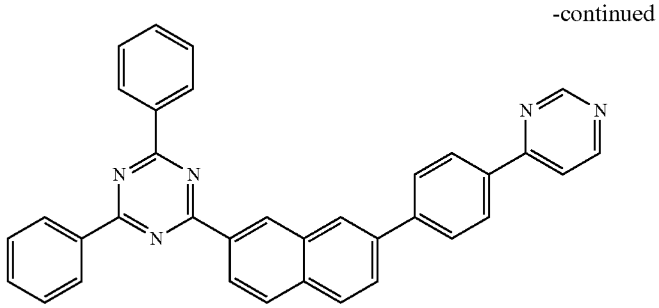
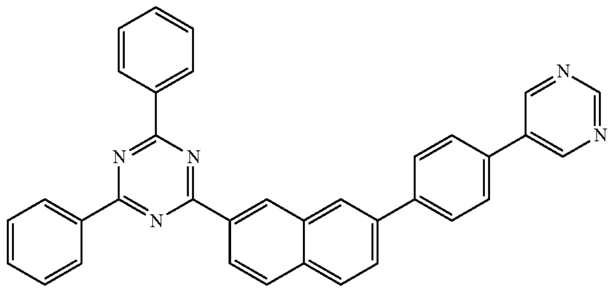
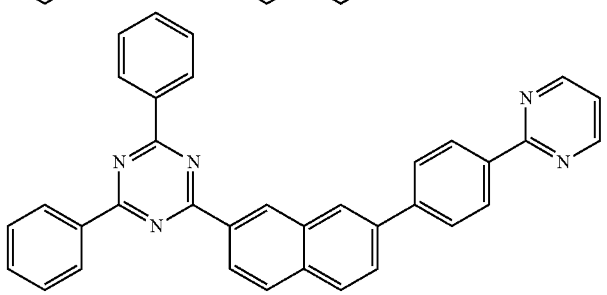
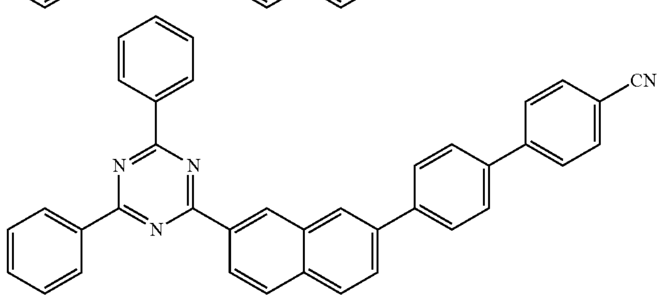
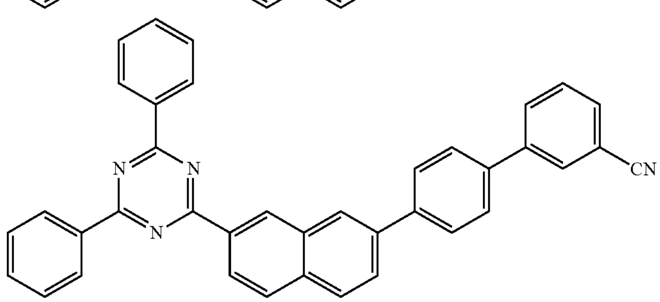
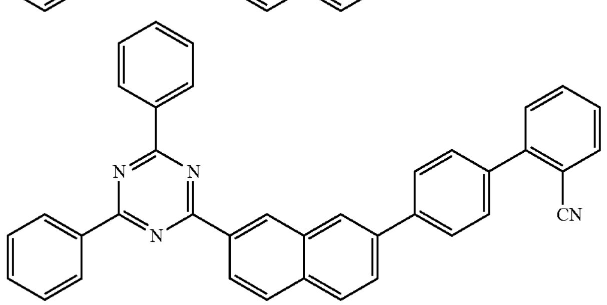

-continued
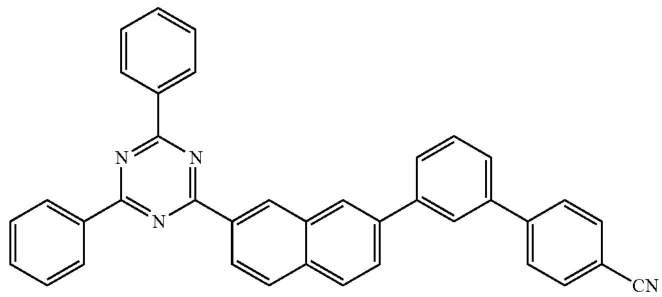
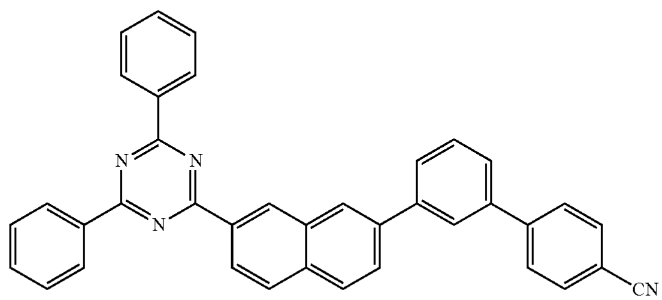
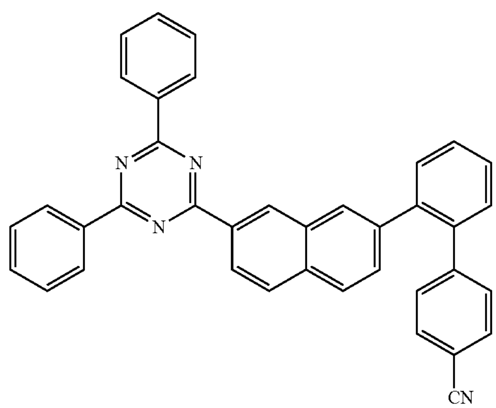
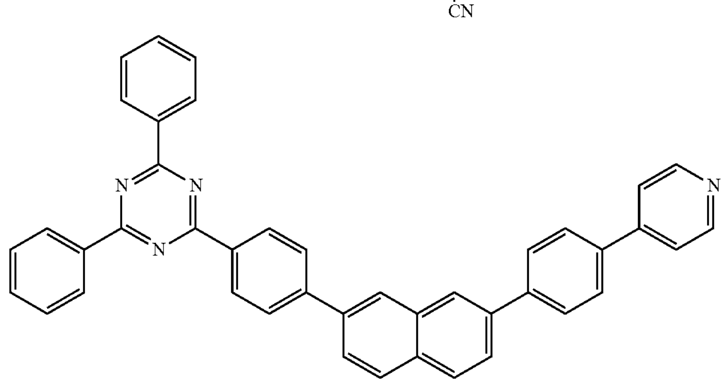
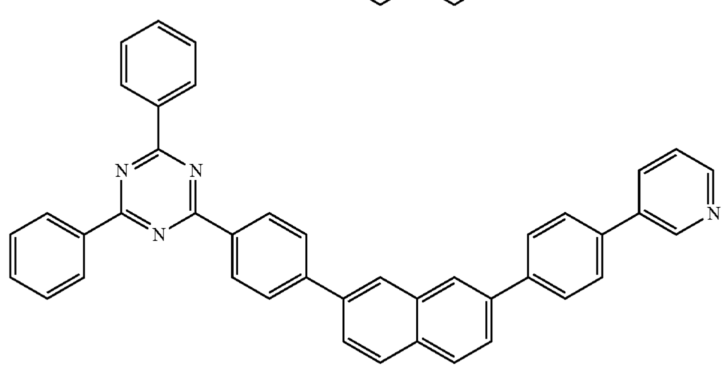

-continued
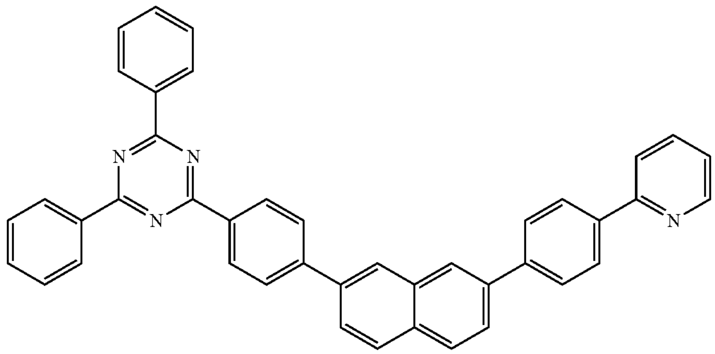
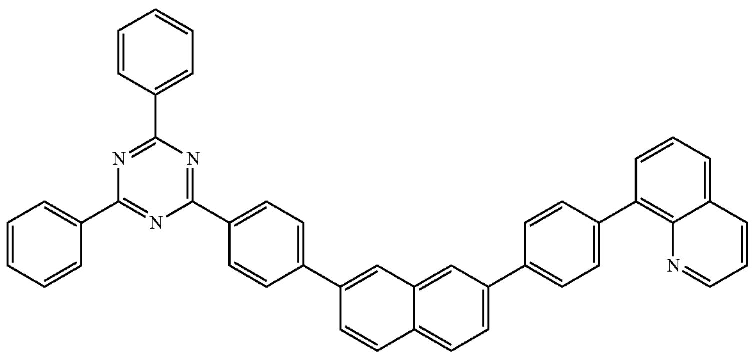
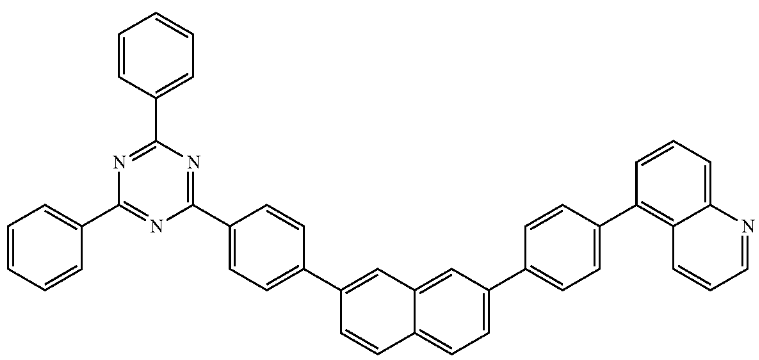
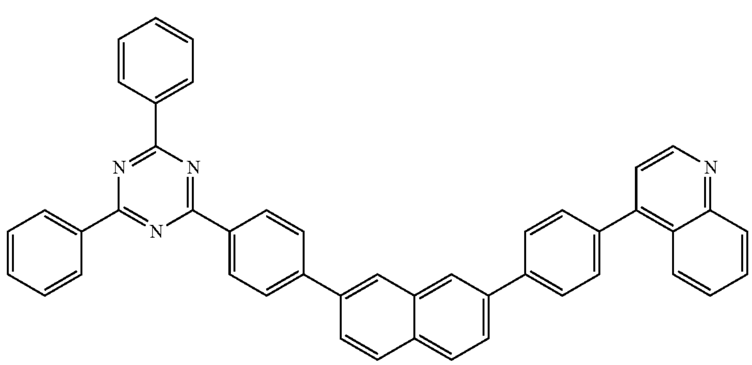

-continued
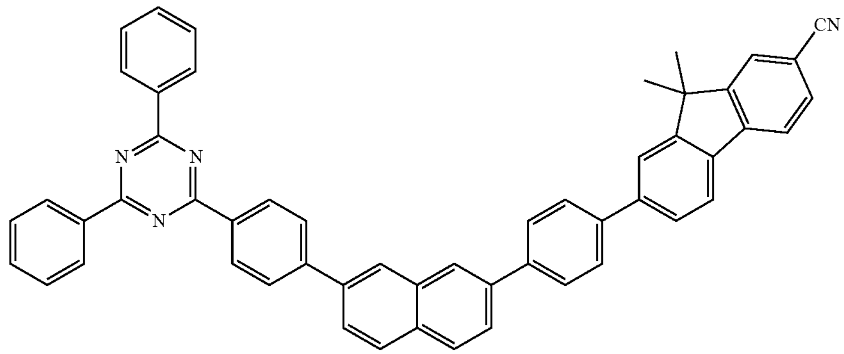
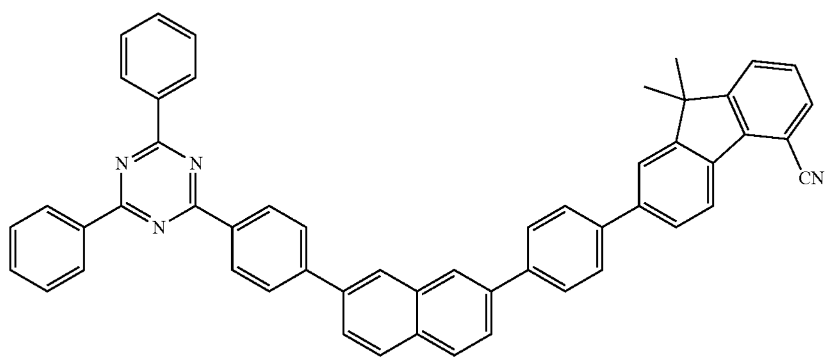
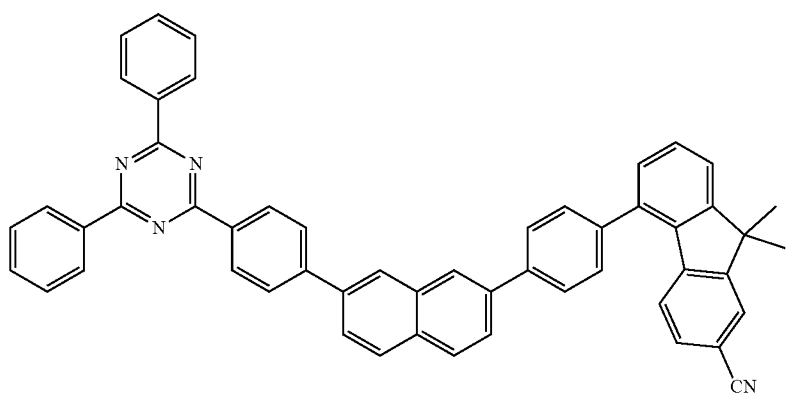
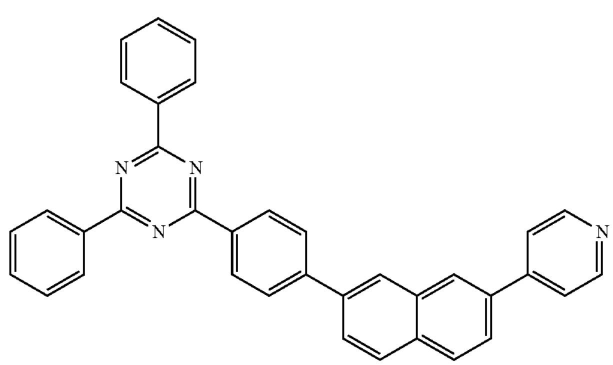

-continued
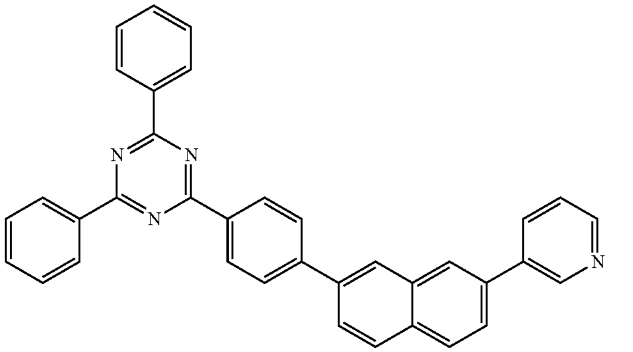
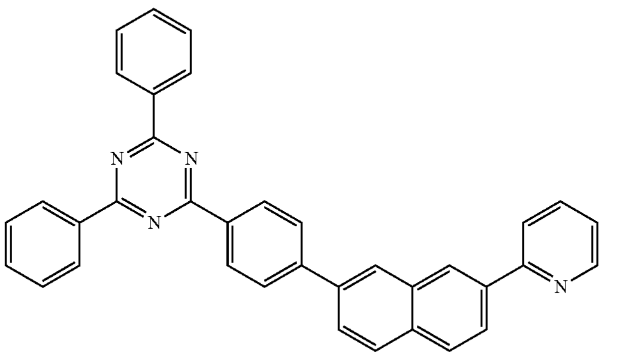
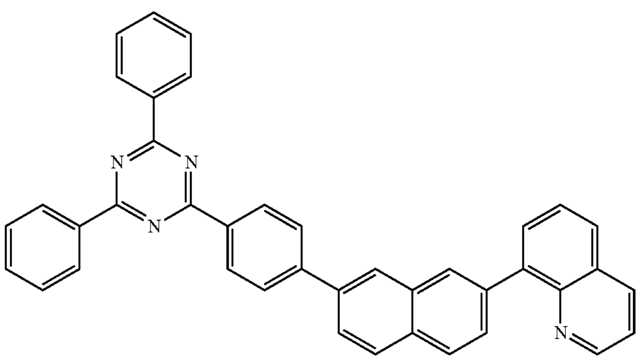
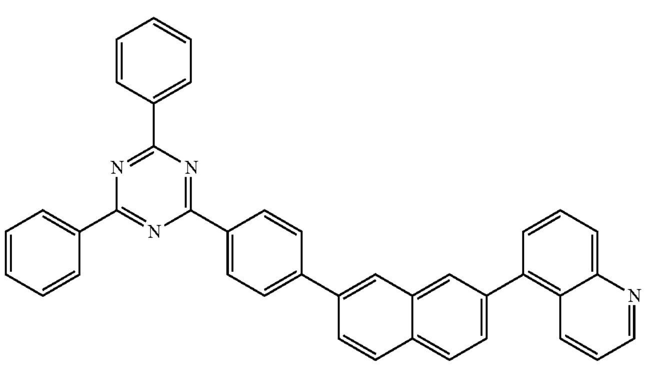

-continued
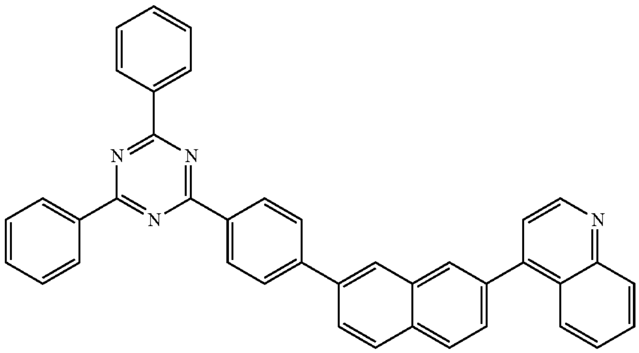
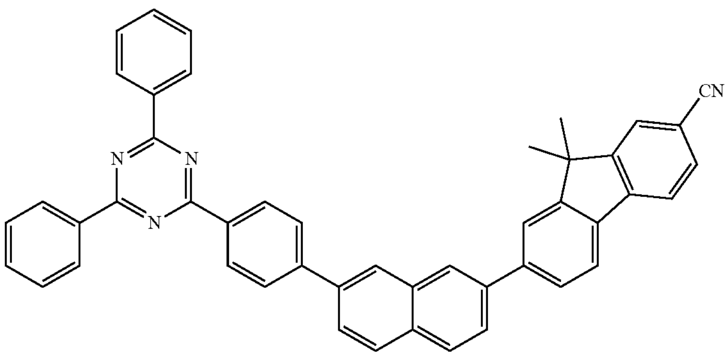
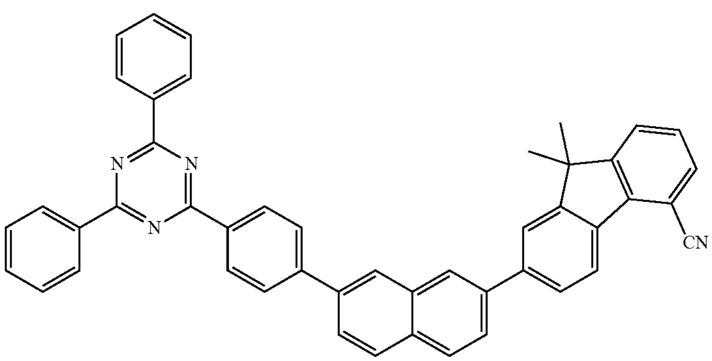
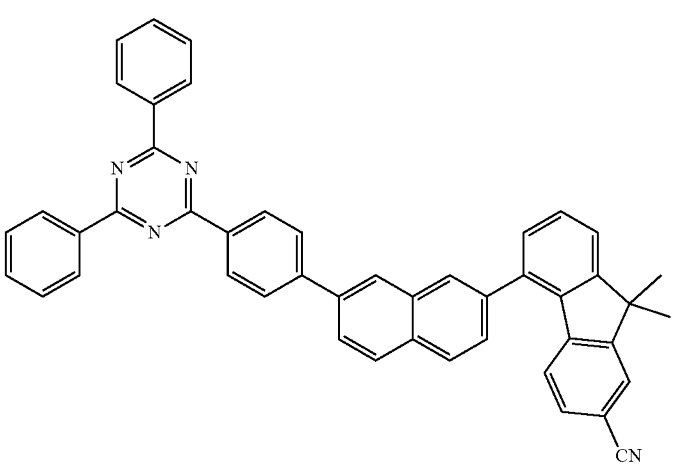

-continued
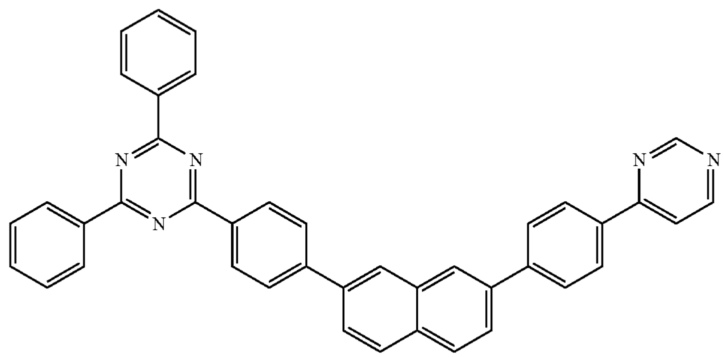
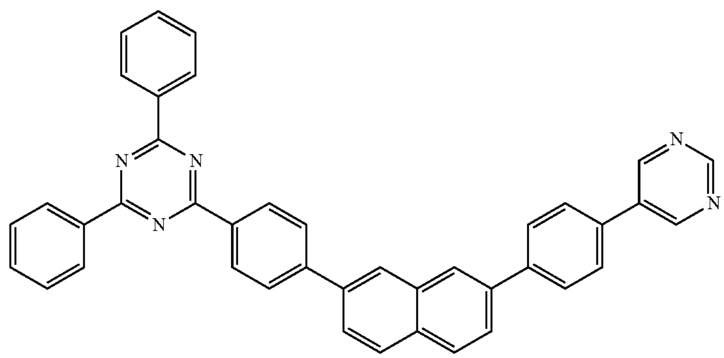
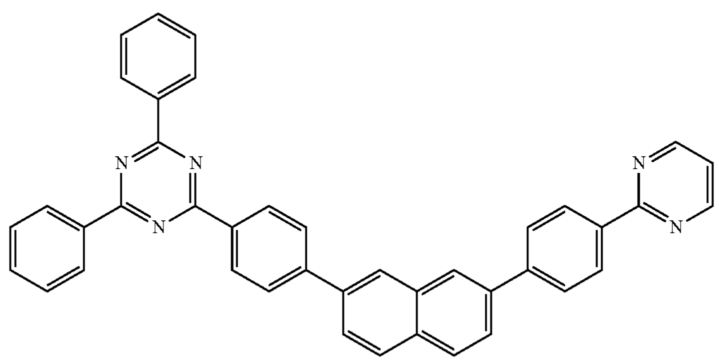
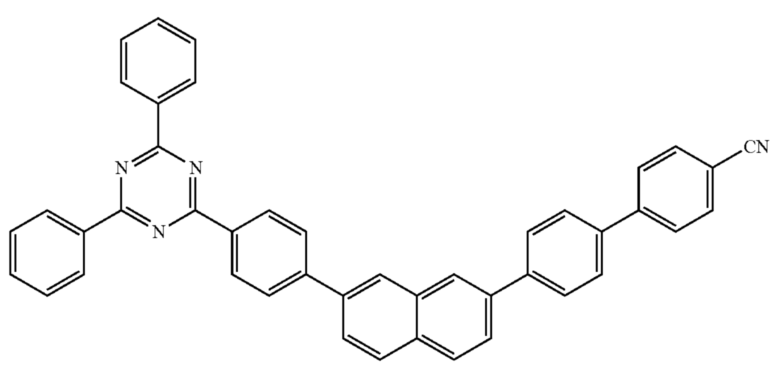

-continued
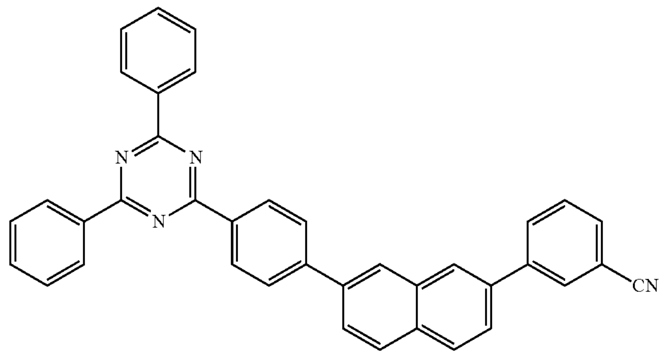
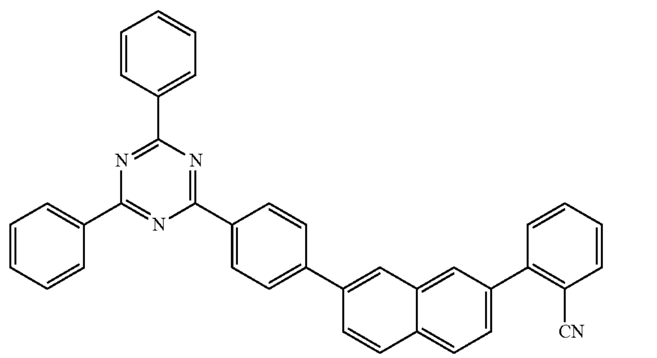
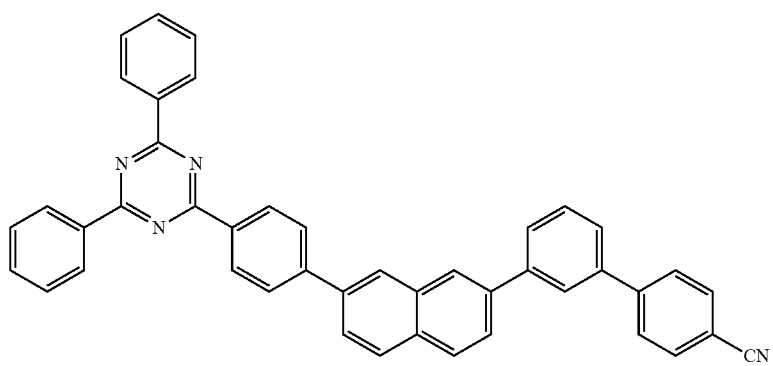
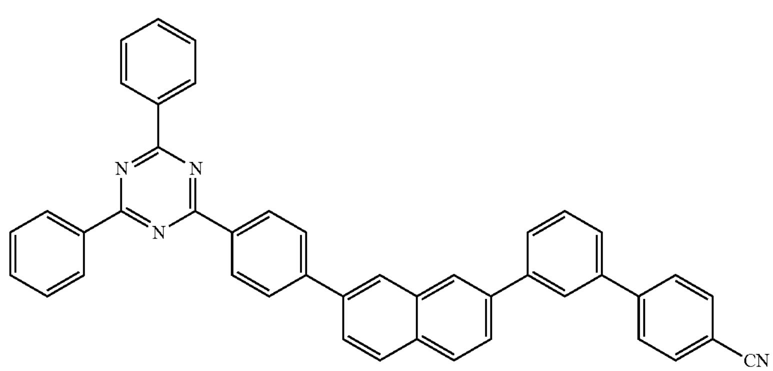

-continued
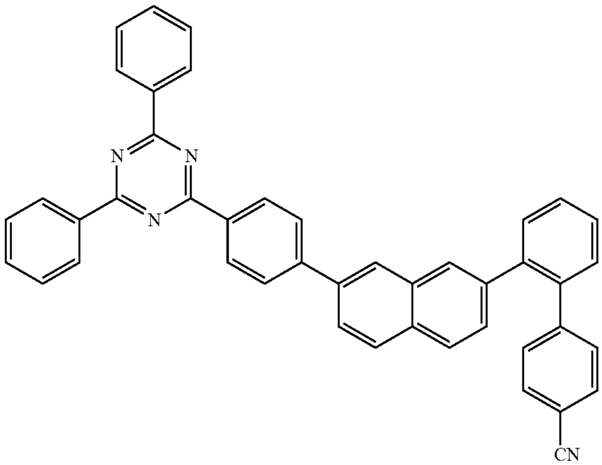
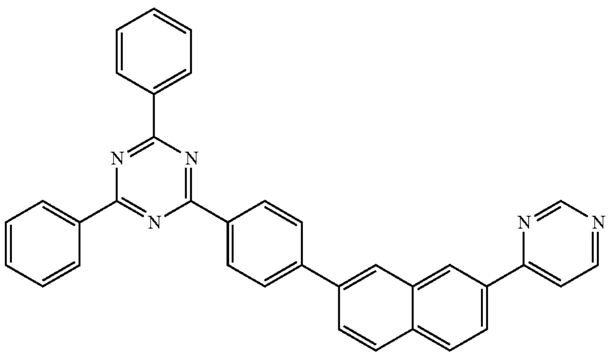
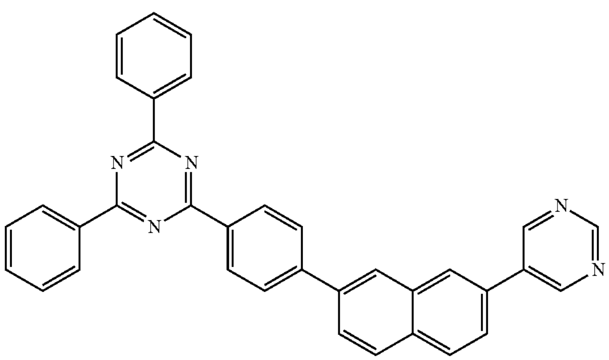
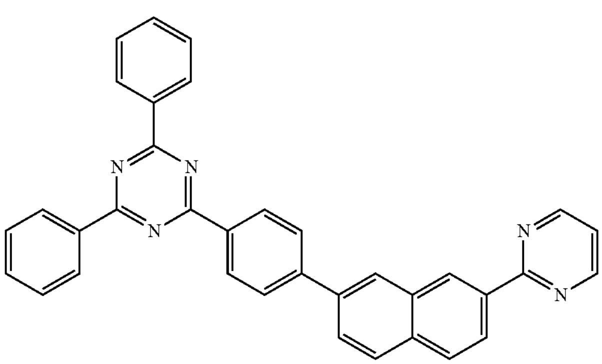

-continued
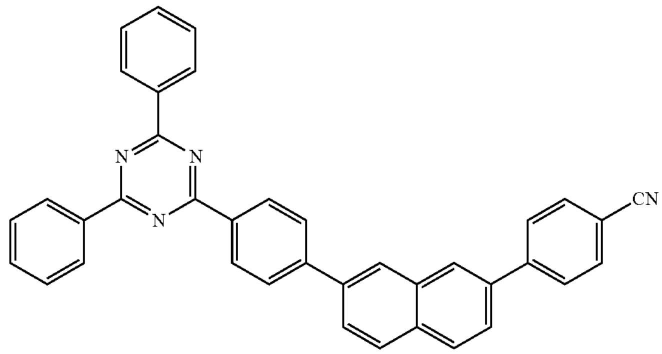
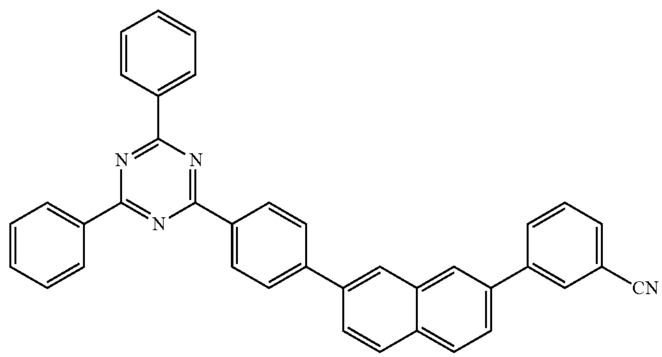
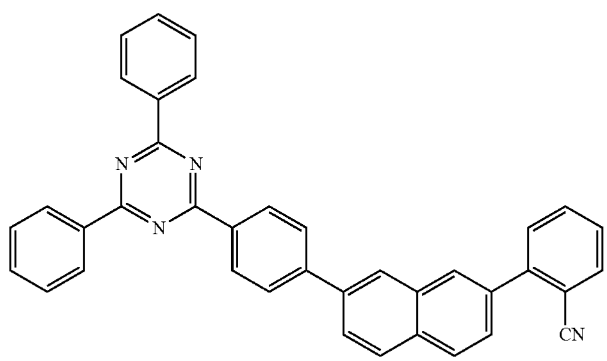
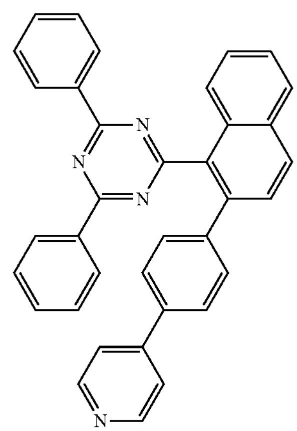
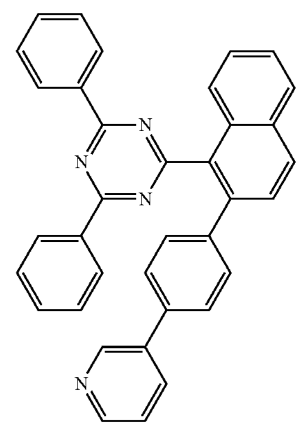
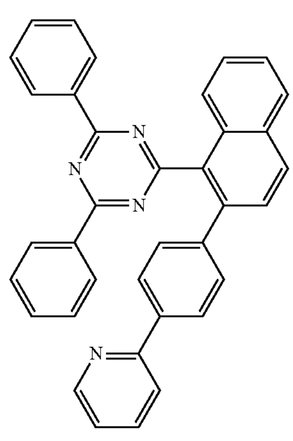
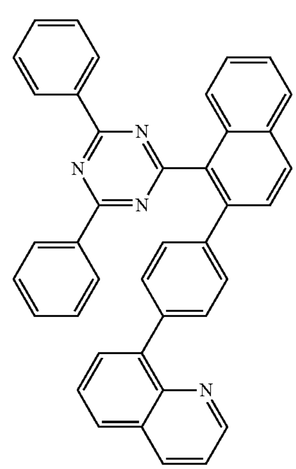
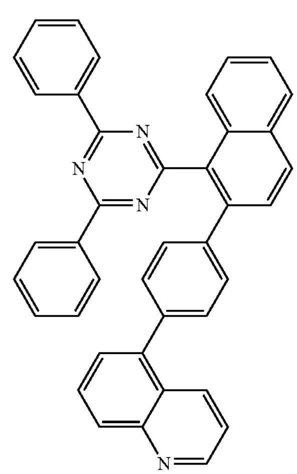
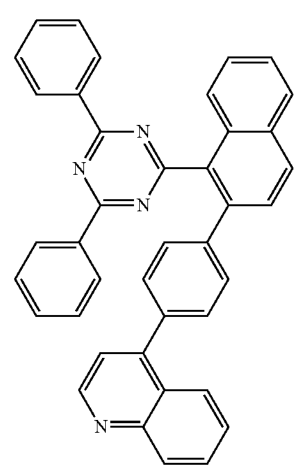

-continued
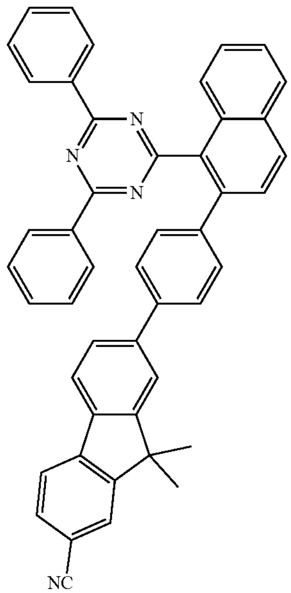
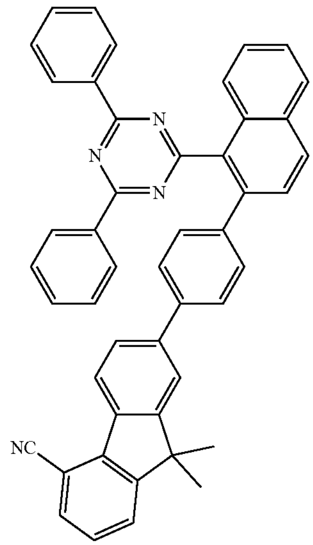
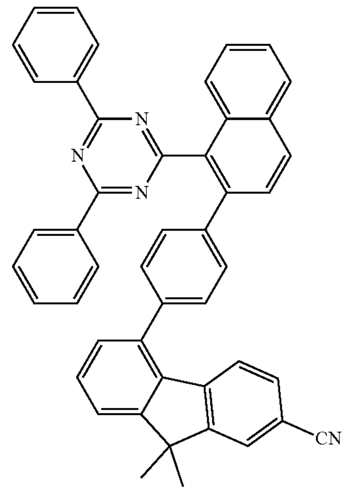
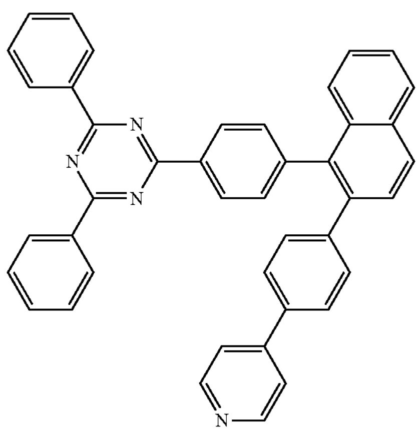
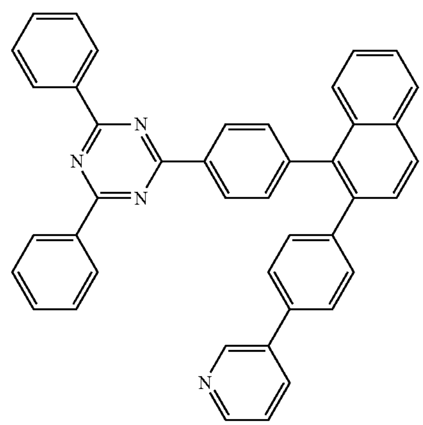
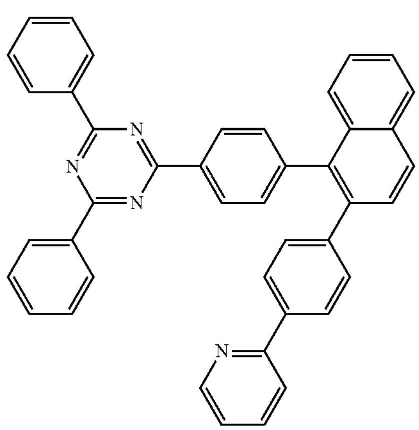
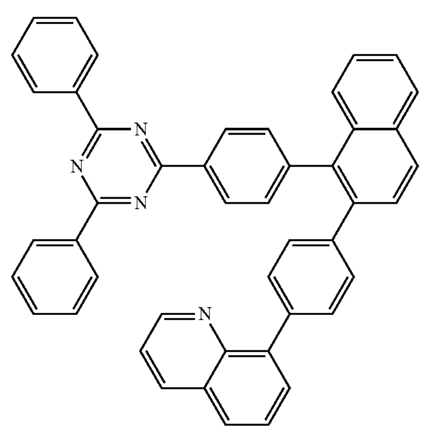

-continued
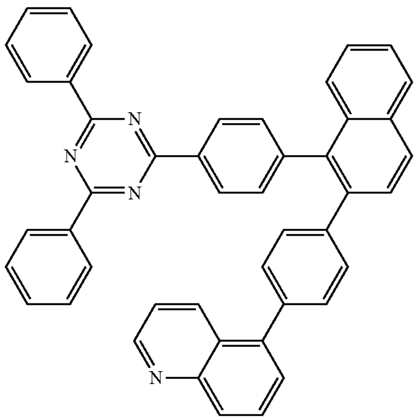
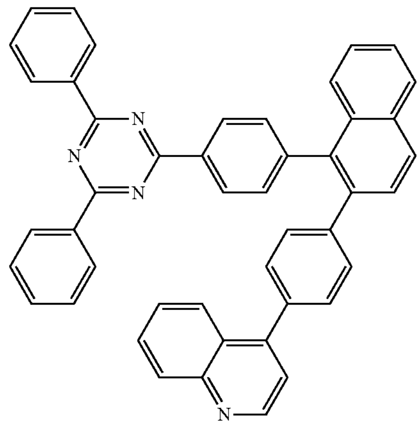
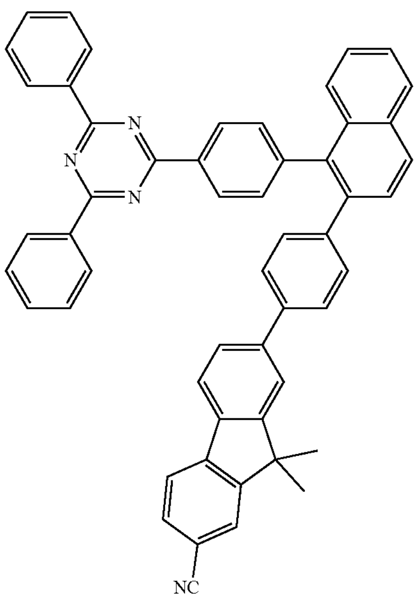
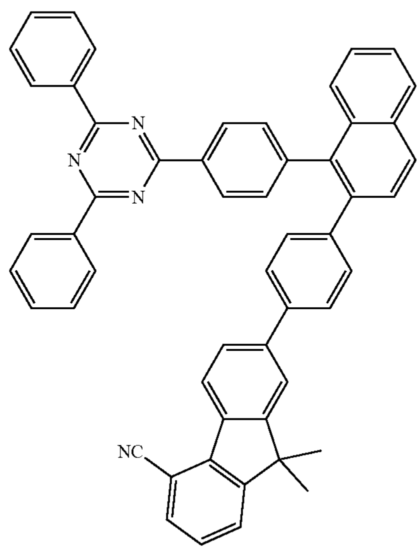
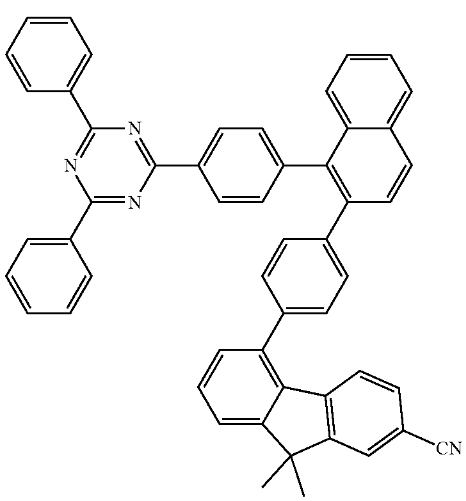
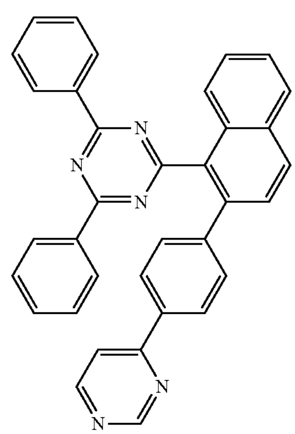
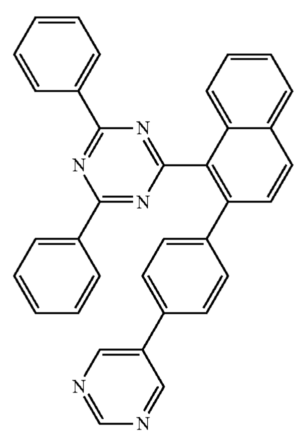

-continued
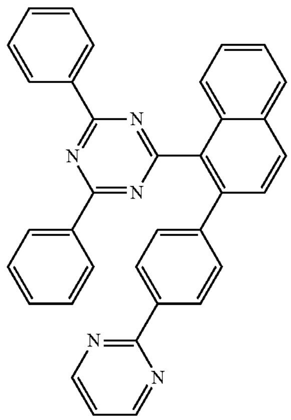
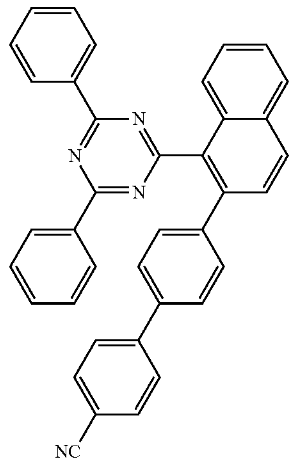
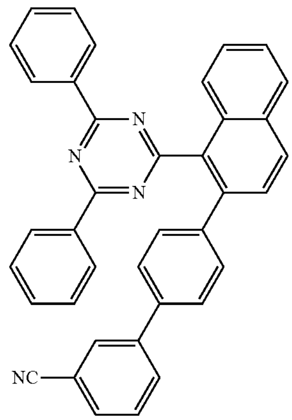
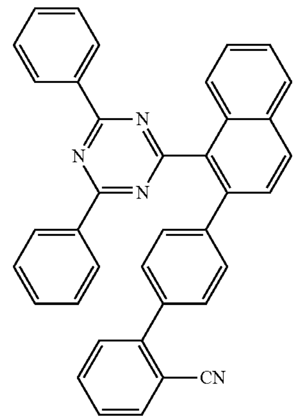
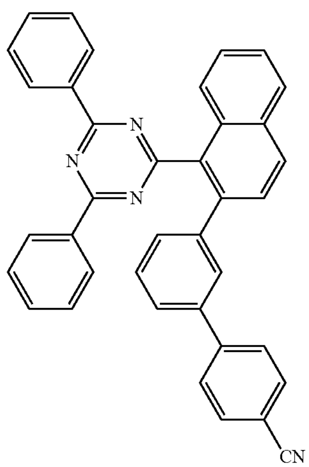
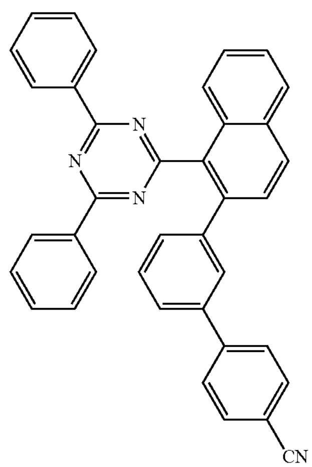
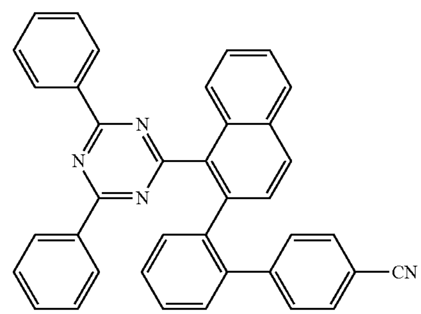
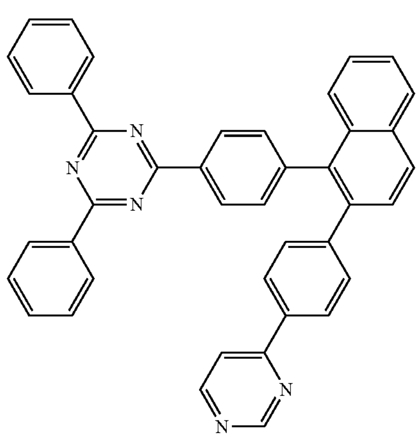
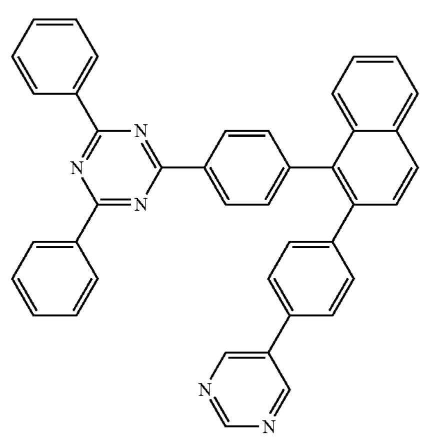

-continued
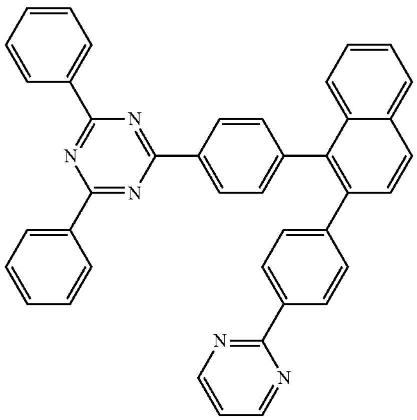
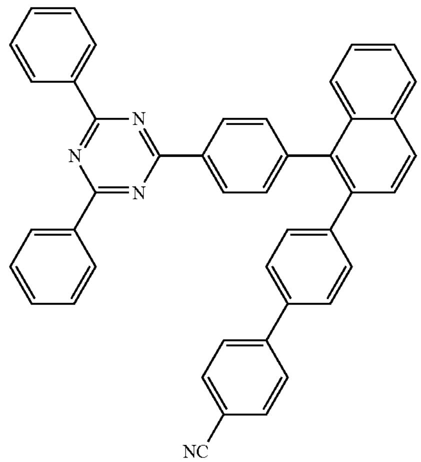
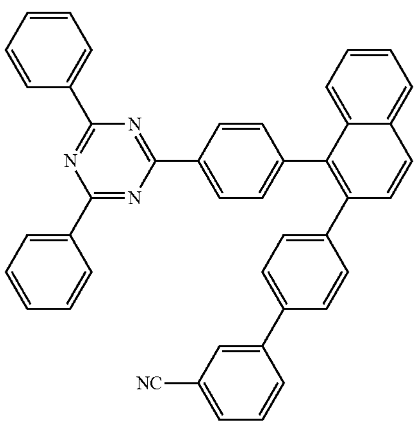
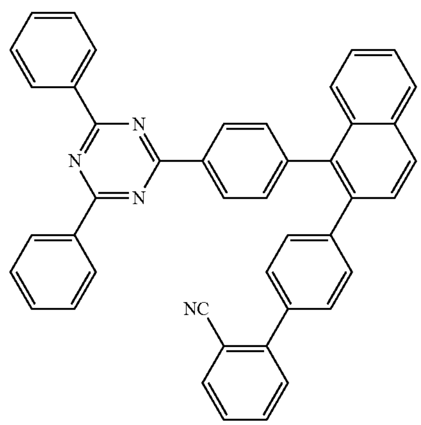
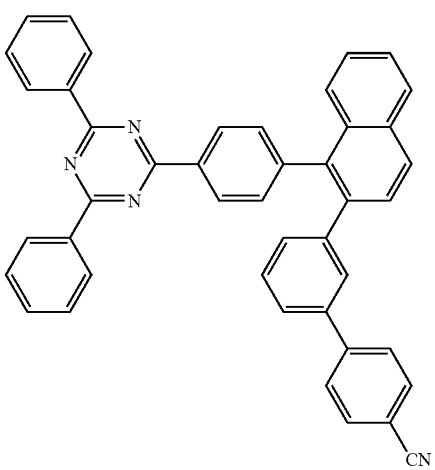
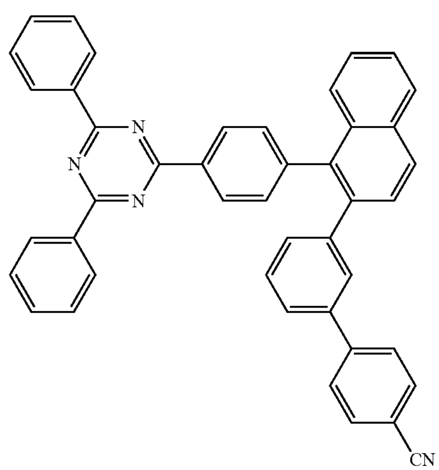
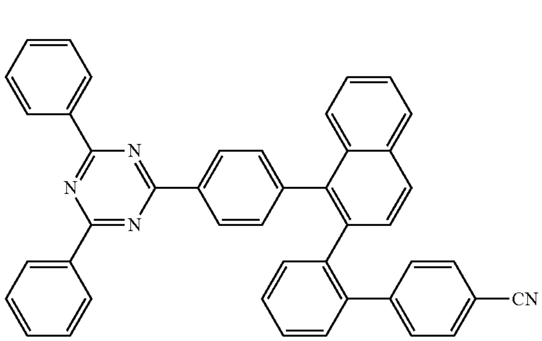
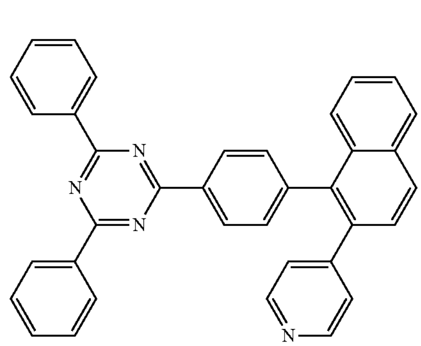

-continued
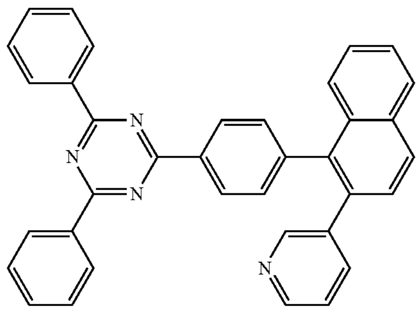
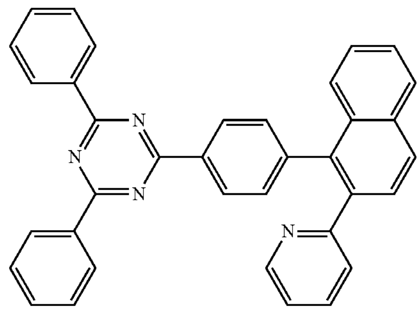
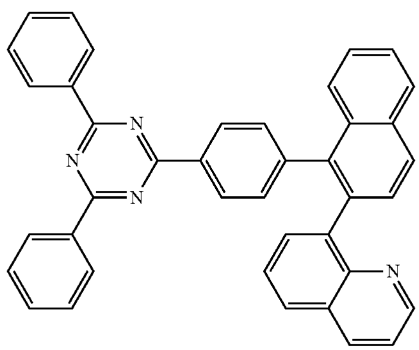
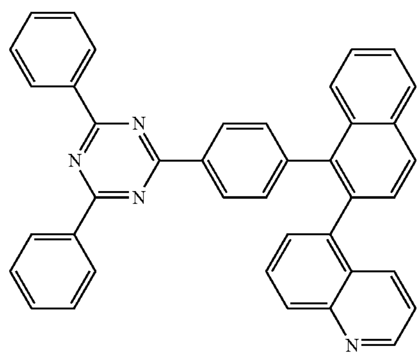
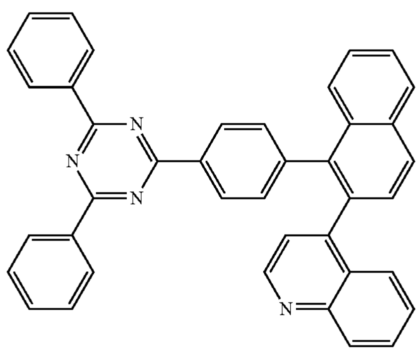
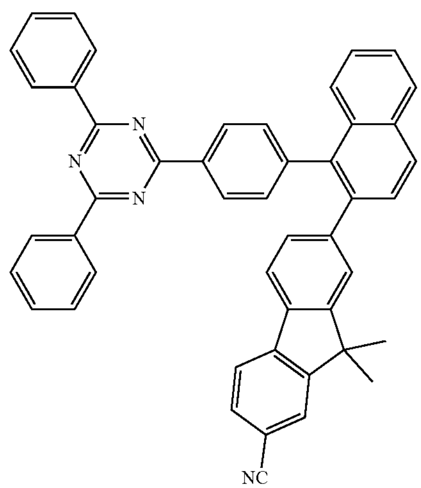
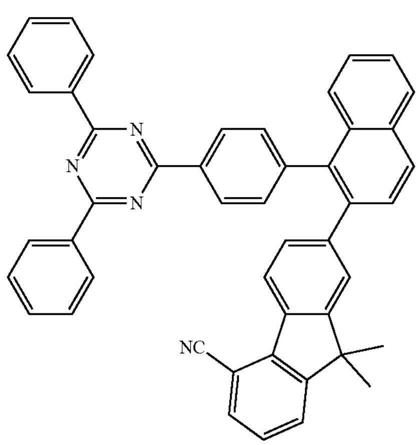
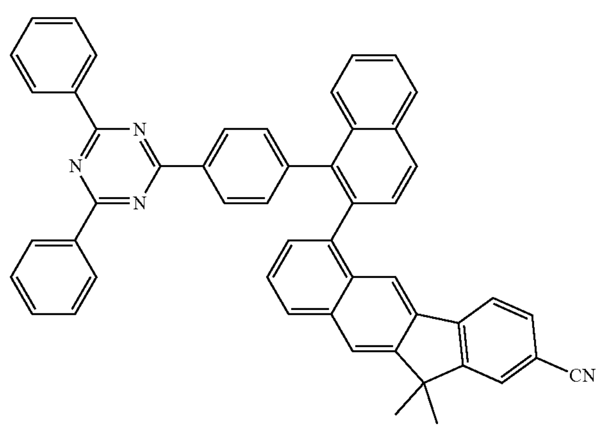

-continued
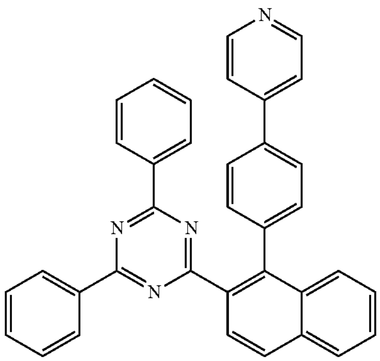
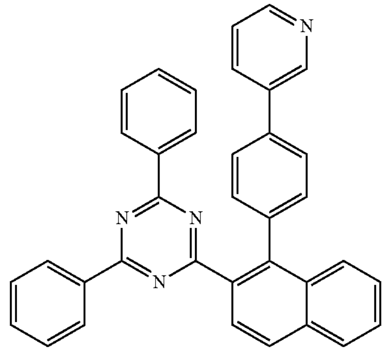
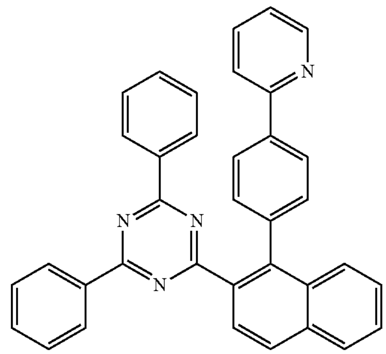
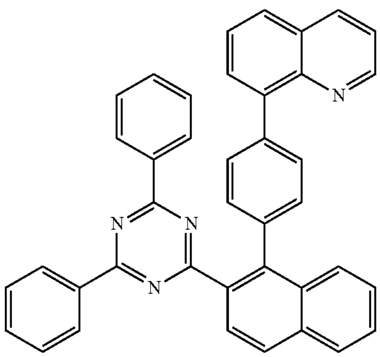
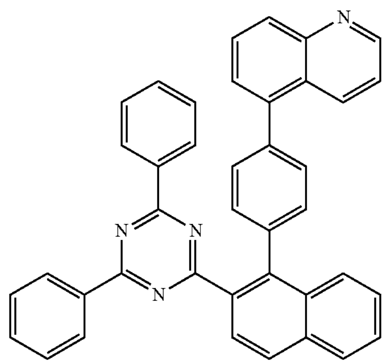
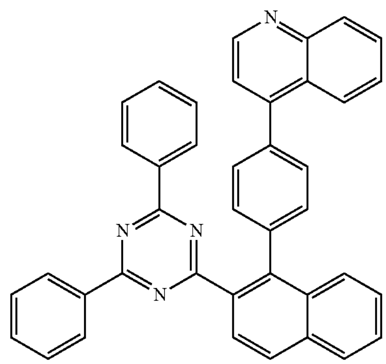
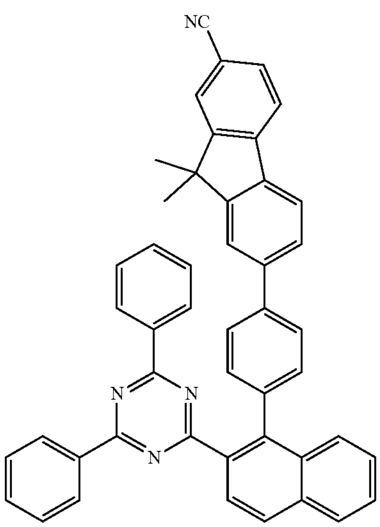
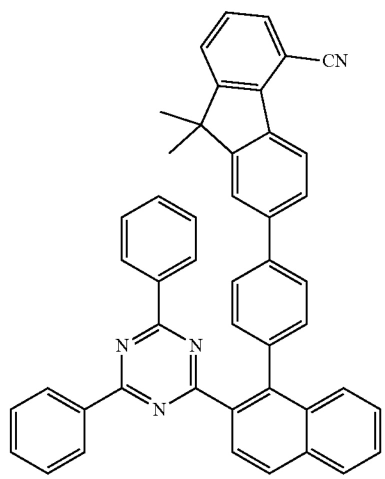
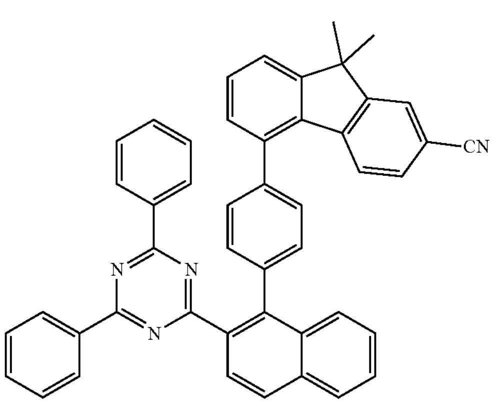
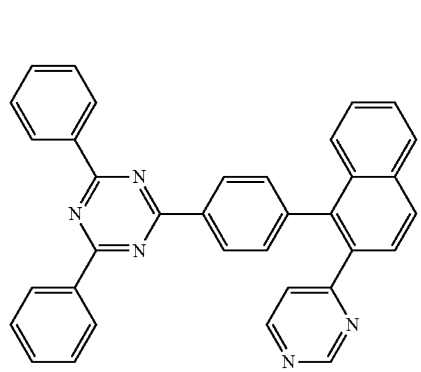

-continued
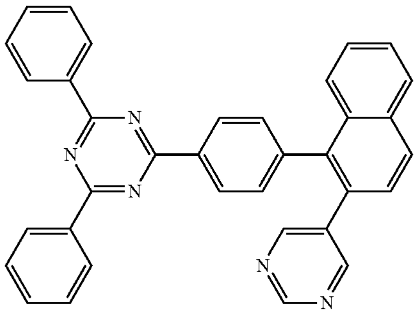
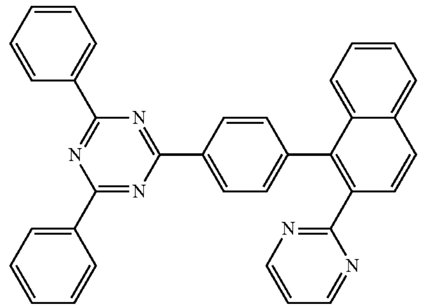
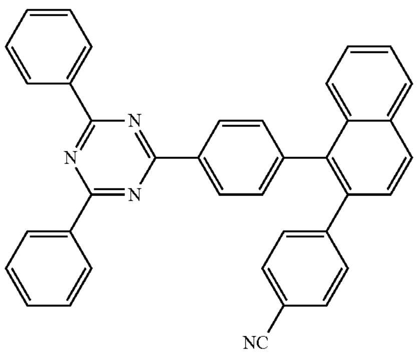
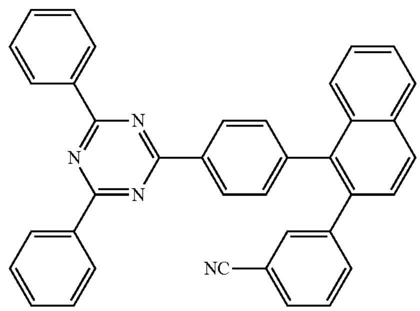
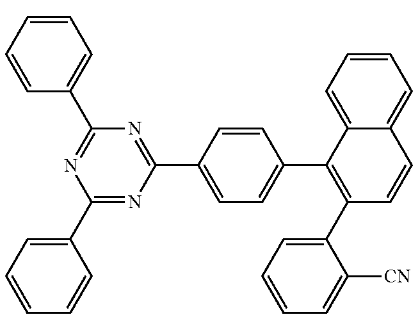
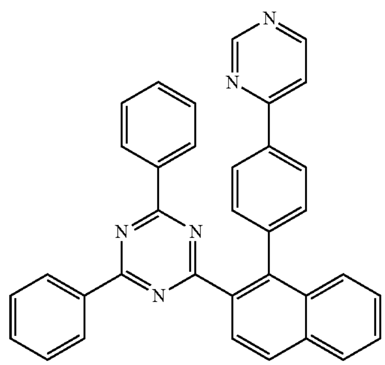
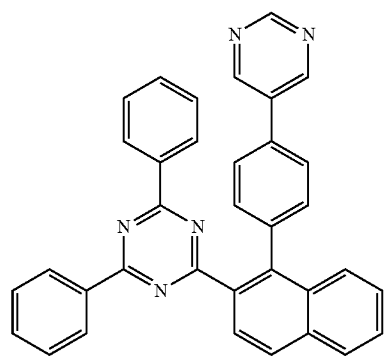
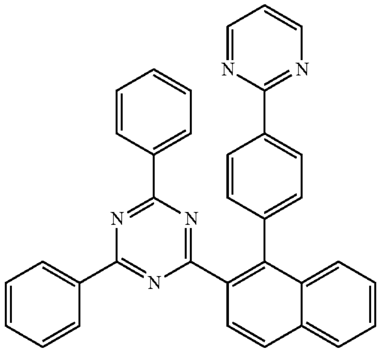
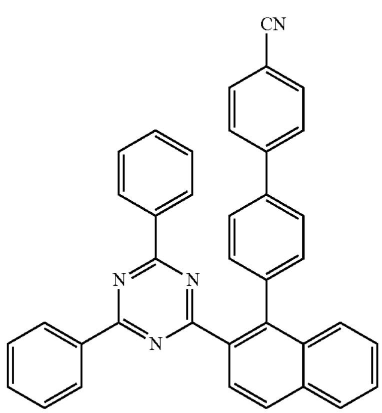
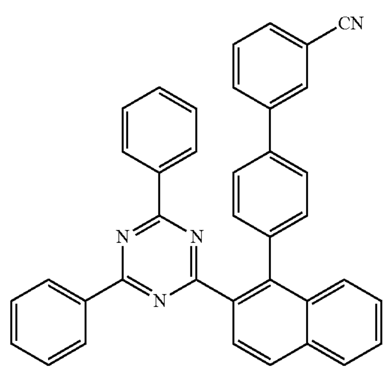

-continued
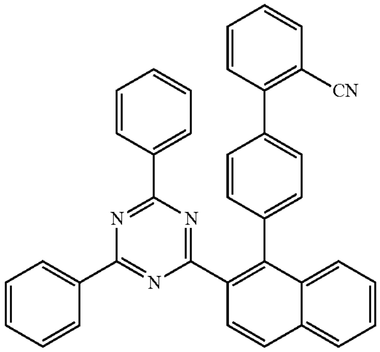
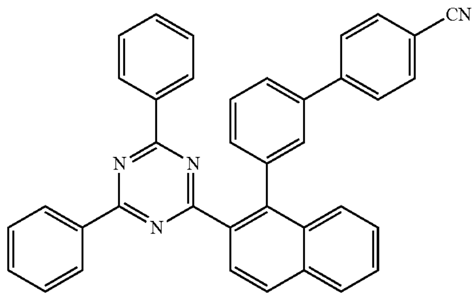
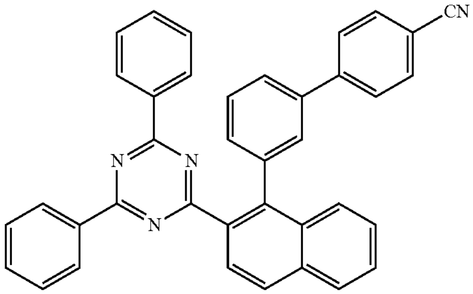
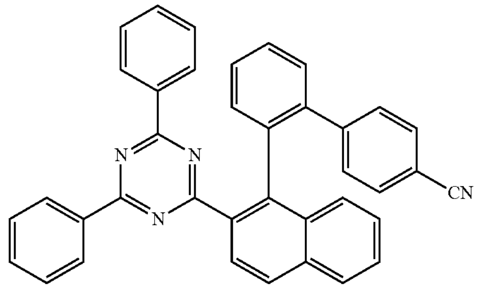
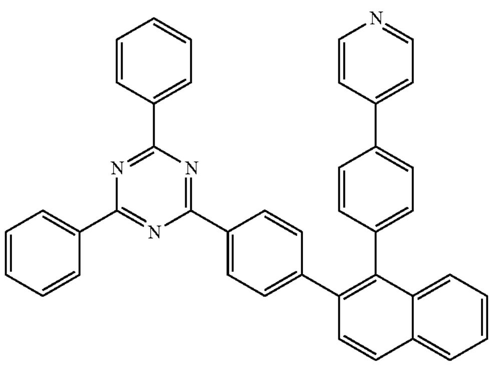
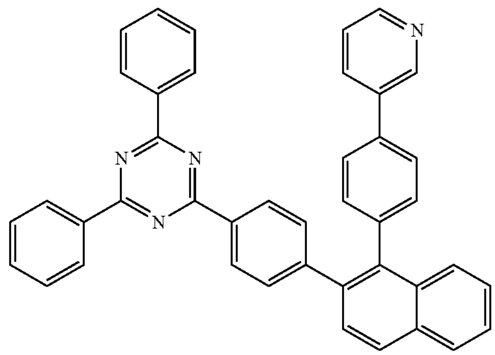
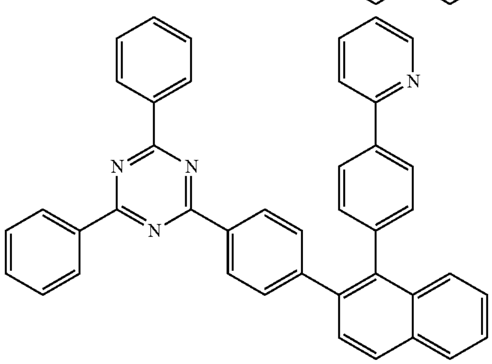
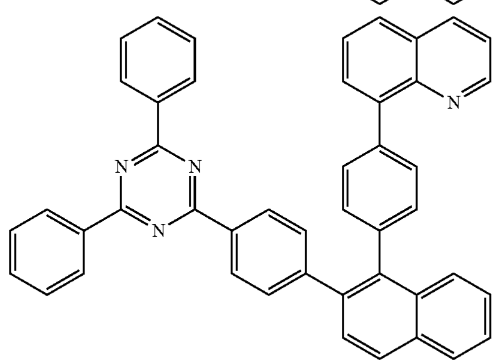
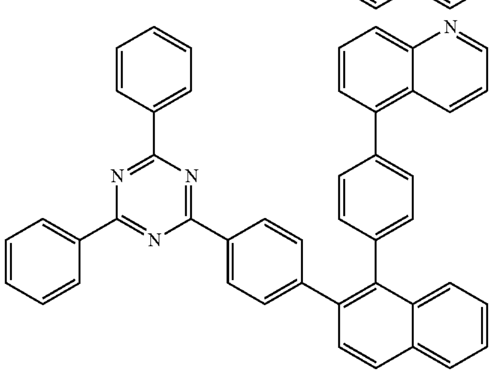
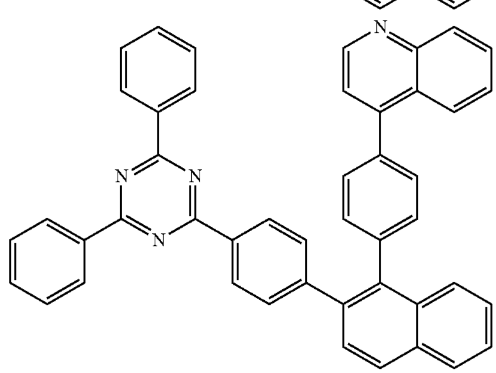

-continued
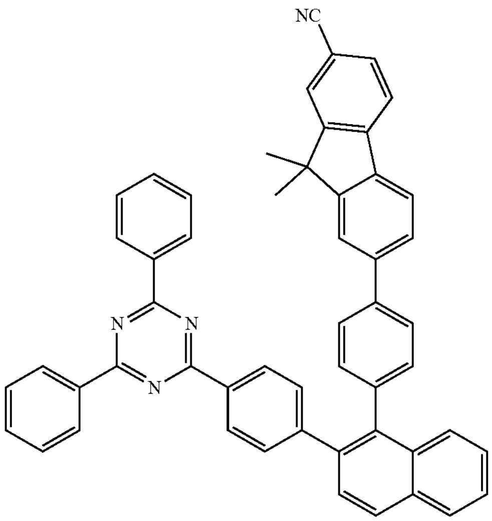
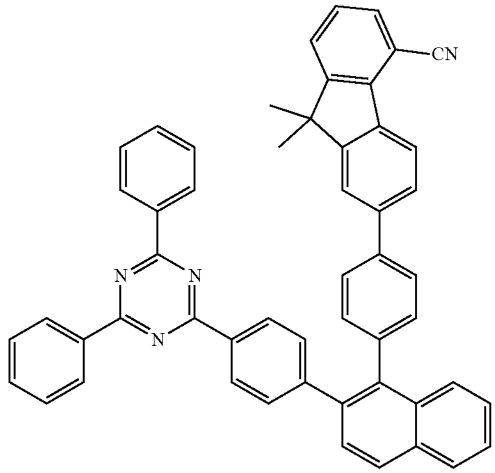
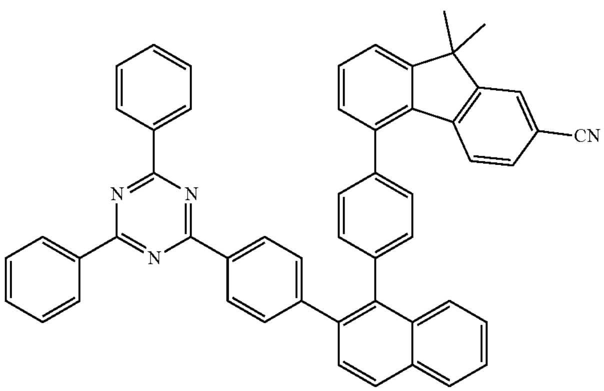
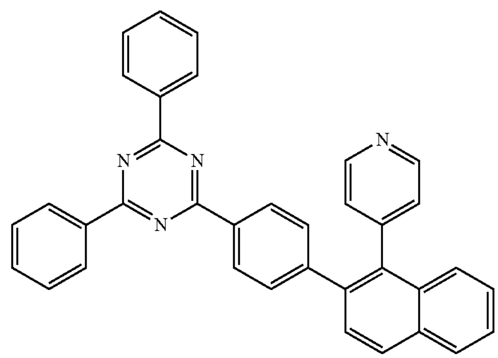
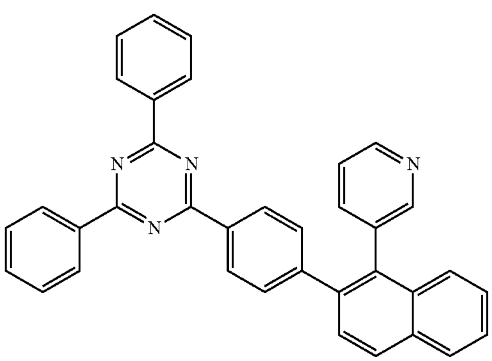
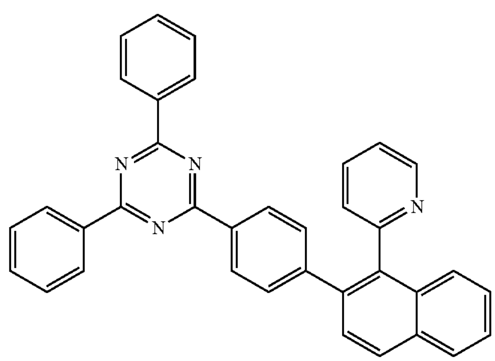
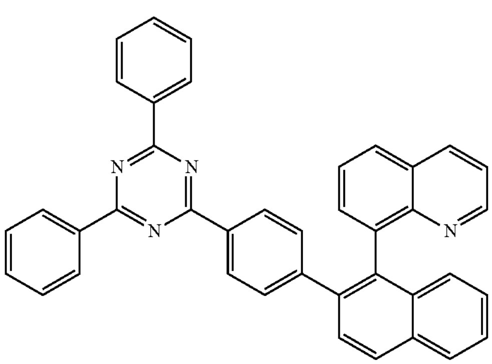
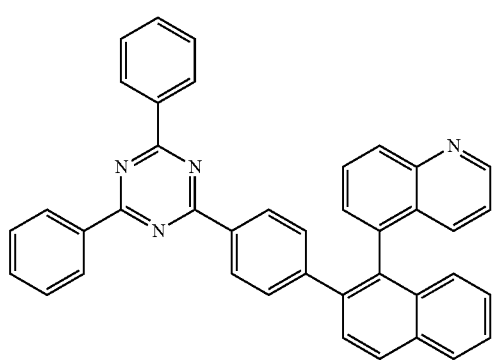

-continued
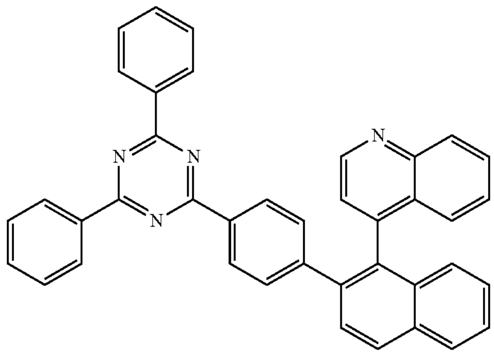
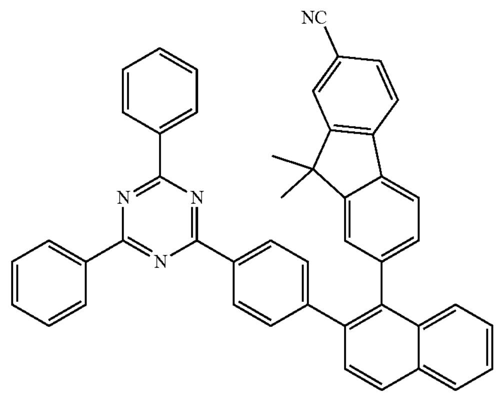
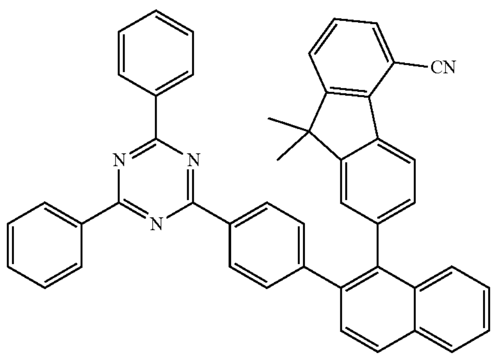
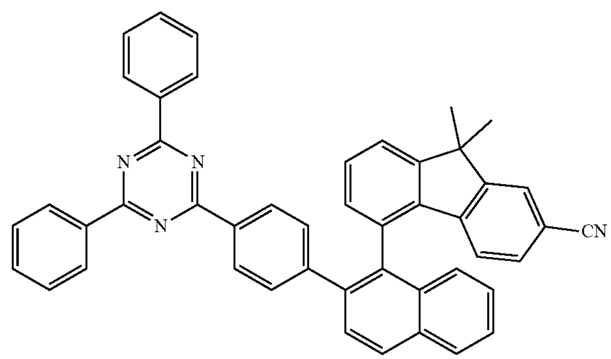
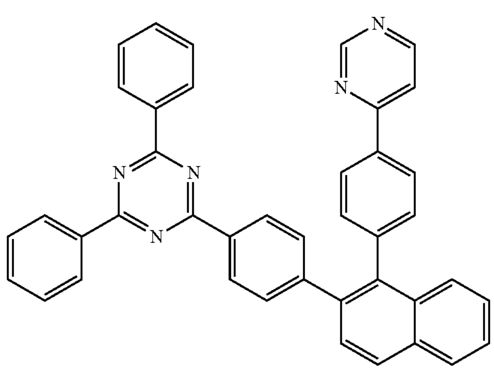
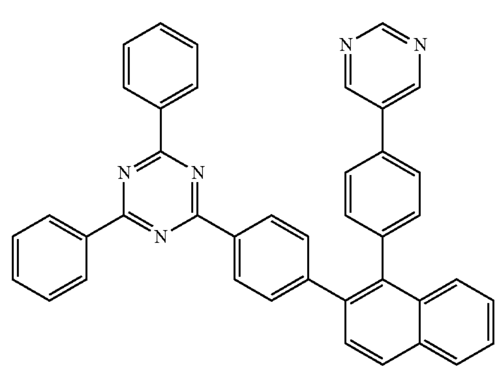
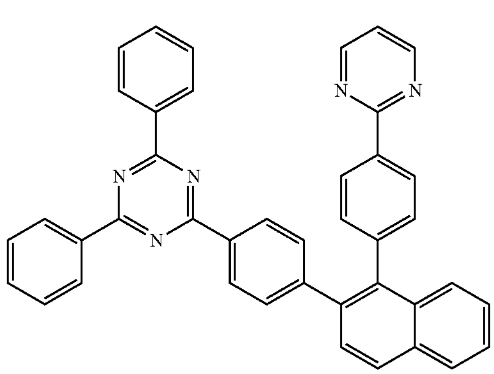
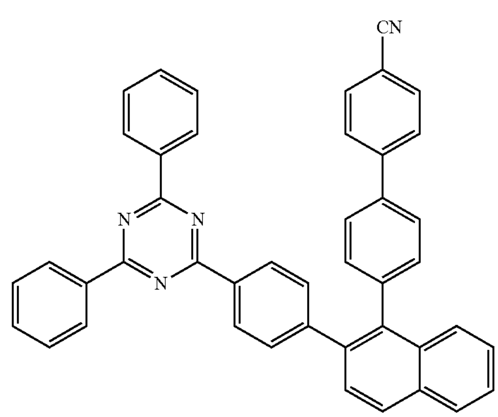

-continued
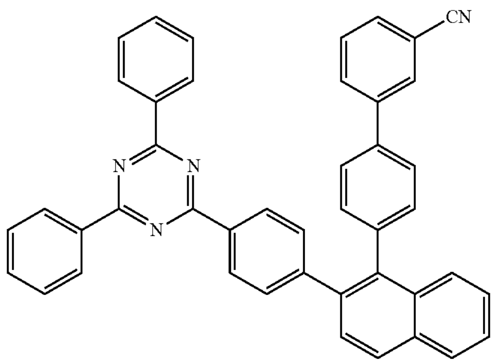
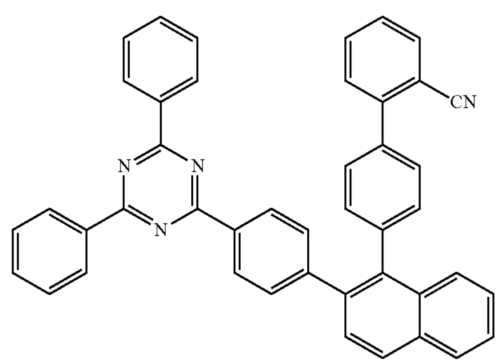
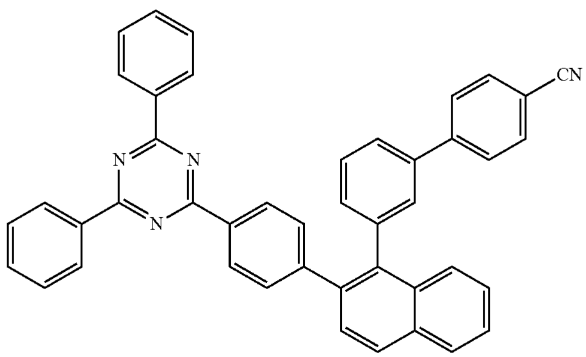
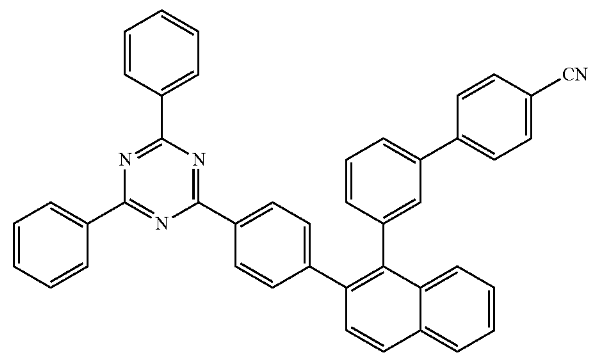
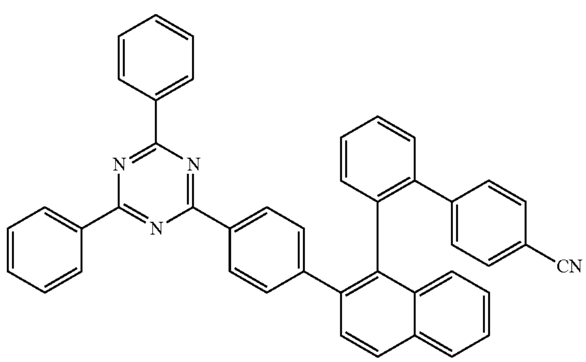
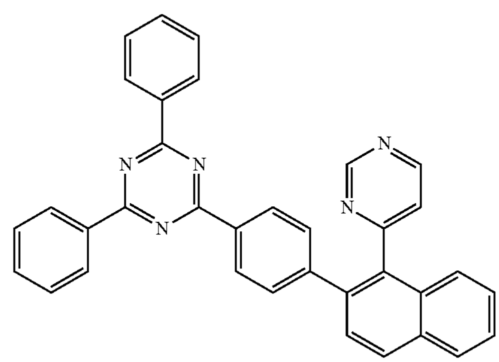
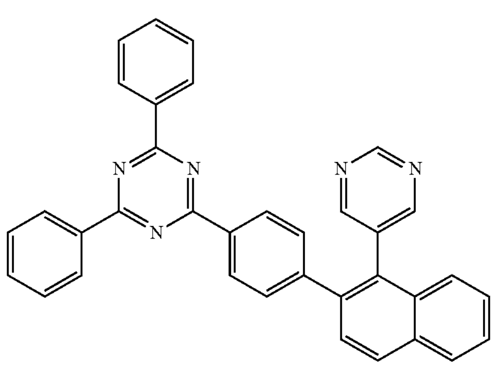
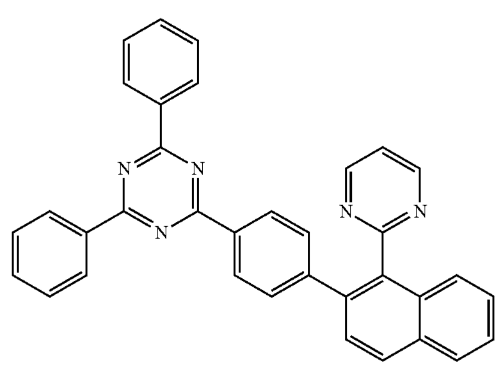

-continued
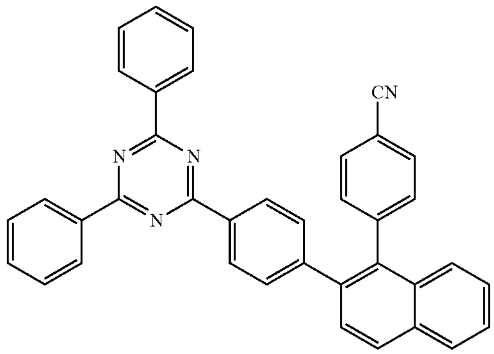
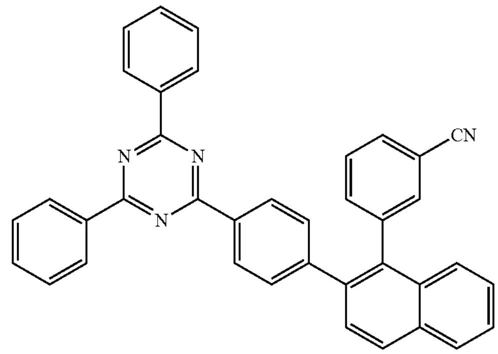
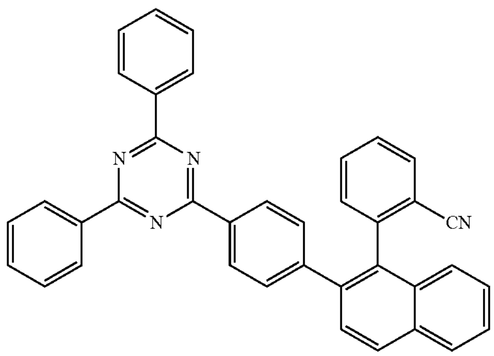
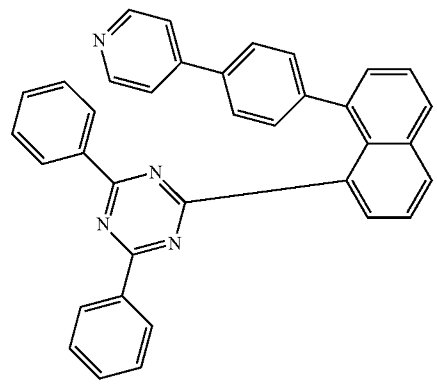
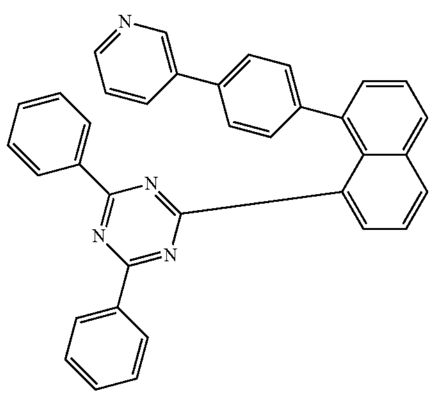
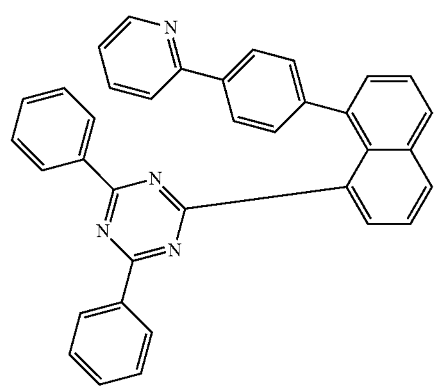
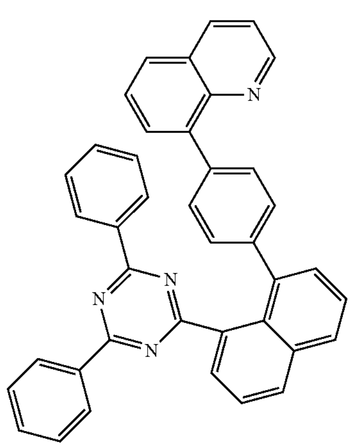
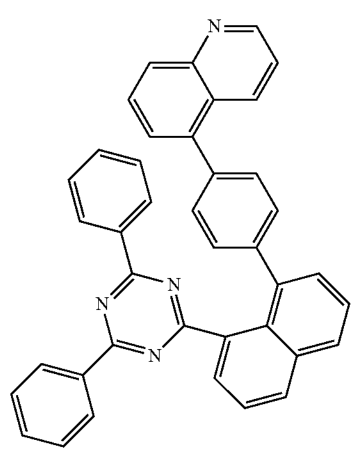
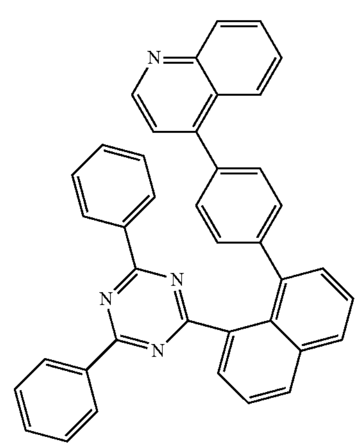

-continued
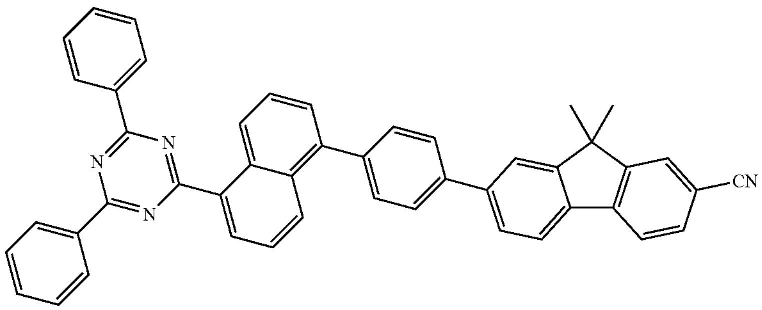
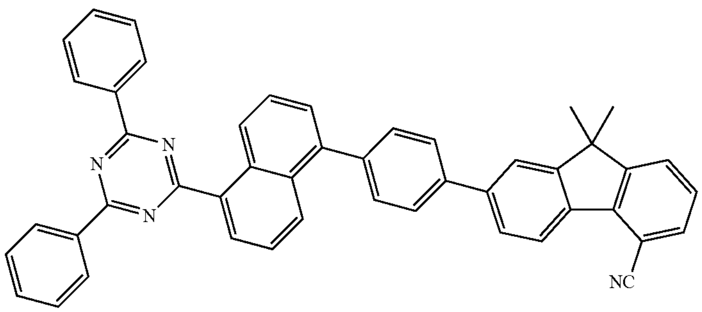
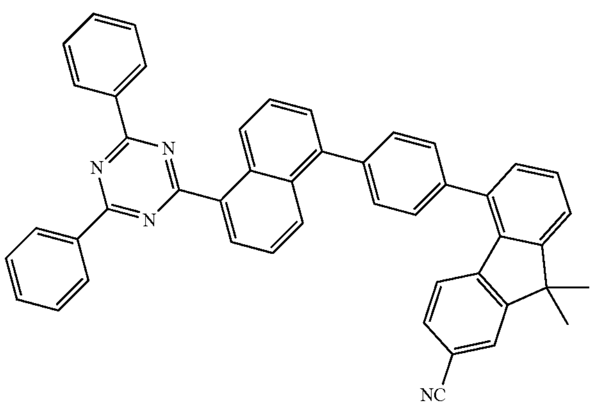
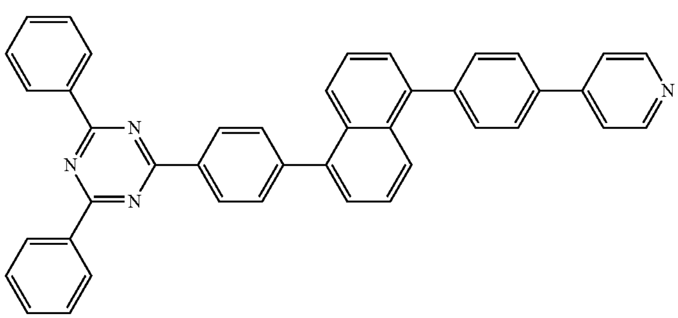
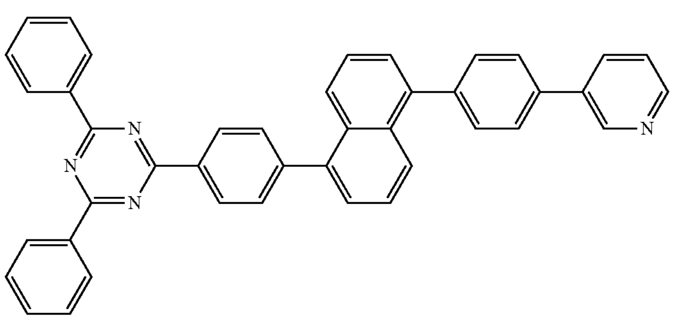

-continued
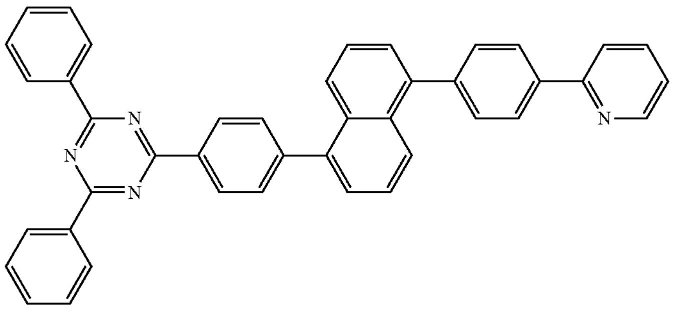
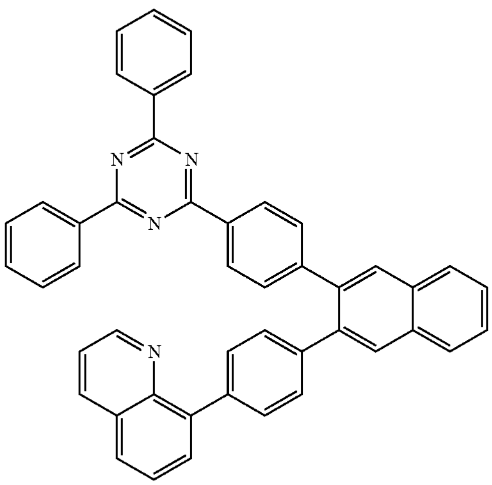
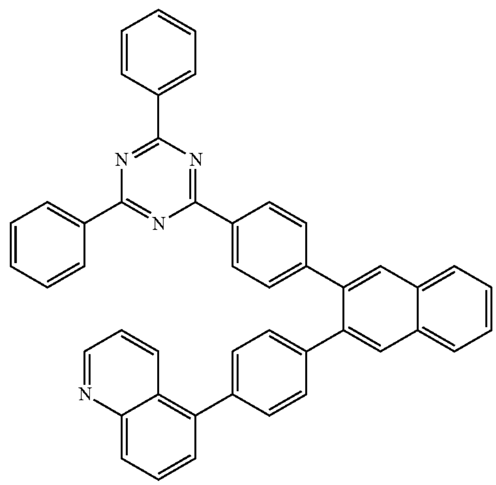
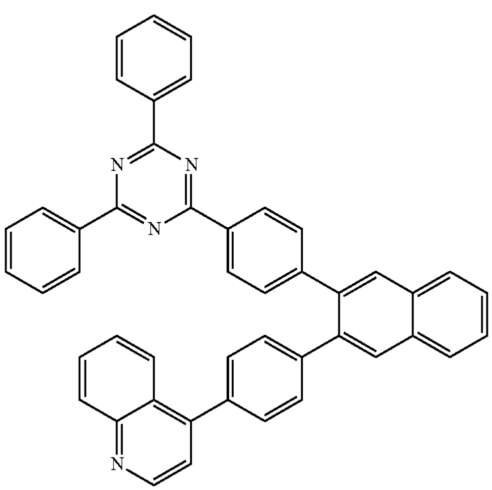
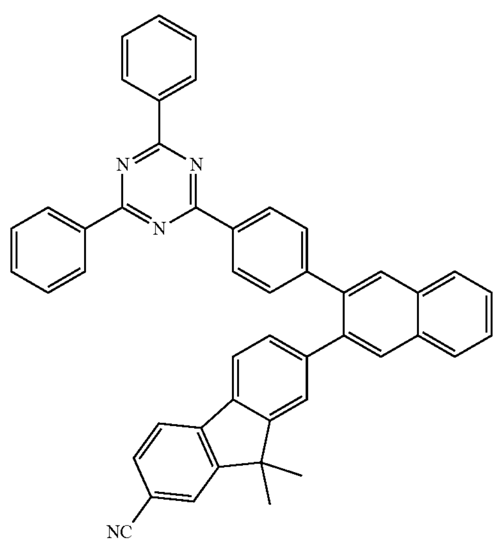

-continued
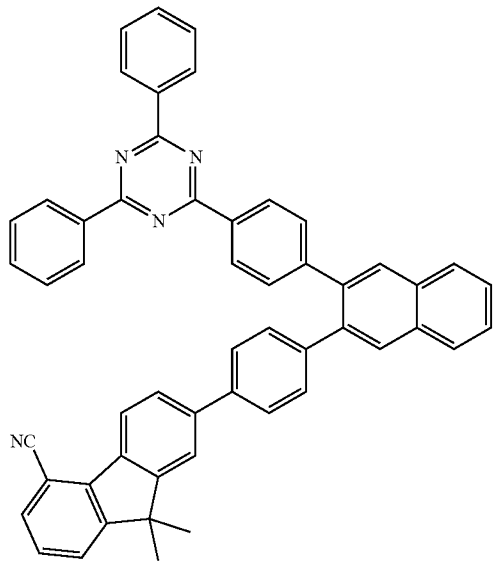
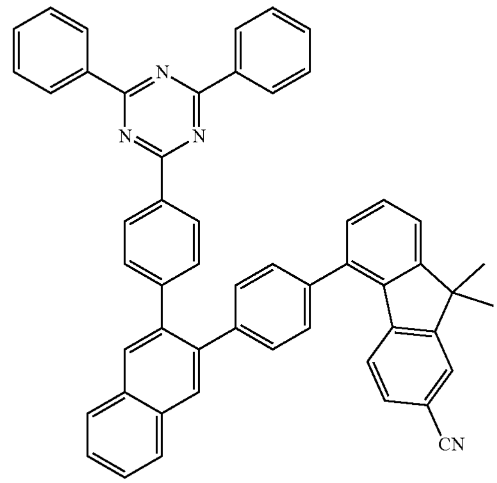
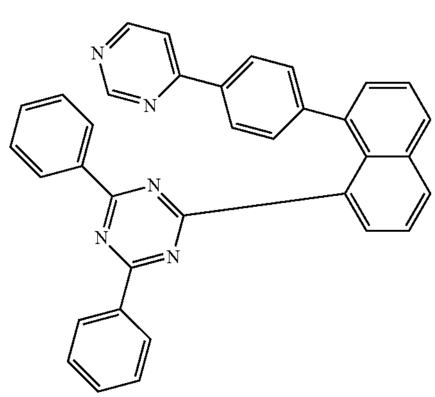
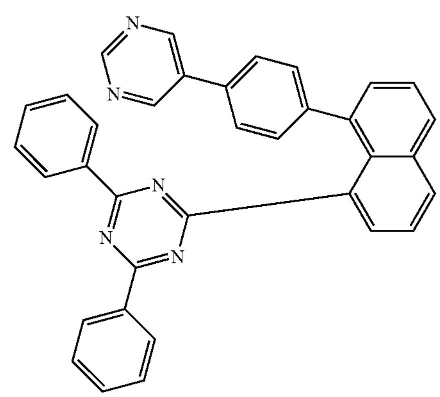
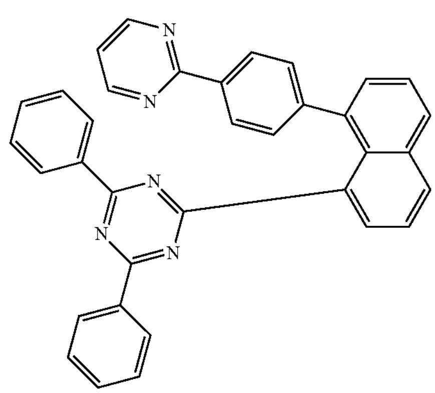
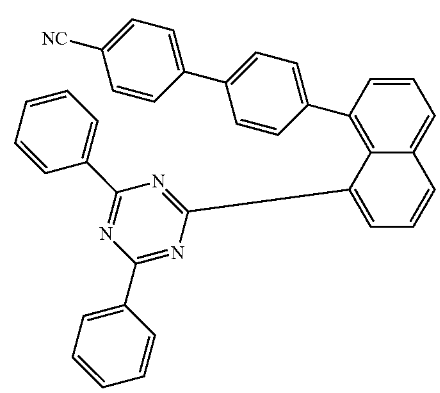

-continued
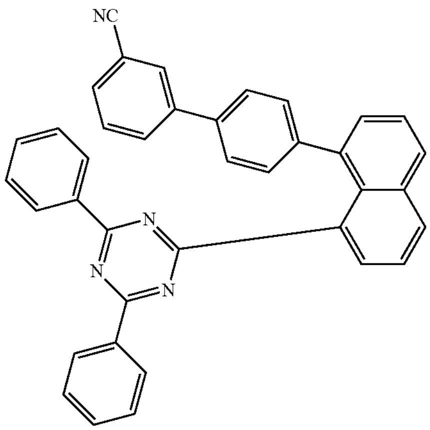
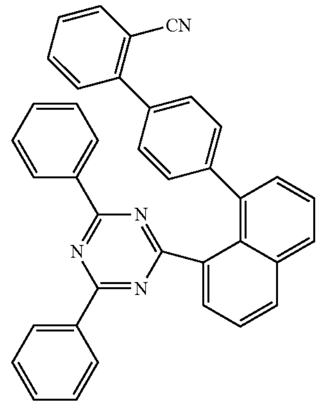
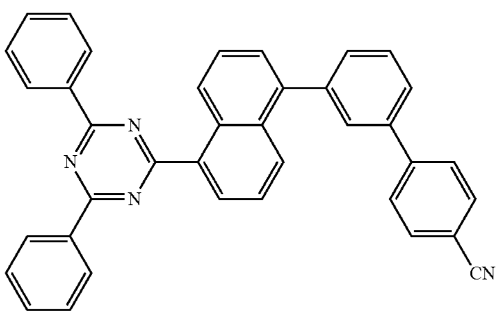
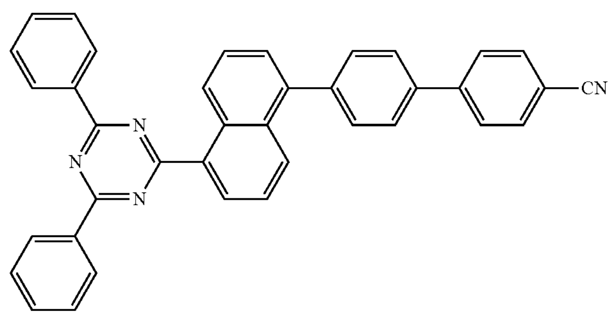
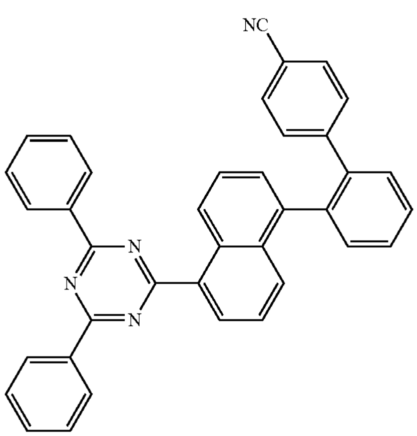
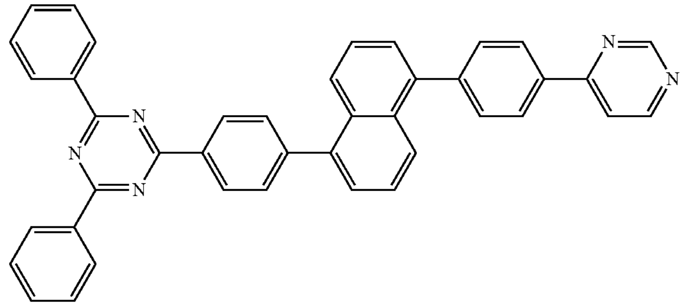
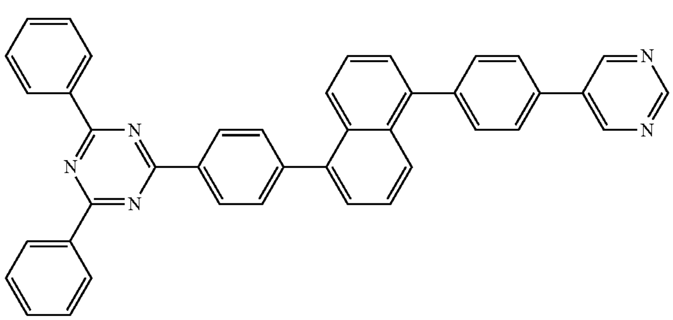

-continued
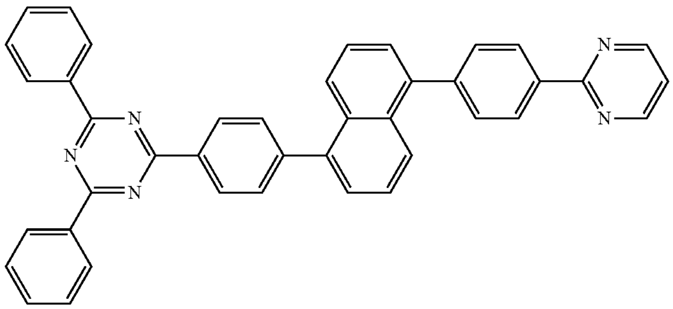
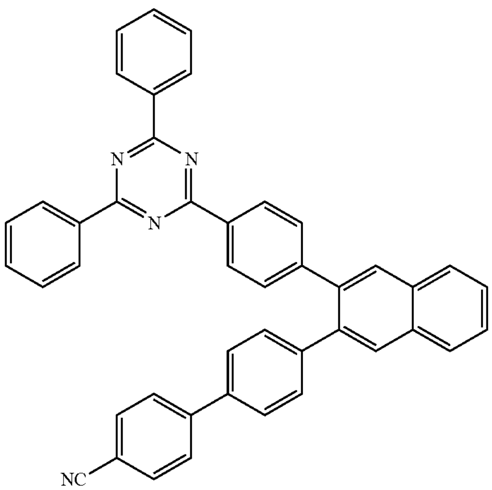
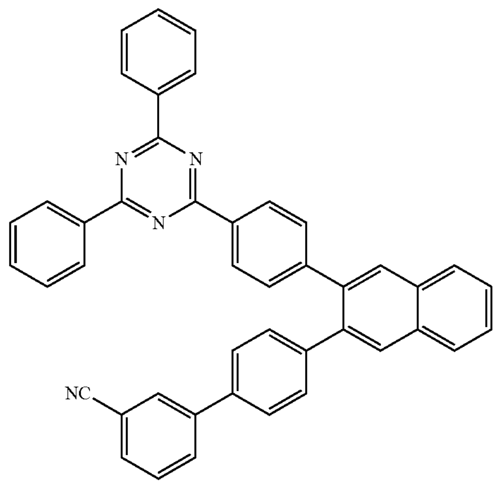
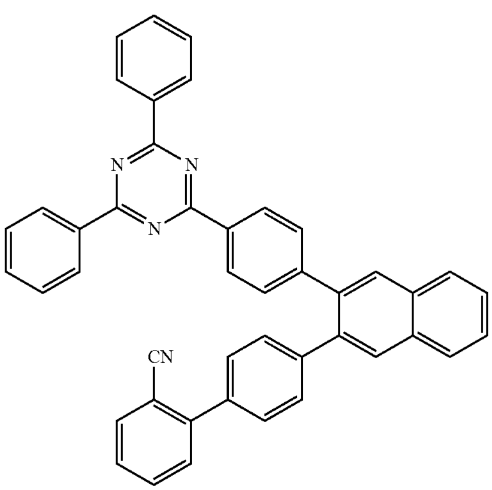
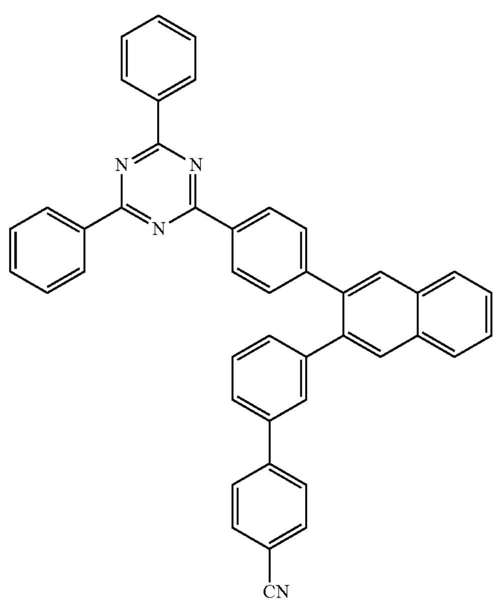

-continued
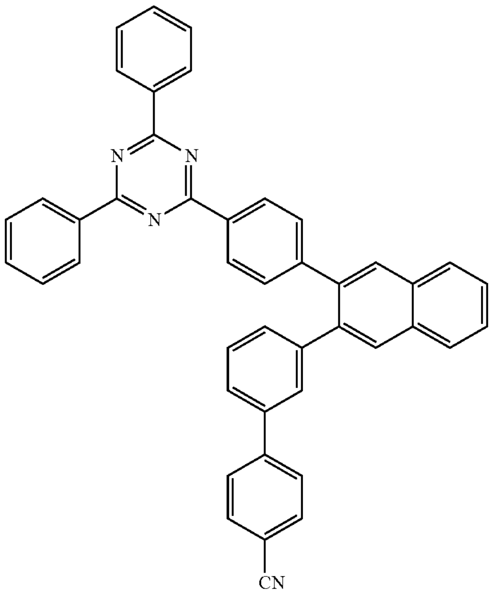
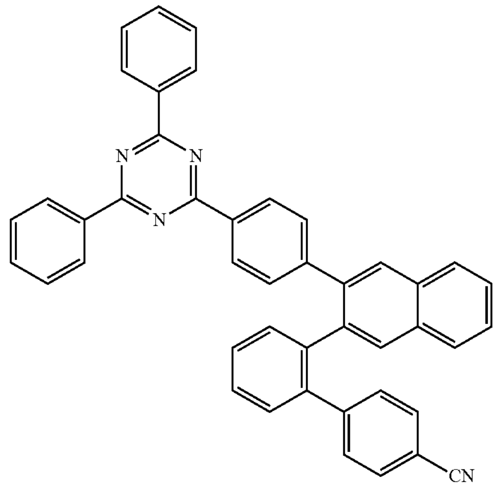
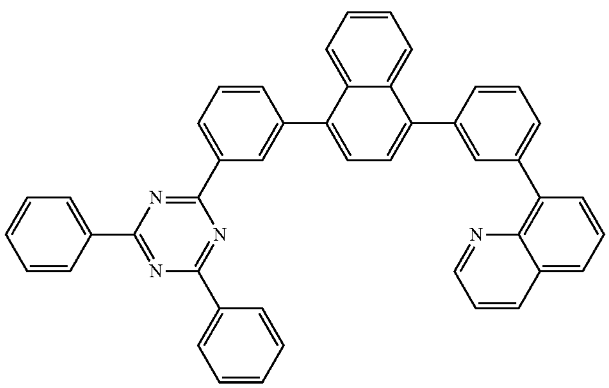
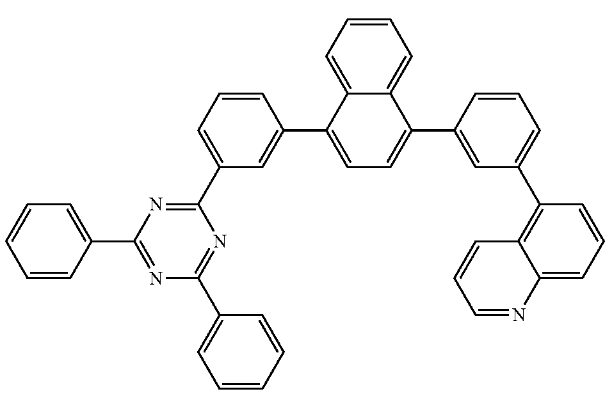

-continued
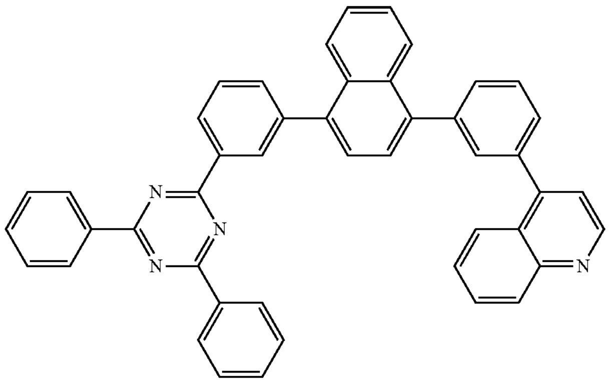
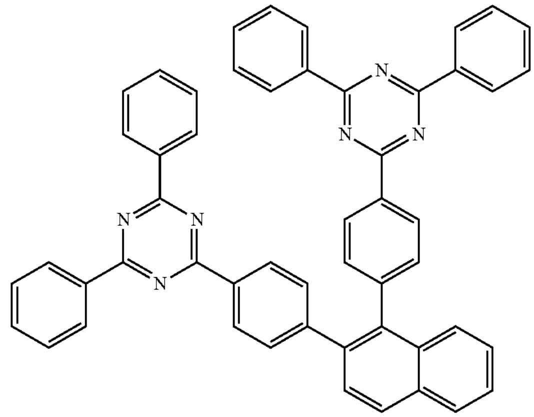
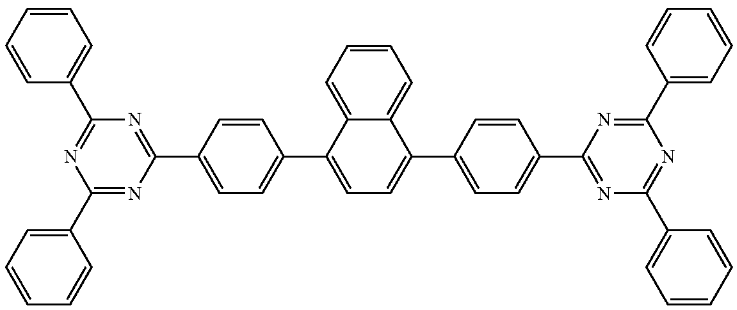
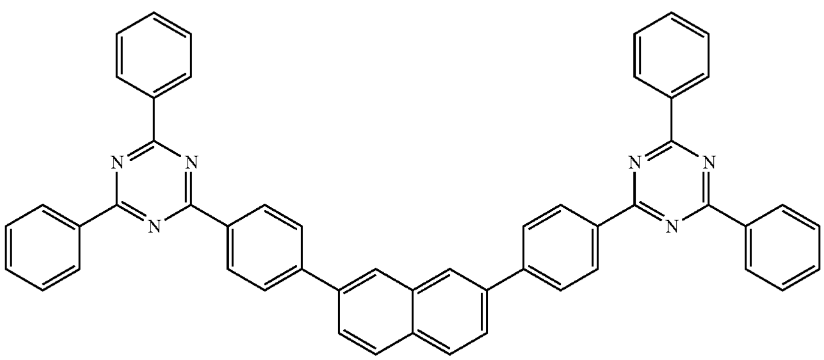
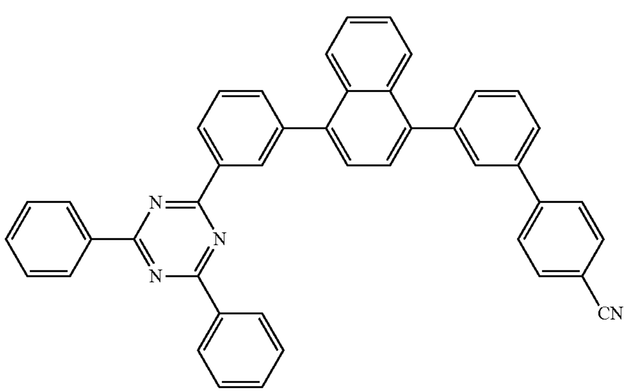

-continued
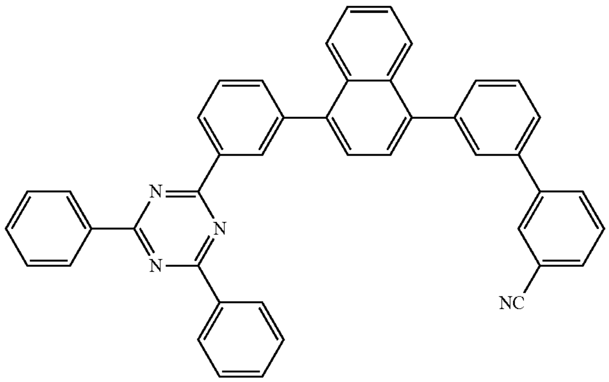
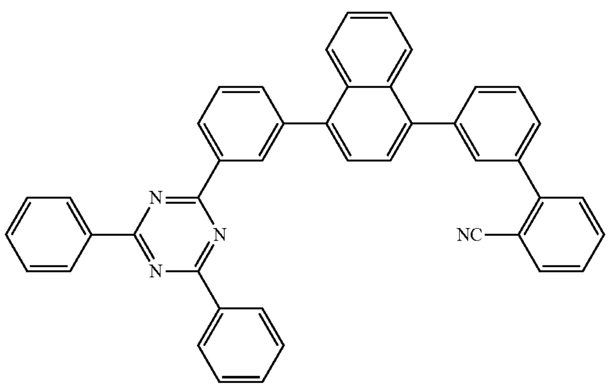
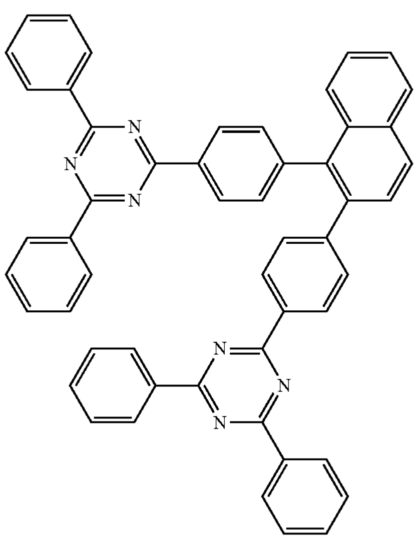
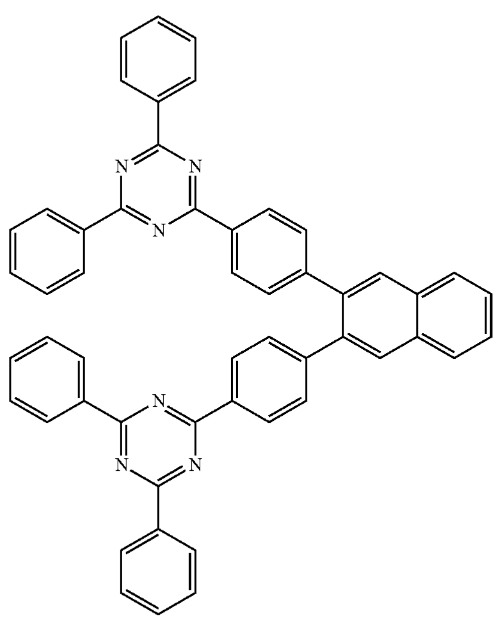

-continued
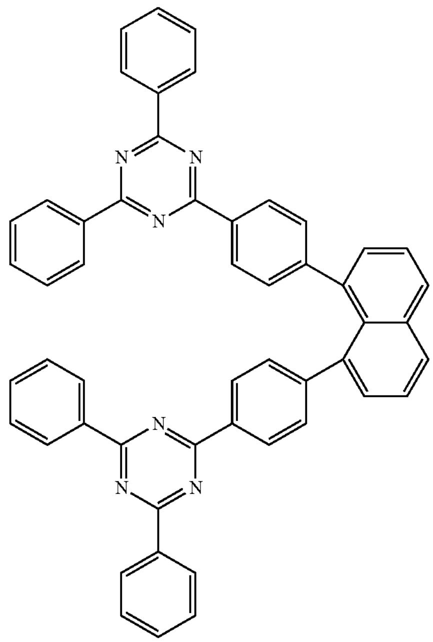
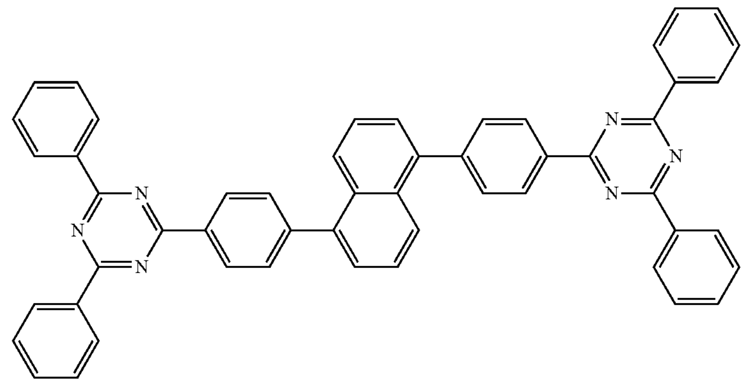
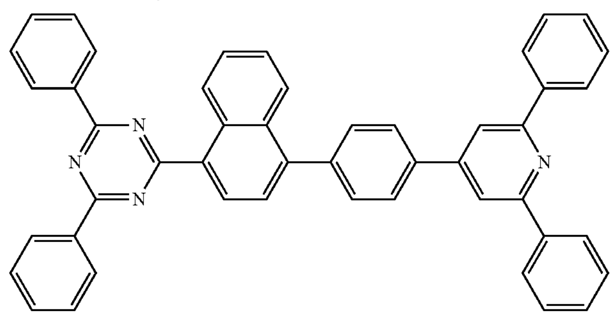
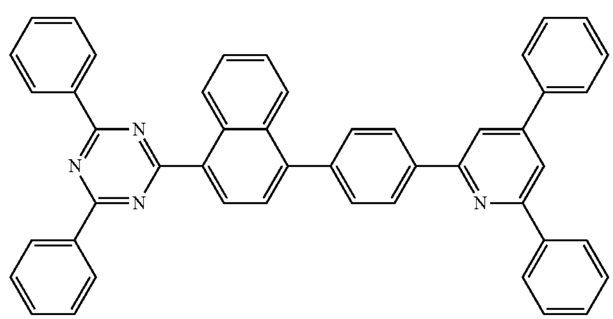
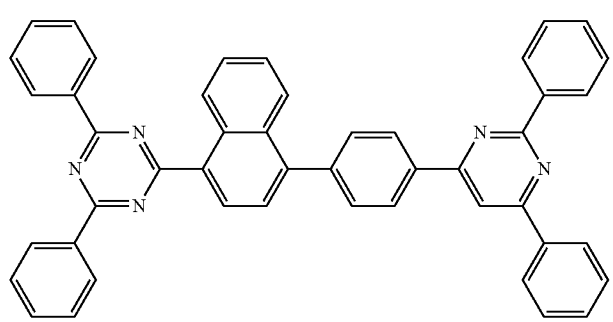

-continued
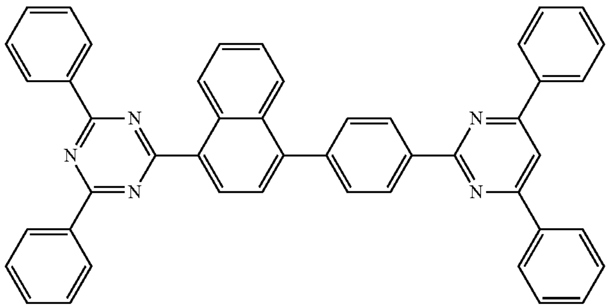
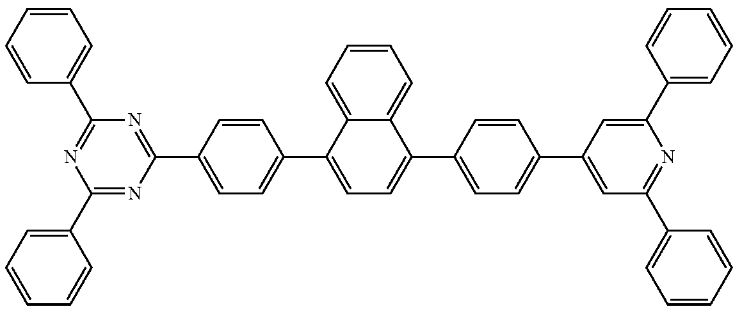
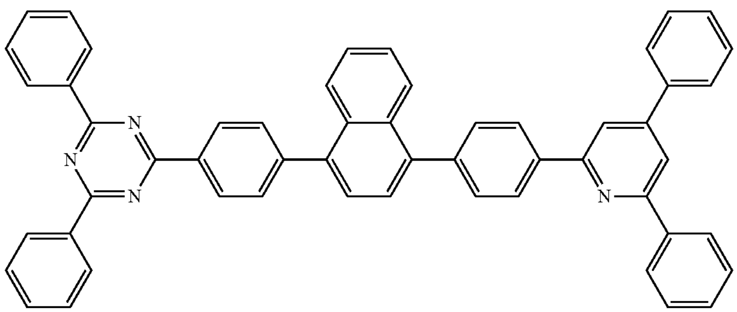
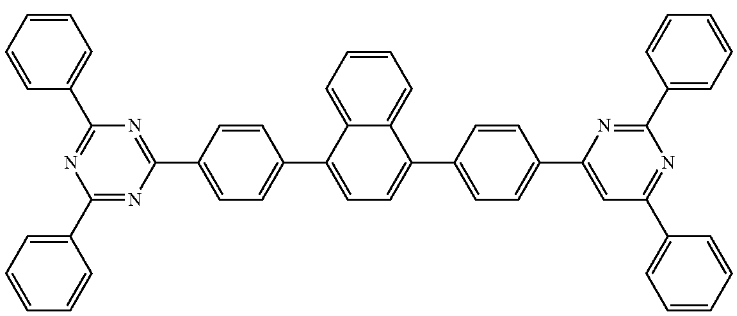
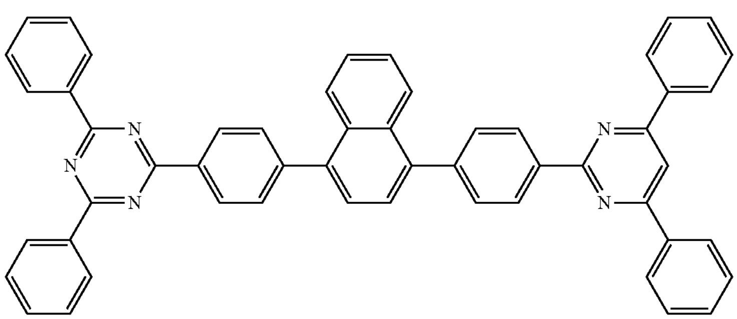

-continued
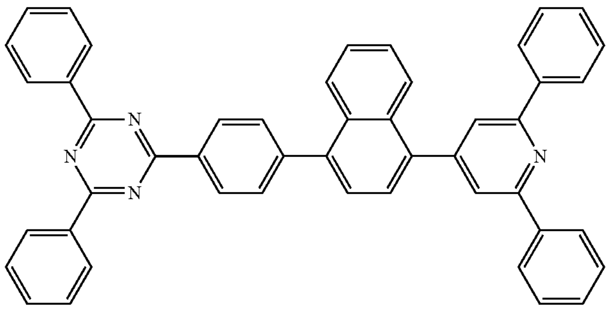
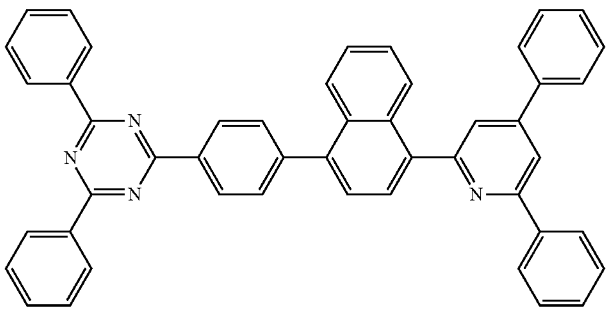
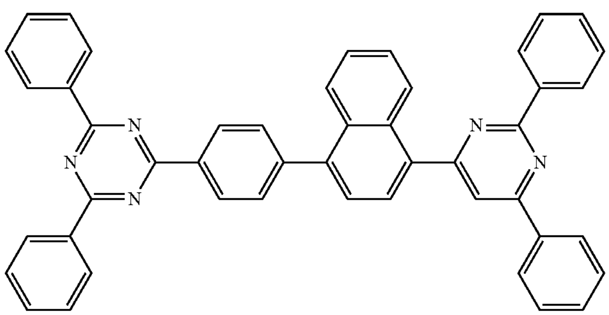
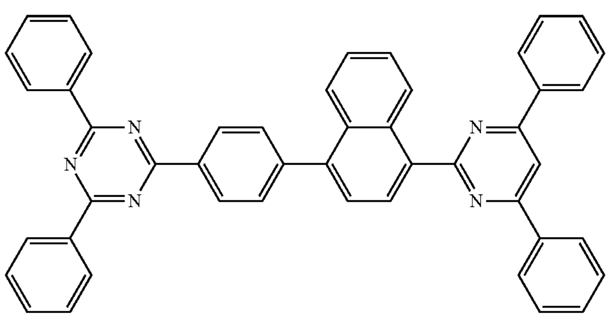
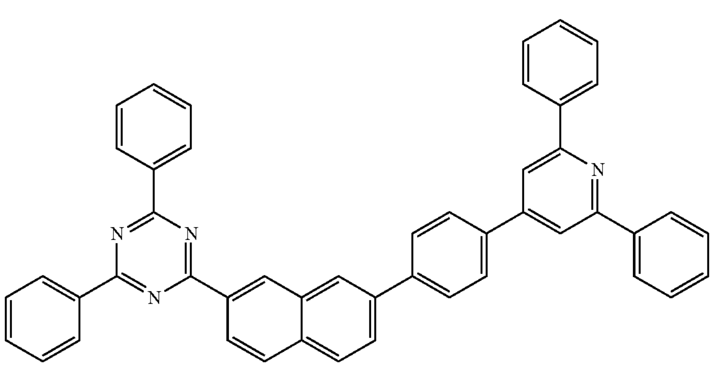

-continued
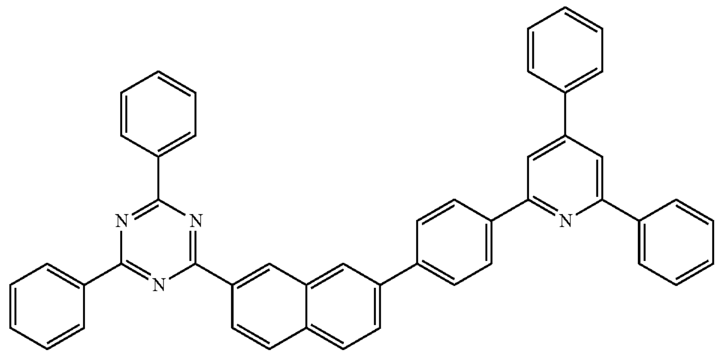
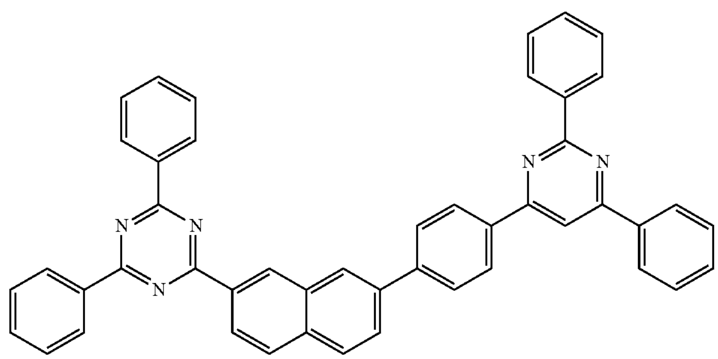
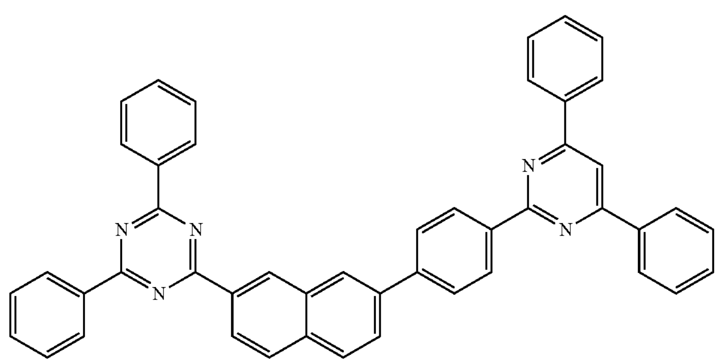
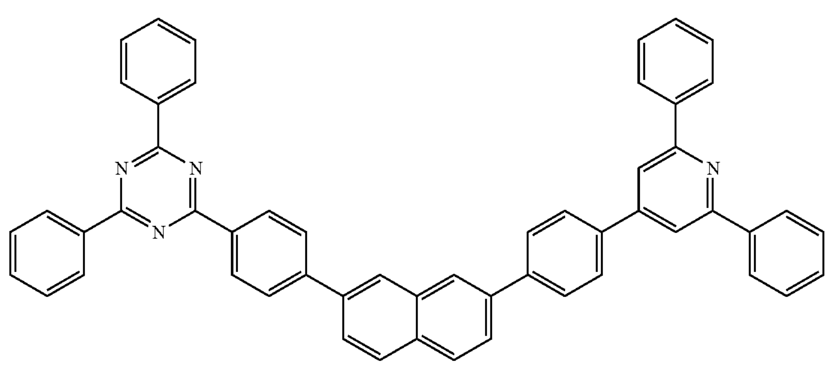

-continued
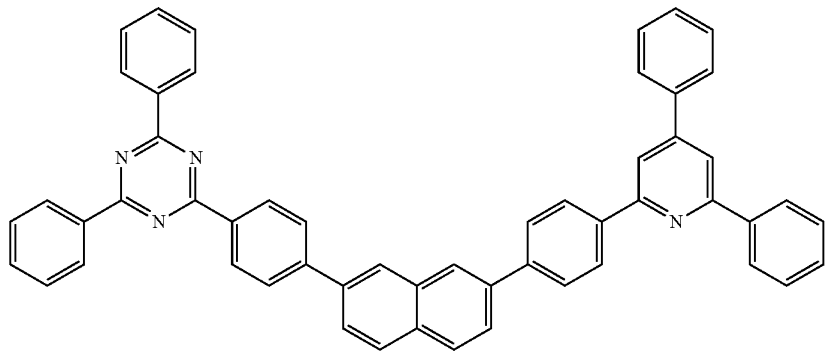
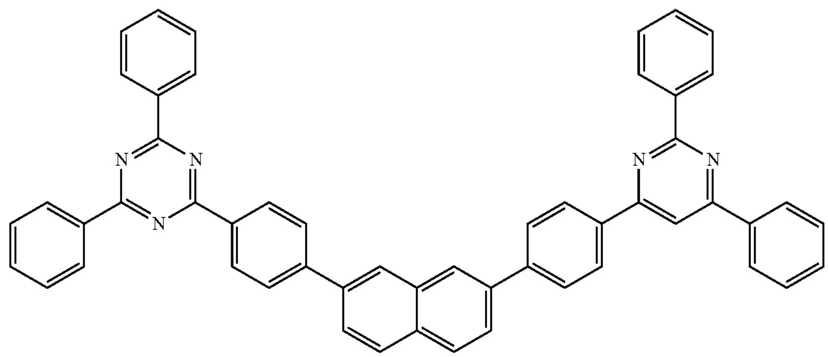
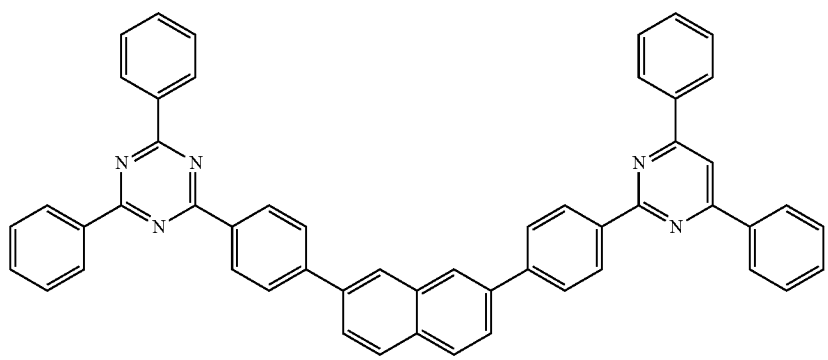
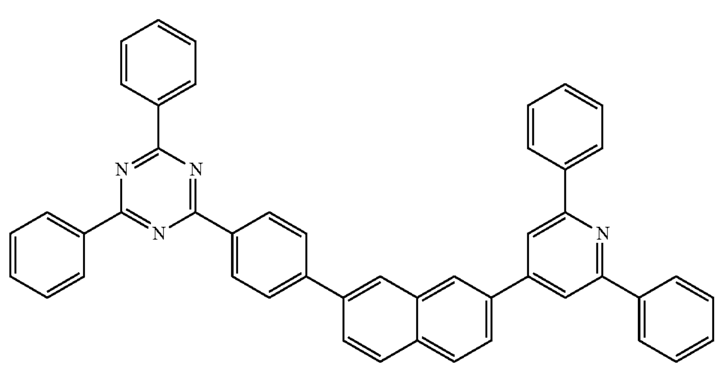

-continued
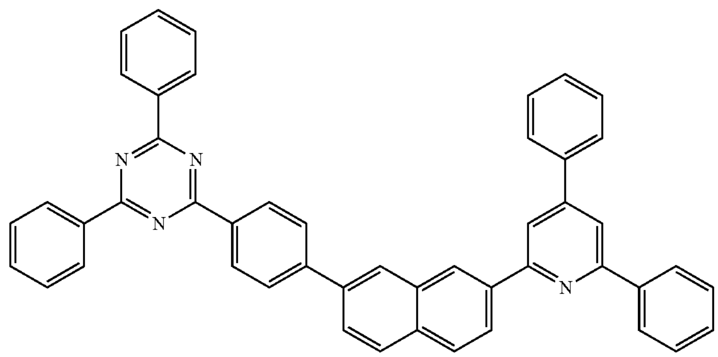
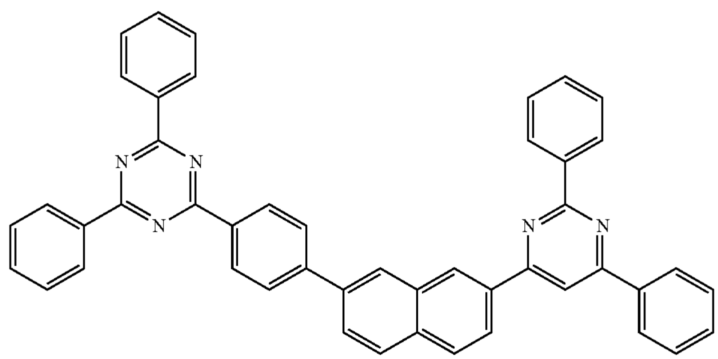
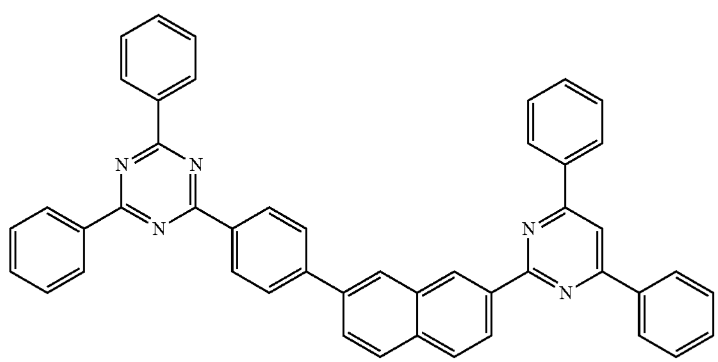
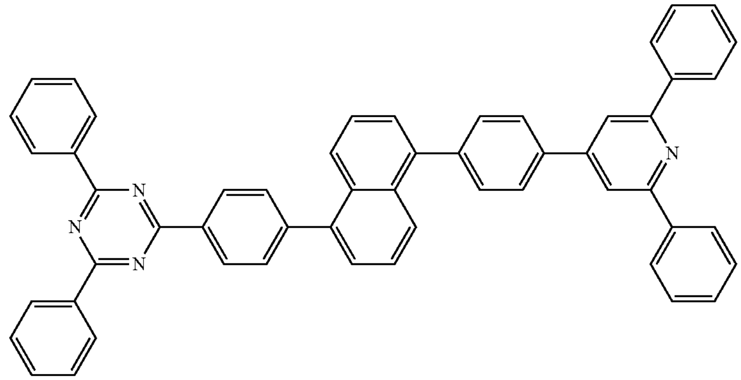

-continued
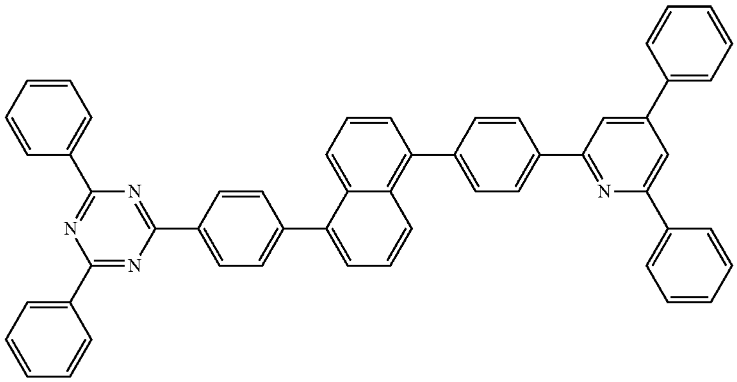
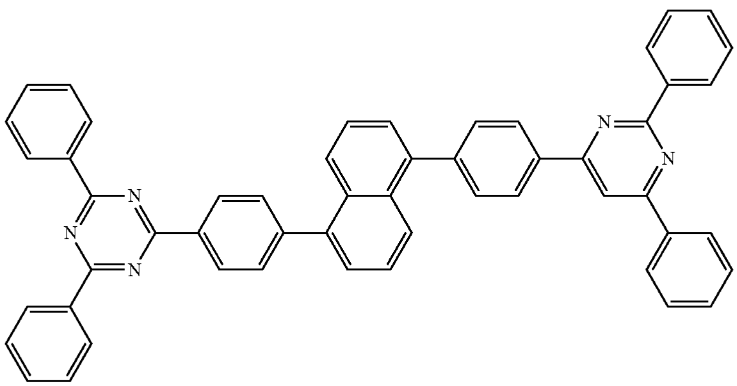
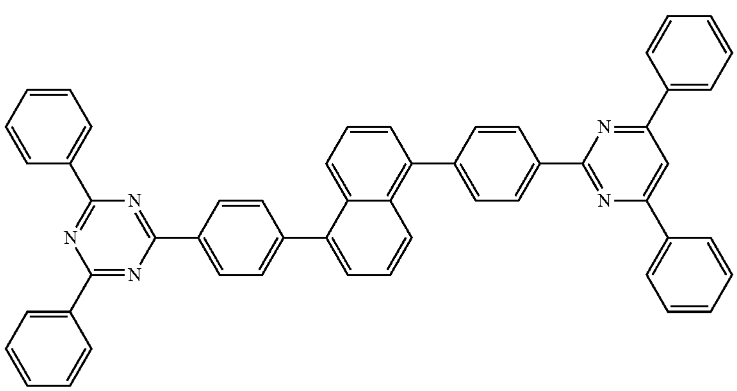
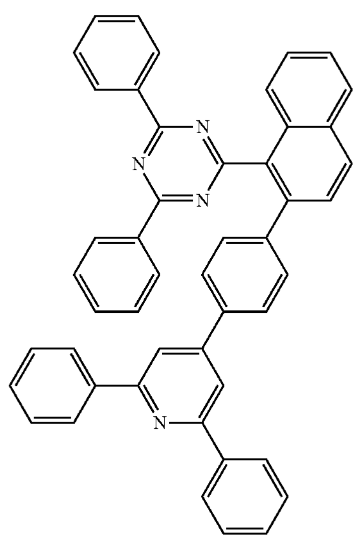

-continued
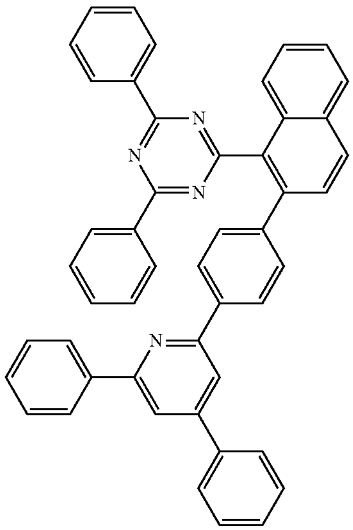
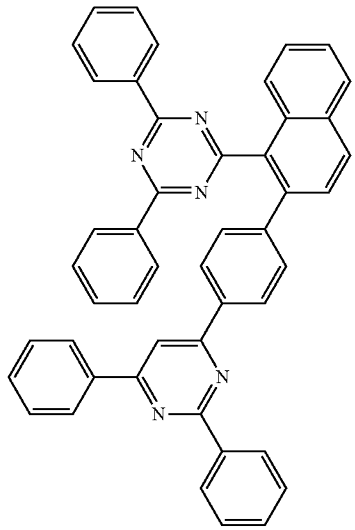
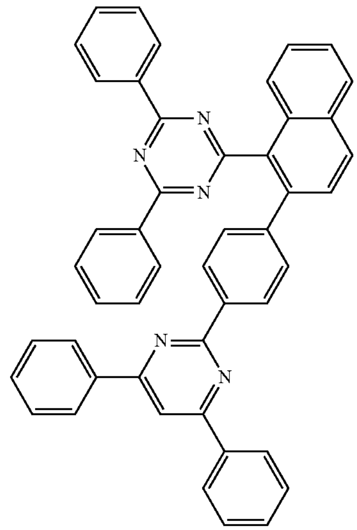
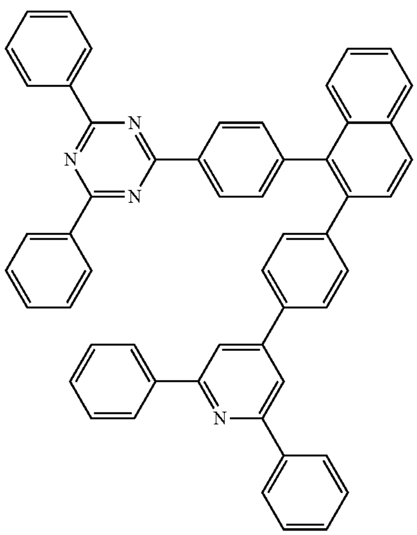
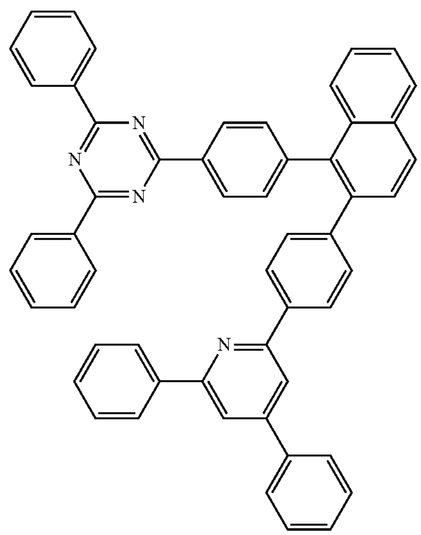
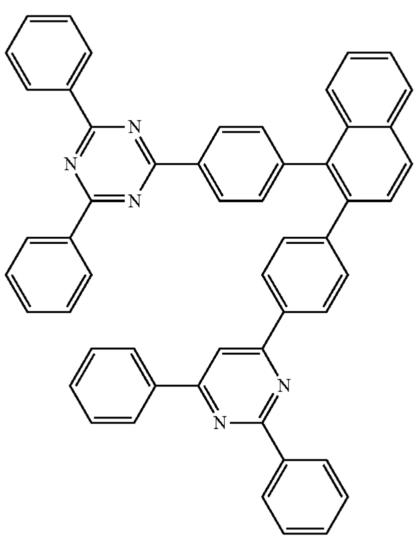
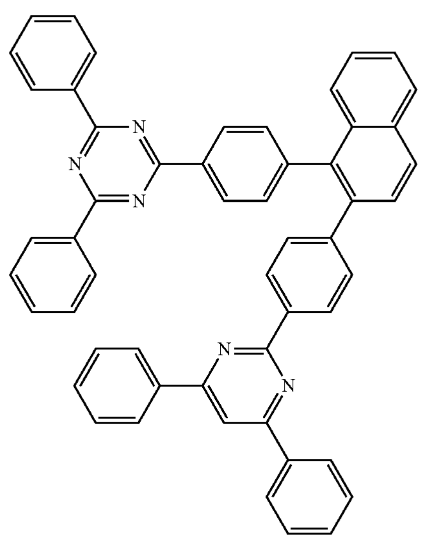

-continued
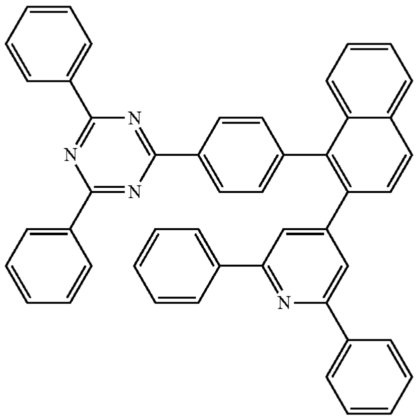
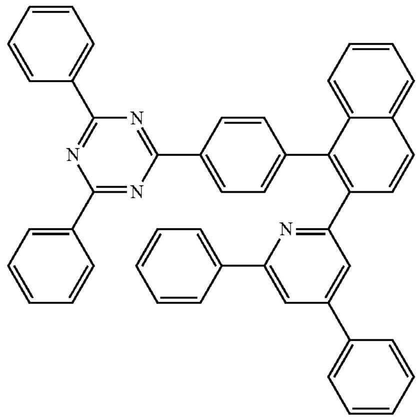
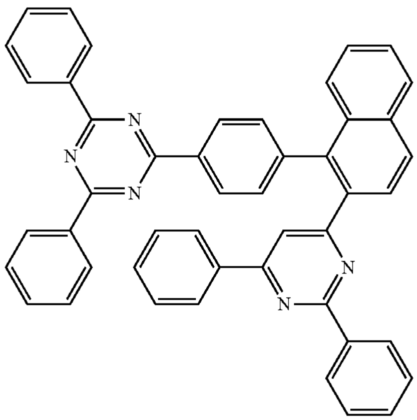
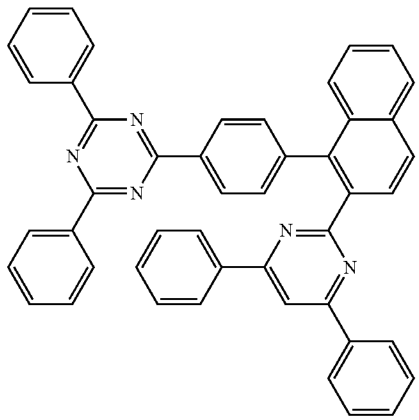
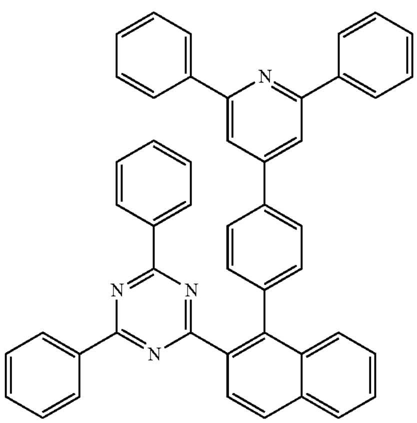
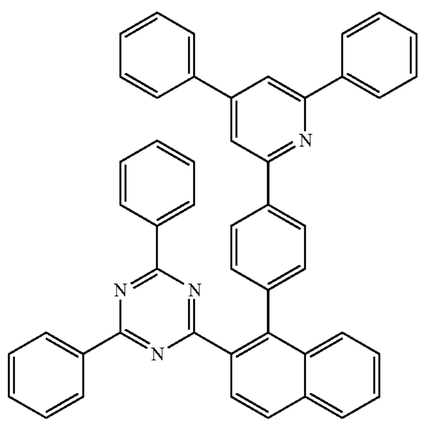
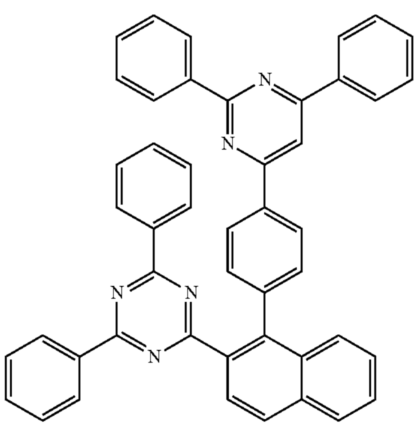
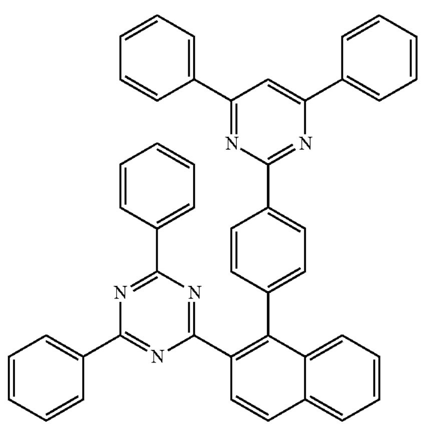

-continued
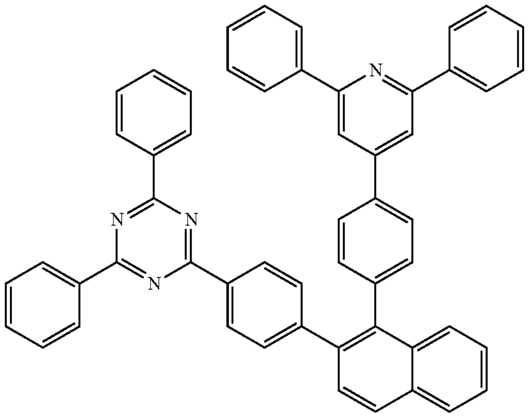
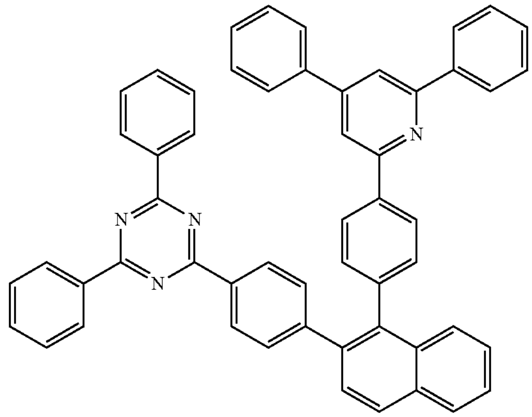
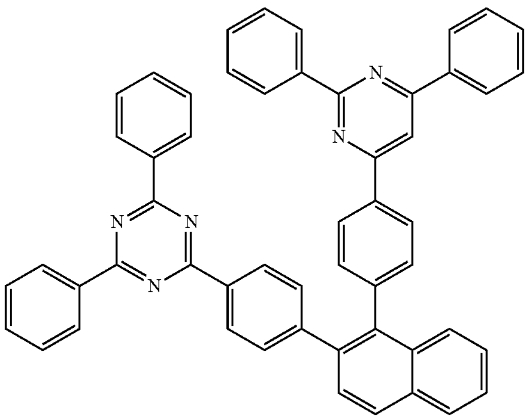
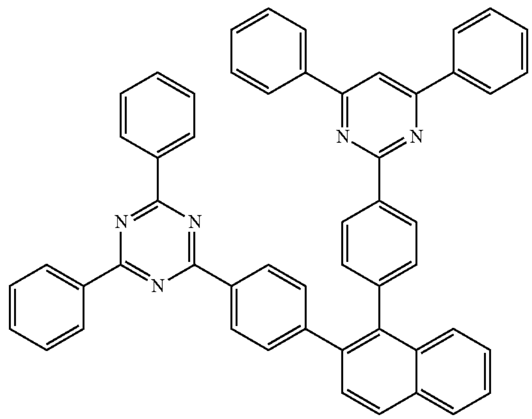
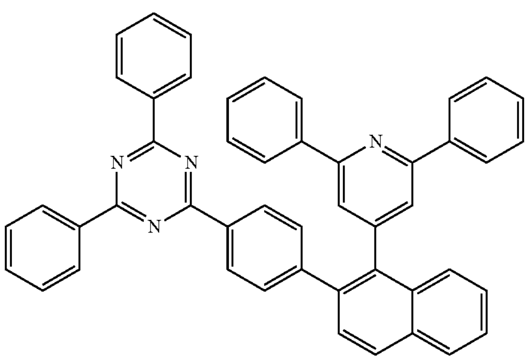
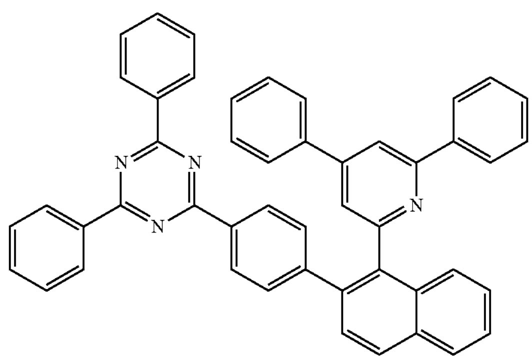
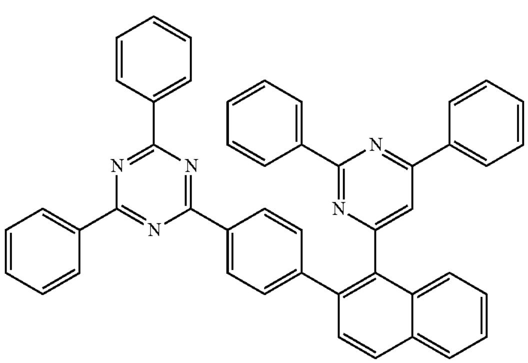
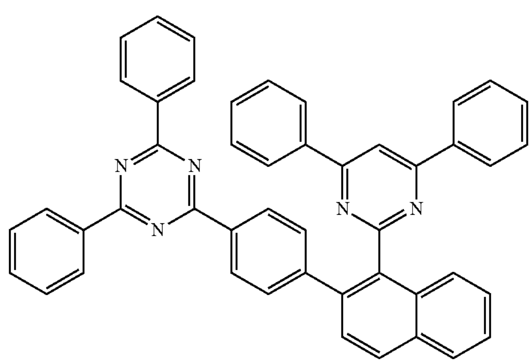

-continued

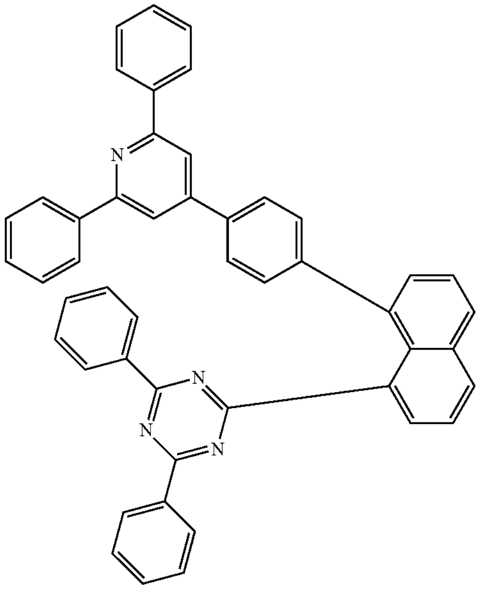

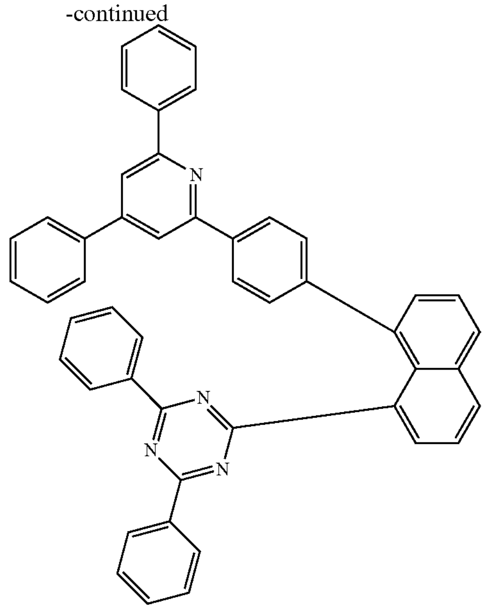

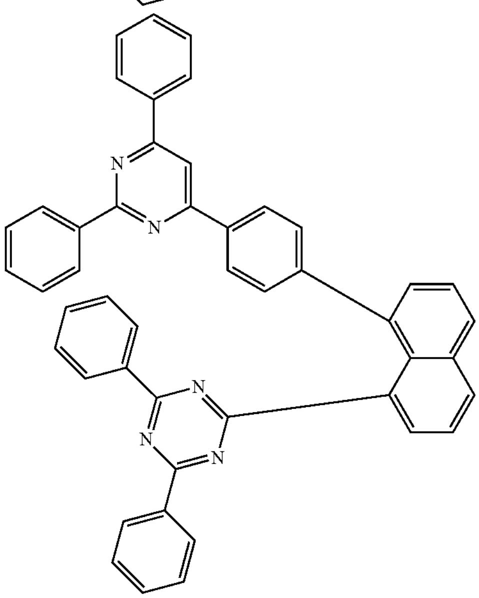

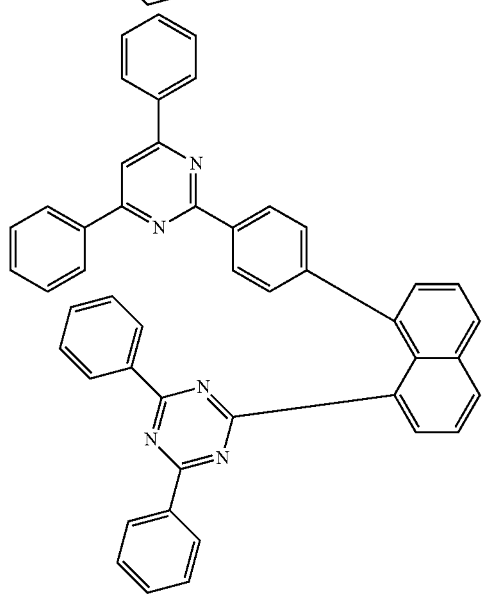

The compound represented by Chemical Formula 2 can be prepared by a preparation method as disclosed in Korean Patent Laid-open Publication Nos. 10-2016-0126862, Korean Patent No. 10-1508424, and the like.

Electron Injection Layer

The organic light emitting device according to the present invention may further include an electron injection layer between the electron transport layer and the cathode. The electron injection layer is a layer injecting the electrons from the electrode, and a compound which has an ability to transport the electrons, an electron injecting effect from the cathode, and an excellent electron injecting effect to the light emitting layer or the light emitting material, prevents movement of an exciton generated in the light emitting layer to the hole injection layer, and has an excellent thin film forming ability is preferable.

Specific examples of materials that can be used for the electron injection layer include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and derivatives thereof, a metal complex compound, a nitrogen-containing 5-membered cycle derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

The structure of the organic light emitting device according to the present invention is illustrated in FIG. 1. FIG. 1 shows an example of an organic light emitting device including a substrate 1, an anode 2, a light emitting layer 3, an electron transport region 4, and a cathode 5. FIG. 2 shows an example of an organic light emitting device including a substrate 1, an anode 2, a light emitting layer 3, a hole blocking layer 6, an electron transport layer 7, and a cathode 5. FIG. 3 shows an example of an organic light emitting device including a substrate 1, an anode 2, a hole transport layer 8, a light emitting layer 3, a hole blocking layer 6, an electron transport layer 7, and a cathode 5.

The organic light emitting device according to the present invention can be manufactured by sequentially stacking the above-described structures. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the respective layers described above thereon, and then depositing a material that can be used as the cathode thereon. In addition to such a method, the organic light emitting device may be manufactured by sequentially depositing a cathode material, an organic material layer, and an anode material on a substrate. Further, the light emitting layer may be formed by subjecting hosts and dopants to a vacuum deposition method and a solution coating method. Herein, the solution coating method means spin coating, dip coating, doctor blading, inkjet printing, screen printing, a spray method, roll coating, or the like, but is not limited thereto.

In addition to such a method, the organic light emitting device may be manufactured by sequentially depositing a cathode material, an organic material layer, and an anode material on a substrate (International Publication WO 2003/012890). However, the manufacturing method is not limited thereto.

Meanwhile, the organic light emitting device according to the present invention may be a front emission type, a back emission type, or a double side emission type according to the used material.

Hereinafter, preferred examples of the present invention will be described to help understanding of the invention. However, these examples are presented for illustrative purposes only, and the scope of the present invention is not limited thereto.

Preparation Example 1: Synthesis of Compound 1-1

(Preparation Example 1-a) Synthesis of Compound 1-1-a

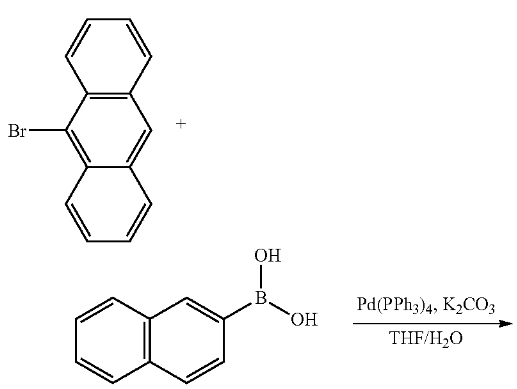

-continued

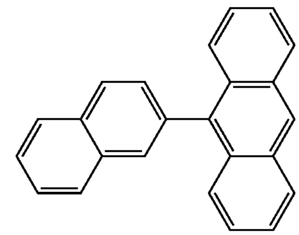

1-1-a

A solution of 9-bromoanthracene (20.0 g, 77.8 mmol) and naphthalene-2-ylboronic acid (14.7 g, 85.6 mmol) dissolved in 300 mL of THF and $K_2CO_3$ (43.0 g, 311.1 mmol) dissolved in 150 ml of $H_2O$ was added to a three-necked flask. $Pd(PPh_3)_4$ (3.6 g, 3.1 mmol) was added thereto, and the mixture was stirred under reflux under an argon atmosphere for 8 hours. After completion of the reaction, the reaction solution was cooled to room temperature, transferred to a reparatory funnel, and then extracted with water and ethyl acetate. The extract was dried over $MgSO_4$, filtered, and concentrated. The sample was purified by silica gel column chromatography to obtain 18.5 g of Compound 1-1-a (yield 78%, MS[M+H]$^+$=304).

(Preparation Example 1-b) Synthesis of Compound 1-1-b

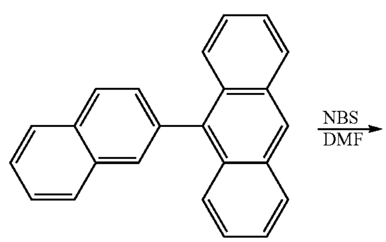

1-1-a

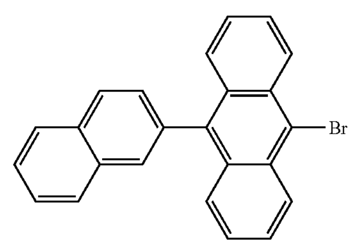

1-1-b

Compound 1-1-a (15.0 g, 49.3 mmol), NBS (9.2 g, 51.7 mmol), and DMF (300 mL) were added to a two-necked flask, and the mixture was stirred at room temperature under an argon atmosphere for 8 hours. After completion of the reaction, the reaction solution was transferred to a separatory funnel and the organic layer was extracted with water and ethyl acetate. The extract was dried over $MgSO_4$, filtered, and concentrated. The sample was purified by silica gel column chromatography to obtain 16.6 g of Compound 1-1-b (yield 88%, MS[M+H]$^+$=383).

(Preparation Example 1-c) Synthesis of Compound 1-1

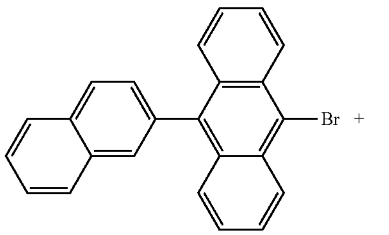

1-1-b

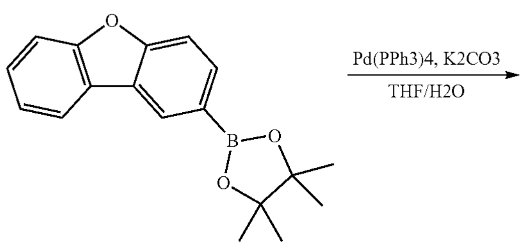

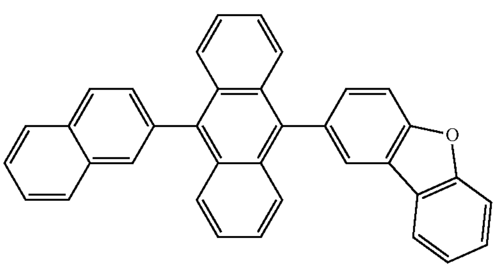

1-1

A solution of Compound 1-1-b (15.0 g, 39.1 mmol) and 2-(dibenzo[b,d]furan-2-yl)-4,4,5,5-tetramethyl-1,3,2-dioxaborolane (12.7 g, 43.0 mmol) dissolved in 225 mL of THF and $K_2CO_3$ (21.6 g, 156.5 mmol) dissolved in 113 mL of $H_2O$ was added to a three-necked flask. $Pd(PPh_3)_4$ (1.8 g, 1.6 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sample was purified by silica gel column chromatography, and then subjected to sublimation purification to obtain 6.4 g of Compound 1-1 (yield 35%, MS[M+H]$^{30}$=471).

Preparation Example 2: Synthesis of Compound 1-2

(Preparation Example 2-a) Synthesis of Compound 1-2-a

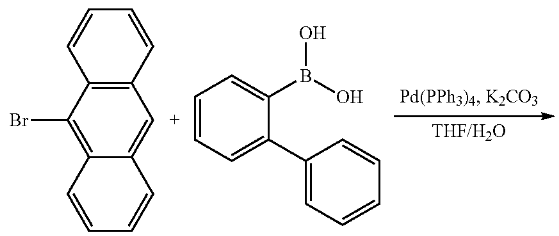

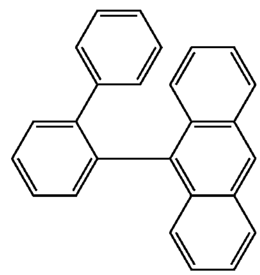

1-2-a 19.3 g of Compound 1-2-a was synthesized in the same manner as in the synthesis of Compound 1-1-a, except that [1,1'-biphenyl]-2-ylboronic acid was used instead of naphthalene-2-ylboronic acid in (Preparation Example 1-a) (yield 75%, MS[M+H]$^+$=330).

(Preparation Example 2-b) Synthesis of Compound 1-2-b

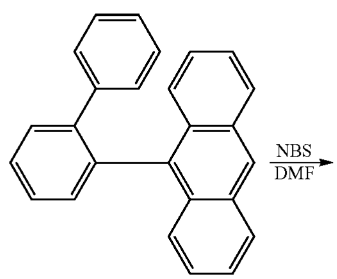

1-2-a

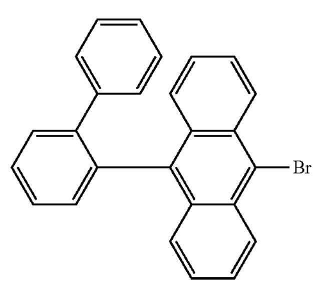

1-2-b 16.9 g of Compound 1-2-b was synthesized in the same manner as in the synthesis of Compound 1-1-b, except that Compound 1-2-a was used instead of Compound 1-1-a in (Preparation Example 1-b) (yield 91%, MS $[M+H]^+$=409).

(Preparation Example 2-c) Synthesis of Compound 1-2

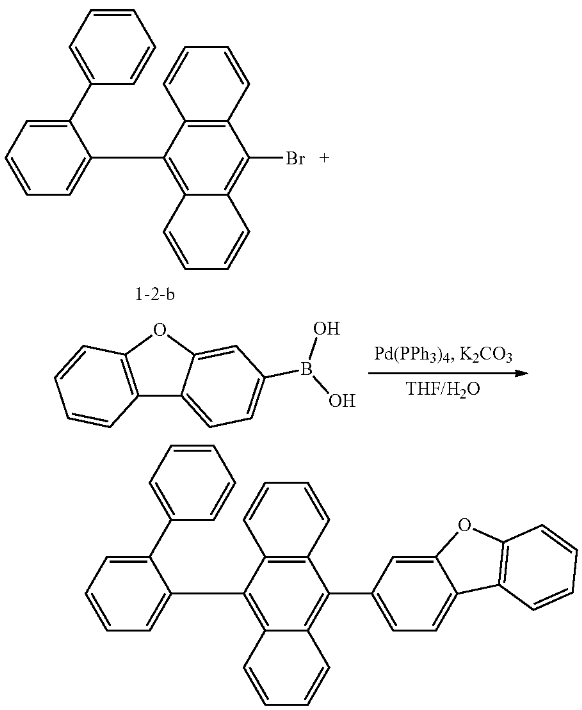

1-2-b 1-2

5.8 g of Compound 1-2 was synthesized in the same manner as in the synthesis of Compound 1-1, except that Compound 1-2-b was used instead of Compound 1-1-b and dibenzo[b,d]furan-3-ylboronic acid was used instead of 2-(dibenzo[b,d]furan-2-yl)-4,4,5,5-tetramethyl-1,3,2-dioxaborolane, in (Preparation Example 1-c) (yield 32%, MS$[M+H]^+$=497).

Preparation Example 3: Synthesis of Compound 1-3

(Preparation Example 3-a) Synthesis of Compound 1-3-a

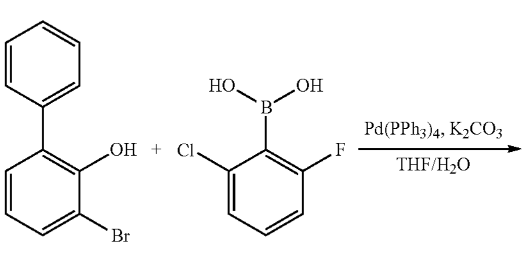

-continued

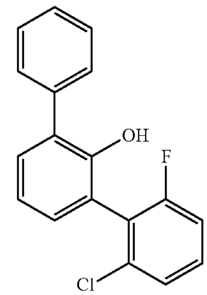

1-3-a

A solution of 3-bromo-[1,1'-biphenyl]-2-ol (30.0 g, 120.4 mmol) and (2-chloro-6-fluorophenyl)boronic acid (23.1 g, 132.5 mmol) dissolved in 450 mL of THF and $K_2CO_3$ (66.6 g, 481.7 mmol) dissolved in 225 mL of $H_2O$ was added to a three-necked flask. $Pd(PPh_3)_4$ (5.6 g, 4.8 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sample was purified by silica gel column chromatography to obtain 27.0 g of Compound 1-3-a (yield 75%, MS$[M+H]^+$=299).

(Preparation Example 3-b) Synthesis of Compound 1-3-b

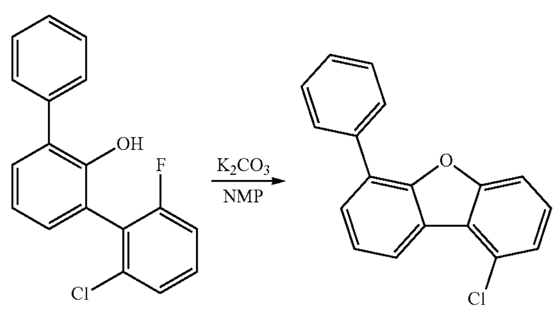

1-3-a 1-3-b

Compound 1-3-a (25.0 g, 83.7 mmol), $K_2CO_3$ (23.1 g, 167.4 mmol), and NMP (325 mL) were added to a three-necked flask, and stirred at 120° C. overnight. After completion of the reaction, the reaction solution was cooled to room temperature, and 300 mL of water was slowly added dropwise thereto. Then, the reaction solution was transferred to a separatory funnel, and the organic layer was extracted with water and ethyl acetate. The extract was dried over $MgSO_4$, filtered, and concentrated. The sa p as purified by silica gel column chromatography to obtain 19.8 g of Compound 1-3-b (yield 85%, MS$[M+H]^+$=279).

(Preparation Example 3-c) Synthesis of Compound 1-3-c

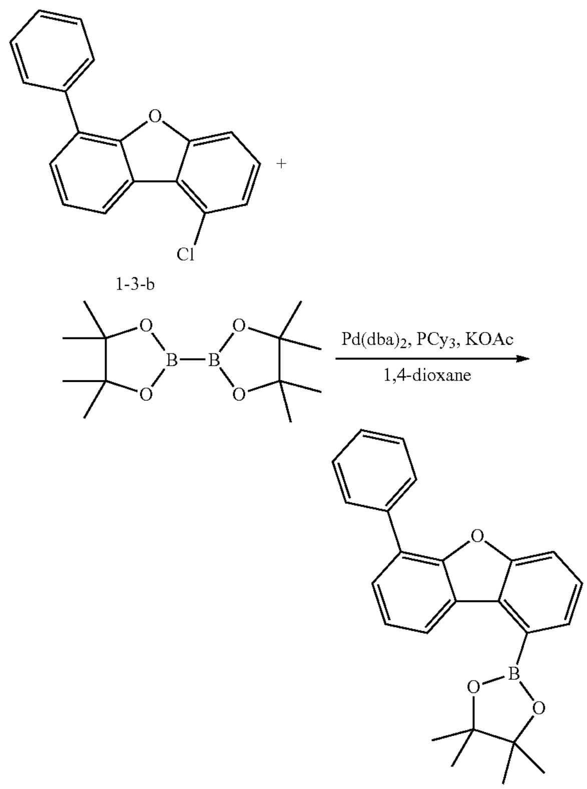

1-3-b 1-3-c

Compound 1-3-b (18.0 g, 64.6 mmol), bis(pinacolato) diboron (19.7 g, 77.5 mmol), $Pd(dba)_2$ (0.7 g, 1.3 mmol), tricyclohexyl phosphine (0.7 g, 2.6 mmol), KOAc (12.7 g, 129.2 mmol), and 1,4-dioxane (270 mL) were added to a three-necked flask, and stirred under reflux under an argon atmosphere for 12 hours. After completion of the reaction, the reaction solution was cooled to room temperature and then transferred to a separatory funnel to which 200 mL of water was added, and extracted with ethyl acetate. The extract was dried over $MgSO_4$, filtered, and concentrated. The sample was purified by silica gel column chromatography to obtain 20.5 g of Compound 1-3-c (yield 73%, $MS[M+H]^+$=370).

(Preparation Example 3-d) Synthesis of Compound 1-3-d

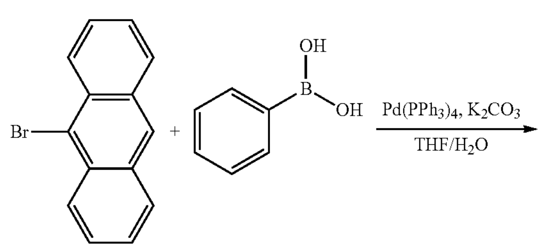

-continued

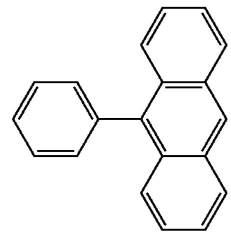

1-3-d 15.6 g of Compound 1-3-d was synthesized in the same manner as in the synthesis of Compound 1-1-a, except that phenylboronic acid was used instead of naphthalene-2-ylboronic acid in (Preparation Example 1-a) (yield 79%, $MS[M+H]^+$254).

(Preparation Example 3-e) Synthesis of Compound 1-3-e

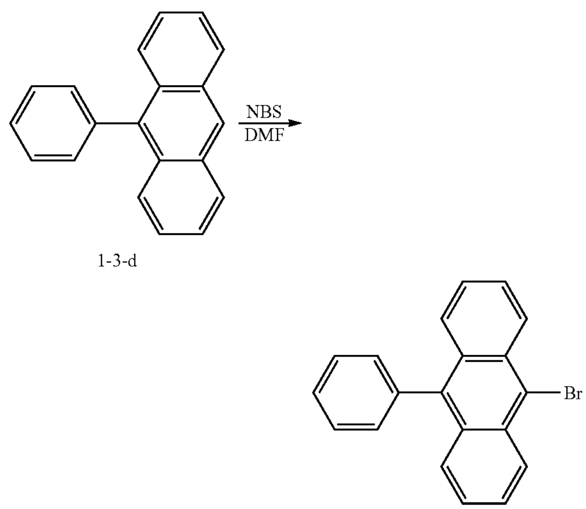

1-3-d 1-3-e 17.3 g of Compound 1-3-e was synthesized in the same manner as in the synthesis of Compound 1-1-b, except that Compound 1-3-d was used instead of Compound 1-1-a in (Preparation Example 1-b) (yield 88%, $MS[M+H]^+$=333).

(Preparation Example 3-f) Synthesis of Compound 1-3

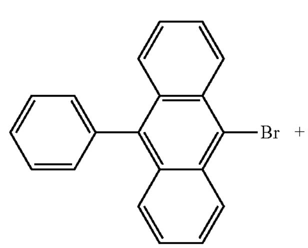

1-3-e

-continued

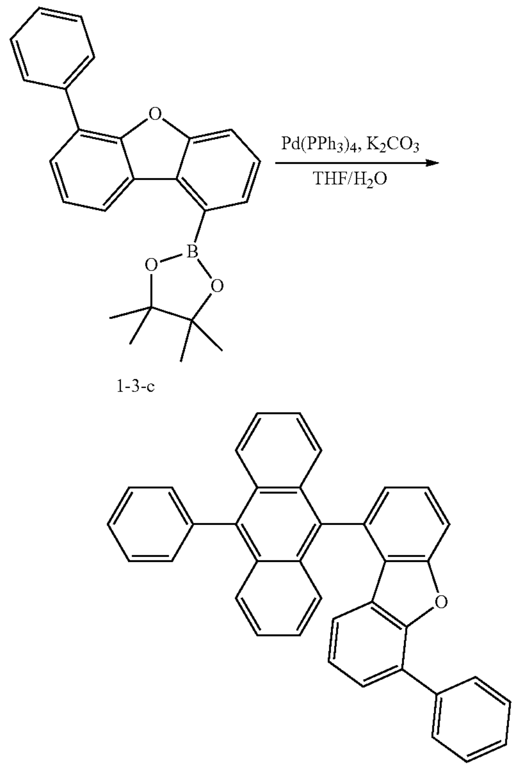

1-3-c 1-3

7.4 g of Compound 1-3 was synthesized in the same manner as in the synthesis of Compound 1-1, except that Compound 1-3-e was used instead of Compound 1-1-b and Compound 1-3-c was used instead of 2-(dibenzo[b,d]furan-2-yl)-4,4,5,5-tetramethyl-1,3,2-dioxaborolane in (Preparation Example 1-c) (yield 32%, MS[M+H]$^+$=497).

Preparation Example 4: Synthesis of Compound 1-4

(Preparation Example 4) Synthesis of Compound 1-4-a

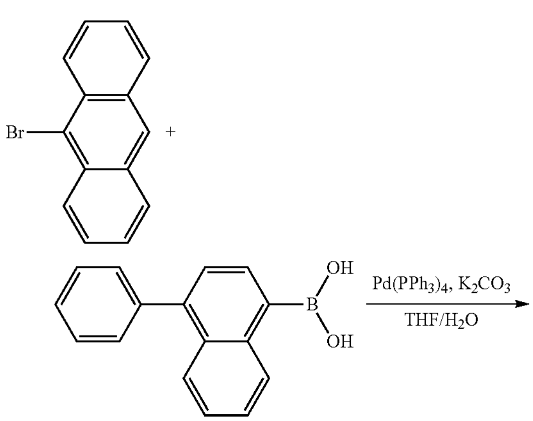

-continued

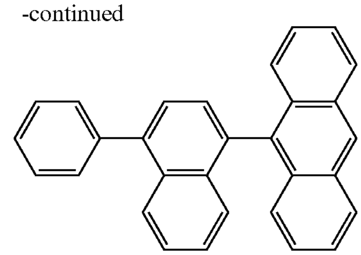

1-4-a 20.1 g of Compound 1-4-a was synthesized in the same manner as in the synthesis of Compound 1-1-a, except that (4-phenylnaphthalen-1-yl)boronic acid was used instead of naphthalene-2-yl boronic acid in (Preparation Example 1-a) (yield 68%, MS[M+H]$^+$=380).

(Preparation Example 4-b) Synthesis of Compound 1-4-b

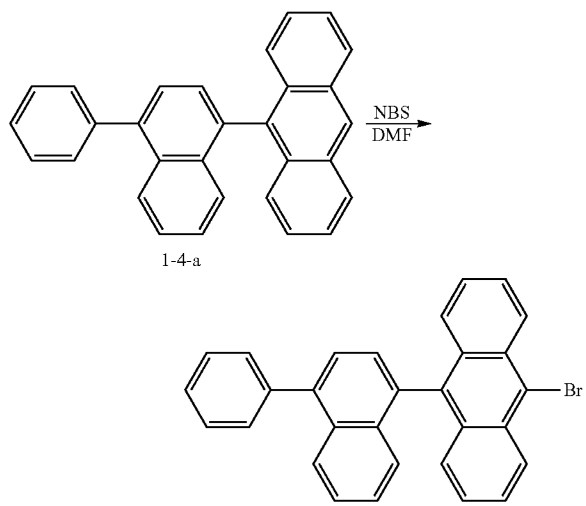

1-4-a 1-4-b 15.4 g of Compound 1-4-b was synthesized in the same runner as in the synthesis of Compound 1-1-b, except that Compound 1-4-a was used instead of Compound 1-1-a in (Preparation Example 1-b) (yield 85%, MS[M+H]$^+$=459).

(Preparation Example 4-c) Synthesis of Compound 1-4

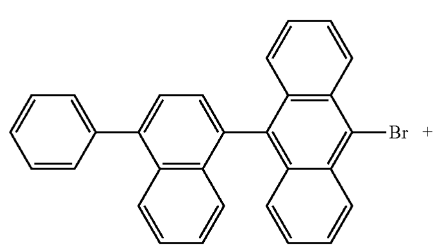

1-4-b

-continued

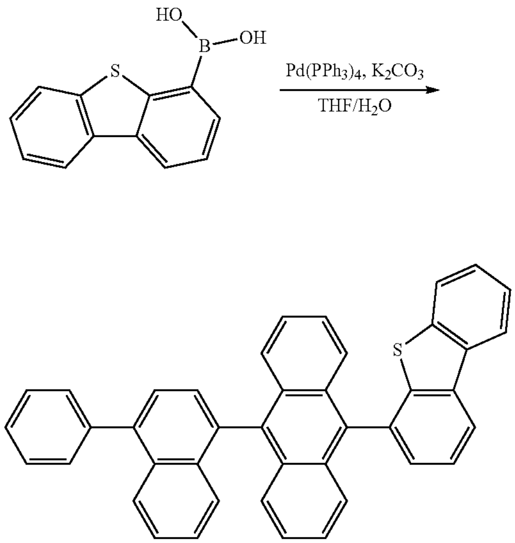

1-4

5.1 g of Compound 1-4 was synthesized in the same manner as in the synthesis of Compound 1-1, except that Compound 1-4-b was used instead of Compound 1-1-b and dibenzo[b,d]thiophen-4-ylboronic acid was used instead of 2-(dibenzo[b,d]furan-2-yl)-4,4,5,5-tetramethyl-1,3,2-dioxaborolane in (Preparation Example 1-c) (yield 28%, MS[M+H]$^+$=563).

Preparation Example 5: Synthesis of Compound 2-1

(Preparation Example 5-a) Synthesis of Compound 2-1-a

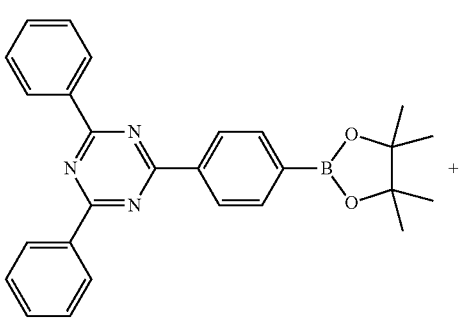

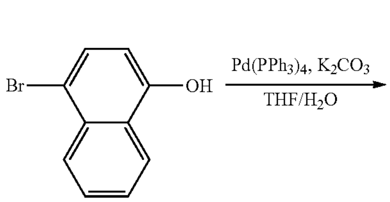

-continued

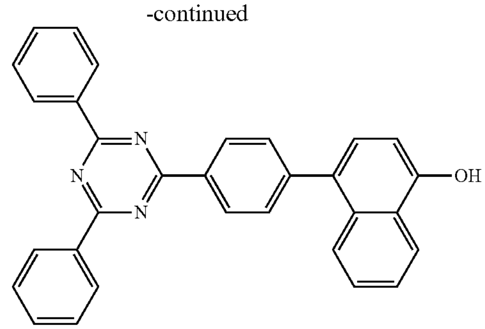

2-1-a

A solution of 4-bromonaphthalene-1-ol (20.0 g, 897 mmol) and 2,4-diphenyl-6-(4-(4,4,5,5-tetramethyl-1,3,2-dioxoborolan-2-yl)phenyl)-1,3,5-triazine (42.9 g, 98.6 mmol) dissolved in 300 mL of THF and $K_2CO_3$ (49.6 g, 358.6 mmol) dissolved in 150 mL of $H_2O$ was added to a three-necked flask. $Pd(PPh_3)_4$ (4.1 g, 3.6 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sample was purified by silica gel column chromatography to obtain 30.0 g of Compound 2-1-a (yield 74%, MS[M+H]$^+$=452).

(Preparation Example 5-b) Synthesis of Compound 2-1-b

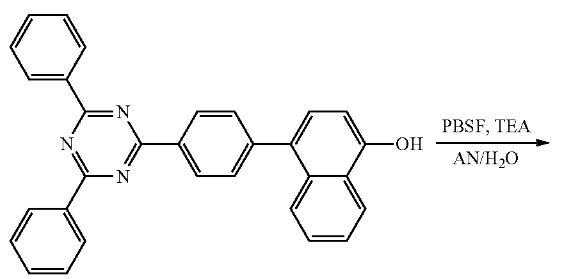

2-1-a

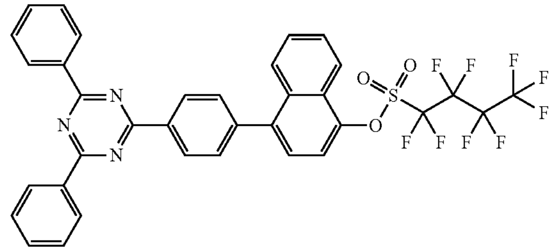

2-1-a

After Compound 2-1-a (30.0 g, 66.4 mmol) was dissolved in 840 ml of acetonitrile in a three-necked flask, triethylamine (15 ml, 106.3 mmol) and perfluoro-1-butanesulfonyl fluoride (18 ml, 99.7 mmol) were added thereto and the mixture was stirred at room temperature overnight. After completion of the reaction, the reaction mixture was diluted with ethyl acetate, transferred to a separatory funnel, washed with 0.5 M sodium hydrogen sulfite aqueous solution, and the organic layer was extracted. The extract was dried over $MgSO_4$, filtered, and concentrated. The sample was purified by silica gel column chromatography to obtain 29.7 g of Compound 2-1-b (yield 61%, MS[M+H]$^+$=734).

(Preparation Example 5-c) Synthesis of Compound 2-1

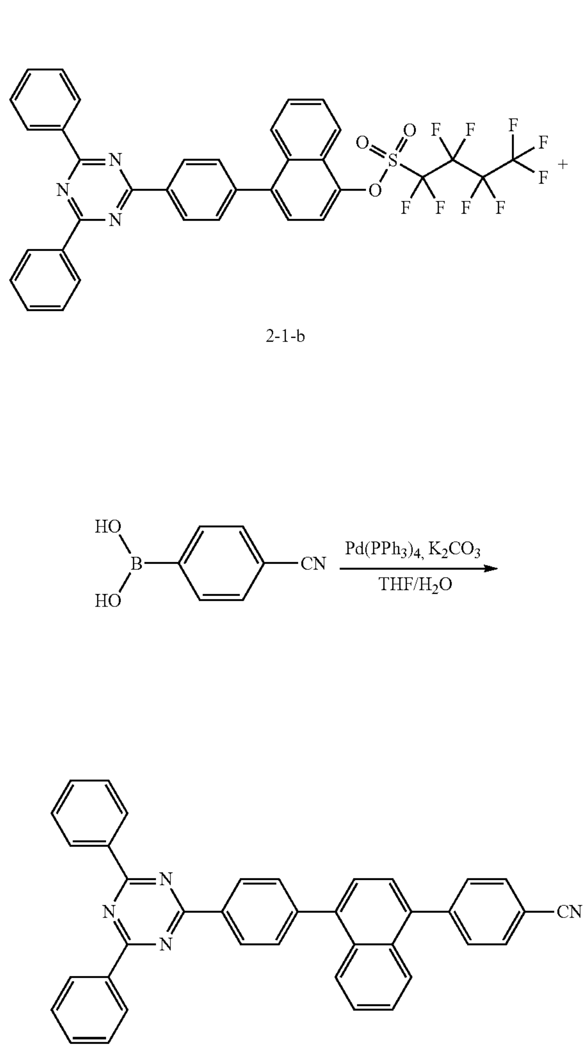

2-1-b 2-1

A solution of Compound 2-1-b (25.0 g, 34.1 mmol) and (4-cyanophenyl)boronic acid (5.5 g, 37.5 mmol) dissolved in 375 ml of THF and $K_2CO_3$ (18.8 g, 136.3 mmol) dissolved in 188 ml of $H_2O$ was added to a three-necked flask. $Pd(PPh_3)_4$ (1.6 g, 1.4 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sample was purified by silica gel column chromatography and then subjected to sublimation purification to obtain 5.7 g of Compound 2-1 (yield 31%, MS[M+H]$^+$=537).

Preparation Example 6: Synthesis of Compound 2-2

(Preparation Example 6-a) Synthesis of Compound 2-2-a

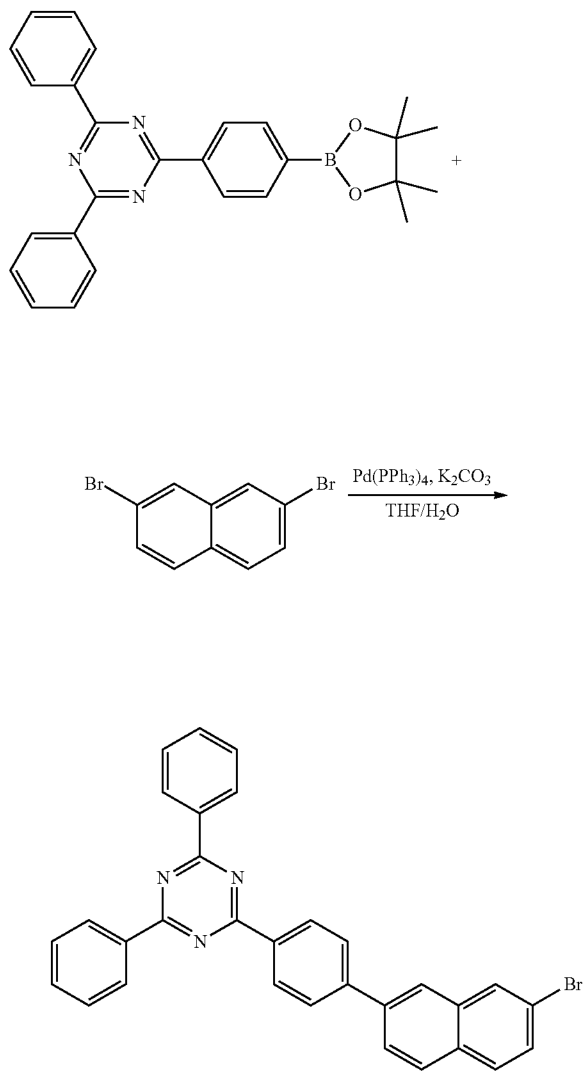

2-2-a

A solution of 2,7-dibromonaphthalene (20.0 g, 69.9 mmol) and 2,4-di phenyl-6-(4-(4,4,5,5-tetramethyl-dioxaborolan-2-yl)phenyl)-1,3,5-triazine (32.0 g, 73.4 mmol) dissolved in 300 ml of THF and $K_2CO_3$ (38.7 g, 279.7 mmol) dissolved 150 ml of $H_2O$ was added to a three-necked flask. $Pd(PPh_3)_4$ (4.1 g, 3.6 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sa p as purified by silica gel column chromatography to obtain 28.1 g of Compound 2-2-a (yield 78%, MS[M+H]$^+$=514).

(Preparation Example 6-b) Synthesis of Compound 2-2

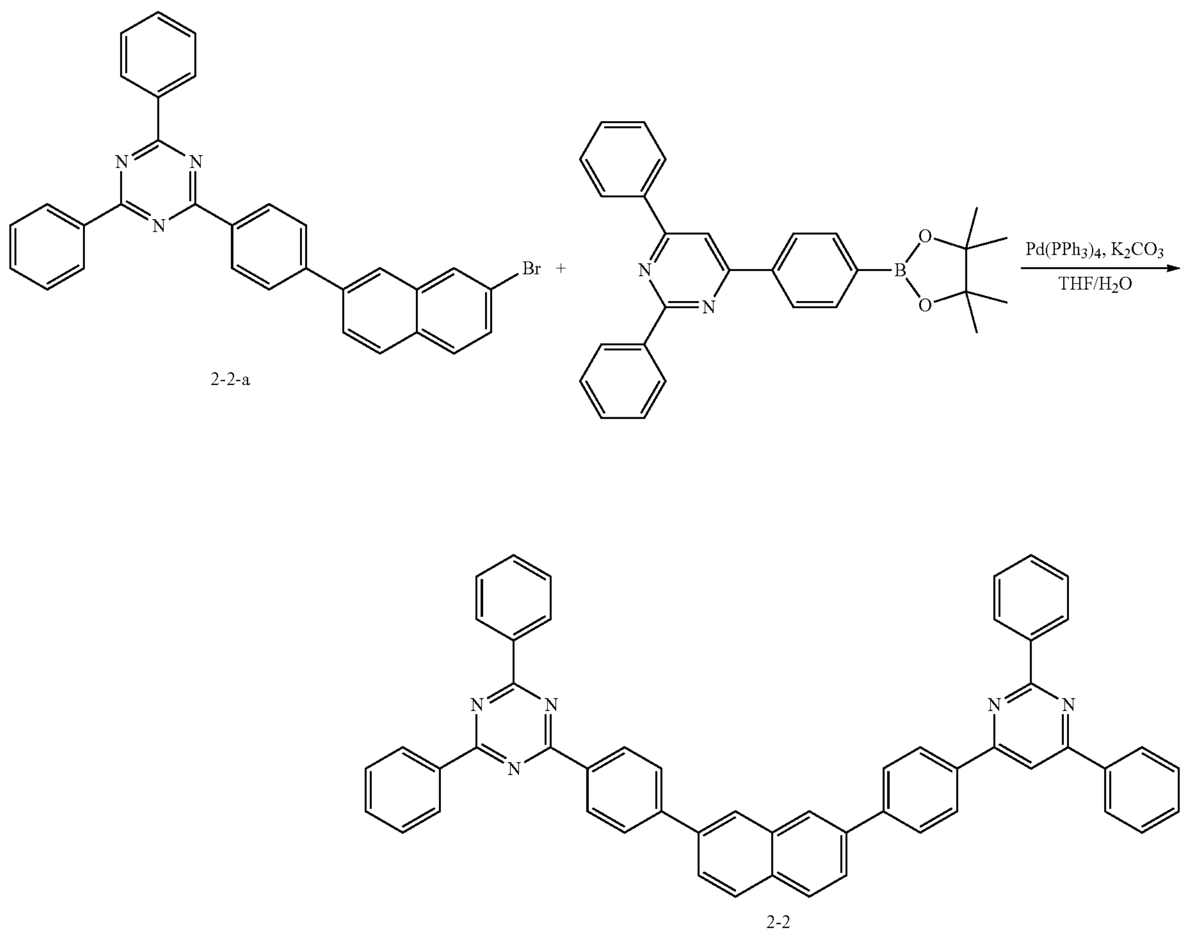

A solution of Compound 2-2-a (25.0 g, 48.6 mmol) and 2,4-diphenyl-6-(4-(4,4,5,5-tetramethyl-1,3,2-dioxaborolan-2-yl)phenyl)pyrimidine (23.2 g, 53.5 mmol) dissolved in 375 ml of THF and $K_2CO_3$ (26.9 g, 194.4 mmol) dissolved in 188 ml of $H_2O$ was added to a three-necked flask. $Pd(PPh_3)_4$ (2.2 g, 1.9 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sample was purified by silica gel column chromatography and then subjected to sublimation purification to obtain 9.7 g of Compound 2-2 (yield 28%, MS[M+H]$^+$=715).

Preparation Example 7: Synthesis of Compound 2-3

(Preparation Example 7-a) Synthesis of Compound 2-3-a

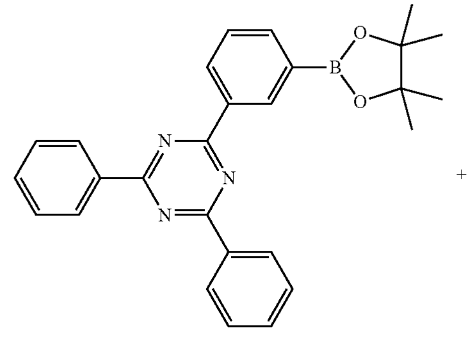

-continued

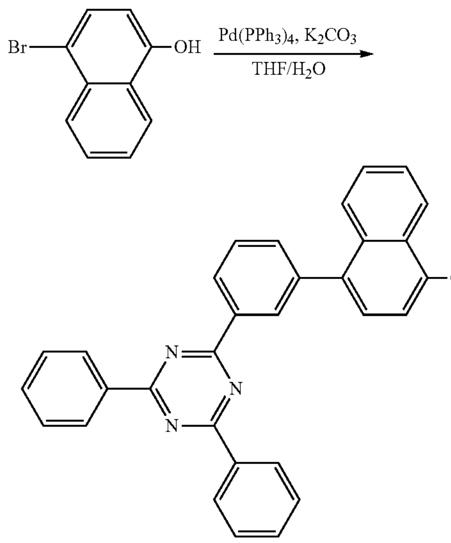

2-3-a 32.0 g of Compound 2-3-a was synthesized in the same manner as in the synthesis of Compound 2-1-a, except that 2,4-diphenyl-6-(3-(4,4,5,5-tetramethyl-1,3,2-dioxaborolan-2-yl)phenyl)-1,3,5-triazine was used instead of 2,4-diphenyl-6-(4-(4,4,5,5-tetramethyl-1,3,2-dioxaborolan-2-yl)phenyl)-1,3,5-triazine in (Preparation Example 5-a) (yield 79%, MS[M+H]$^+$=452).

(Preparation Example 7-b) Synthesis of Compound 2-3-b

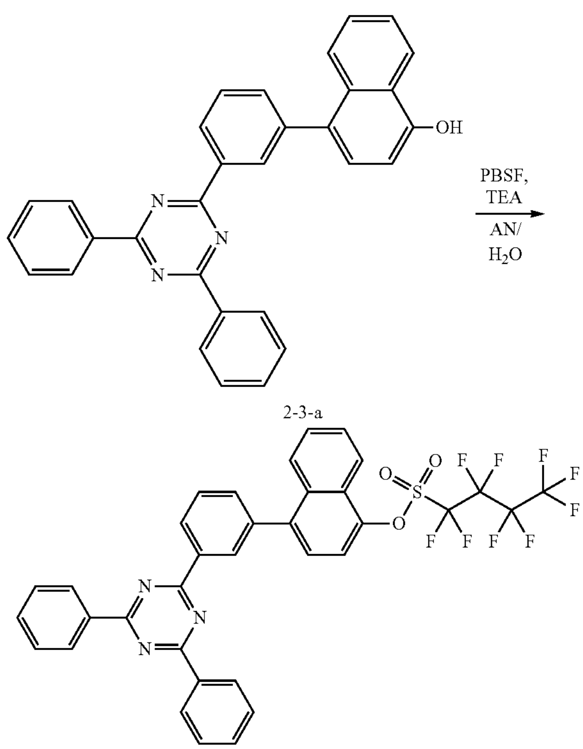

2-3-a 2-3-b 24.4 g of Compound 2-3-b was synthesized in the same manner as in the synthesis of Compound 2-1-b, except that Compound 2-3-a was used instead of Compound 2-1-a in (Preparation Example 5-b) (yield 53%, MS[M+H]$^+$=734).

(Preparation Example 7-c) Synthesis of Compound 2-3

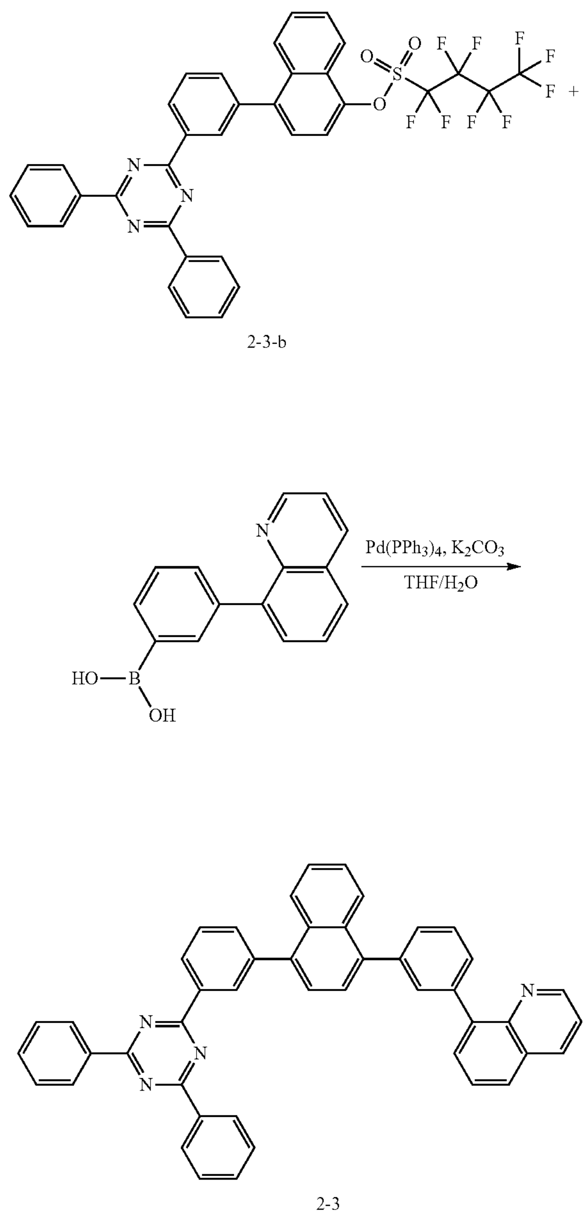

2-3-b 2-3

5.9 g of Compound 2-3 was synthesized in the same manner as in the synthesis of Compound 2-1, except that Compound 2-3-b was used instead of Compound 2-1-b and (4-(quinolin-8-yl)phenyl)boronic acid was used instead of (4-cyanophenyl)boronic acid in (Preparation Example 7-c) (yield 27%, MS[M+H]$^+$=639).

Preparation Example 8: Synthesis of Compound 2-4

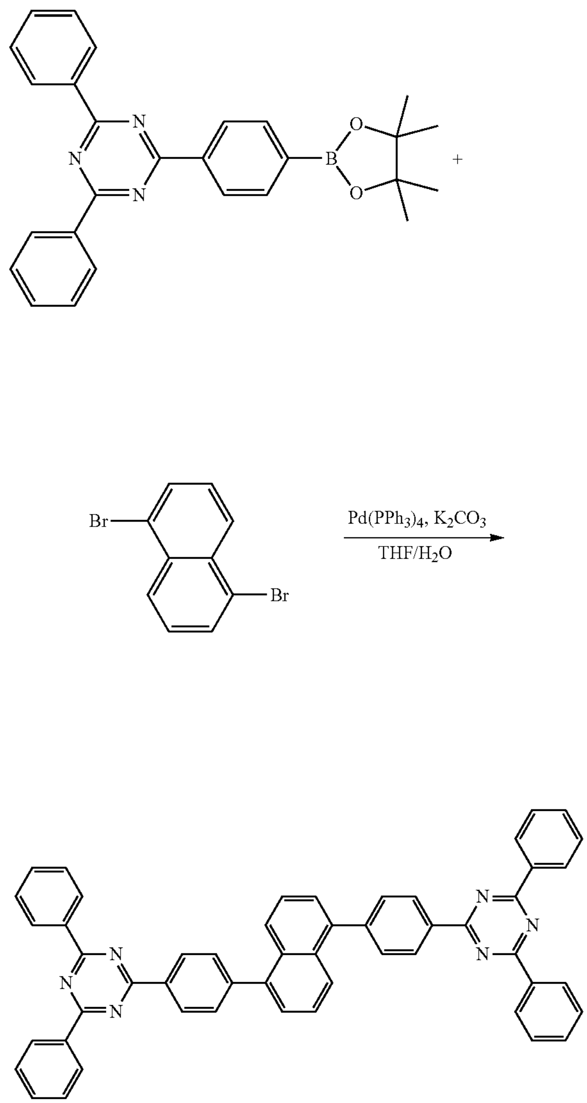

2-4

A solution of 1,5-dibromonaphthalene (25.0 g, 48.6 mmol) and 2,4-diphenyl-6-(4-(4,4,5,5-tetramethyl-1,3,2-dioxaborolan-2-yl)phenyl)-1,3,5-triazine (46.4 g, 106.9 mmol) dissolved in 500 ml of THF and $K_2CO_3$ (53.7 g, 388.8 mmol) dissolved in 250 ml of $H_2O$ was added to a three-necked flask. $Pd(PPh_3)_4$ (4.5 g, 3.9 mmol) was added thereto, and the mixture was stirred under reflux under an argon atmosphere for 8 hours. After completion of the reaction, the reaction solution was cooled to room temperature, transferred to a separatory funnel, and then extracted with water and ethyl acetate. The extract was dried over $MgSO_4$, filtered, and concentrated. The sample was purified by silica gel column chromatography and then subjected to sublimation purification to obtain 7.6 g of Compound 2-4 (yield 21%, $MS[M+H]^+=743$).

Preparation Example 9: Synthesis of Compound 2-5

(Preparation Example 9-a) Synthesis of Compound 2-5-a

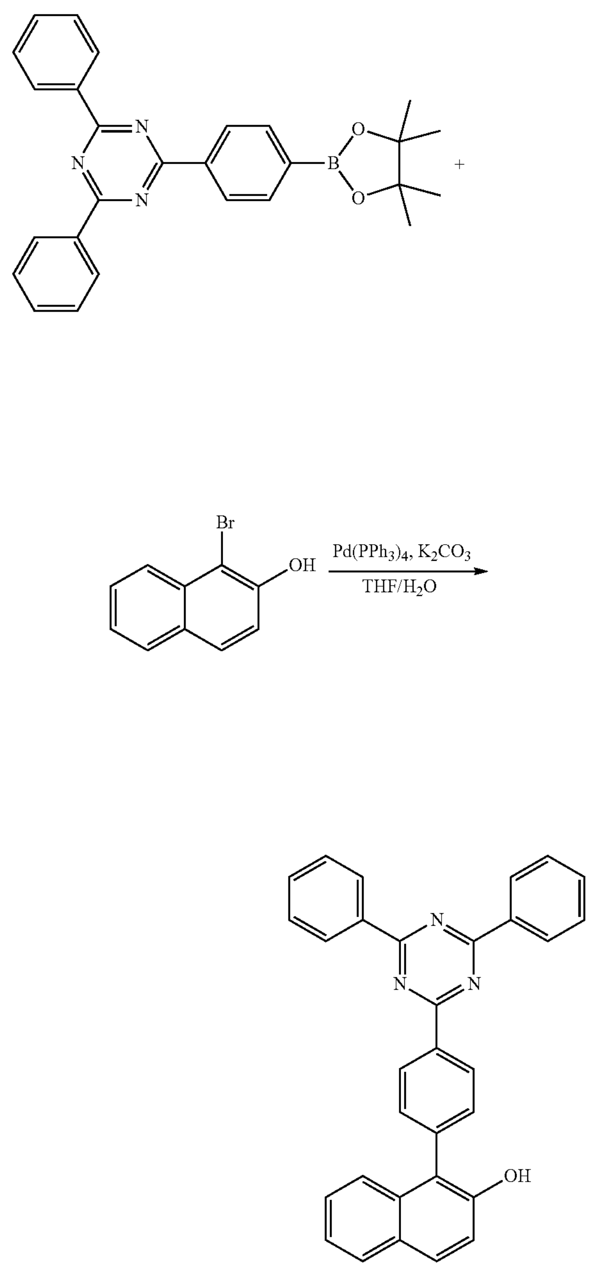

2-5-a 32.0 g of Compound 2-5-a was synthesized in the same manner as in the synthesis of Compound 2-1-a, except that 1-bromonaphthalene-2-ol was used instead of 4-bromonaphthalene-1-ol in (Preparation Example 5-a) (yield 72%, $MS[M+H]^+=452$).

(Preparation Example 9-b) Synthesis of Compound 2-5-b

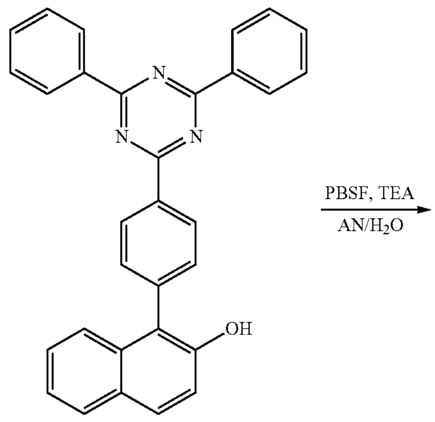

2-5-a

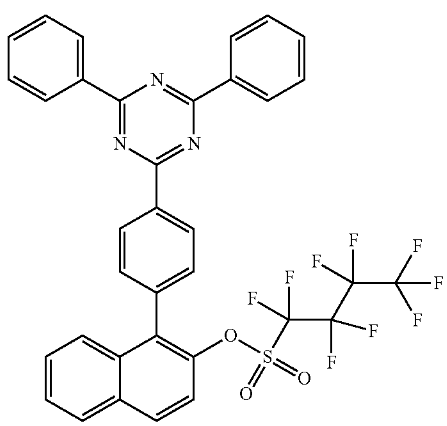

2-5-b 31.2 g of Compound 2-5-b was synthesized in the same manner as in the synthesis of Compound 2-1-b, except that Compound 2-5-a was used instead of Compound 2-1-a in (Preparation Example 5-b) (yield 64%, MS[M+H]$^+$=734).

(Preparation Example 9-c) Synthesis of Compound 2-5

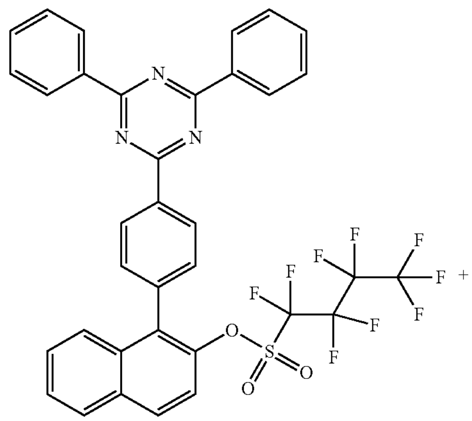

2-5-b

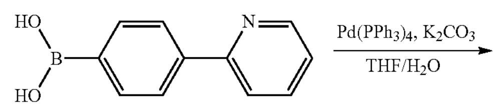

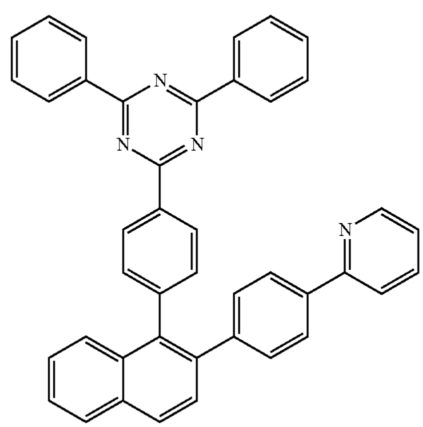

2-5

6.6 g of Compound 2-5 was synthesized in the same manner as in the synthesis of Compound 2-1, except that Compound 2-5-b was used instead of Compound 2-1-b and (4-(pyridin-2-yl)phenyl)boronic acid was used instead of (4-cyanophenyl)boronic acid in (Preparation Example 5-c) (yield 33%, MS[M+H]$^+$=589).

Preparation Example 10: Synthesis of Compound 2-6

(Preparation Example 10-a) Synthesis of Compound 2-6-a

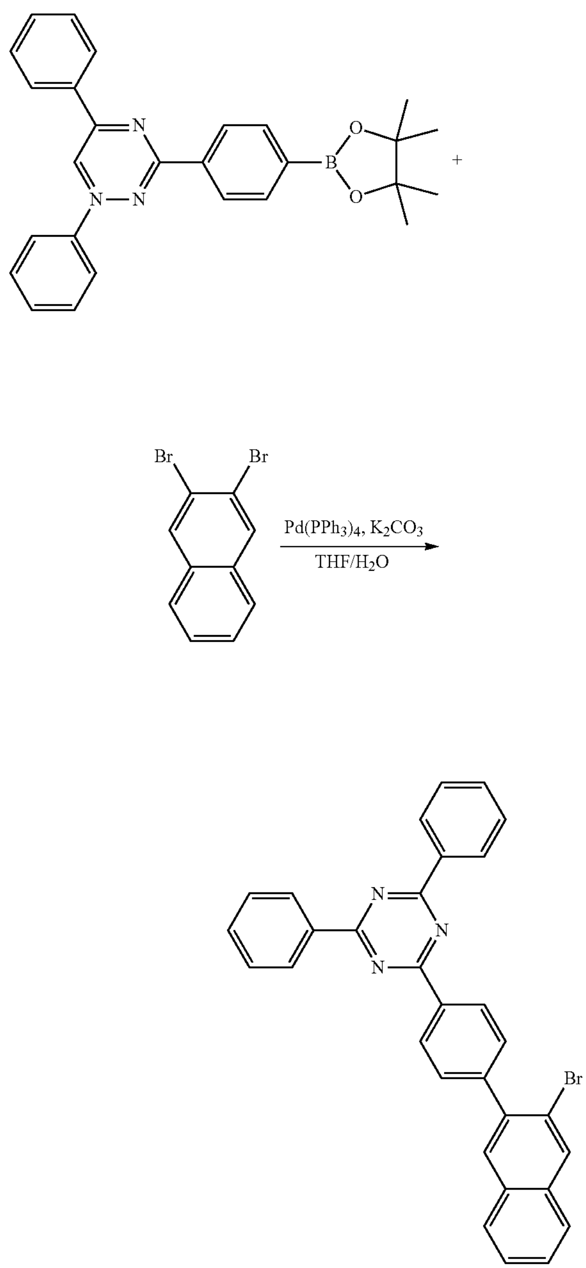

2-6-a 32.0 g of Compound 2-6-a was synthesized in the same manner as in the synthesis of Compound 2-2-a, except that 2,3-dibromonaphthalene was used instead of 2,7-dibromonaphthalene in (Preparation Example 6-a) (yield 79%, MS[M+H]$^+$=514).

(Preparation Example 10-b) Synthesis of Compound 2-6

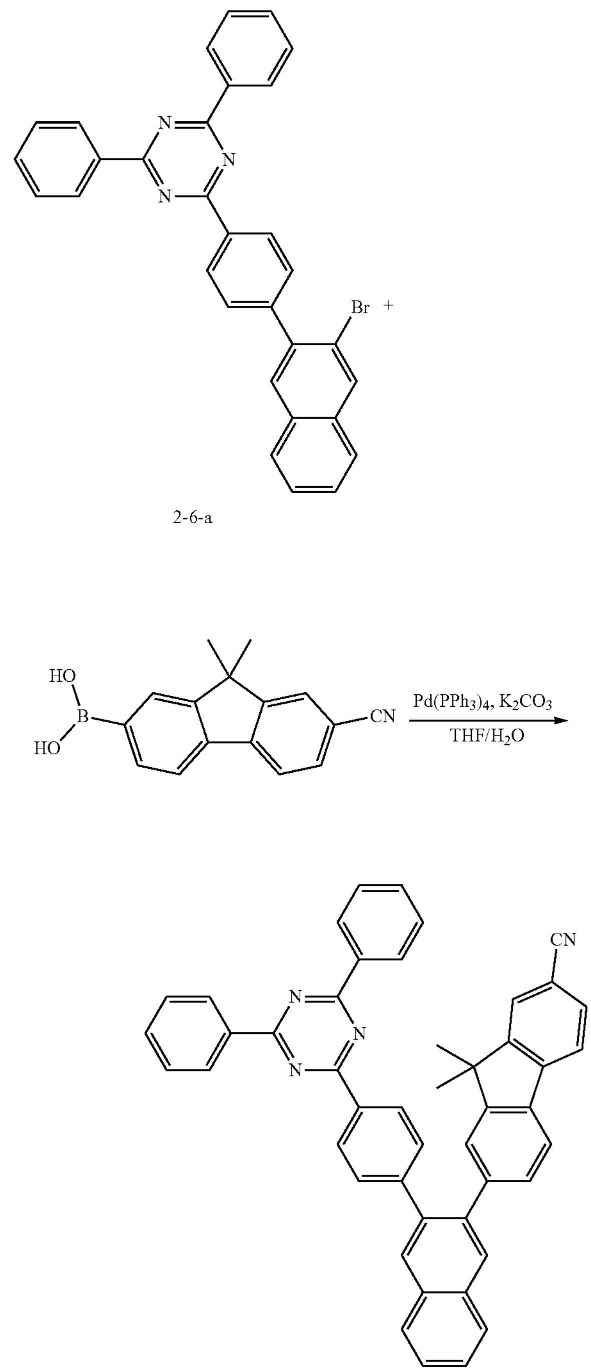

2-6

9.5 g of Compound 2-6 was synthesized in the same manner as in the synthesis of Compound 2-2, except that Compound 2-6-a was used instead of Compound 2-2-a and (7-cyano-9,9-dimethyl-9H-fluoren-2-yl)boronic acid was used instead of 2,4-diphenyl-6-(4-(4,4,5,5-tetramethyl-1,3,2-dioxaborolan-2-yl)phenyl)pyrimidine in (Preparation Example 6-b) (yield 30%, MS[M+H]$^+$=653).

Preparation Example 11: Synthesis of Compound 2-7

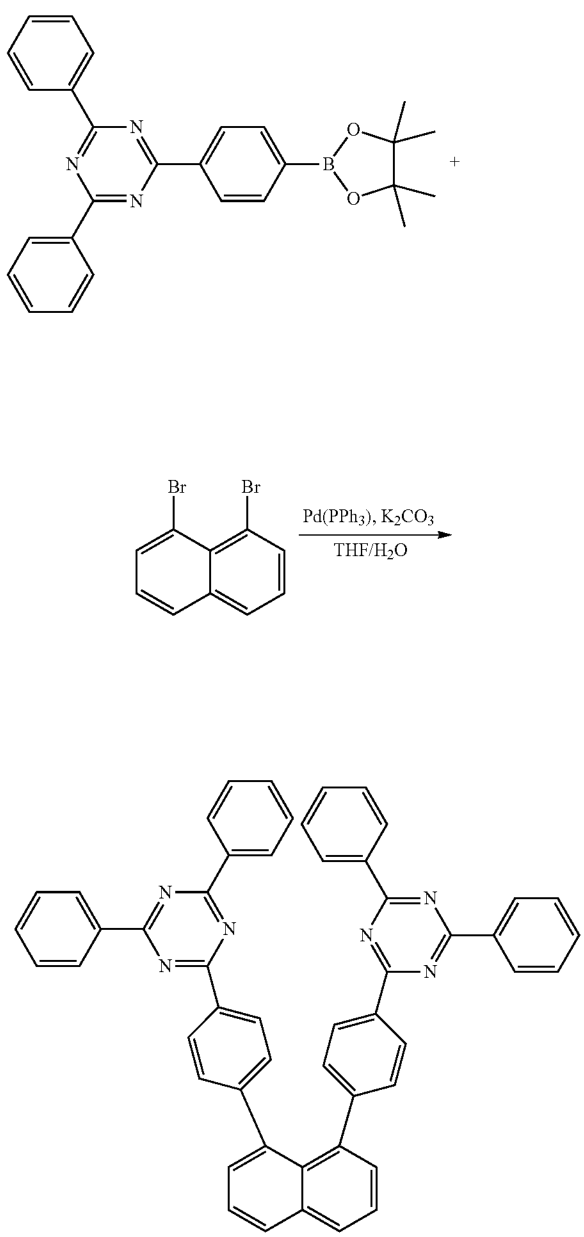

2-7

18.8 g of Compound 2-7 was synthesized in the same manner as in the synthesis of Compound 2-4, except that 1,8-dibromonaphthalene was used instead of 1,5-dibromonaphthalene in (Preparation Example 8) (yield 29%, MS[M+H]$^+$=743).

Example 1-1

A glass substrate on which a thin film of ITO (indium tin oxide) was coated in a thickness of 1400 Å was put into distilled water containing a detergent dissolved therein and washed with ultrasonic waves. In this case, the detergent used was a product commercially available from Fisher Co., and the distilled water was one which was filtered twice by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and a methanol solvent, and dried, after which it was transported to a plasma cleaner. Then, the substrate was cleaned with oxygen plasma for 5 minutes, and then transferred to a vacuum evaporator.

On the ITO transparent electrode thus prepared, a compound represented by Formula HI-A below and a compound represented by Formula HAT below were sequentially subjected to thermal vacuum-deposition in a thickness of 650 Å and 50 Å, respectively, to form a hole injection layer. A compound represented by Formula HT-A below was vacuum-deposited thereon hi a thickness of 600 Å as a hole transport layer, and then a compound represented by Formula HT-B below was thermally vacuum-deposited in a thickness of 50 Å as an electron blocking layer. Then, the Compound 1-1 (host) prepared in Preparation Example 1 and a compound (dopant) represented by Formula BD below were vacuum-deposited at a weight ratio of 96:4 as a light emitting layer in a thickness of 200 Å. Subsequently, the Compound 2-1 prepared in Preparation Example 5 and a compound represented by Formula Liq below were thermally vacuum-deposited at a weight ratio of 1:1 in a thickness of 360 Å as an electron transport layer, and then the compound represented by Formula Liq was vacuum-deposited in a thickness of 5 Å as an electron injection layer. Magnesium and silver were sequentially deposited at a weight ratio of 10:1 on the electron injection layer in a thickness of 220 Å, and aluminum was deposited in a thickness of 1000 Å to form a cathode, thereby preparing an organic light emitting device.

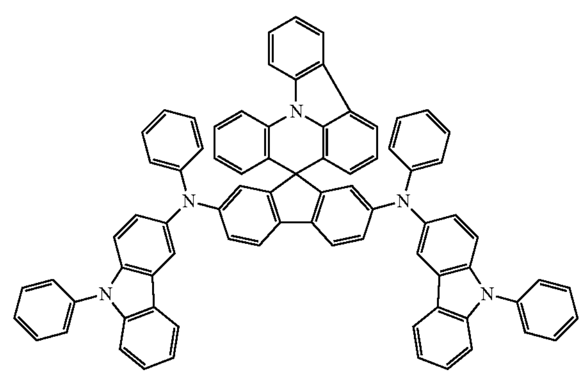

HI-A

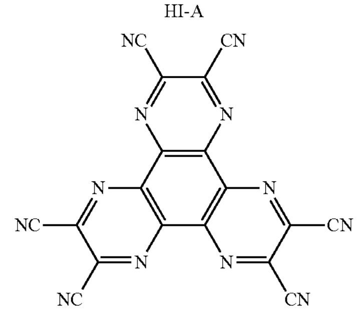

HAT

-continued

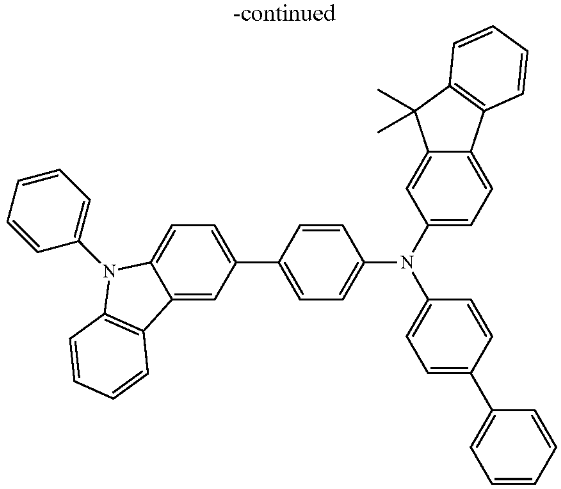

HT-A

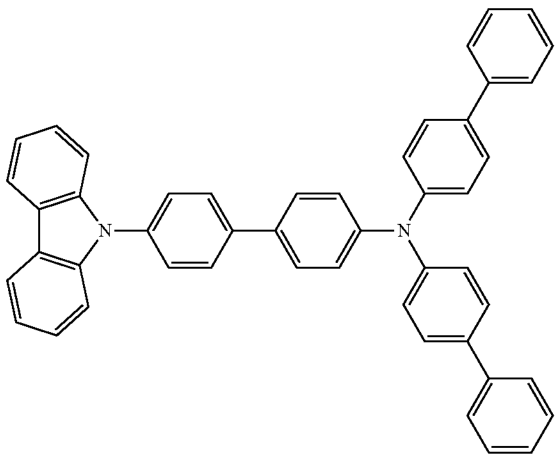

HT-B

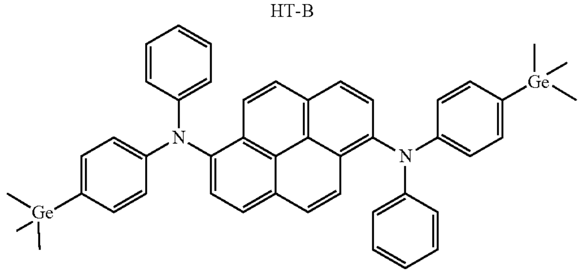

BD

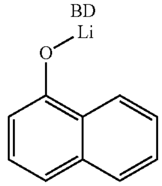

Liq

Examples 1-2 and Comparative Examples 1-1 to 1-11

The organic light emitting devices of Examples 1-2 to 1-16 and Comparative Examples 1-1 to 1-11 were respectively manufactured in the same manner as in Example 1-1, except that the Compound 1-1 as the host material, and the Compound 2-1 contained in the electron transport layer were changed as shown in Table 1 below.

TABLE 1

| | Host | Electron transport layer |
|---|---|---|
| Example 1-1 | Compound 1-1 | Compound 2-1 |
| Example 1-2 | Compound 1-1 | Compound 2-2 |
| Example 1-3 | Compound 1-1 | Compound 2-3 |
| Example 1-4 | Compound 1-1 | Compound 2-4 |
| Example 1-5 | Compound 1-2 | Compound 2-1 |
| Example 1-6 | Compound 1-2 | Compound 2-2 |
| Example 1-7 | Compound 1-2 | Compound 2-3 |
| Example 1-8 | Compound 1-2 | Compound 2-4 |
| Example 1-9 | Compound 1-3 | Compound 2-1 |
| Example 1-10 | Compound 1-3 | Compound 2-2 |
| Example 1-11 | Compound 1-3 | Compound 2-3 |
| Example 1-12 | Compound 1-3 | Compound 2-4 |
| Example 1-13 | Compound 1-4 | Compound 2-1 |
| Example 1-14 | Compound 1-4 | Compound 2-2 |
| Example 1-15 | Compound 1-4 | Compound 2-3 |
| Example 1-16 | Compound 1-4 | Compound 2-4 |
| Comparative Example 1-1 | BH-A | ET-A |
| Comparative Example 1-2 | BH-A | Compound 2-1 |
| Comparative Example 1-3 | BH-A | Compound 2-4 |
| Comparative Example 1-4 | BH-B | Compound 2-2 |
| Comparative Example 1-5 | Compound 1-1 | ET-A |
| Comparative Example 1-6 | Compound 1-1 | ET-D |
| Comparative Example 1-7 | Compound 1-2 | ET-B |
| Comparative Example 1-8 | Compound 1-3 | ET-C |
| Comparative Example 1-9 | Compound 1-4 | ET-D |
| Comparative Example 1-10 | BH-C | ET-C |
| Comparative Example 1-11 | BH-D | ET-E |

The respective compounds in Table 1 are as follows.

BH-A

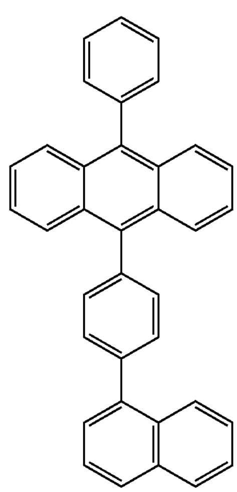

-continued
BH-B
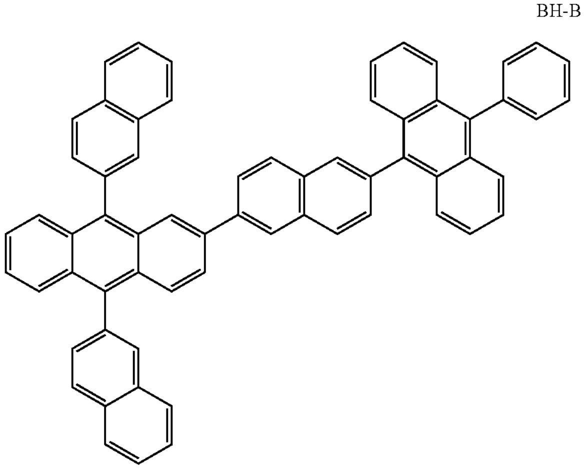
BH-C
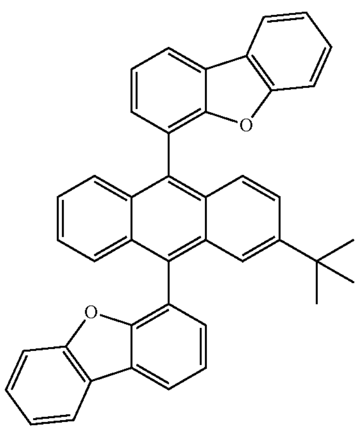
BH-D
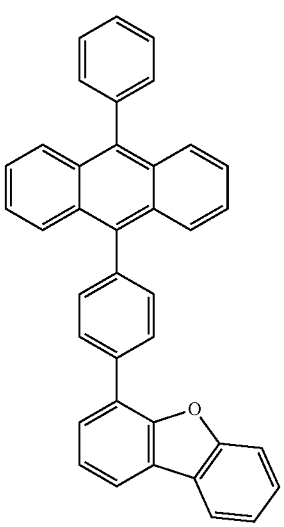
-continued
ET-A
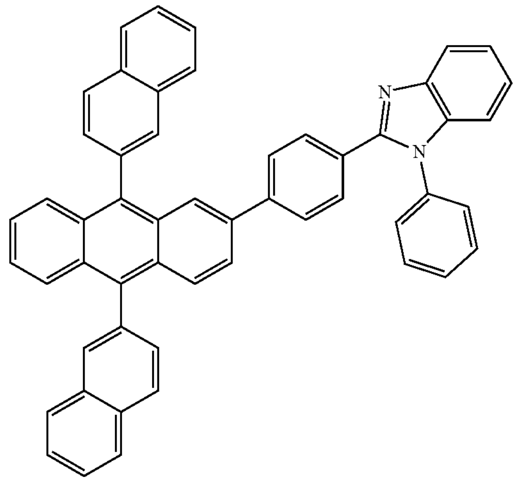
ET-B
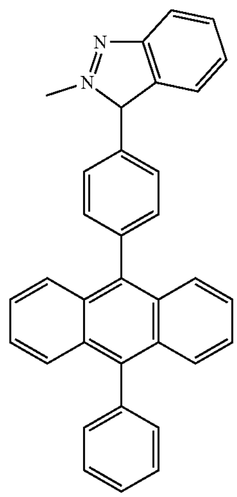
ET-C
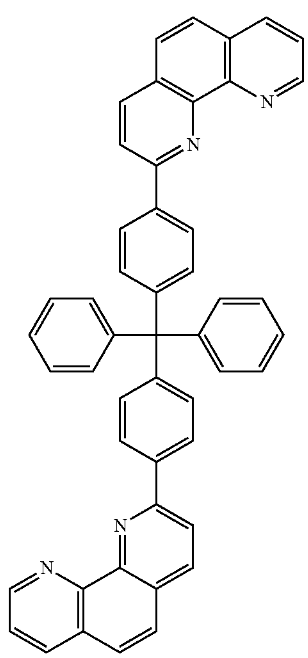

-continued

ET-D

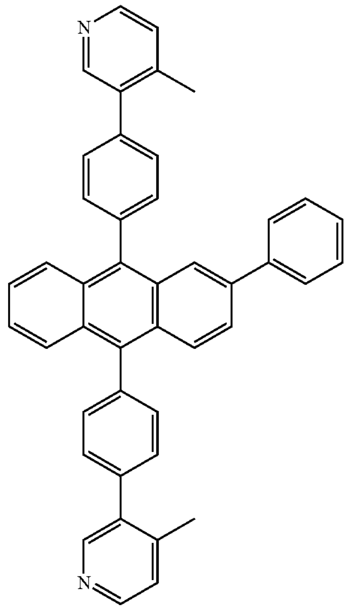

ET-E

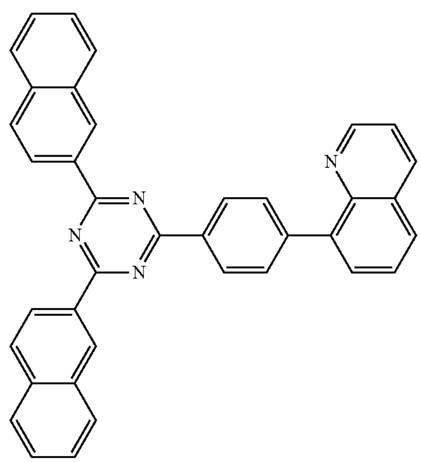

The voltage, efficiency, and color coordinates were measured at the current density of 10 mA/cm$^2$ for the organic light emitting devices manufactured in the examples and comparative examples, and the time (lifetime) required until the initial luminance was decreased by 90% at the current density of 20 mA/cm$^2$ was measured. The results are shown in Table 2 below.

TABLE 2

| | @ 10 mA/cm$^2$ | | | | @ 20 mA/cm$^2$ |
|---|---|---|---|---|---|
| | Voltage (V) | Efficiency (cd/A) | CIE-x | CIE-y | Lifetime ($T_{90}$, h) |
| Example 1-1 | 3.78 | 5.27 | 0.138 | 0.131 | 151 |
| Example 1-2 | 3.82 | 5.28 | 0.138 | 0.130 | 148 |
| Example 1-3 | 3.88 | 5.26 | 0.139 | 0.130 | 161 |
| Example 1-4 | 3.83 | 5.29 | 0.138 | 0.129 | 147 |
| Example 1-5 | 3.91 | 5.21 | 0.139 | 0.131 | 150 |
| Example 1-6 | 3.98 | 5.27 | 0.137 | 0.130 | 152 |
| Example 1-7 | 3.93 | 5.21 | 0.138 | 0.132 | 161 |
| Example 1-8 | 3.91 | 5.28 | 0.138 | 0.130 | 158 |
| Example 1-9 | 3.88 | 5.26 | 0.137 | 0.130 | 146 |
| Example 1-10 | 3.72 | 5.23 | 0.138 | 0.130 | 152 |
| Example 1-11 | 3.83 | 5.24 | 0.138 | 0.130 | 156 |
| Example 1-12 | 3.87 | 5.12 | 0.139 | 0.130 | 141 |
| Example 1-13 | 3.91 | 5.18 | 0.138 | 0.131 | 147 |
| Example 1-14 | 3.95 | 5.19 | 0.138 | 0.130 | 138 |
| Example 1-15 | 4.06 | 5.14 | 0.138 | 0.130 | 129 |
| Example 1-16 | 4.05 | 5.11 | 0.138 | 0.129 | 131 |
| Comparative Example 1-1 | 4.54 | 4.87 | 0.138 | 0.130 | 100 |
| Comparative Example 1-2 | 4.67 | 4.65 | 0.138 | 0.132 | 50 |
| Comparative Example 1-3 | 4.67 | 4.51 | 0.138 | 0.130 | 53 |
| Comparative Example 1-4 | 4.85 | 3.15 | 0.137 | 0.130 | 21 |
| Comparative Example 1-5 | 3.93 | 4.18 | 0.140 | 0.131 | 75 |
| Comparative Example 1-6 | 3.85 | 4.08 | 0.139 | 0.130 | 80 |
| Comparative Example 1-7 | 3.91 | 4.15 | 0.139 | 0.131 | 83 |
| Comparative Example 1-8 | 3.88 | 3.98 | 0.138 | 0.132 | 68 |
| Comparative Example 1-9 | 3.99 | 3.79 | 0.141 | 0.131 | 35 |
| Comparative Example 1-10 | 4.09 | 4.53 | 0.137 | 0.130 | 5 |
| Comparative Example 1-11 | 4.08 | 4.36 | 0.138 | 0.130 | 30 |

As shown in Table 2, the compounds represented by Chemical Formula 1 of the present invention are advantageous for the injection of holes into the light emitting layer, and exhibit low voltage characteristics when used as host materials. Also, the compounds represented by Chemical Formula 2 have excellent electron injecting characteristics and excellent electron transporting characteristics, and when applied to an electron transport layer, a device with low voltage and high efficiency can be obtained. Particularly, when both of them are applied at the same time, it can be confirmed that the injection balance of the hole and electron in the light emitting layer is well matched, so that it has remarkable effects not only in terms of voltage and efficiency, but also of lifetime.

Example 2-1

A glass substrate on which a thin film of ITO (indium tin oxide) was coated in a thickness of 1400 Å was put into distilled water containing the detergent dissolved therein and washed with ultrasonic waves. In this case, the detergent used was a product commercially available from Fisher Co., and the distilled water was one which was filtered twice by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and methanol solvent, and dried, after which it was transported to a plasma cleaner. Then, the substrate was cleaned with oxygen plasma for 5 minutes, and then transferred to a vacuum evaporator.

On the ITO transparent electrode thus prepared, a compound represented by Formula HI-A below and a compound represented by Formula HAT below were sequentially subjected to thermal vacuum-deposition in a thickness of 650 Å and 50 Å, respectively, to form a hole injection layer. A compound represented by Formula HT-A below was vacuum-deposited thereon in a thickness of 600 Å as a hole transport layer, and then a compound represented by Formula HT-B below was thermally vacuum-deposited in a thickness of 50 Å as an electron blocking layer. Then, the Compound 1-1 (host) prepared in Preparation Example 1 and a compound (dopant) represented by Formula BD below were vacuum-deposited at a weight ratio of 96:4 as a light emitting layer in a thickness of 200 Å. Then, the Compound 2-1 prepared in Preparation Example 5 was vacuum-deposited as a hole blocking layer in a thickness of 50 Å. A compound represented by Formula ET-A below and a compound represented by Formula Liq below was thermally vacuum-deposited at a weight ratio of 1:1 on the hole blocking layer in a thickness of 310 Å to form an electron transport layer, and then a compound represented by Formula Liq below was vacuum-deposited in a thickness of 5 Å to form an electron injection layer. Magnesium and silver were sequentially deposited at a weight ratio of 10:1 on the electron injection layer in a thickness of 220 Å, and aluminum was deposited in a thickness of 1000 Å to form a cathode, thereby preparing an organic light emitting device

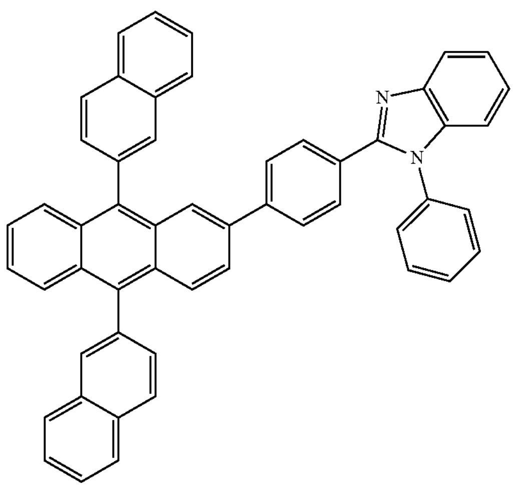

ET-A

Examples 2-2 to Comparative Examples 2-1 to 2-8

The organic light emitting devices of Examples 2-2 to 2-16 and Comparative Examples 2-1 to 2-8 were respectively manufactured in the same manner as in Example 2-1, except that Compound 1-1 as a host material and Compound 2-1 as a hole blocking layer material were changed as shown in Table 3 below.

TABLE 3

| Example | Host | Hole blocking layer |
|---|---|---|
| Example 2-1 | Compound 1-1 | Compound 2-1 |
| Example 2-2 | Compound 1-1 | Compound 2-5 |
| Example 2-3 | Compound 1-1 | Compound 2-6 |
| Example 2-4 | Compound 1-1 | Compound 2-7 |
| Example 2-5 | Compound 1-2 | Compound 2-1 |
| Example 2-6 | Compound 1-2 | Compound 2-5 |
| Example 2-7 | Compound 1-2 | Compound 2-6 |
| Example 2-8 | Compound 1-2 | Compound 2-7 |
| Example 2-9 | Compound 1-3 | Compound 2-1 |
| Example 2-10 | Compound 1-3 | Compound 2-5 |
| Example 2-11 | Compound 1-3 | Compound 2-6 |
| Example 2-12 | Compound 1-3 | Compound 2-7 |
| Example 2-13 | Compound 1-4 | Compound 2-1 |
| Example 2-14 | Compound 1-4 | Compound 2-5 |
| Example 2-15 | Compound 1-4 | Compound 2-6 |
| Example 2-16 | Compound 1-4 | Compound 2-7 |
| Comparative Example 2-1 | BH-A | Compound 2-1 |
| Comparative Example 2-2 | BH-B | Compound 2-7 |
| Comparative Example 2-3 | BH-C | Compound 2-6 |
| Comparative Example 2-4 | Compound 1-1 | ET-A |
| Comparative Example 2-5 | Compound 1-1 | HB-A |
| Comparative Example 2-6 | Compound 1-2 | HB-B |
| Comparative Example 2-7 | Compound 1-3 | HB-C |
| Comparative Example 2-8 | BH-D | HB-C |

The respective compounds in Table 3 are as follows.

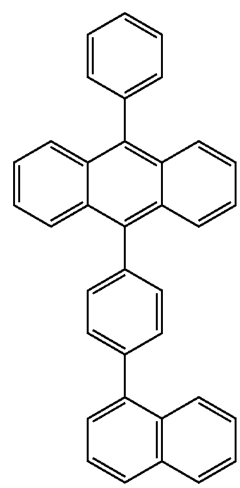

BH-A

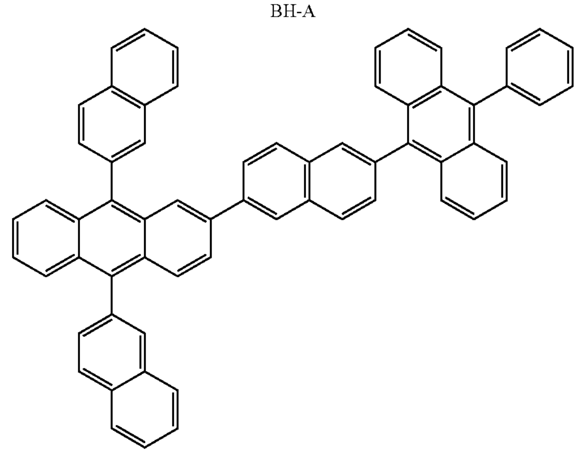

BH-B

-continued

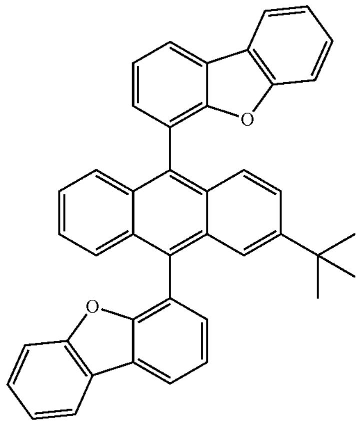

BH-C

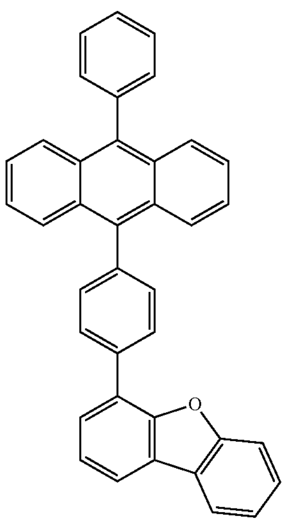

BH-D

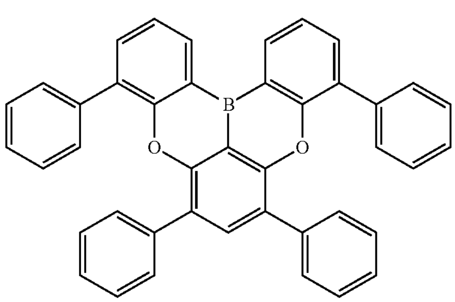

HB-A

-continued

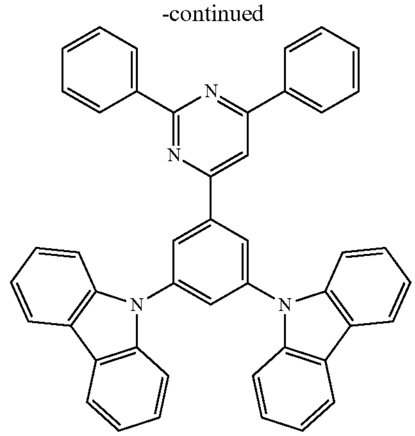

HB-B

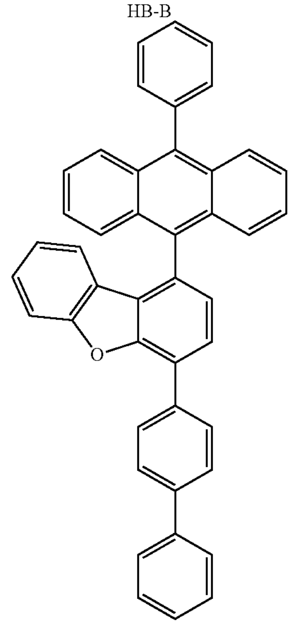

HB-C

The voltage, efficiency, and color coordinates were measured at the current density of 10 mA/cm$^2$ for the organic light emitting devices manufactured in the examples and comparative examples, and the time (lifetime) required until the initial luminance was decreased by 90% at the current density of 20 mA/cm$^2$ was measured. The results are shown in Table 4 below.

TABLE 4

| | @ 10 mA/cm$^2$ | | | | @ 20 mA/cm$^2$ |
|---|---|---|---|---|---|
| | V | cd/A | CIE-x | CIE-y | Lifetime (h) |
| Example 2-1 | 3.57 | 5.21 | 0.138 | 0.130 | 150 |
| Example 2-2 | 3.61 | 5.15 | 0.138 | 0.129 | 141 |
| Example 2-3 | 3.52 | 5.03 | 0.138 | 0.130 | 148 |
| Example 2-4 | 3.63 | 5.18 | 0.139 | 0.130 | 163 |
| Example 2-5 | 3.58 | 5.11 | 0.137 | 0.130 | 144 |
| Example 2-6 | 3.51 | 5.27 | 0.139 | 0.131 | 158 |
| Example 2-7 | 3.68 | 5.05 | 0.138 | 0.130 | 153 |
| Example 2-8 | 3.51 | 5.10 | 0.138 | 0.131 | 151 |
| Example 2-9 | 3.68 | 5.17 | 0.138 | 0.129 | 142 |
| Example 2-10 | 3.53 | 5.19 | 0.138 | 0.130 | 158 |
| Example 2-11 | 3.57 | 5.03 | 0.138 | 0.130 | 159 |
| Example 2-12 | 3.65 | 5.05 | 0.137 | 0.129 | 154 |

TABLE 4-continued

| | @ 10 mA/cm² | | | | @ 20 mA/cm² |
|---|---|---|---|---|---|
| | V | cd/A | CIE-x | CIE-y | Lifetime (h) |
| Example 2-13 | 3.67 | 5.21 | 0.138 | 0.130 | 132 |
| Example 2-14 | 3.59 | 5.27 | 0.138 | 0.130 | 146 |
| Example 2-15 | 3.72 | 5.12 | 0.139 | 0.130 | 129 |
| Example 2-16 | 3.76 | 5.23 | 0.137 | 0.130 | 155 |
| Comparative Example 2-1 | 4.75 | 4.83 | 0.138 | 0.130 | 80 |
| Comparative Example 2-2 | 4.87 | 4.78 | 0.140 | 0.134 | 80 |
| Comparative Example 2-3 | 4.78 | 4.01 | 0.142 | 0.132 | 37 |
| Comparative Example 2-4 | 3.75 | 4.28 | 0.139 | 0.130 | 76 |
| Comparative Example 2-5 | 3.73 | 4.38 | 0.139 | 0.141 | 61 |
| Comparative Example 2-6 | 3.79 | 4.51 | 0.138 | 0.132 | 84 |
| Comparative Example 2-7 | 3.69 | 4.10 | 0.137 | 0.129 | 57 |
| Comparative Example 2-8 | 4.81 | 3.15 | 0.138 | 0.130 | 10 |

As shown in Table 4, it is confirmed that, when the compounds represented by Chemical Formula 1 of the present invention are used as a host material and the compound represented by Chemical Formula 2 is used in combination as a hole blocking material, the organic light emitting devices exhibit remarkable effects in terms of voltage, efficiency, and lifetime. That is, it is confirmed that the voltage, efficiency, and lifetime are improved not only when the compounds represented by Chemical Formula 2 of the present invention were used as an electron transport layer but also when they are applied as a hole blocking layer.

DESCRIPTION OF SYMBOLS

1: substrate, 2: anode,
3: light emitting layer
4: electron transport region,
5: cathode, 6: hole blocking layer
7: electron transport layer
8: hole transport layer,

What is claimed is:

1. An organic light emitting device comprising:
an anode;
a cathode;
a light emitting layer disposed between the anode and the cathode; and
an electron transport region between the cathode and the light emitting layer,
wherein the light emitting layer includes a compound represented by Chemical Formula 1, and
the electron transport region includes a compound represented by Chemical Formula 2:

[Chemical Formula 1]

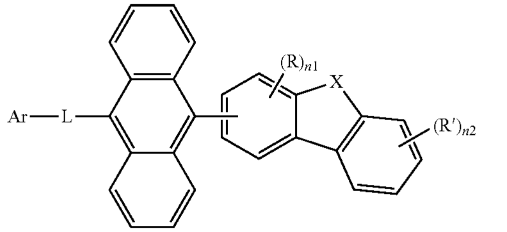

in Chemical Formula 1,
X is O or S,
L is a bond; or a substituted or unsubstituted $C_{6-60}$ arylene,
Ar is a substituted or unsubstituted $C_{6-60}$ aryl,
R and R' are each independently hydrogen; deuterium; a halogen; a cyano; a nitro; an amino: a substituted or unsubstituted $C_{1-60}$ alkyl; a substituted or unsubstituted $C_{3-60}$ cycloalkyl; a substituted or unsubstituted $C_{2-60}$ alkenyl group; a substituted or unsubstituted $C_{6-60}$ aryl; or a substituted or unsubstituted $C_{2-60}$ heteroaryl containing at least one heteroatom selected from the group consisting of N, O, and S,
n1 is an integer of 0 to 3, and
n2 is an integer of 0 to 4,

[Chemical Formula 2]

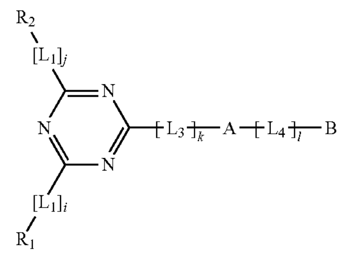

in Chemical Formula 2,
$R_1$ and $R_2$ are each independently a substituted or unsubstituted $C_{6-60}$ aryl, or a substituted or unsubstituted $C_{2-60}$ heteroaryl containing at least one heteroatom selected from the group consisting of N, O, and S,
$L_1$, $L_2$, $L_3$, and $L_4$ are each independently a bond; or a substituted or unsubstituted $C_{6-60}$ arylene,
A is a substituted or unsubstituted naphthylene,
B is phenyl substituted with a cyano group, dimethylfluorenyl substituted with a cyano group, pyridinyl, pyrazinyl, pyrimidinyl, pyridazinyl, isoindolyl, indazolyl, quinolinyl, isoquiriolinyl, benzoquinolinyl, quinoxalinyl, quinazolinyl, phthalazinyl or triazinyl substituted with phenyl, and
i, j, k, and l are each independently 0 or 1.

2. The organic light emitting device of claim 1, wherein L is a bond, phenylene, biphenylene, or naphthylene.

3. The organic light emitting device of claim 1, wherein Ar is phenyl, biphenylyl, terphenylyl, naphthyl, or phenanthrenyl.

4. The organic light emitting device of claim 1, wherein R and R' are each independently hydrogen, deuterium, phenyl, biphenylyl, or naphthyl.

5. The organic light emitting device of claim 1, wherein the compound represented by Chemical Formula 1 is any one selected from the group consisting of:

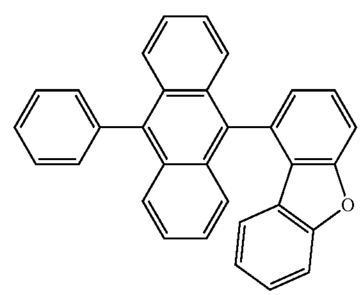

-continued
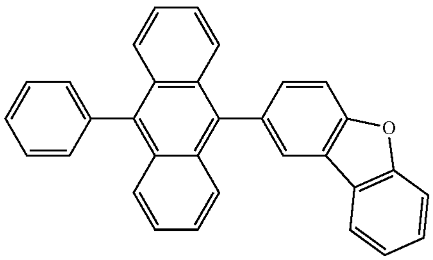
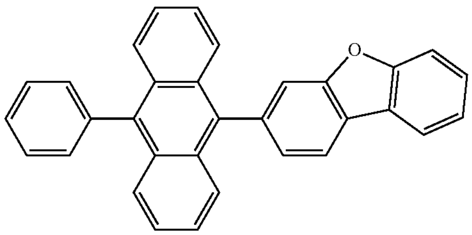
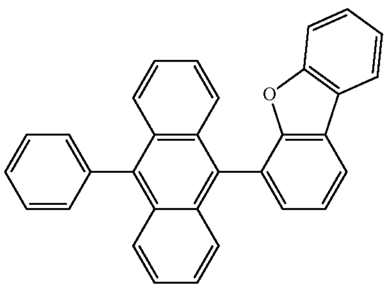
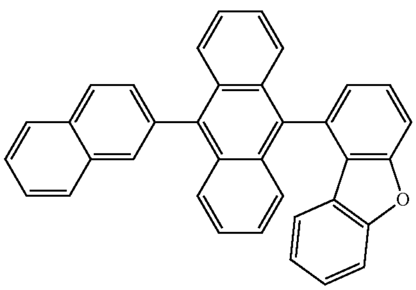
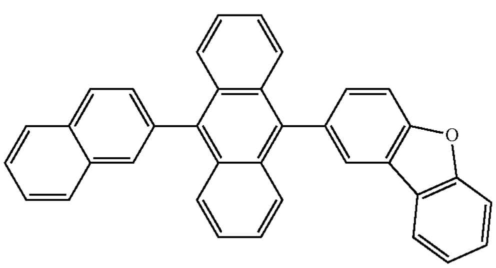
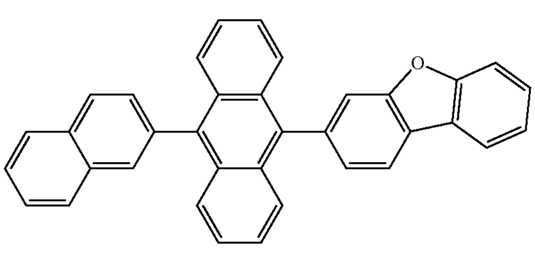
-continued
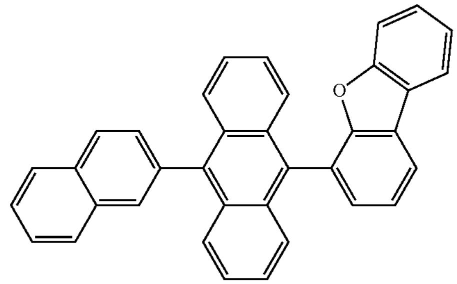
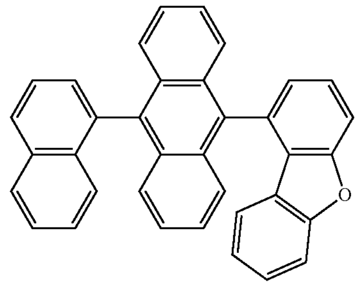
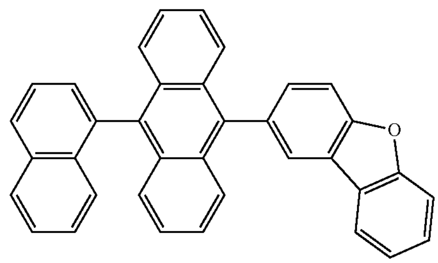
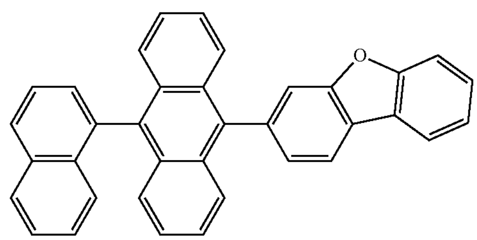
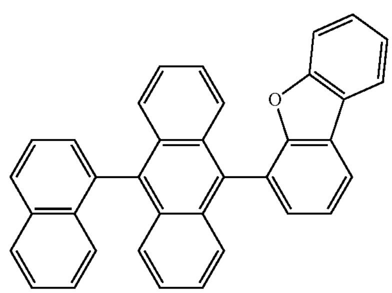
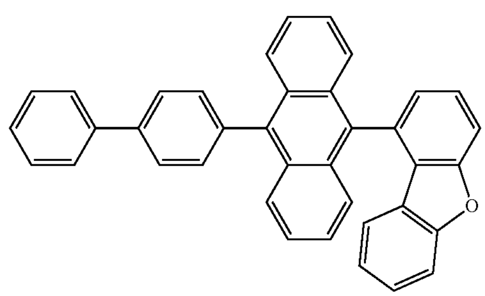

-continued
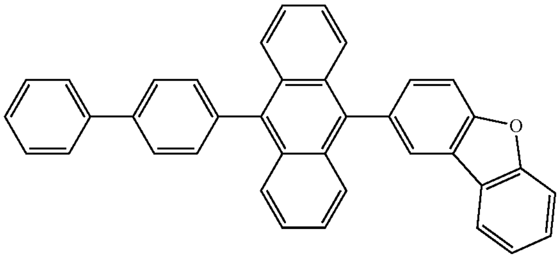
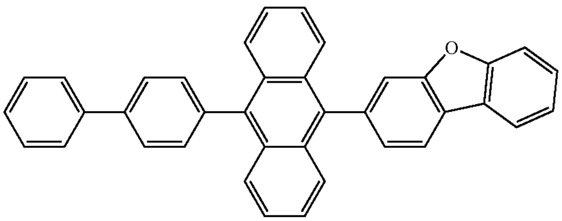
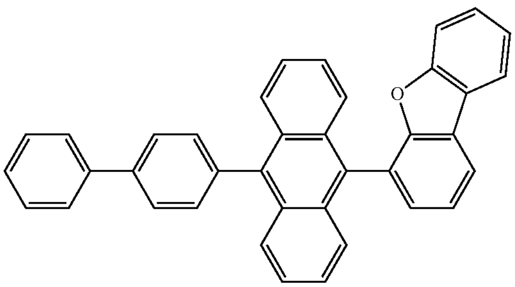
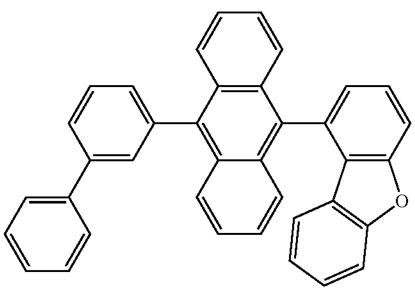
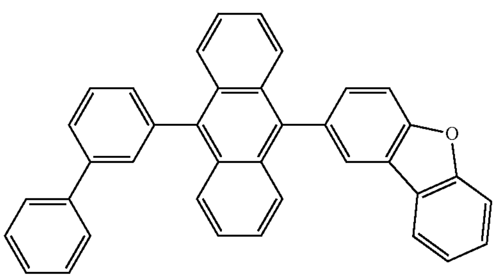
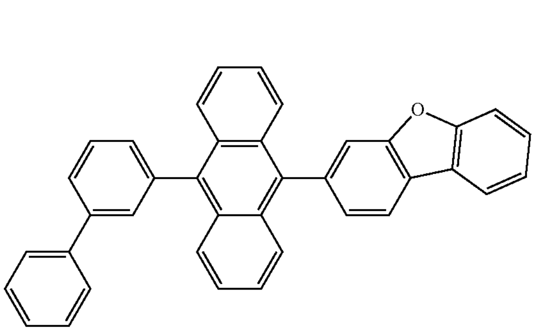
-continued
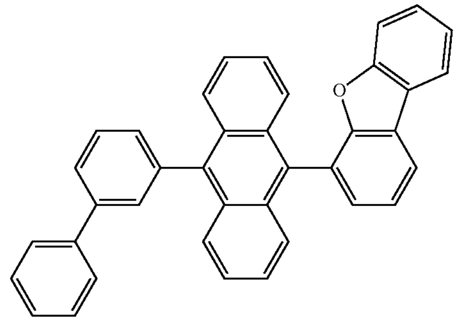
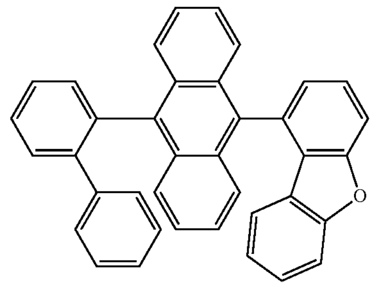
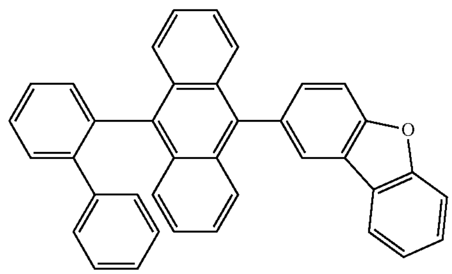
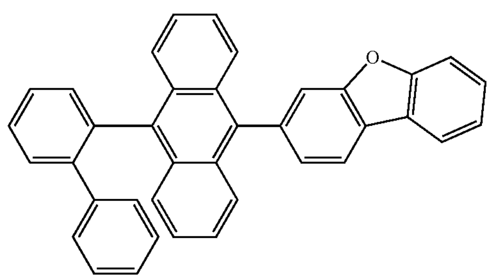
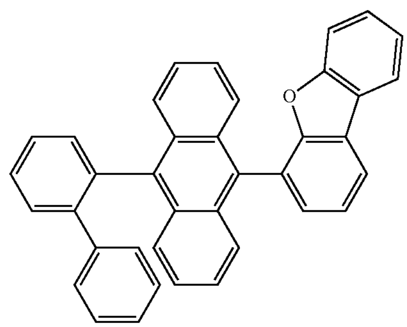

-continued
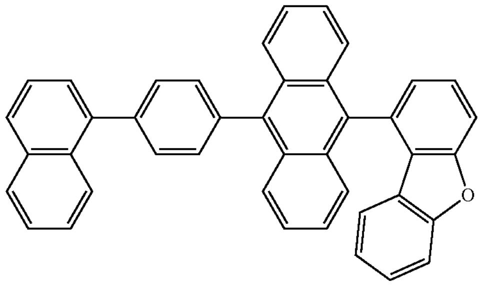
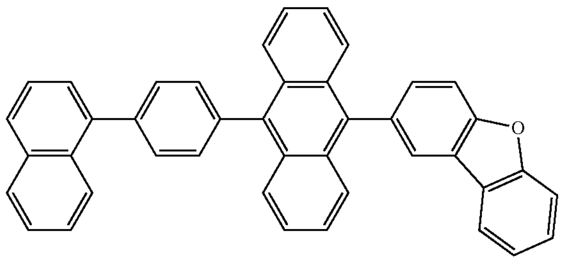
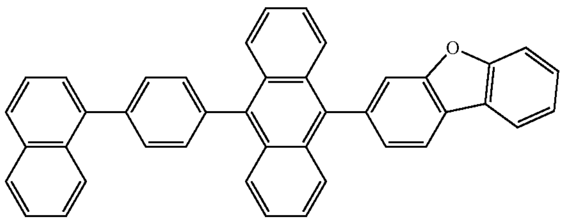
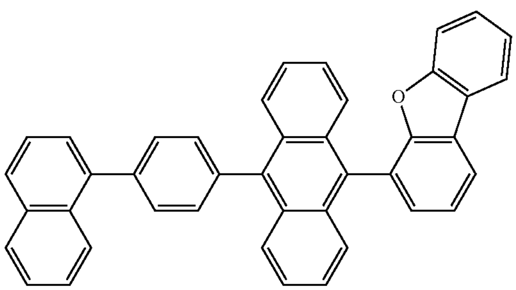
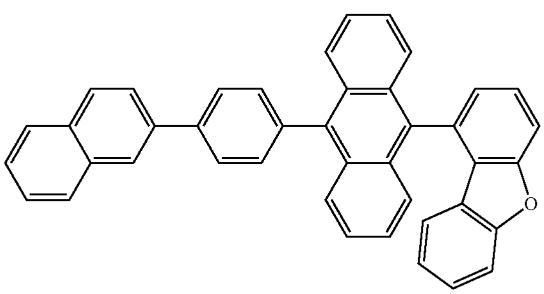
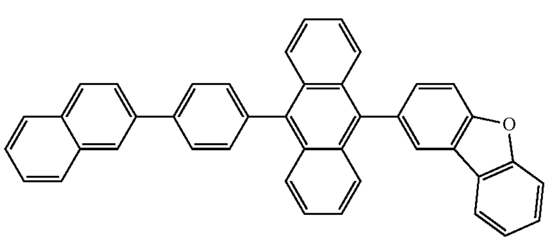
-continued
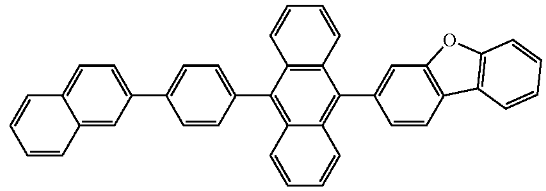
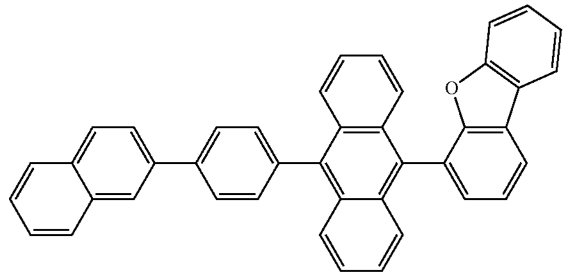
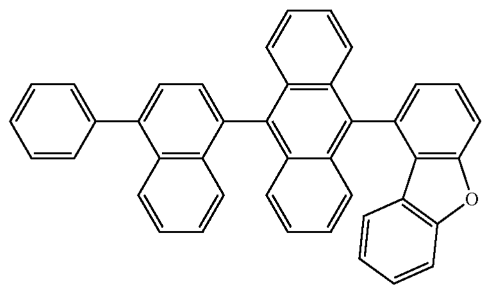
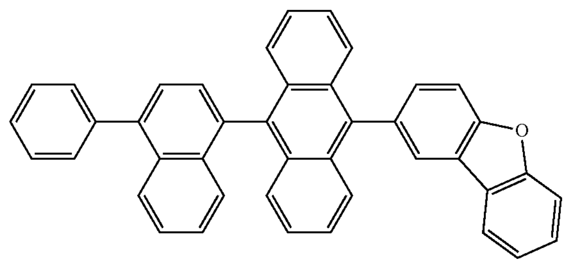
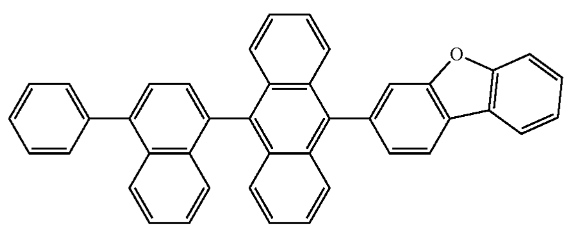
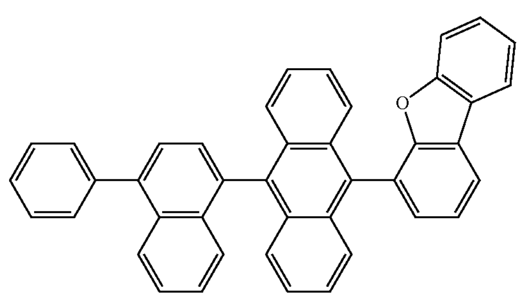

-continued
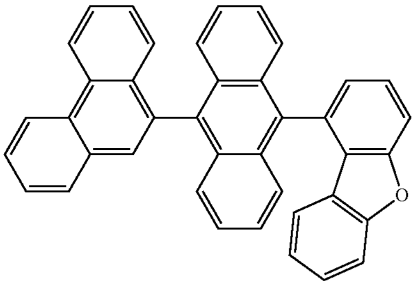
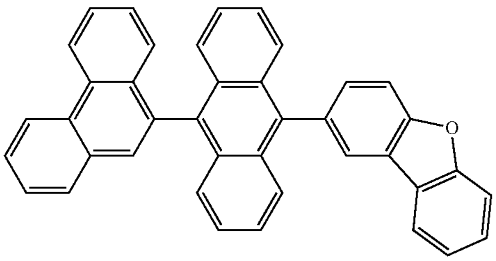
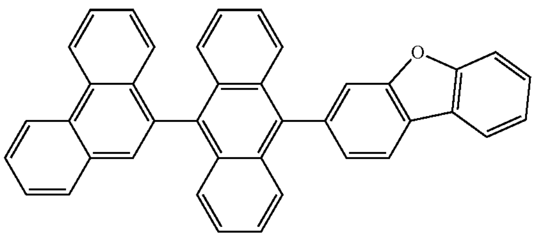
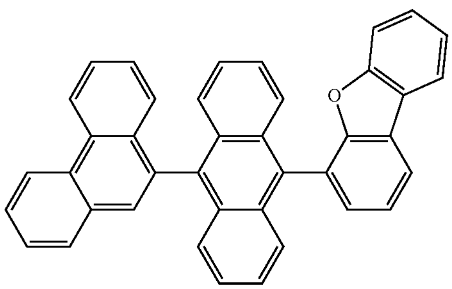
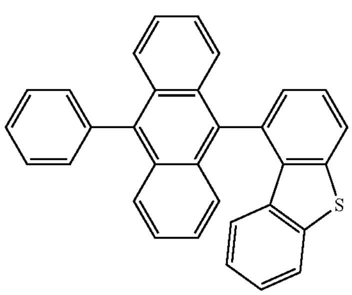
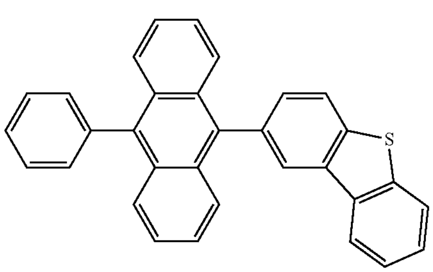
-continued
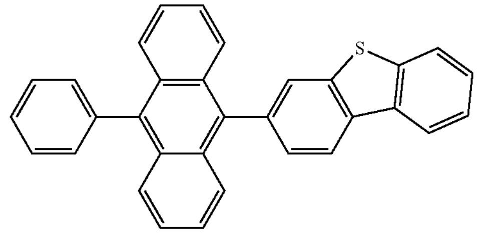
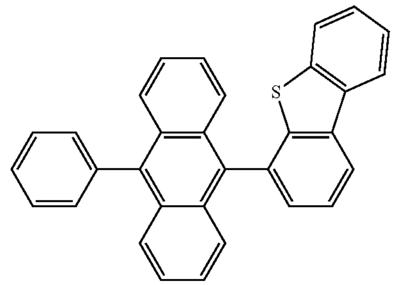
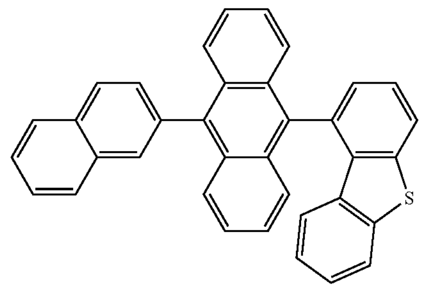
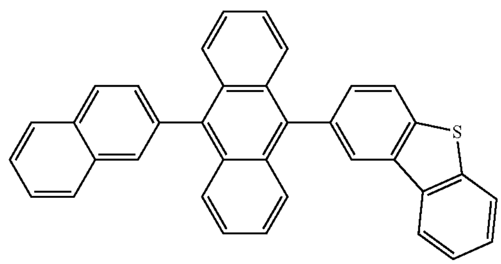
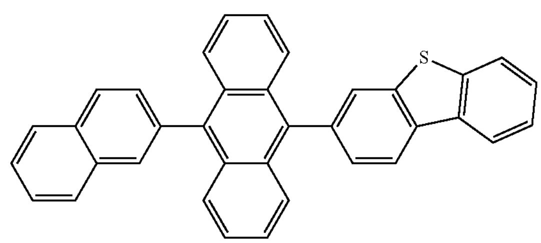
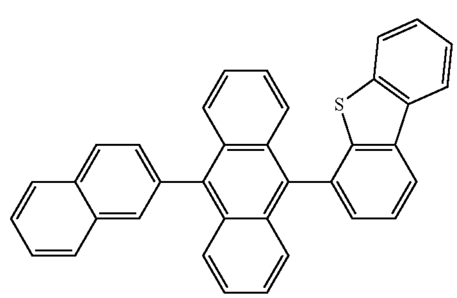

-continued
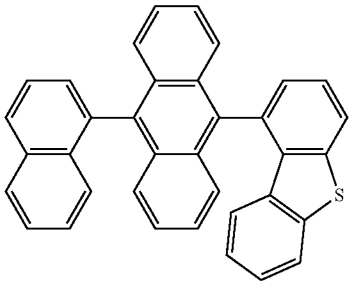
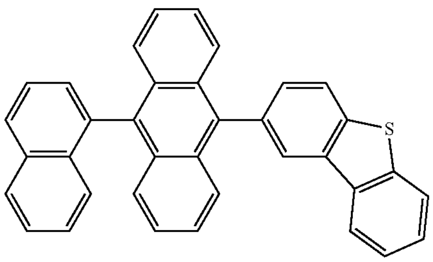
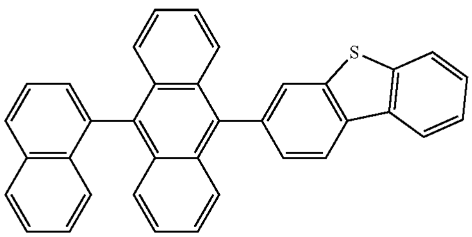
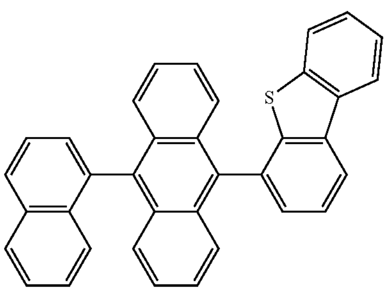
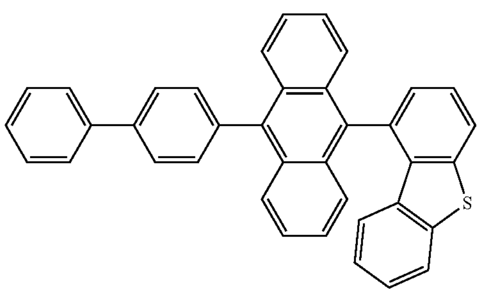
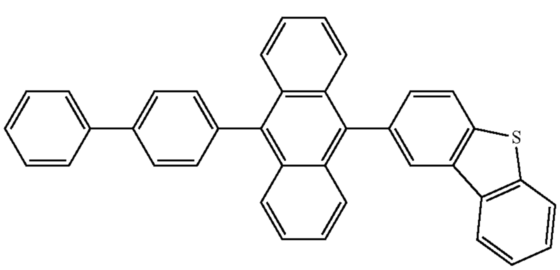
-continued
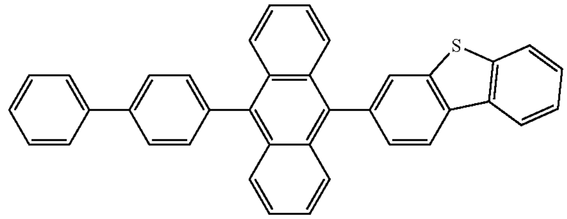
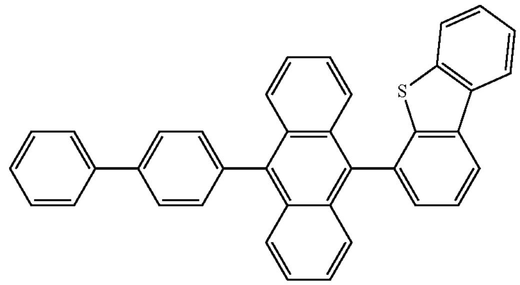
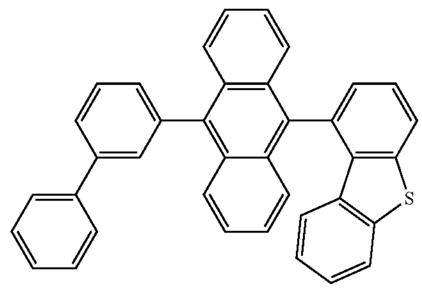
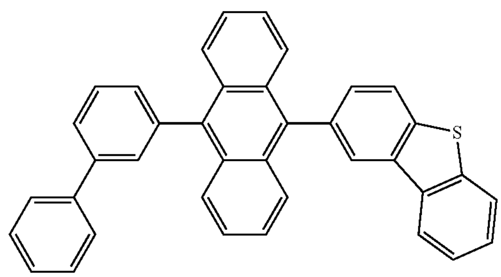
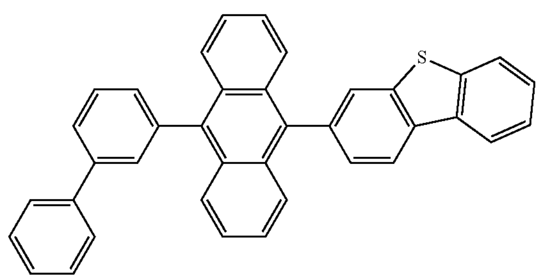
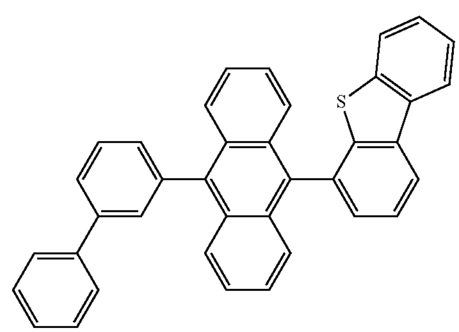

-continued
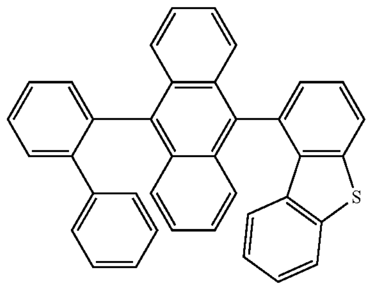
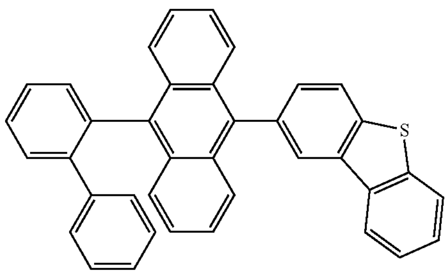
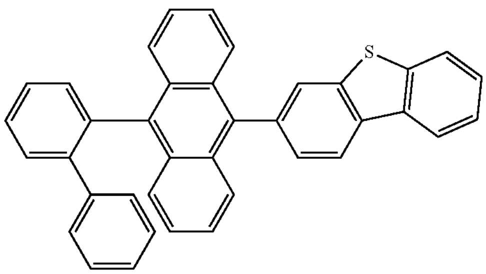
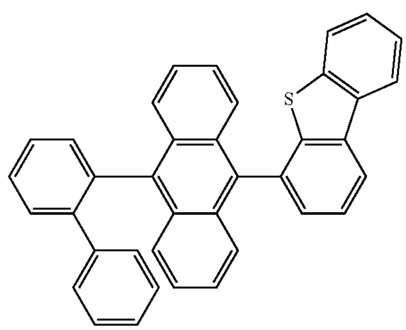
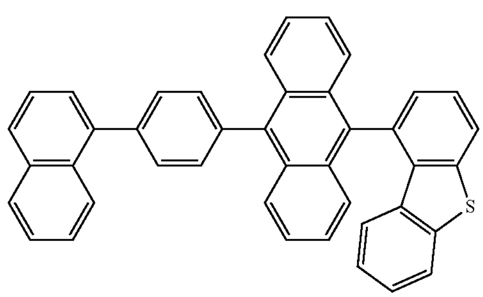
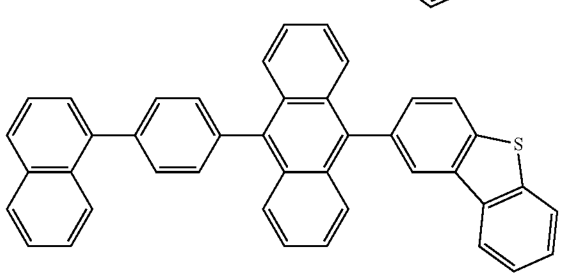
-continued
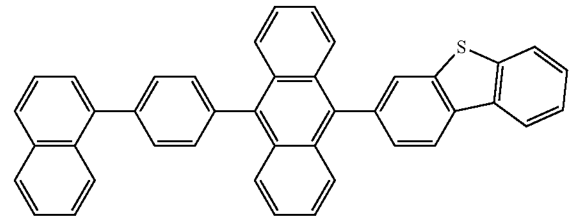
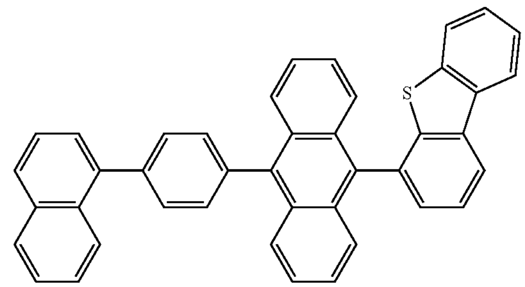
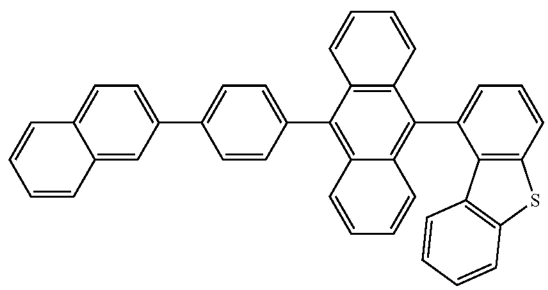
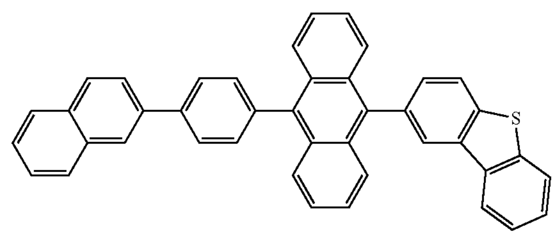
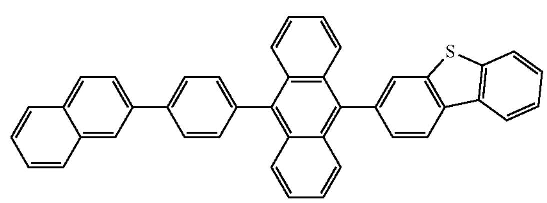
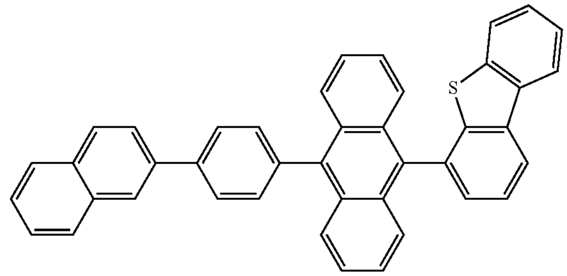

-continued
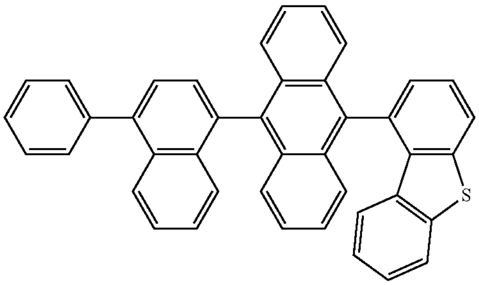
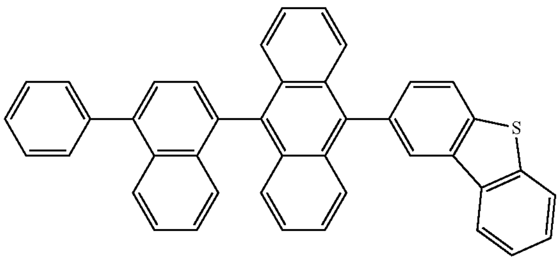
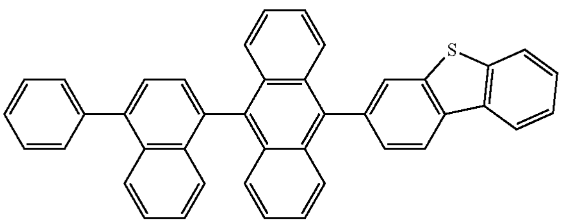
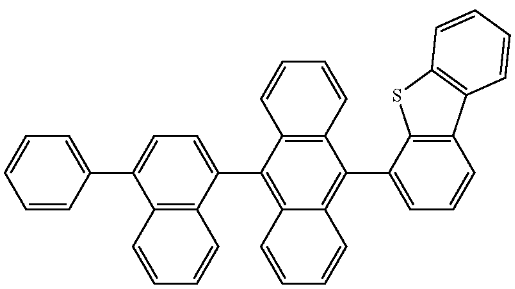
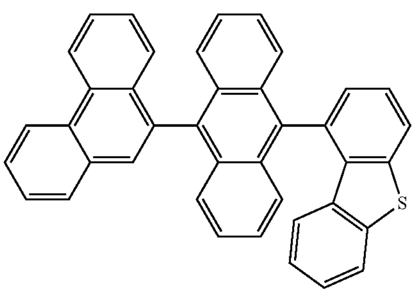
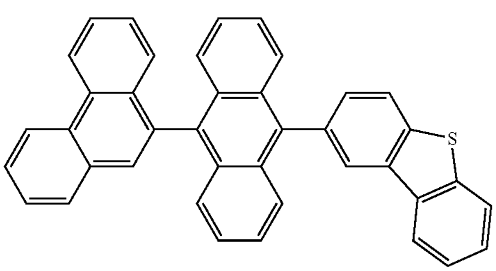
-continued
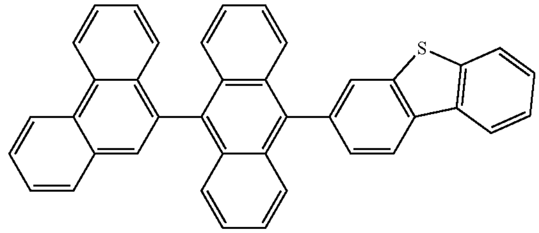
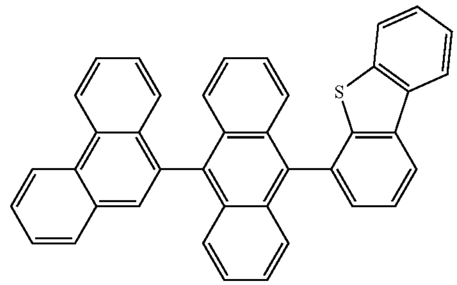
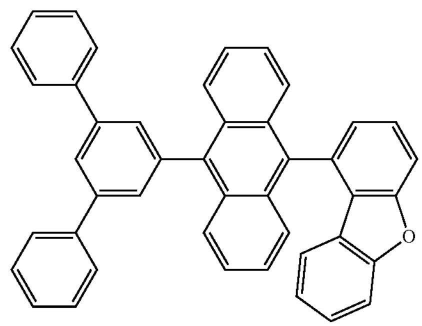
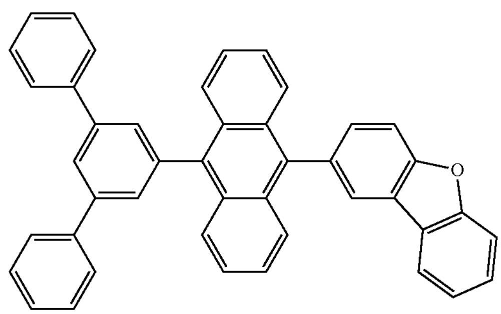
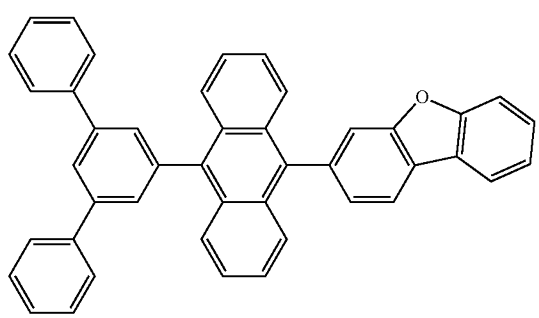

-continued
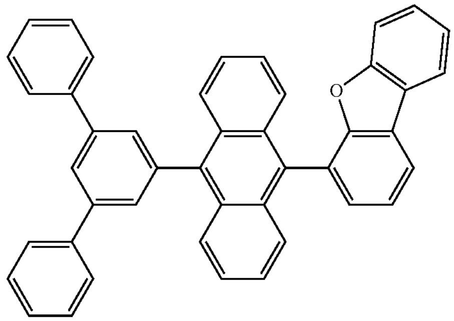
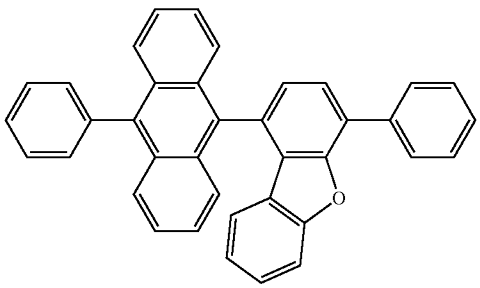
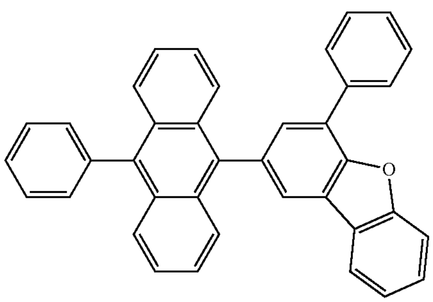
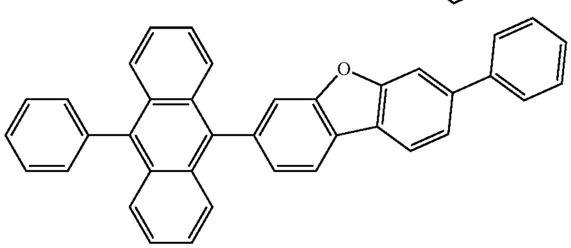
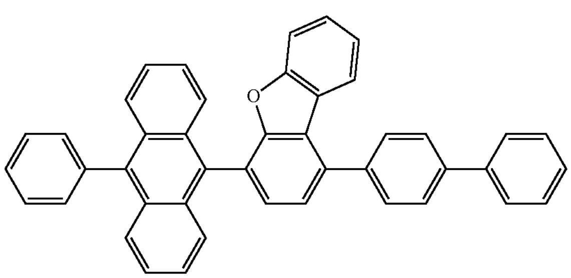
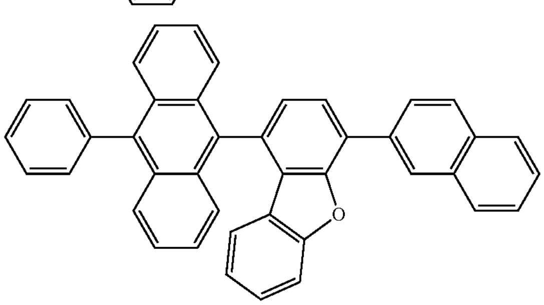
-continued
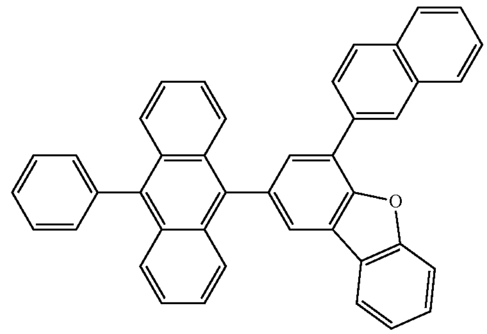
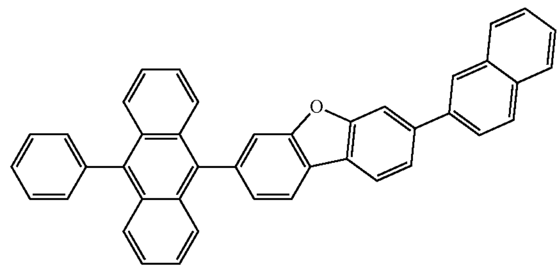
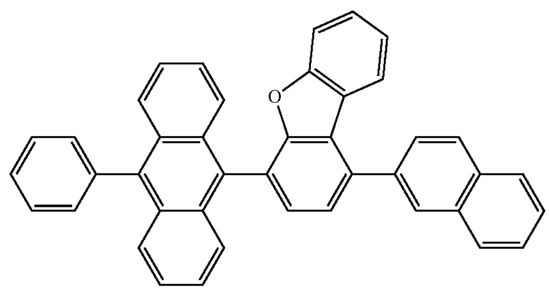
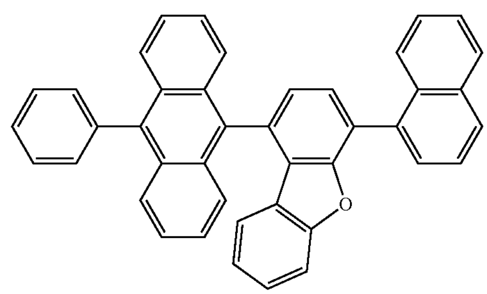
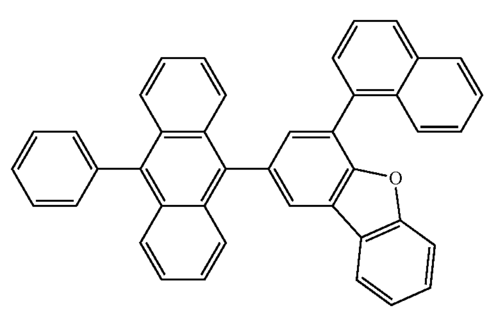

-continued
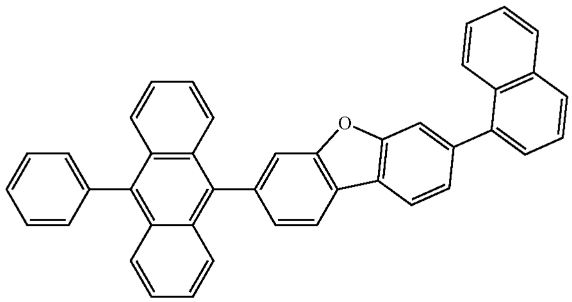
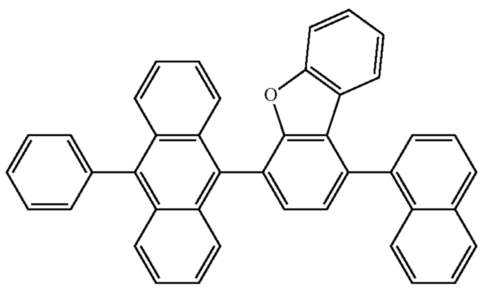
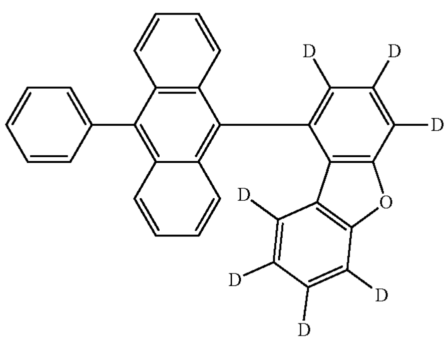
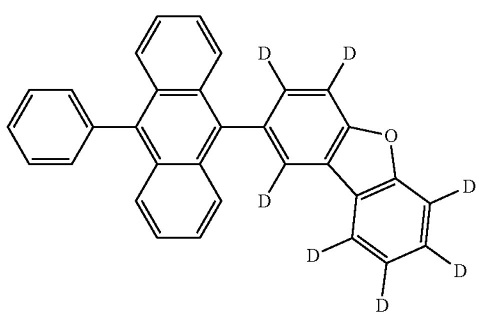
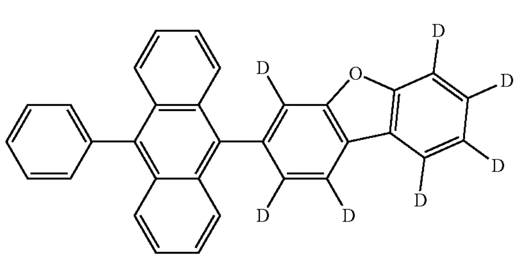
-continued
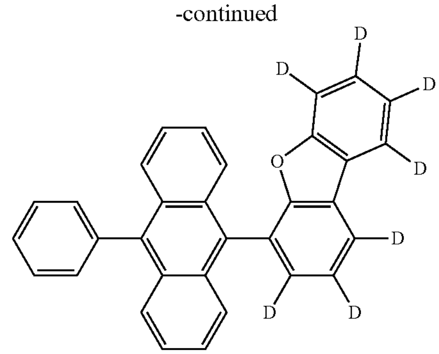
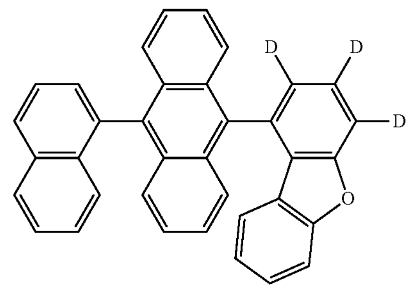
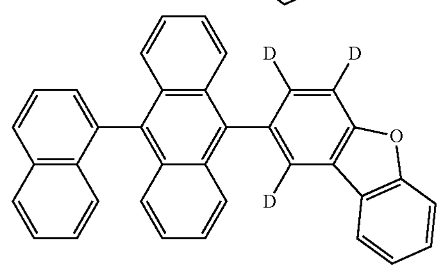
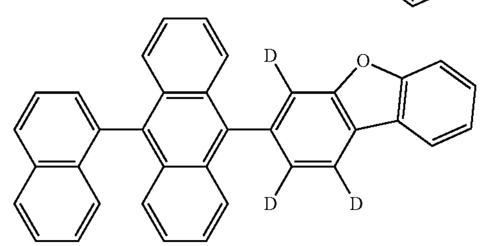
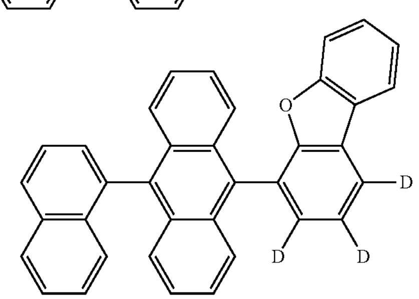
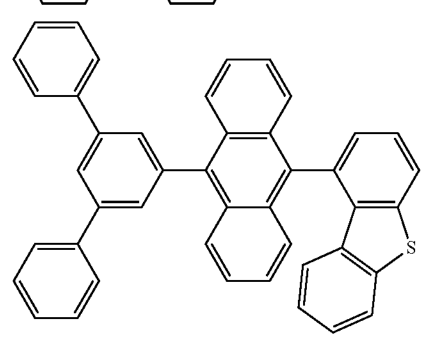

-continued
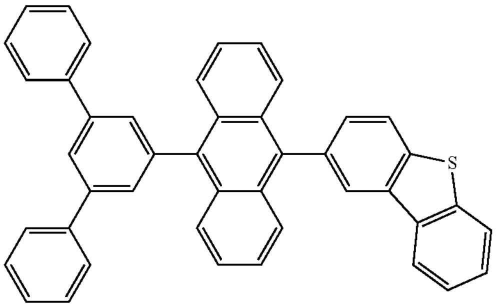
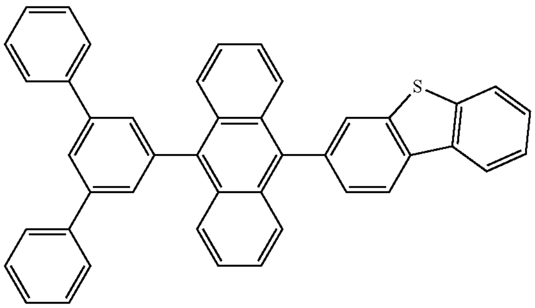
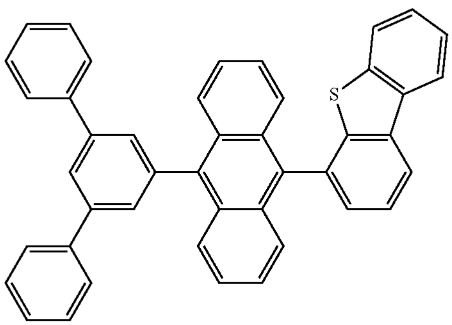
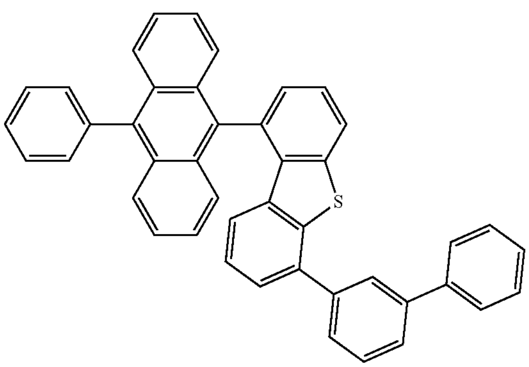
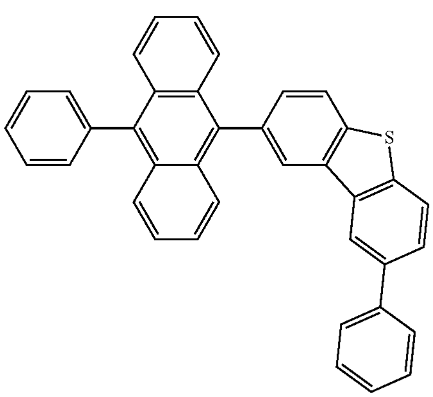
-continued
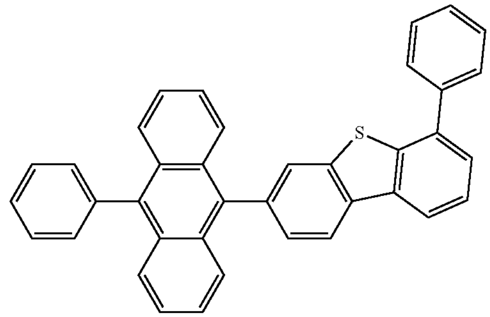
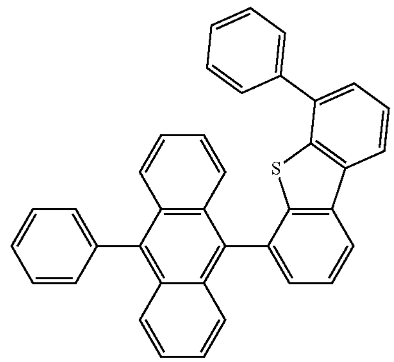
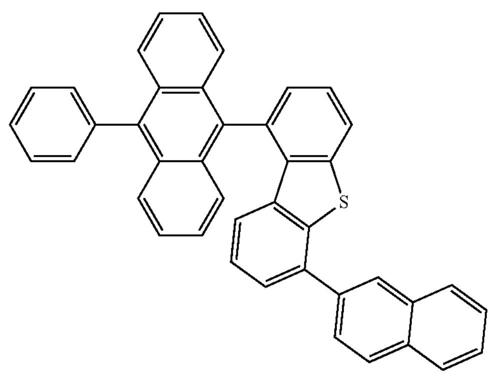
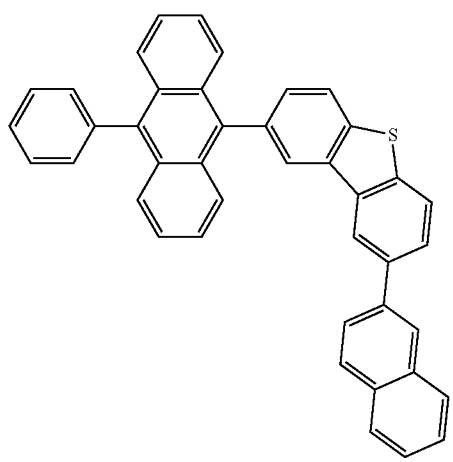

-continued
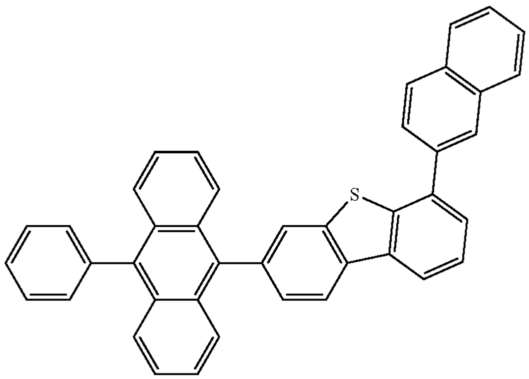
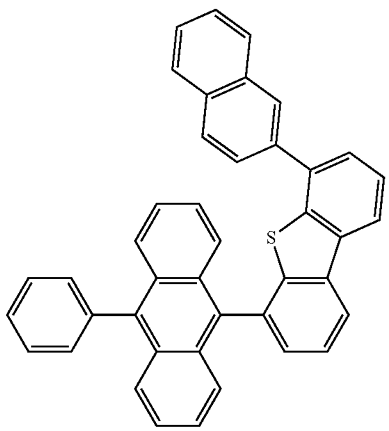
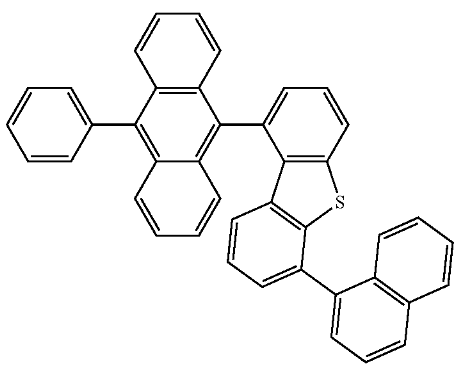
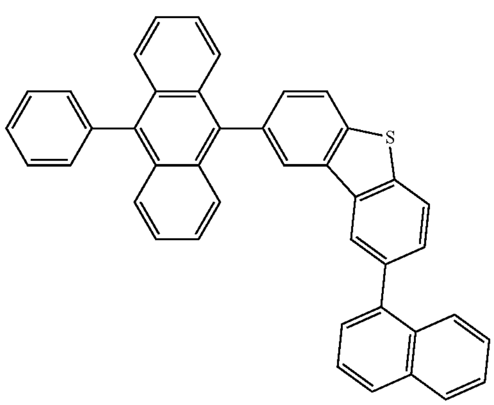
-continued
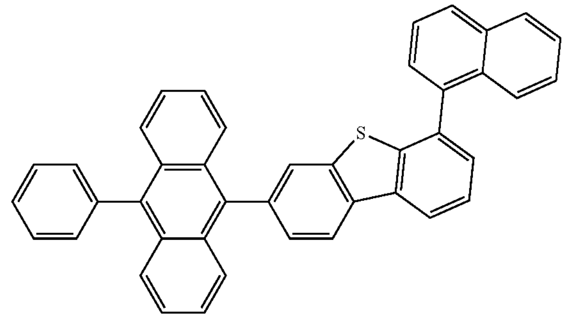
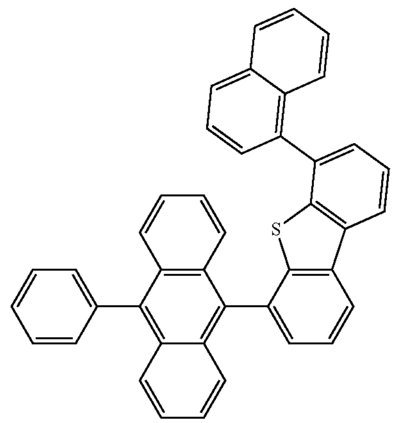
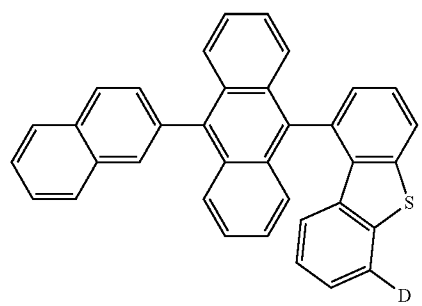
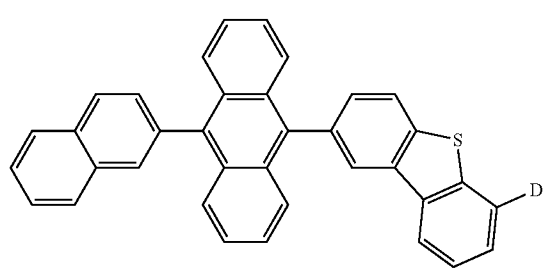
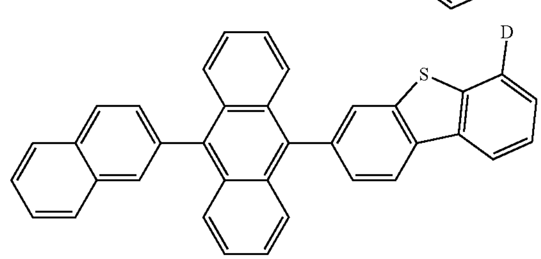

-continued
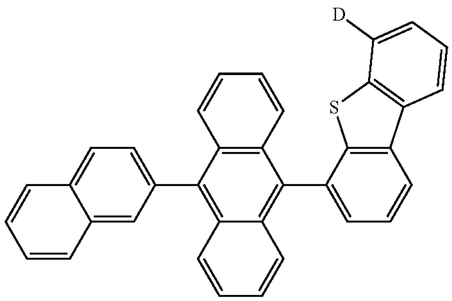
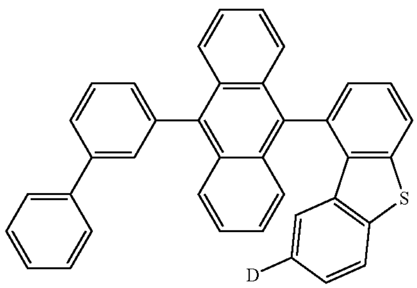
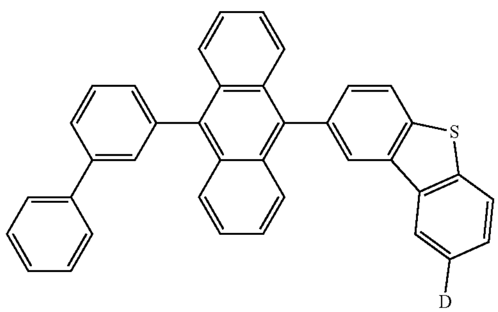
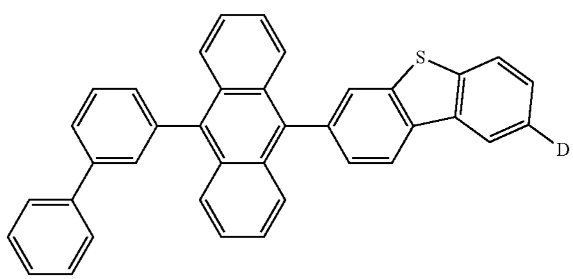
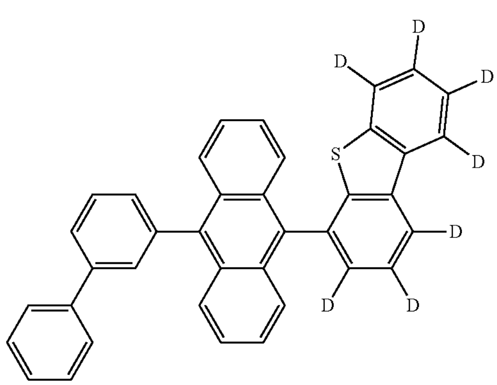
-continued
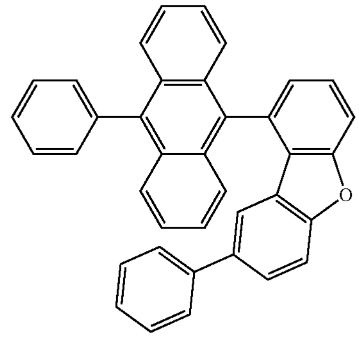
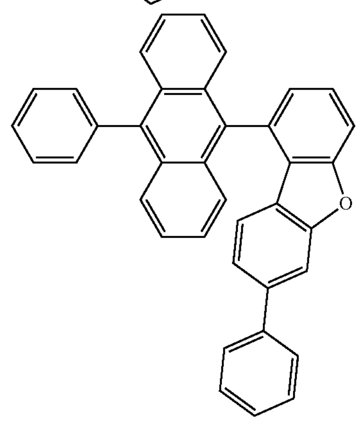
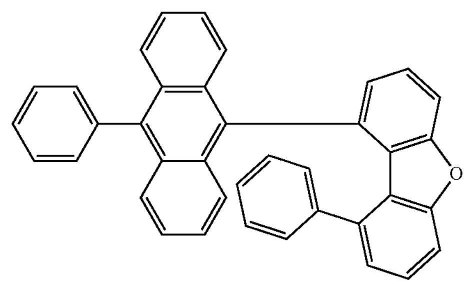
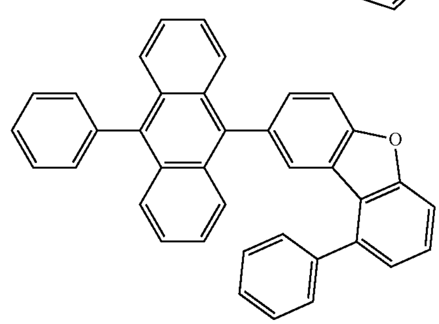
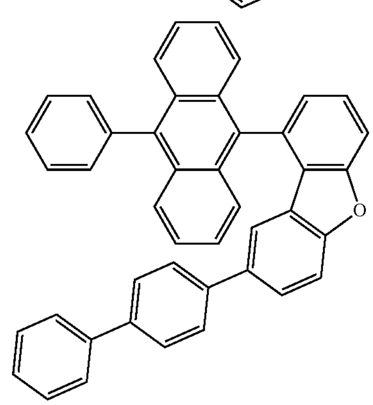

-continued
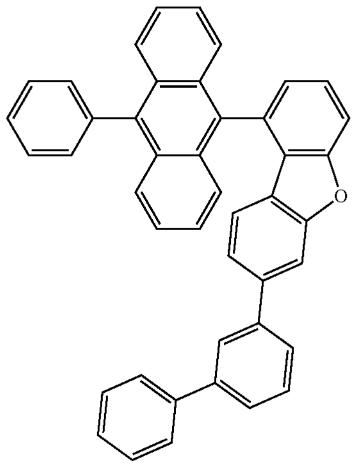
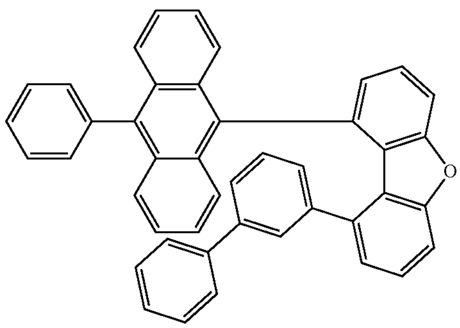
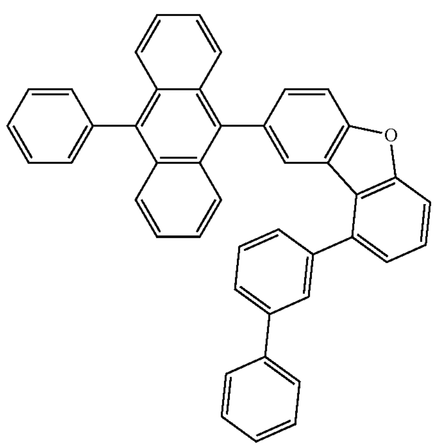
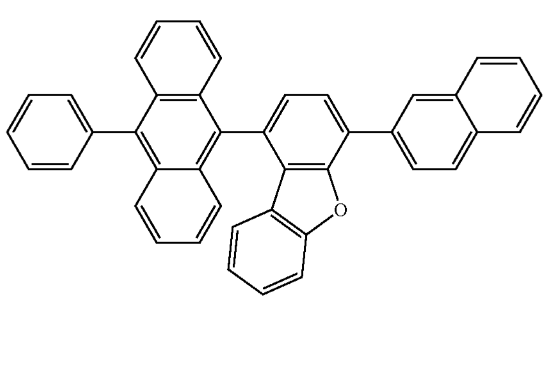
-continued
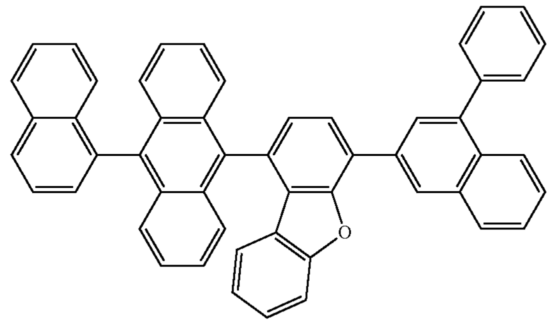
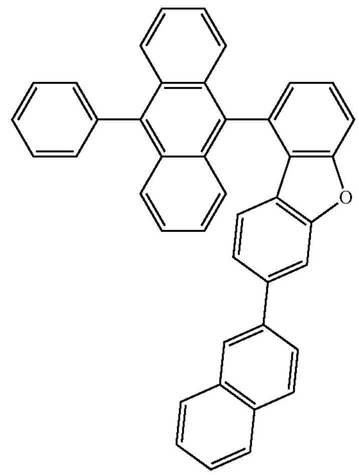
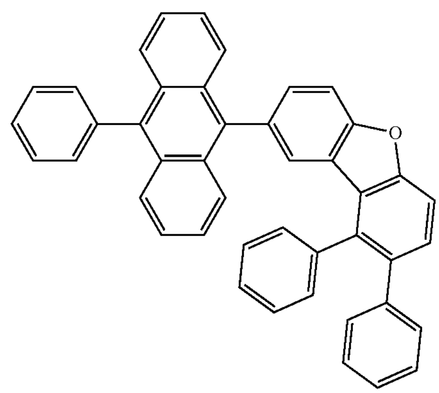
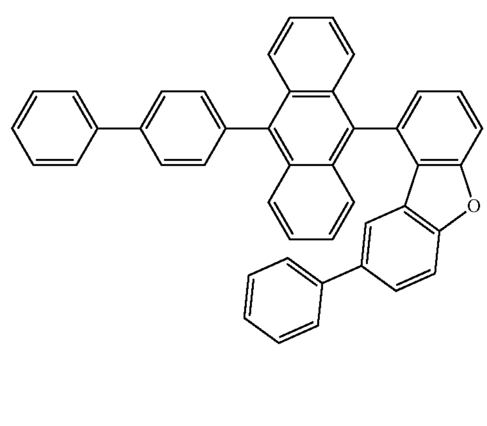

-continued
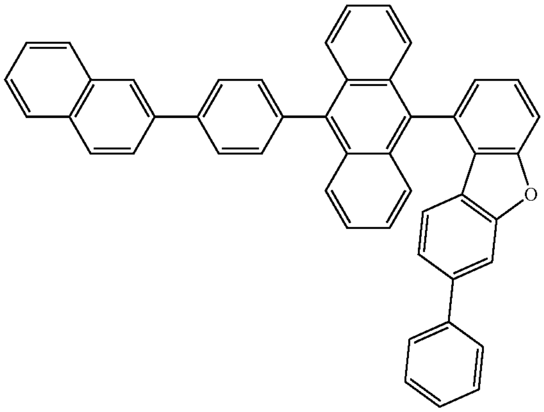
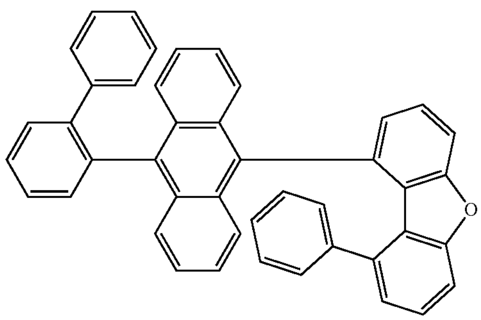
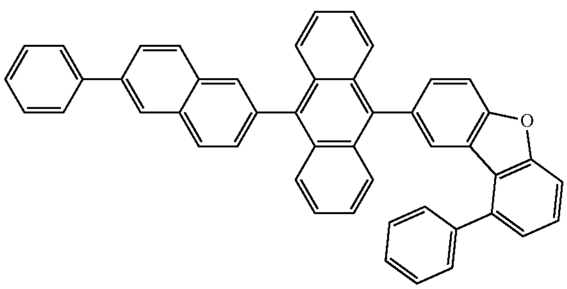
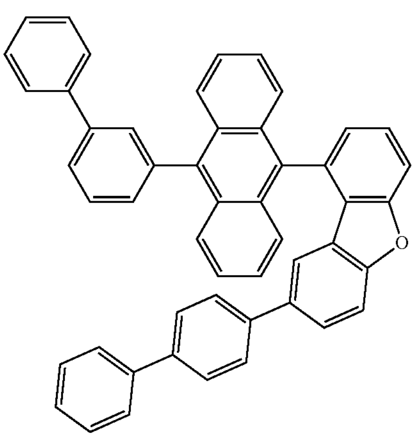
-continued
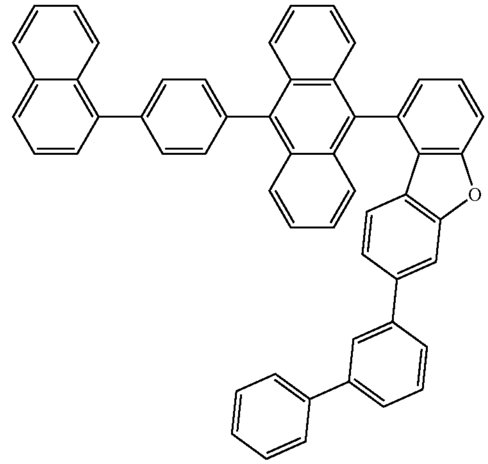
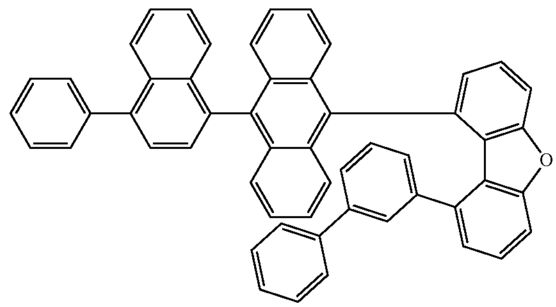
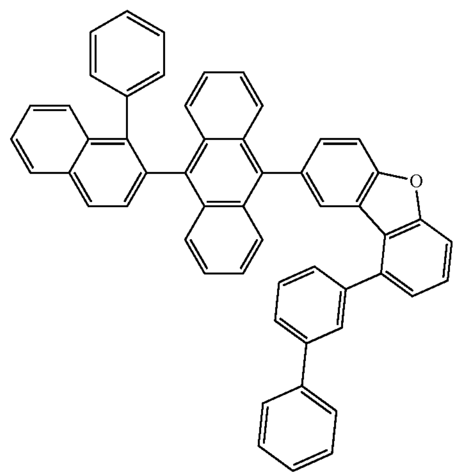
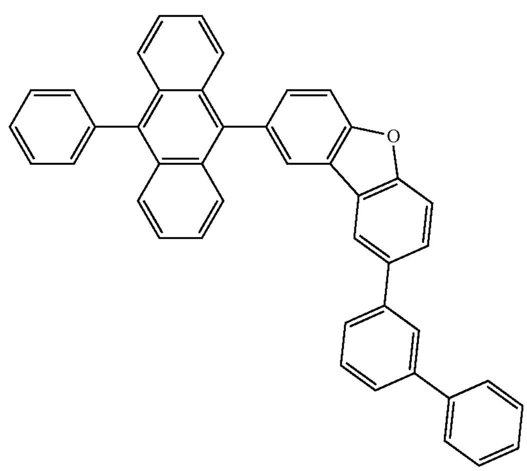

-continued
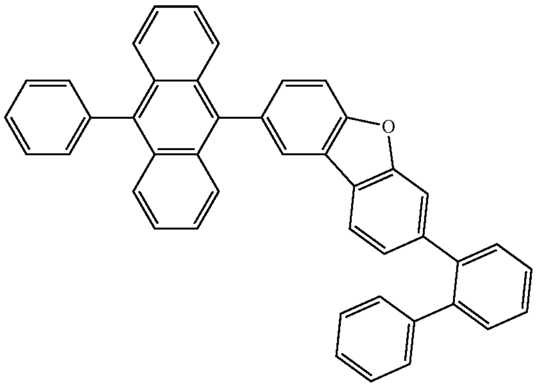
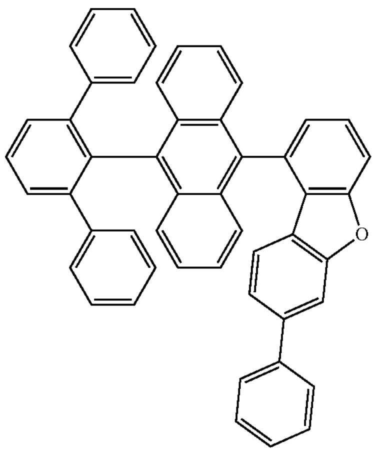
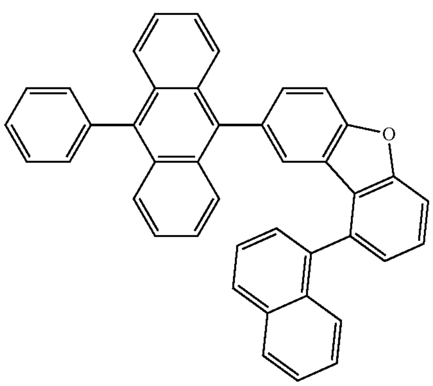
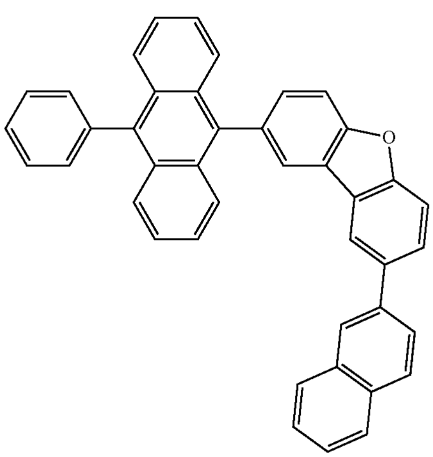
-continued
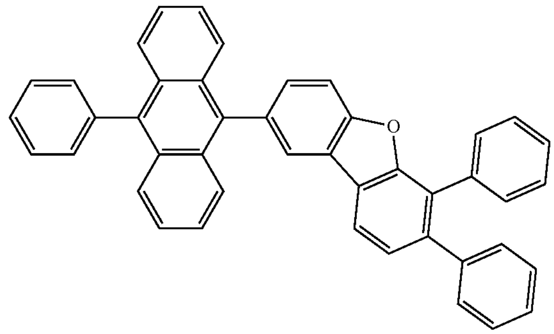
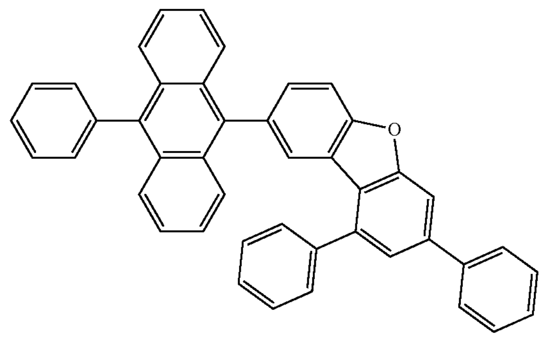
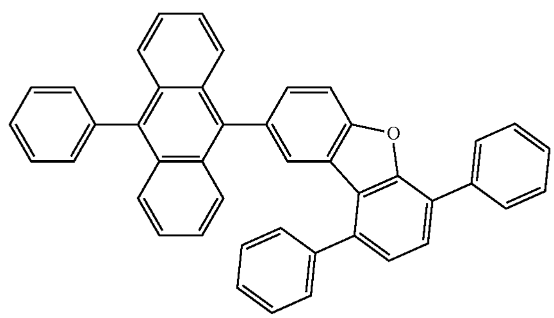
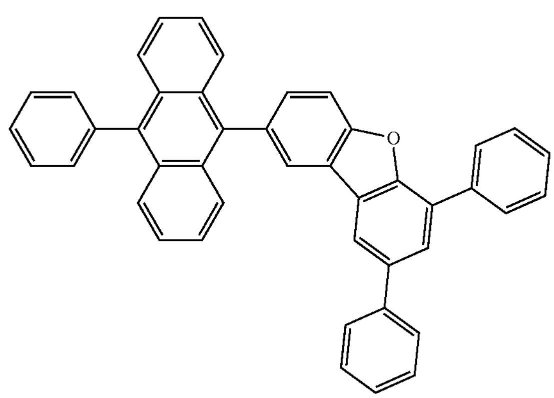

-continued

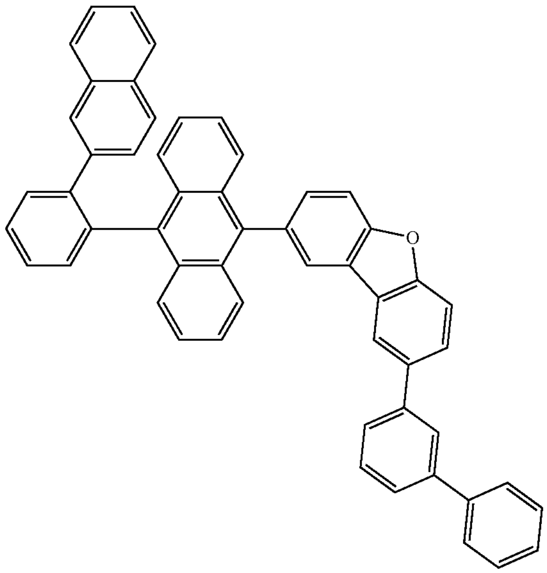

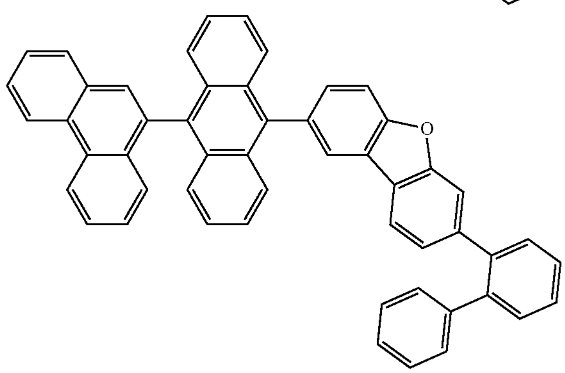

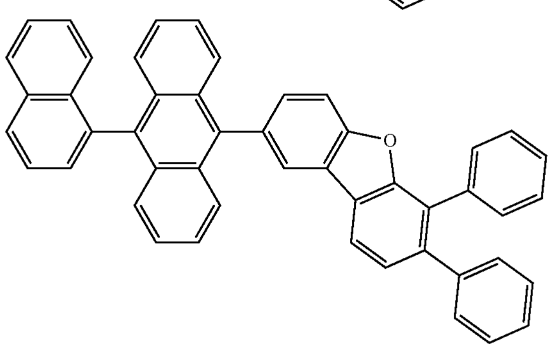

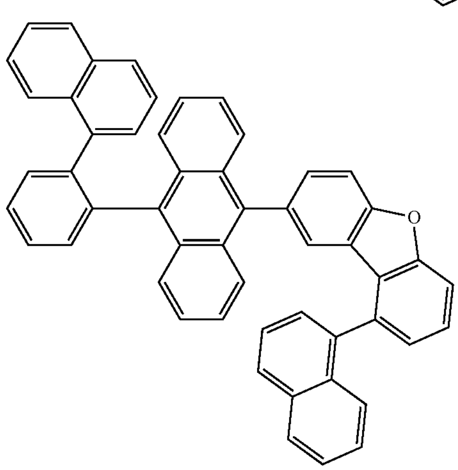

-continued

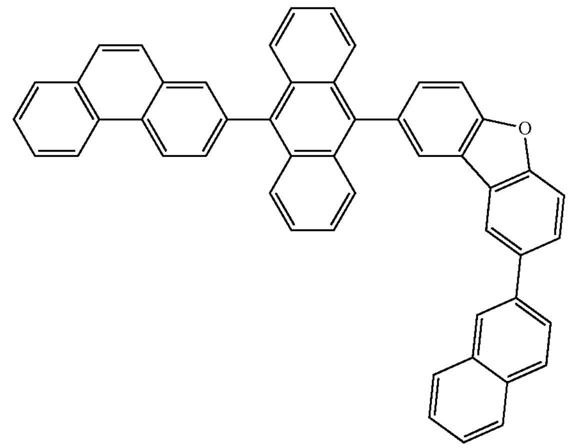

and

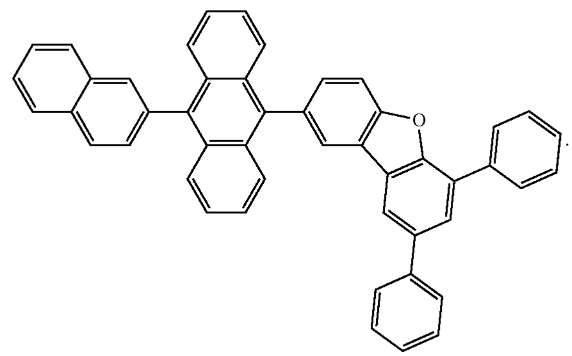.

6. The organic light emitting device of claim 1, wherein $R_1$ and $R_2$ are phenyl.

7. The organic light emitting device of claim 1, wherein $L_1$, $L_2$, $L_3$, and $L_4$ are each independently a bond or phenylene.

8. The organic light emitting device of claim 1, wherein i and j are 0, and k and l are each independently 0 or 1.

9. The organic light emitting device of claim 1, wherein i+j is 0, and k+l is 1 or 2.

10. The organic light emitting device of claim 1, wherein A is any one selected from the group consisting of:

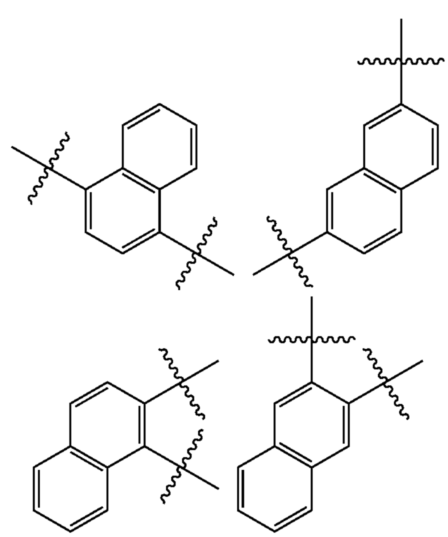

-continued
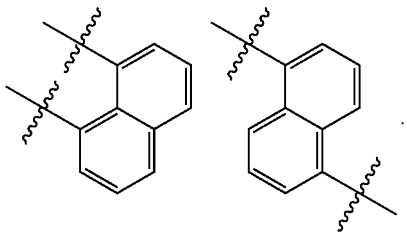
11. The organic light emitting device of claim 1, wherein B is any one selected from the group consisting of:
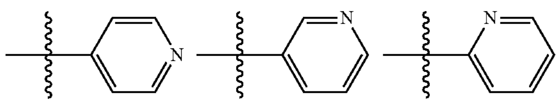
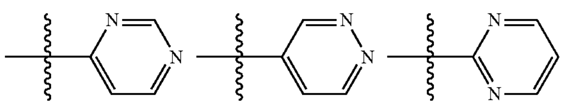
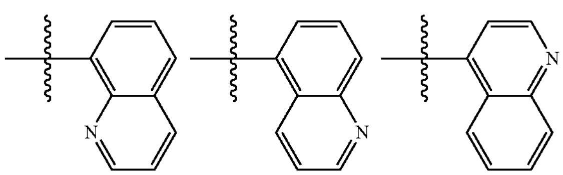
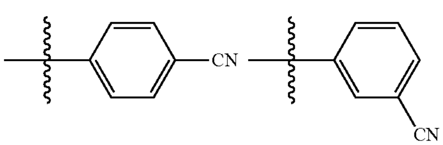
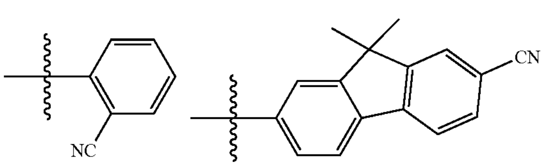
-continued
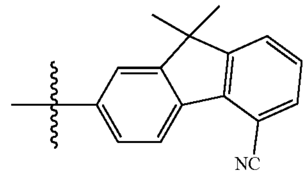
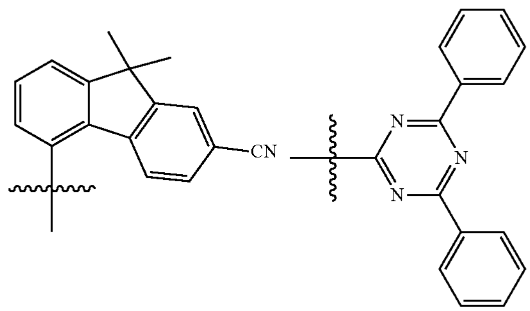
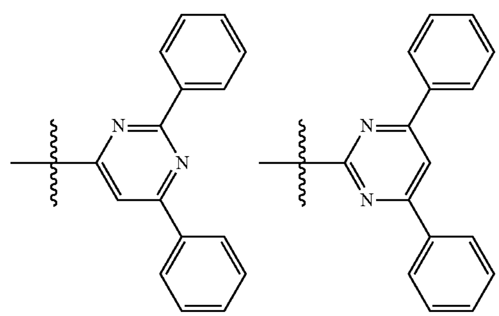
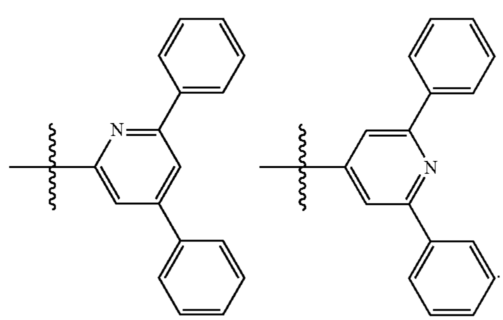

12. The organic light emitting device of claim 1, wherein the compound represented by Chemical Formula 2 is any one selected from the group consisting of:
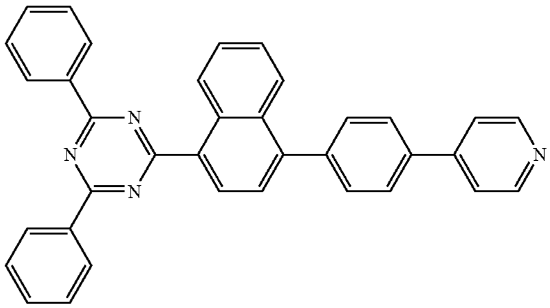
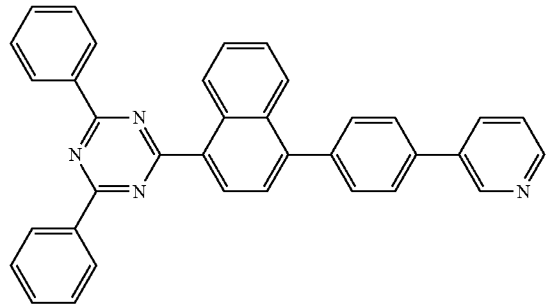
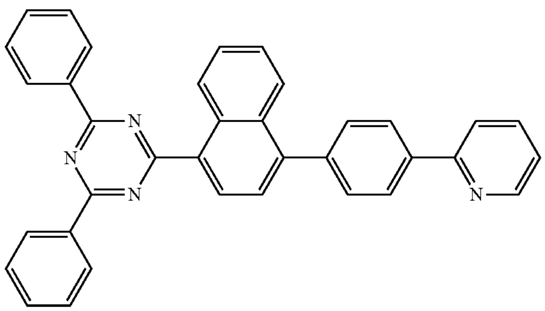
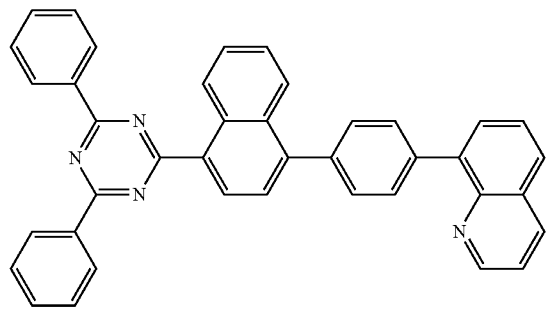
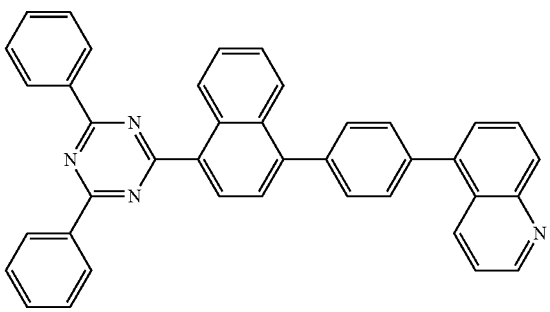
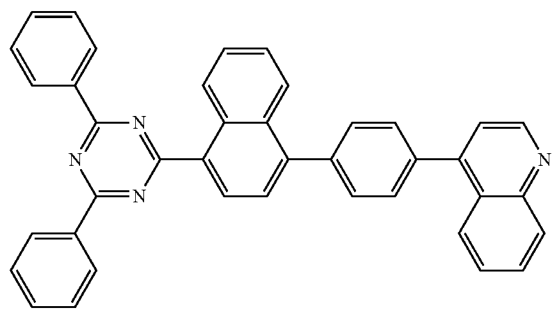
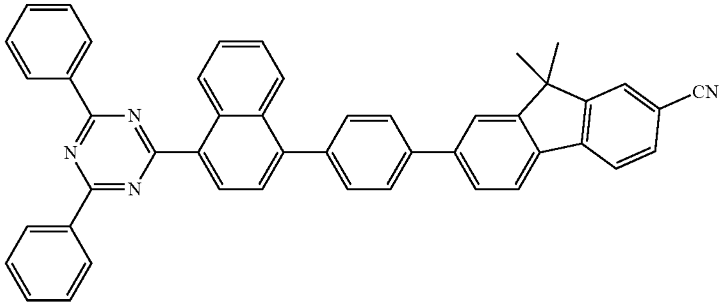
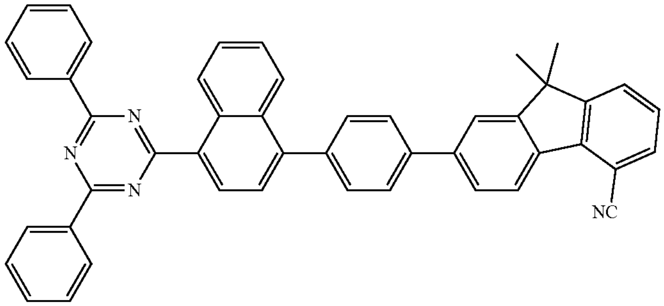

-continued
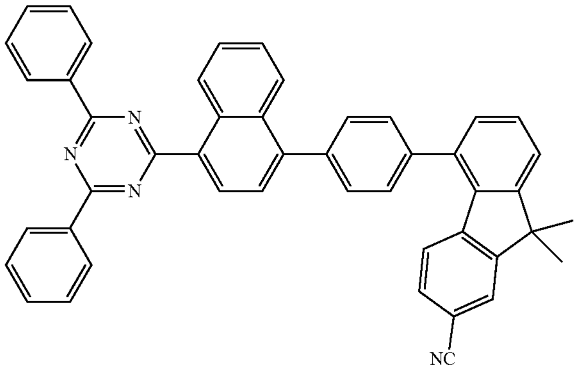
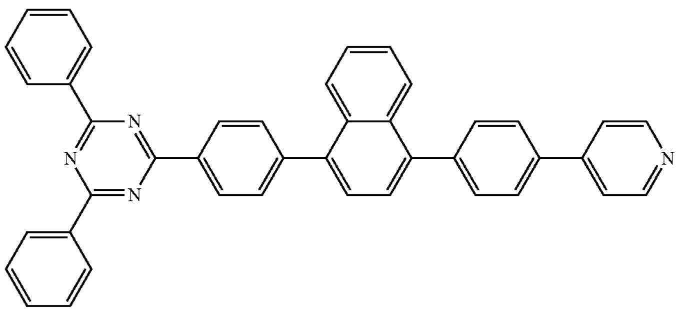
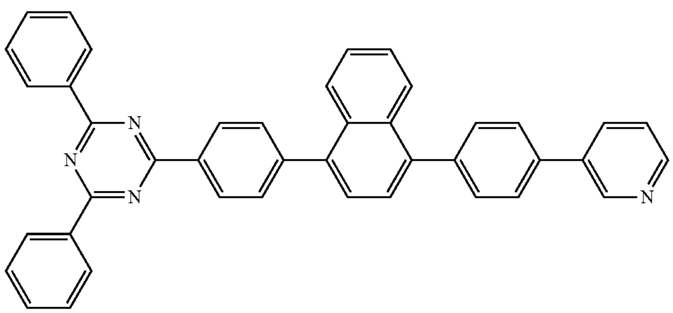
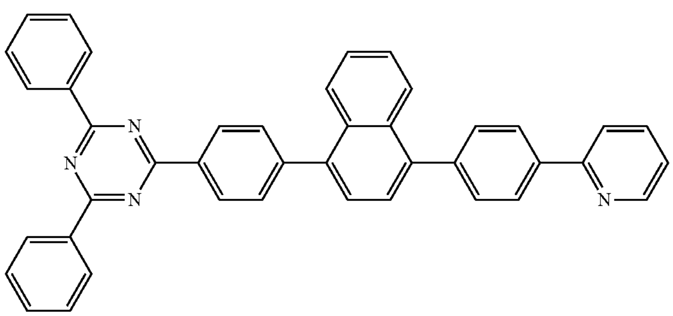
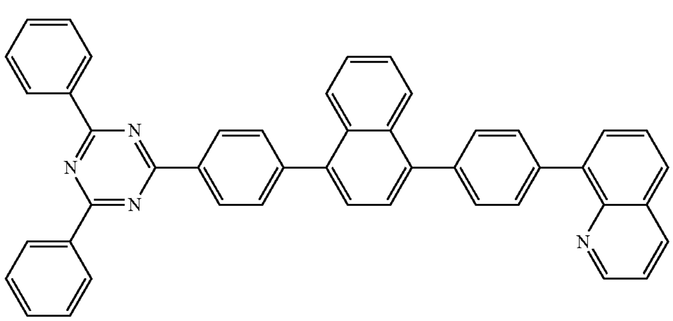

-continued
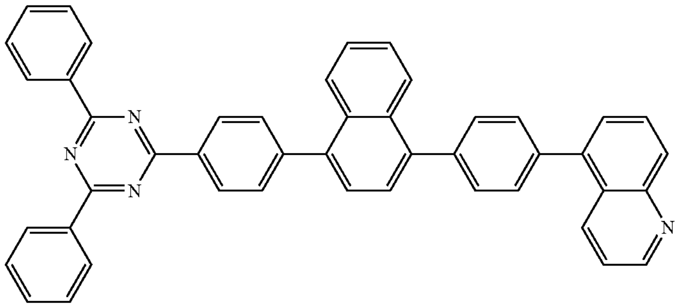
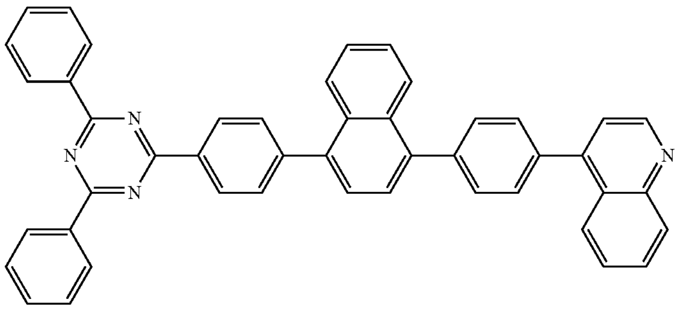
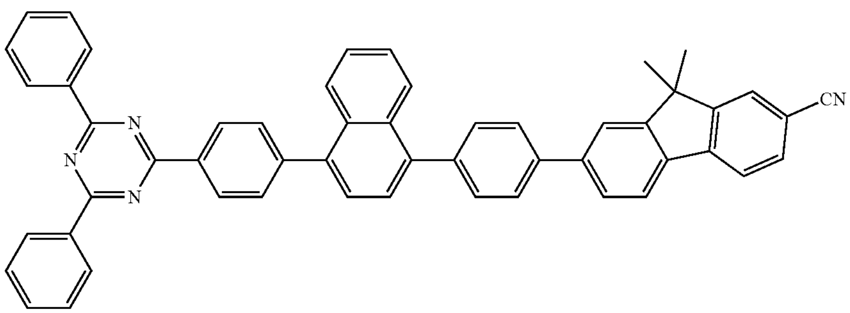
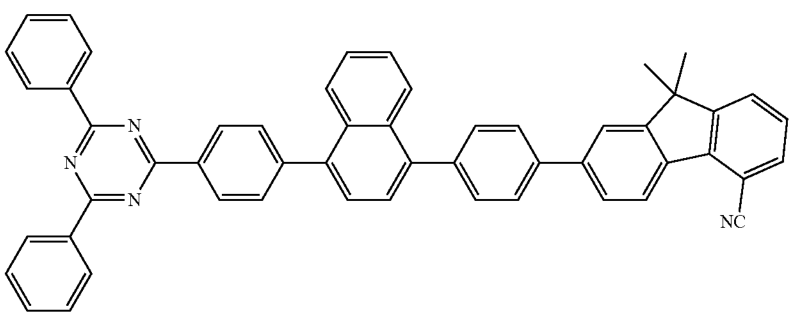
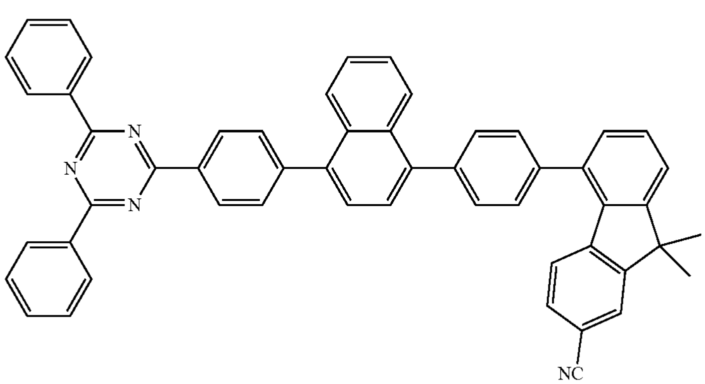

-continued
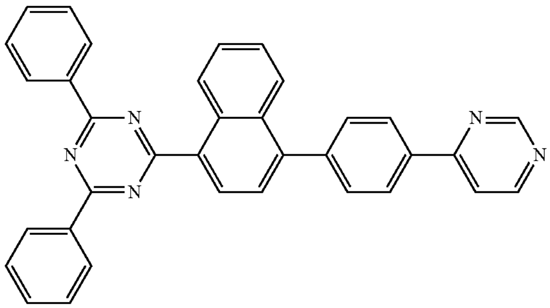
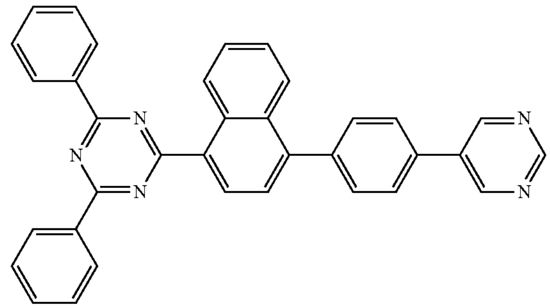
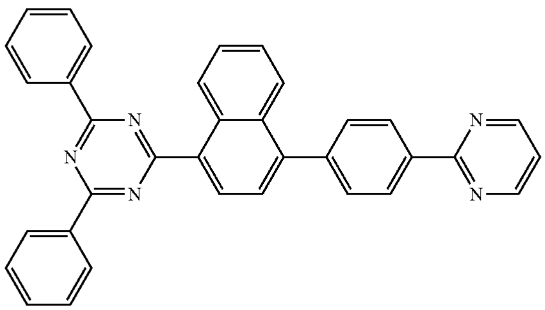
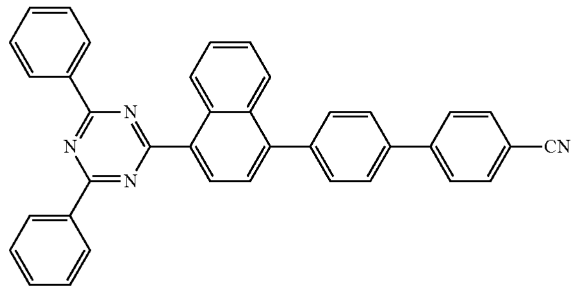
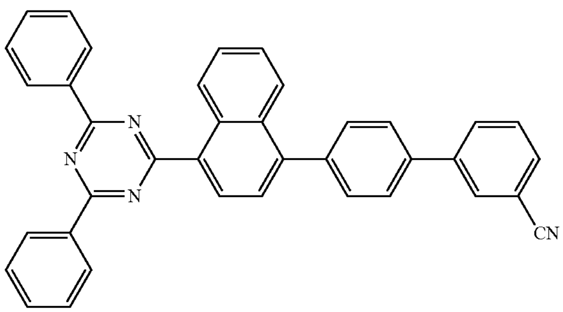
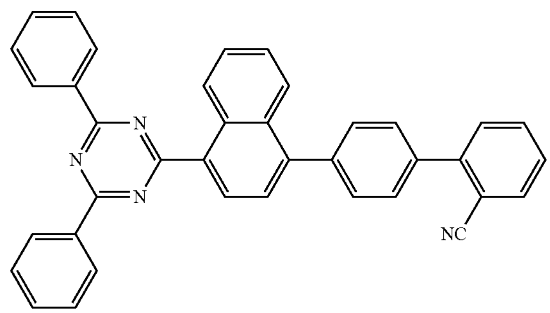
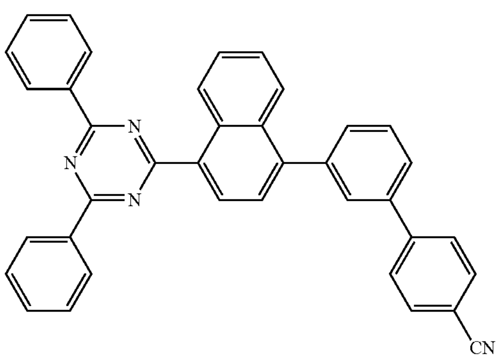
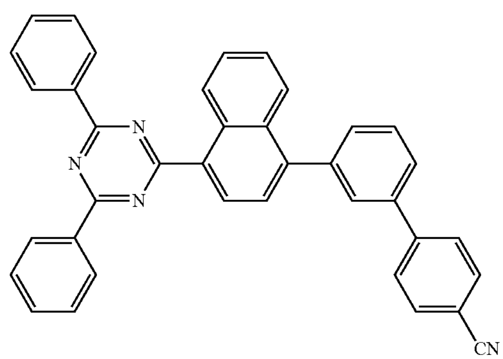
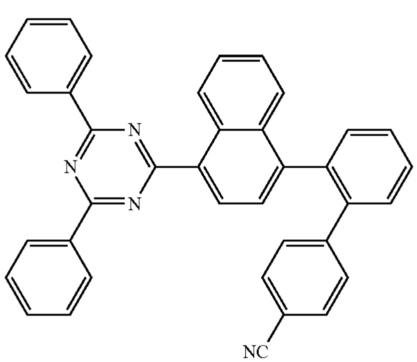
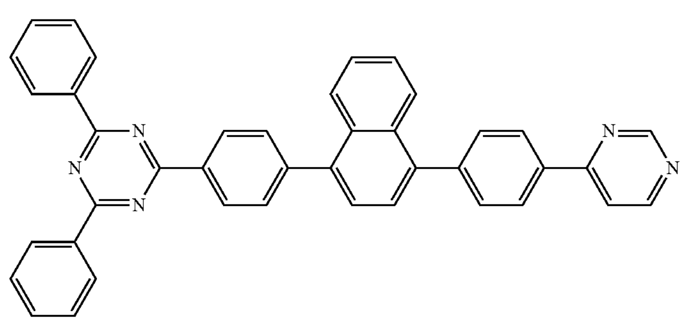

-continued
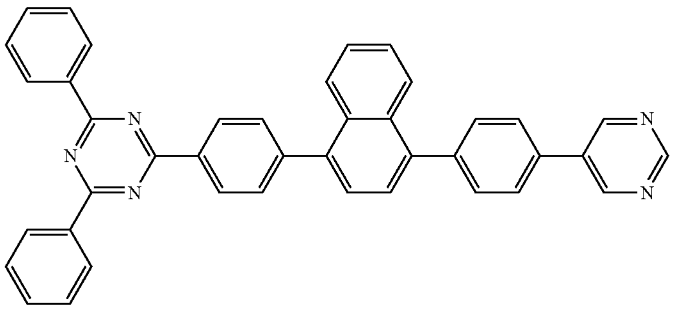
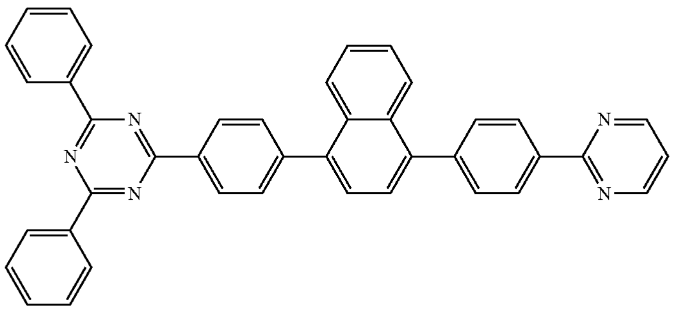
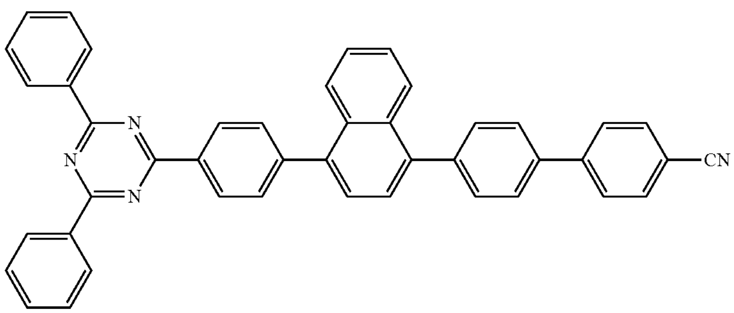
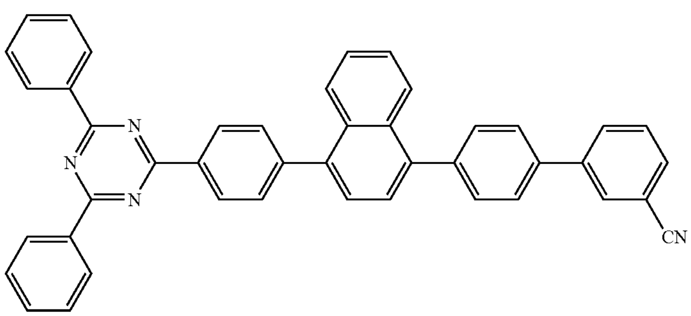
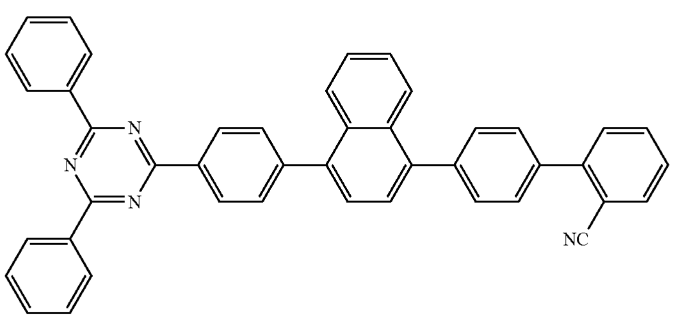

-continued
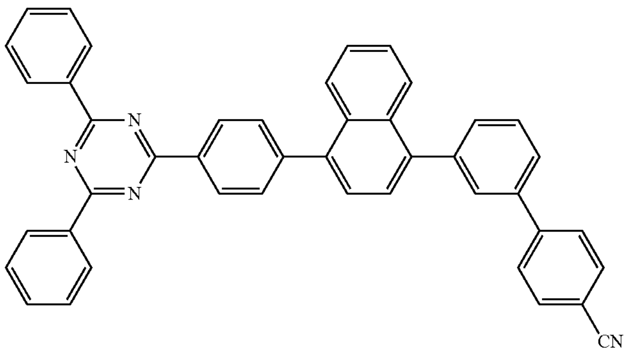
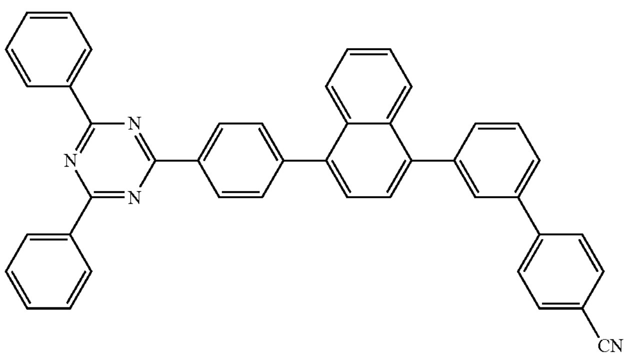
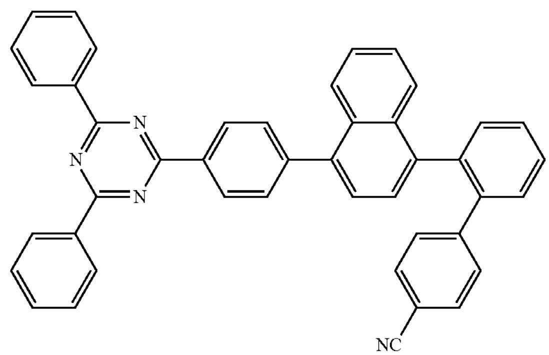
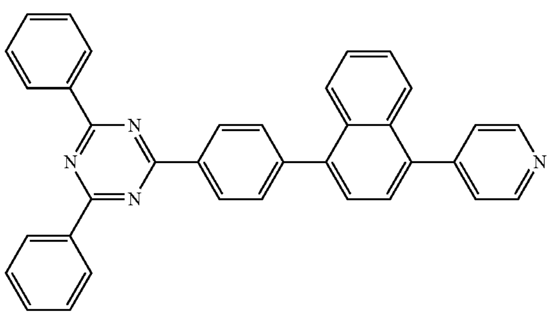
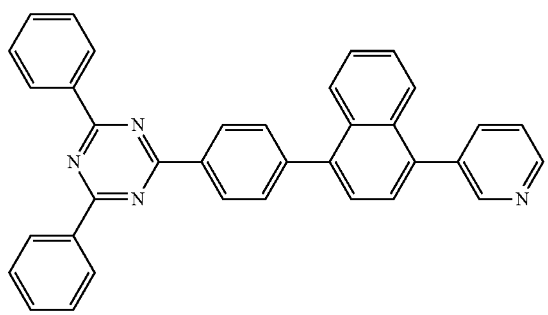
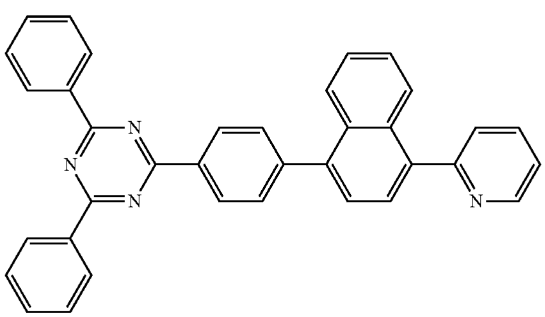
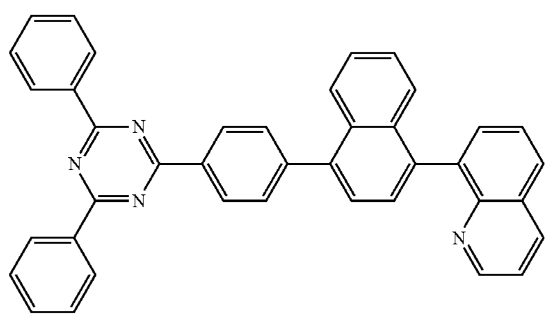
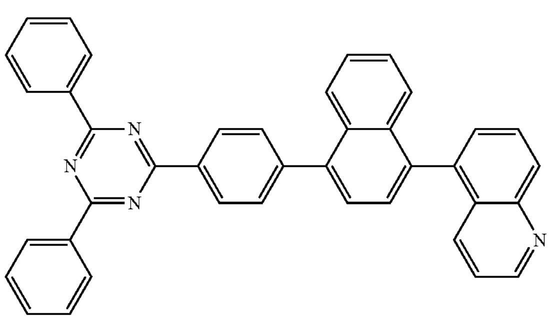
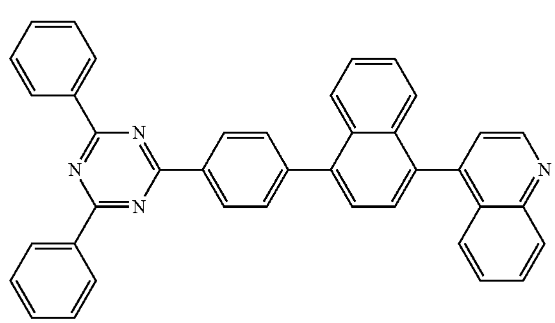

-continued
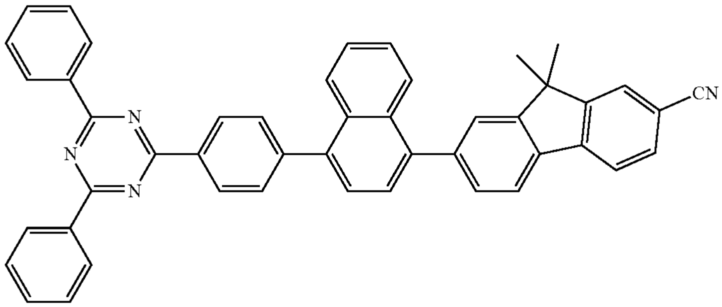
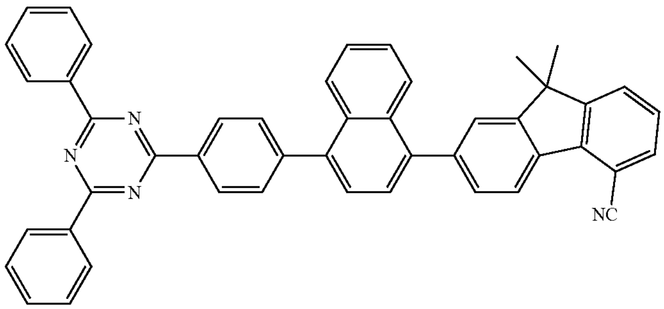
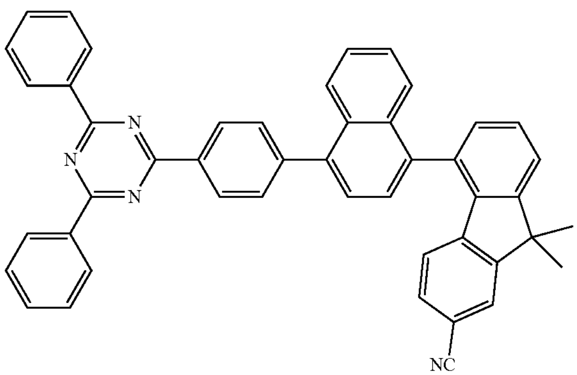
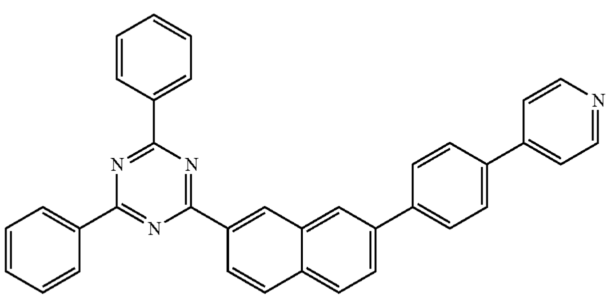
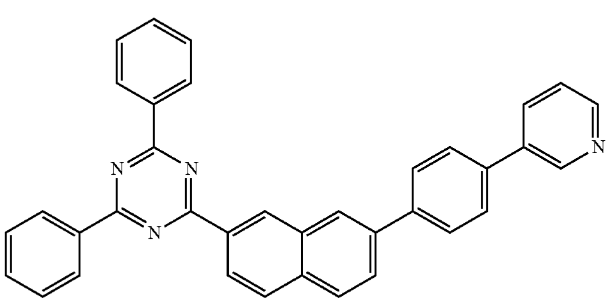

-continued
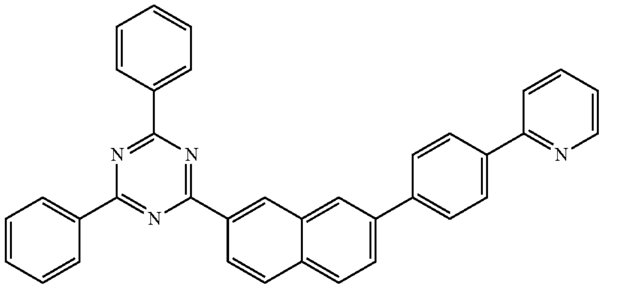
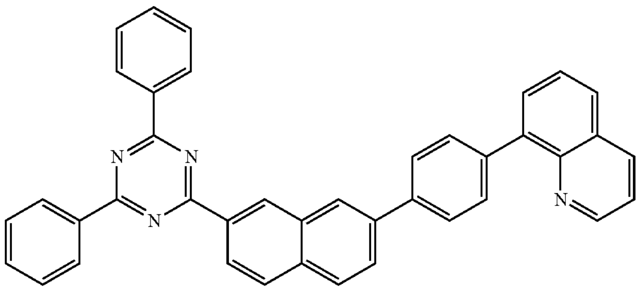
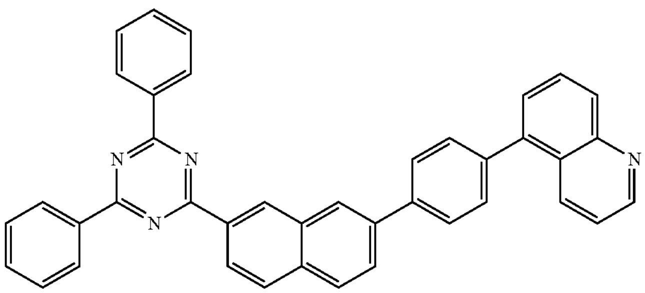
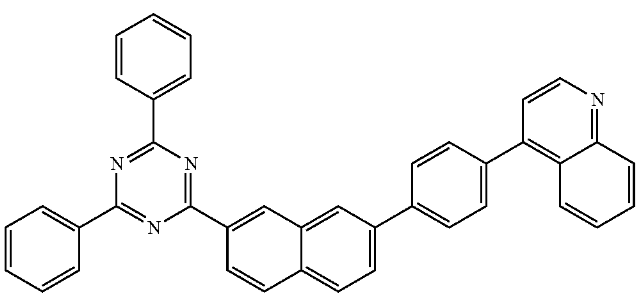
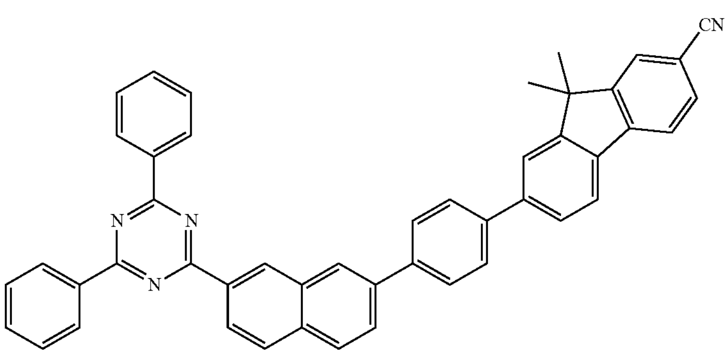

-continued
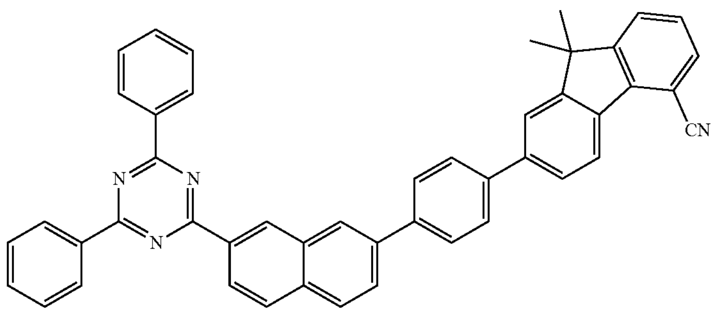
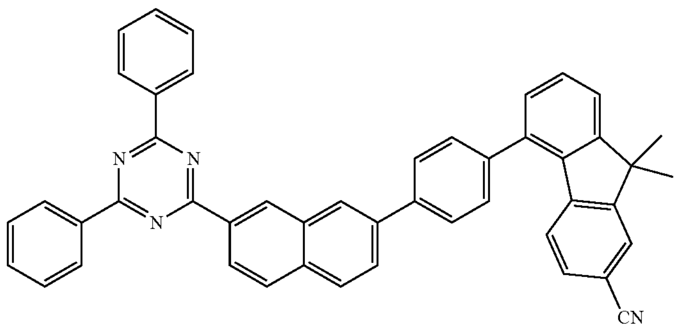
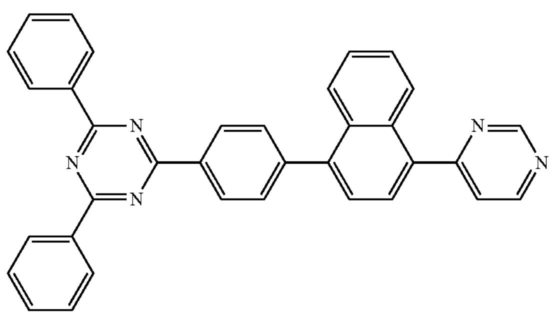
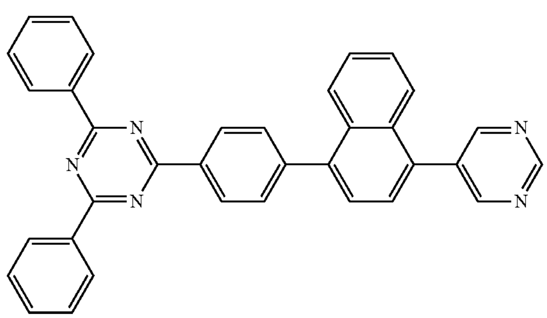
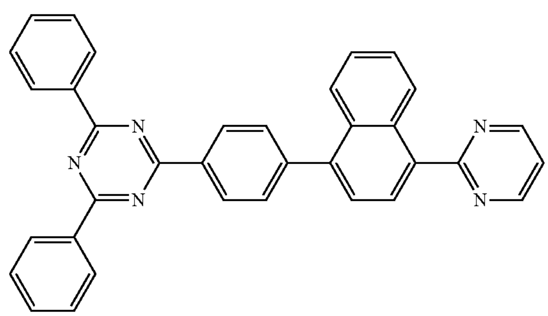
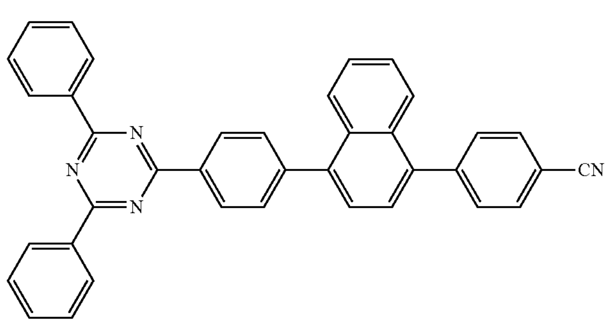
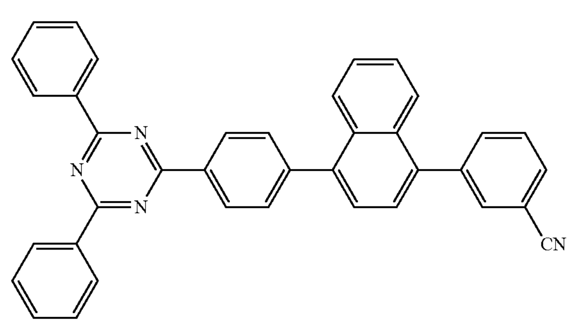

-continued
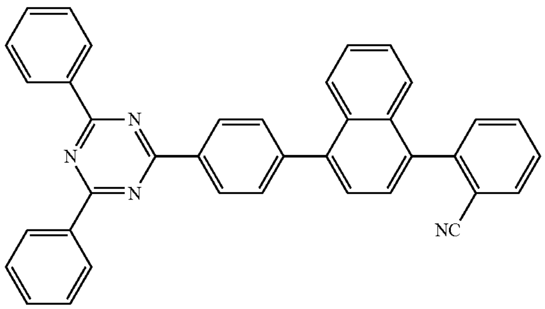
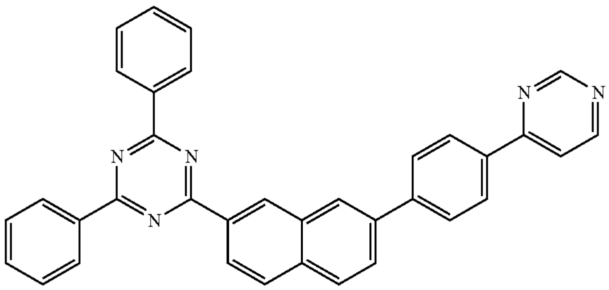
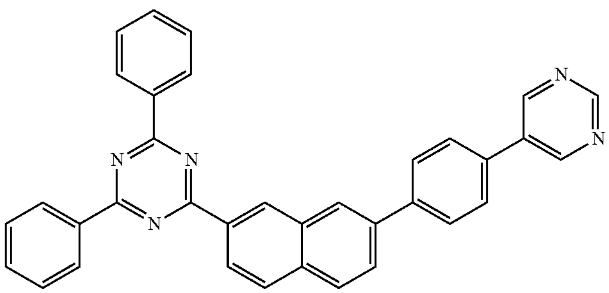
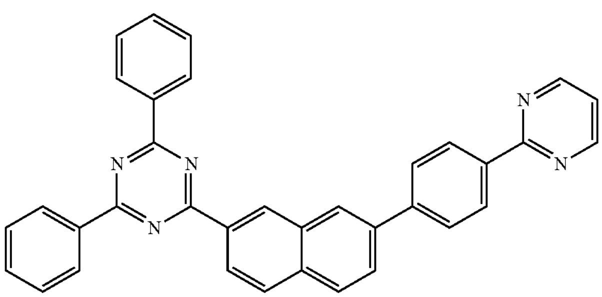
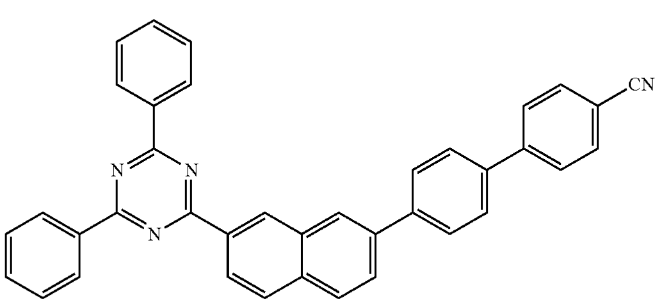

-continued
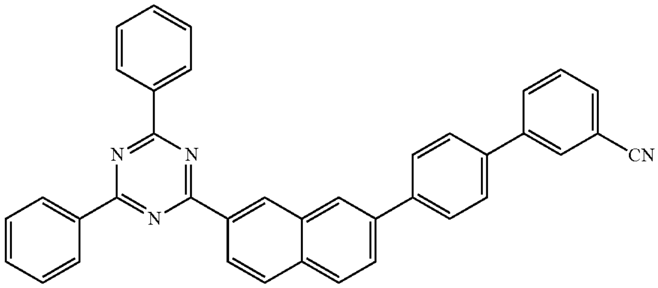
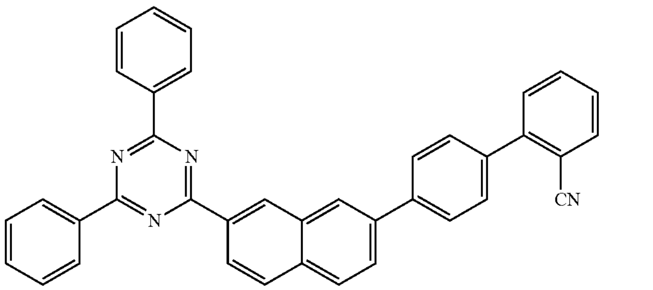
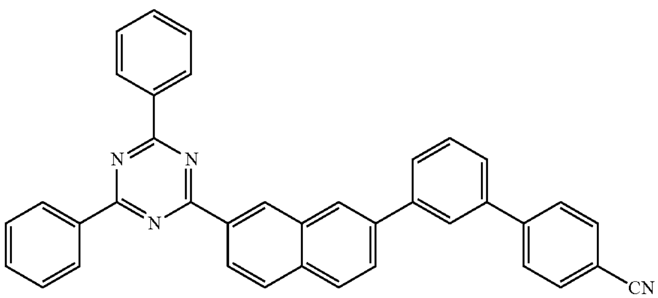
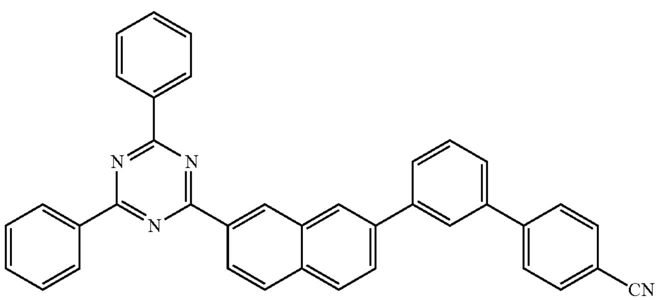
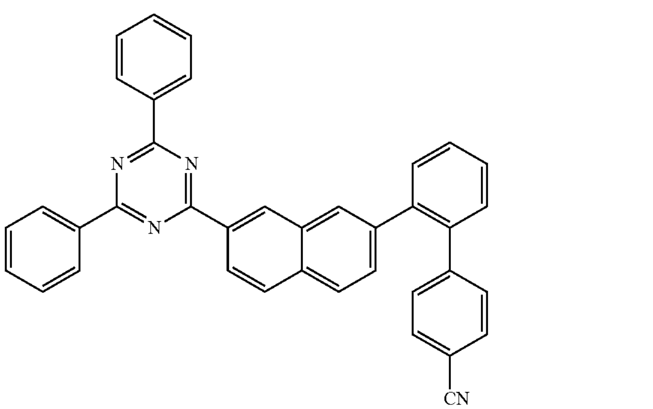

-continued
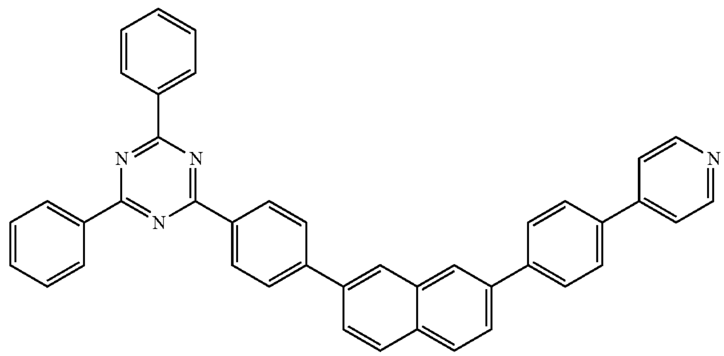
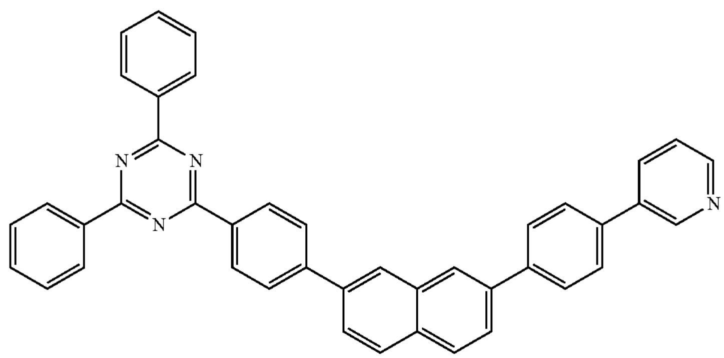
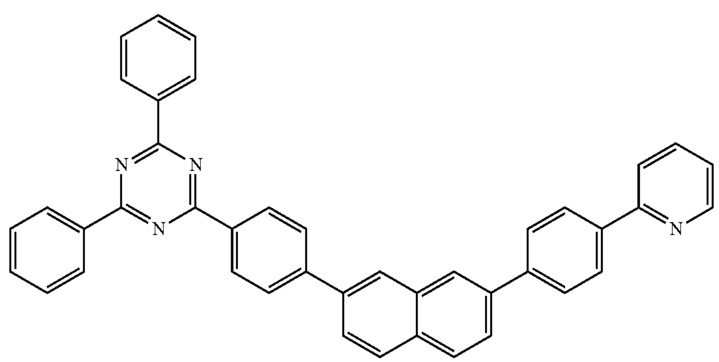
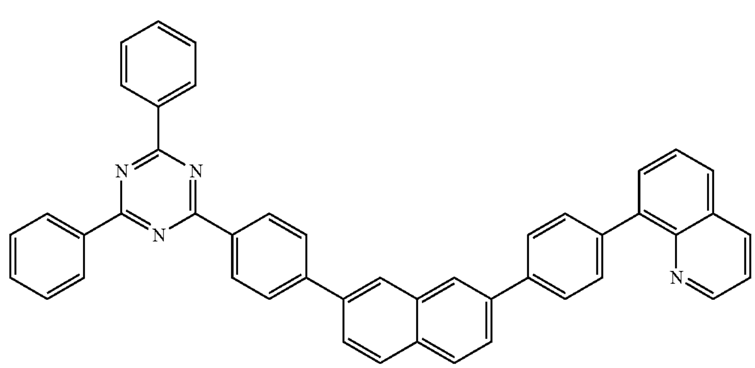

-continued
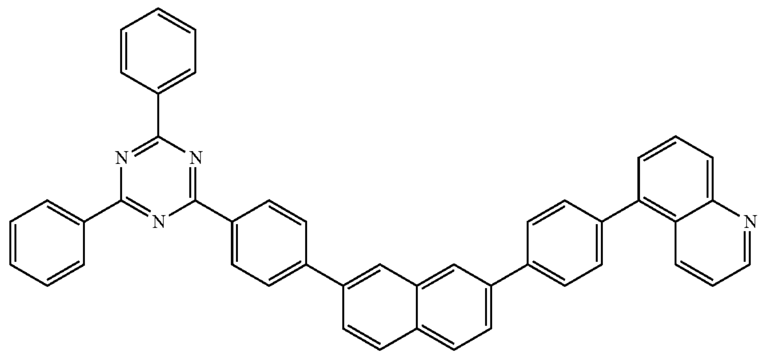
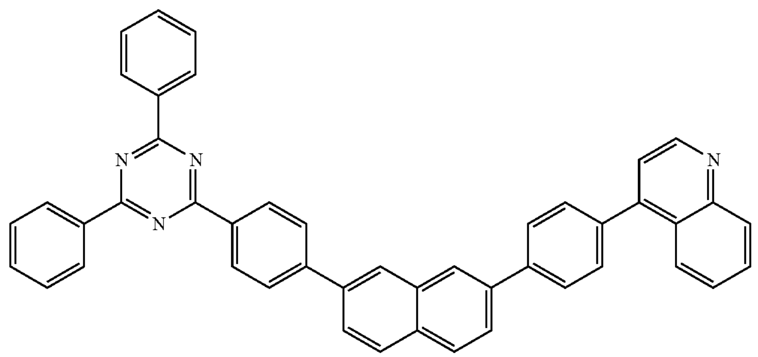
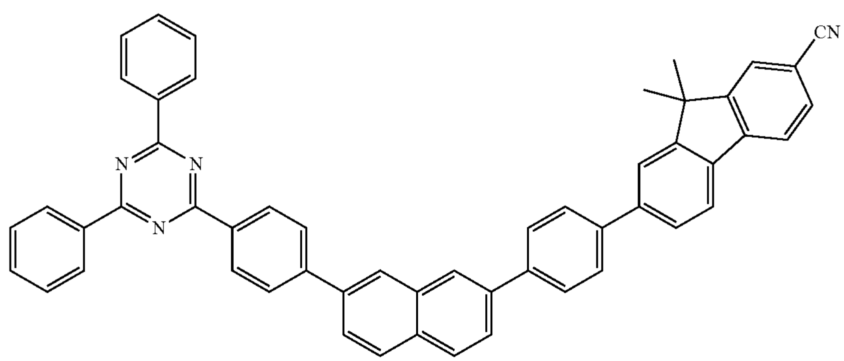
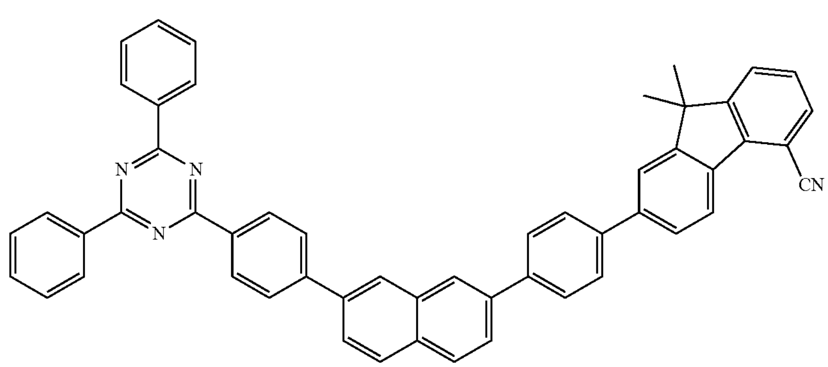

-continued
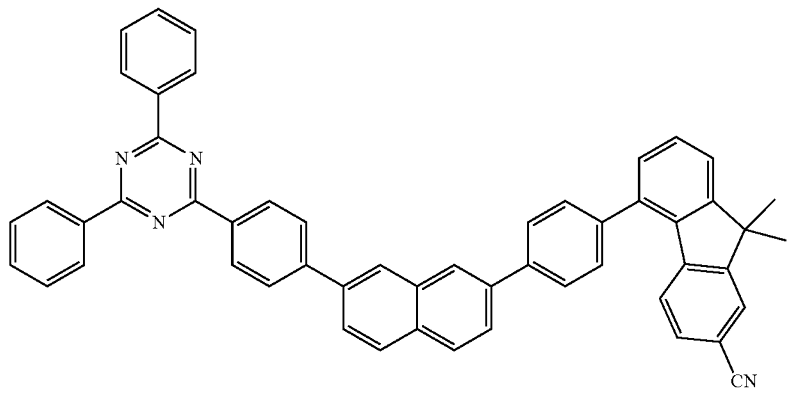
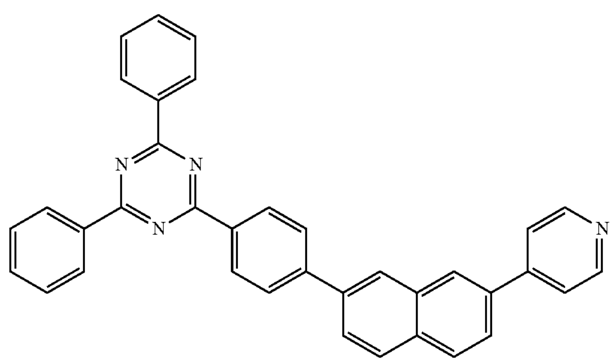
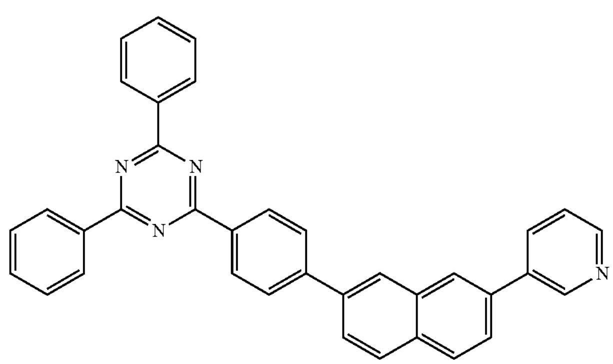
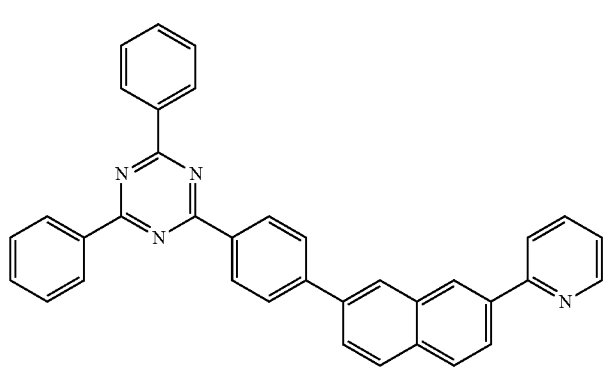

-continued
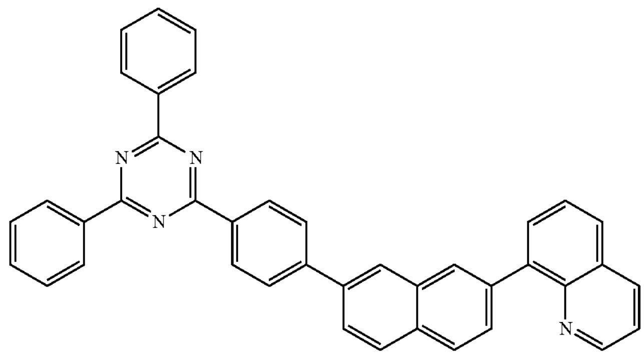
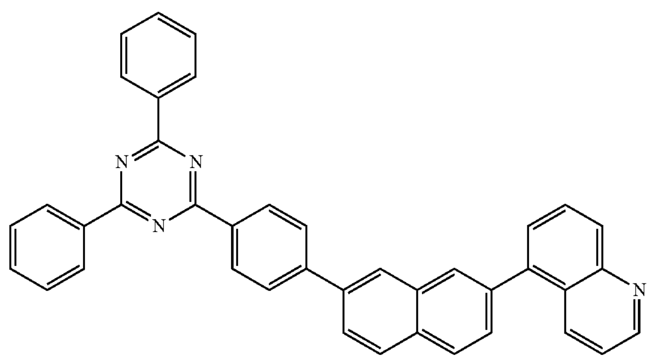
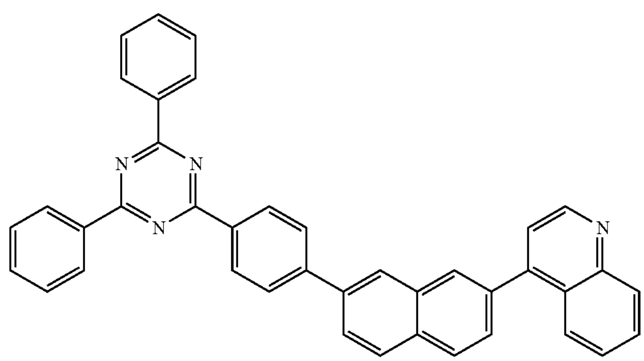
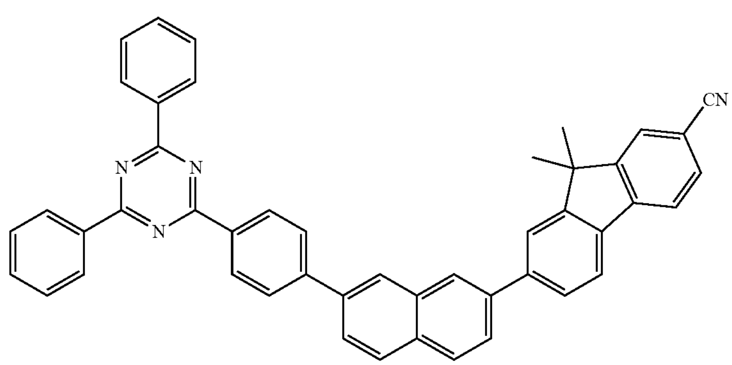

-continued
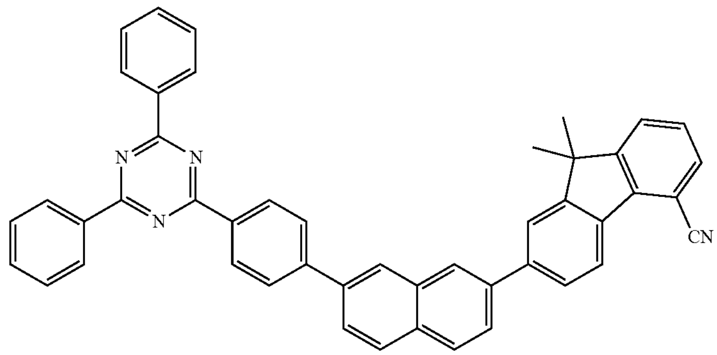
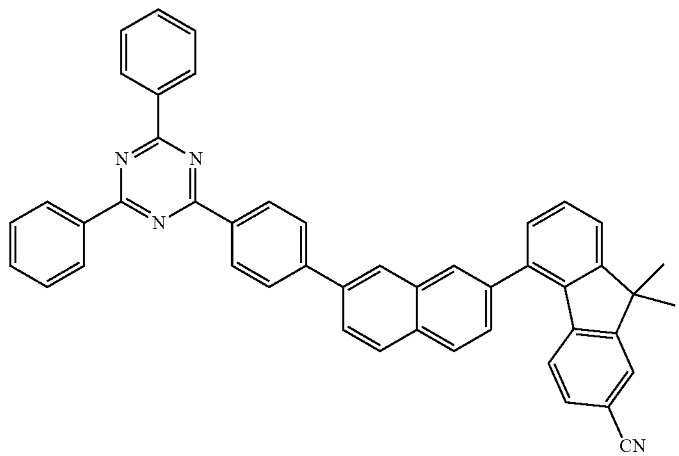
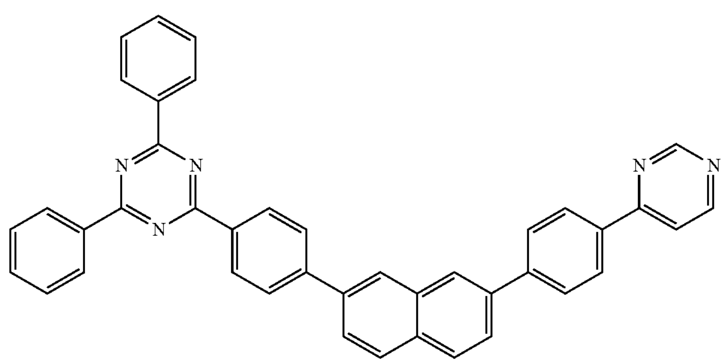
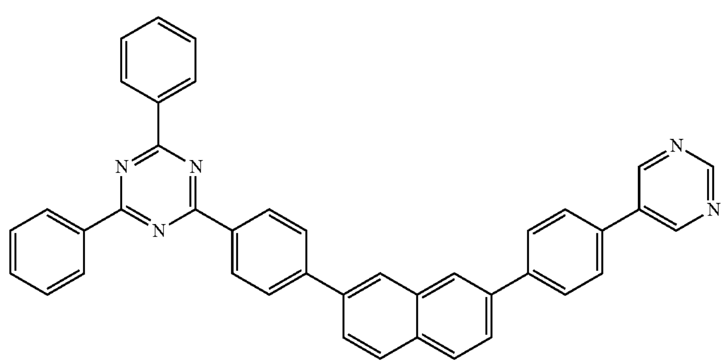

-continued
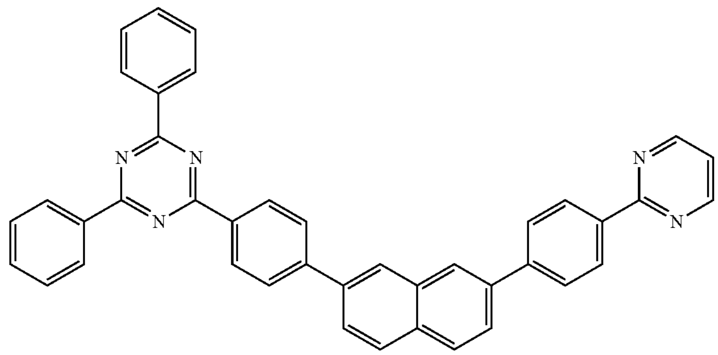
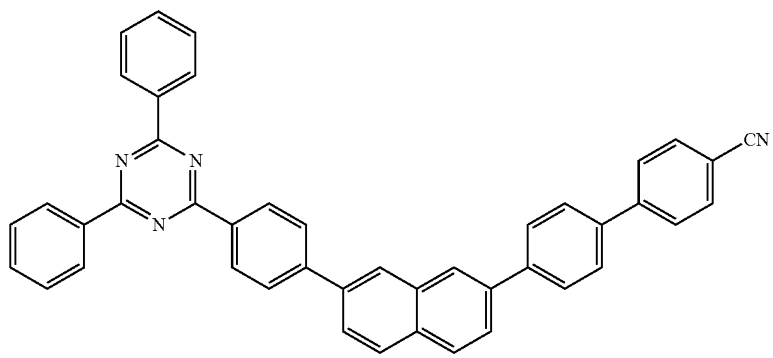
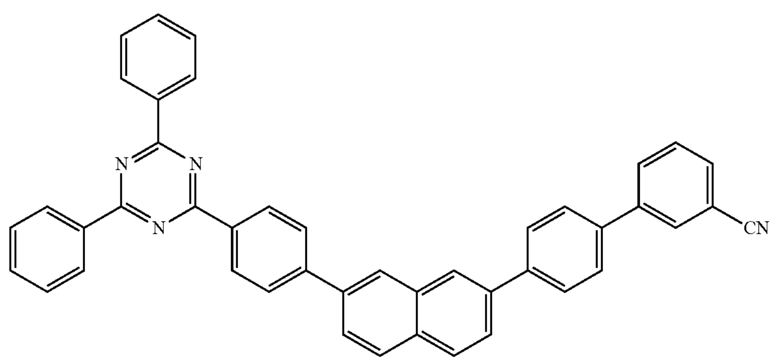
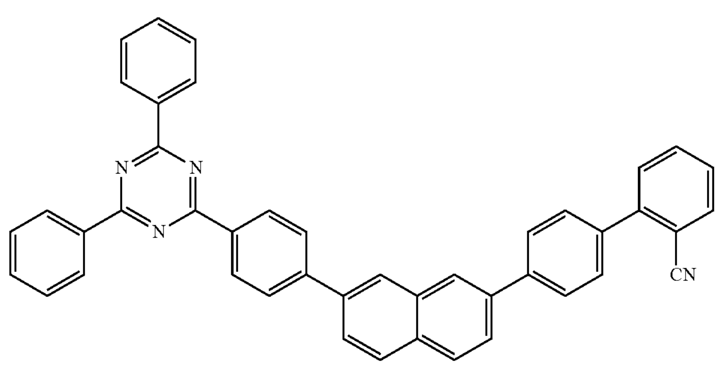

-continued
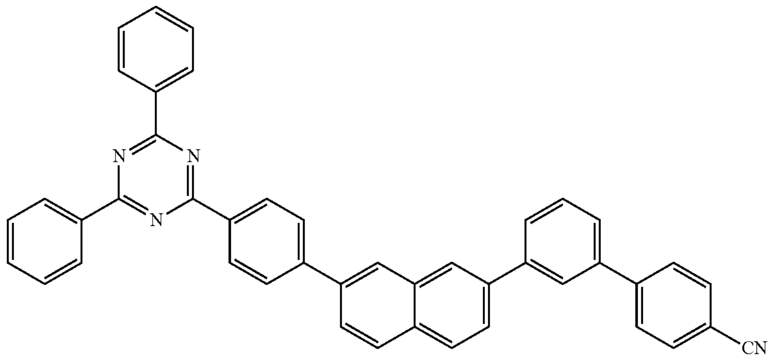
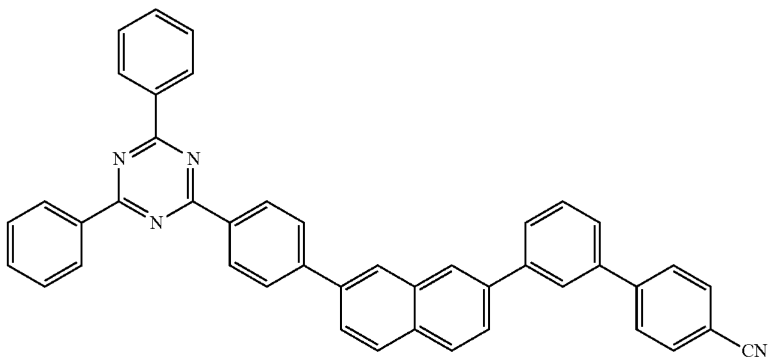
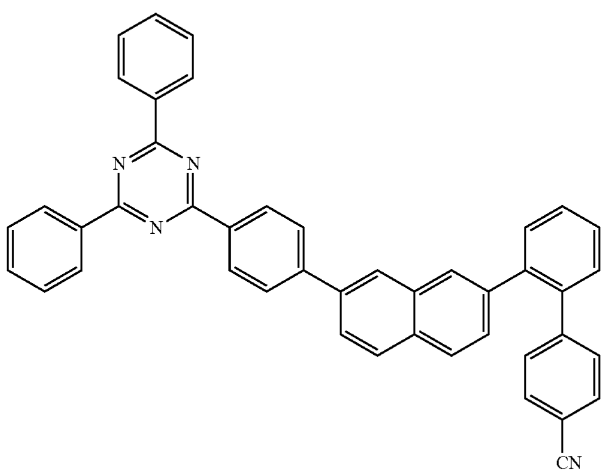
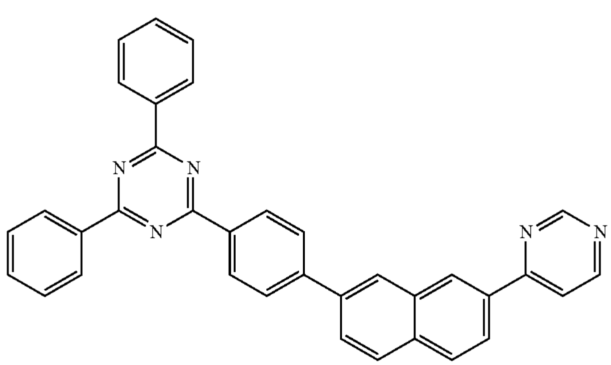

-continued
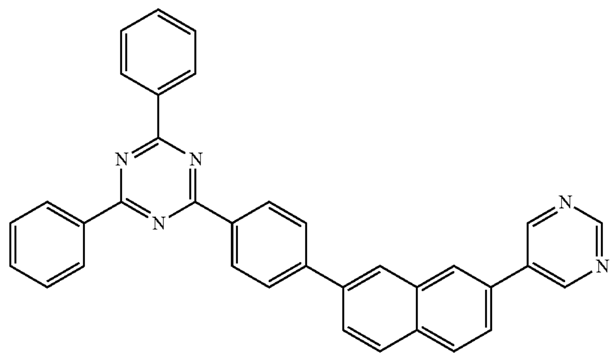
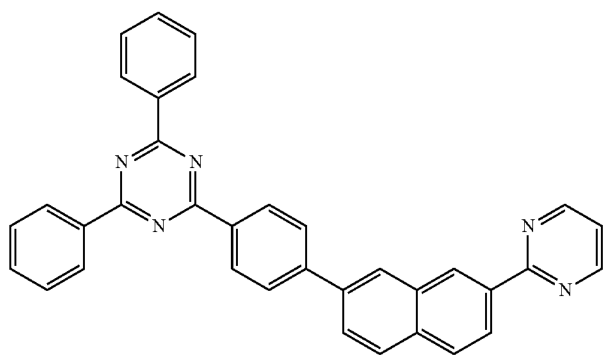
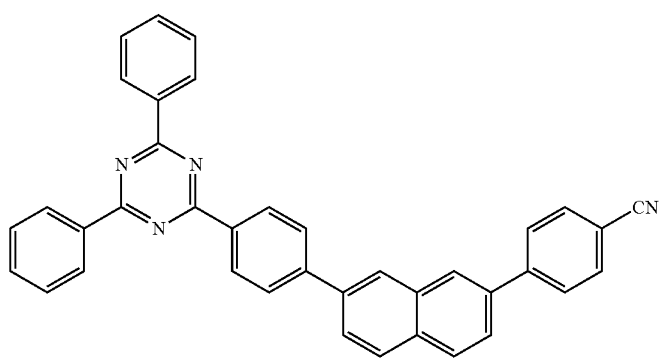
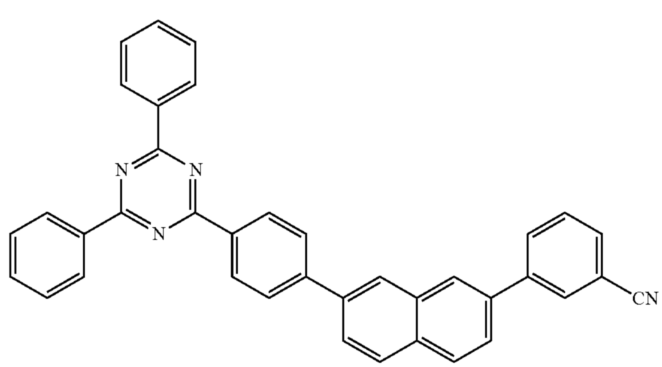

-continued
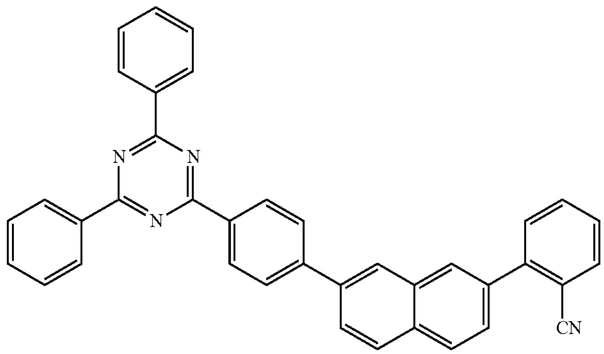
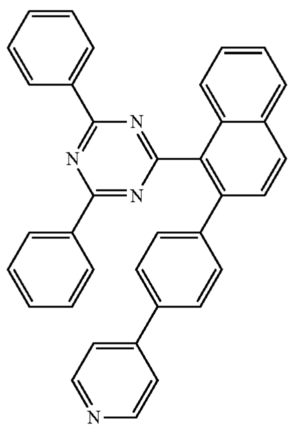
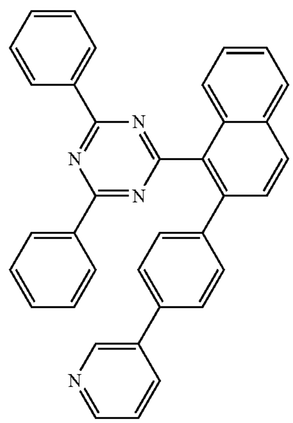
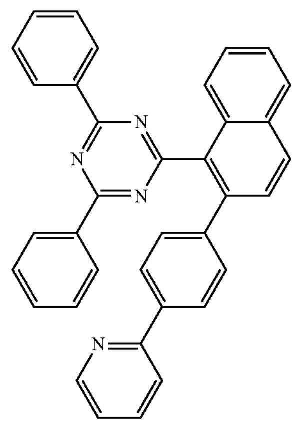
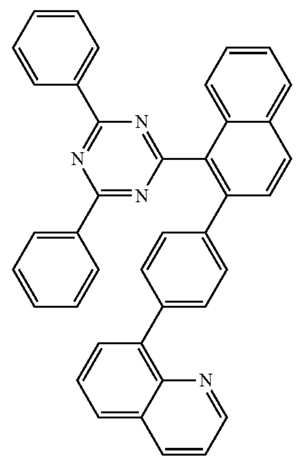
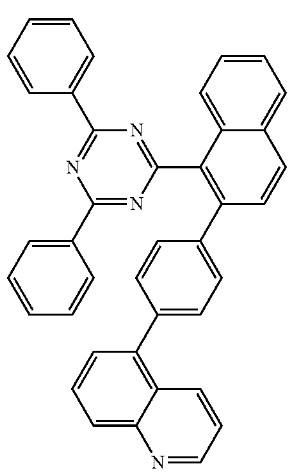
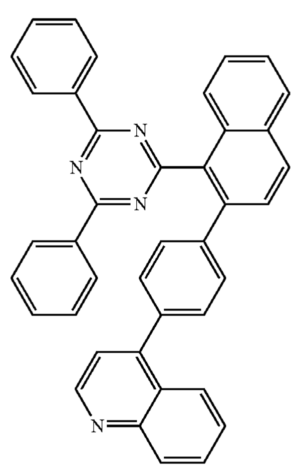
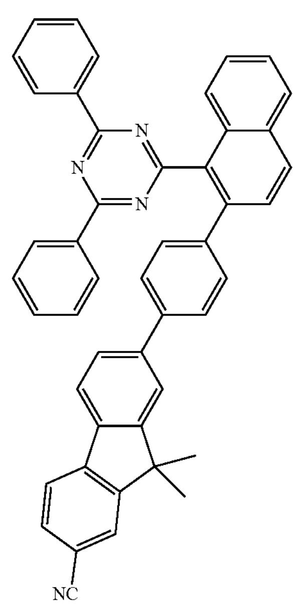

-continued
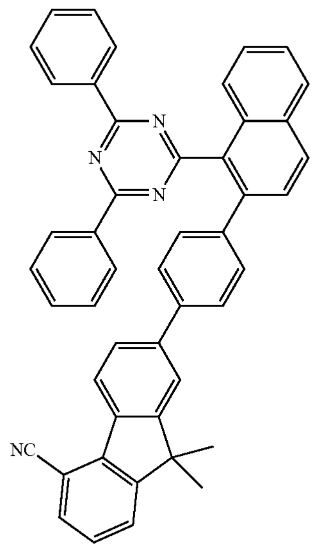
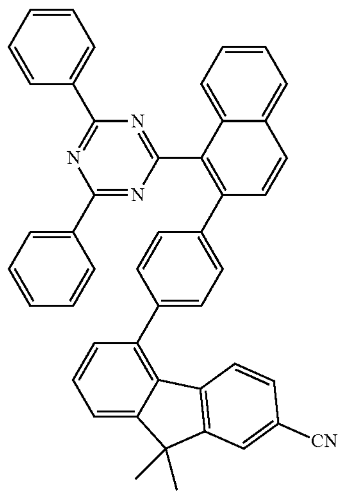
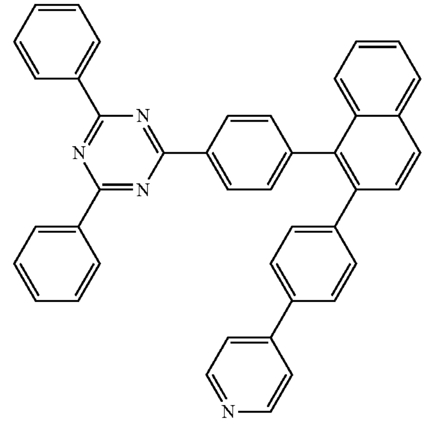
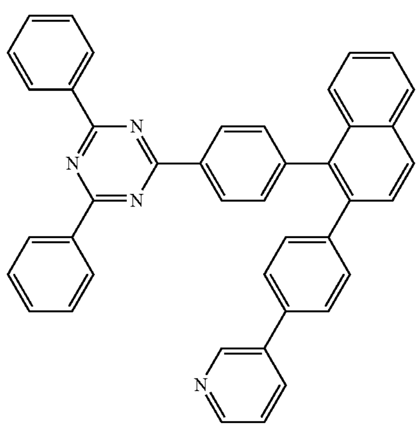
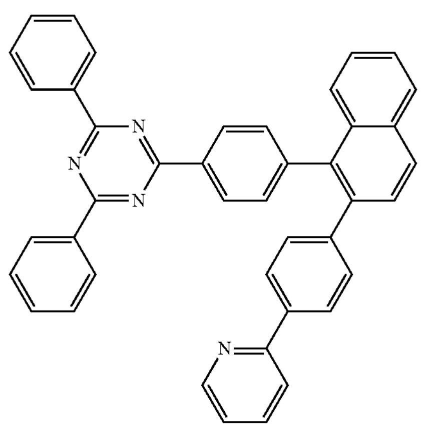
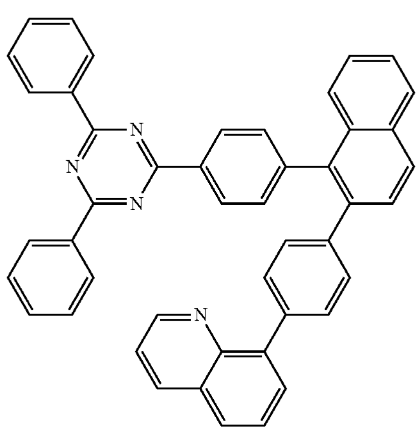
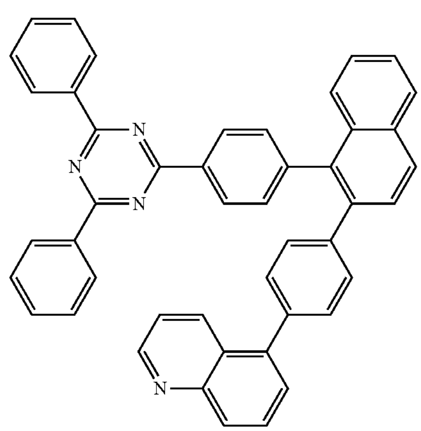

-continued
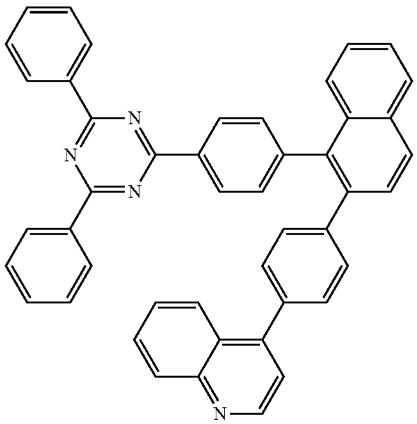
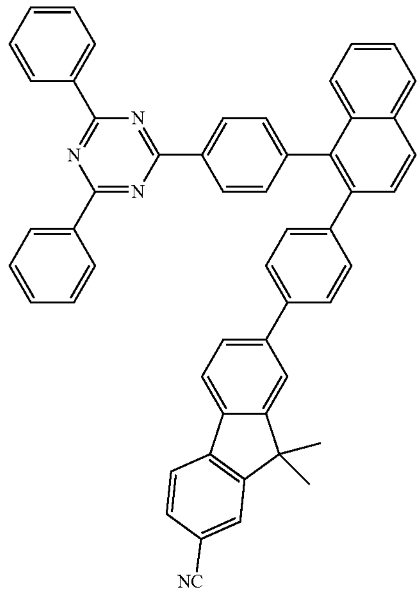
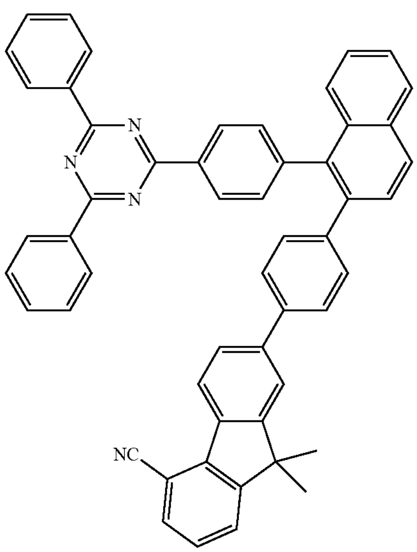
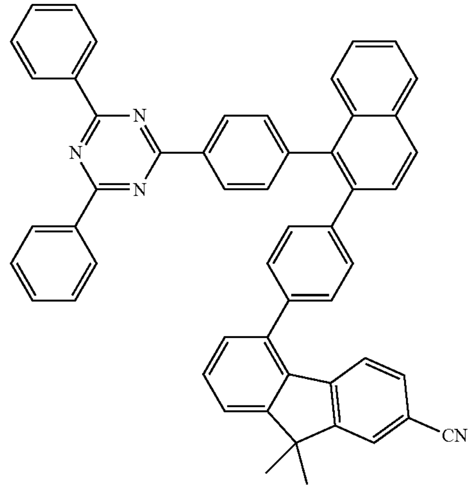
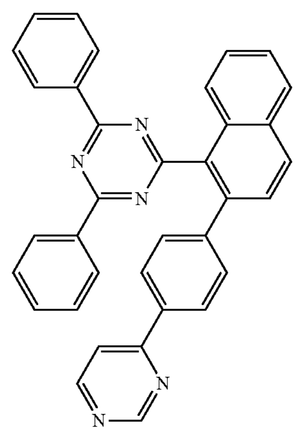
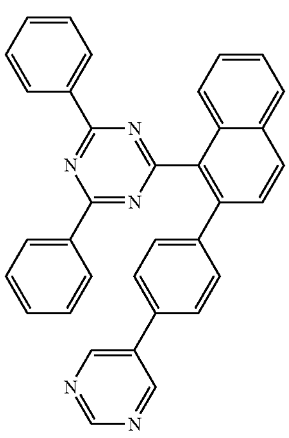
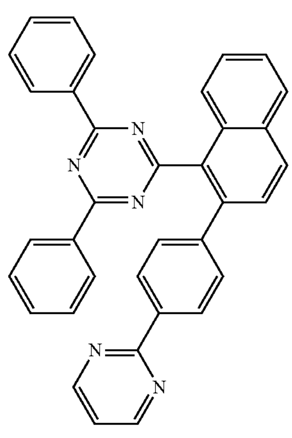
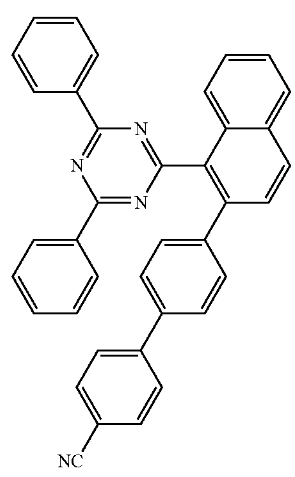

-continued
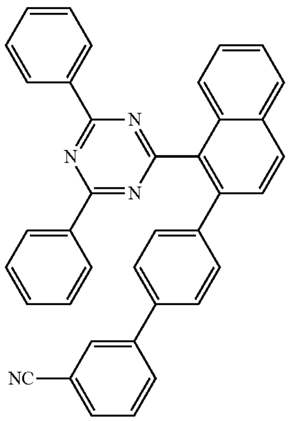
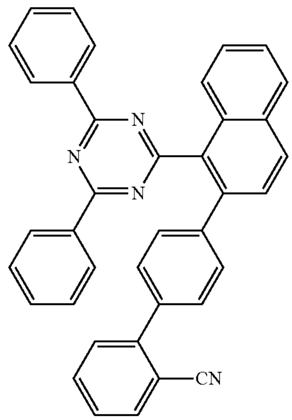
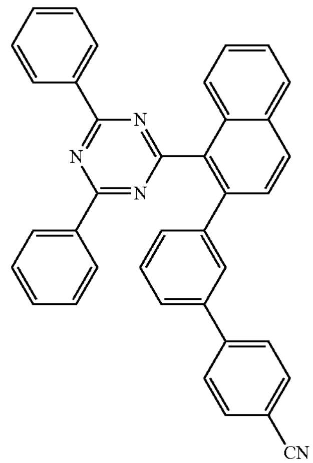
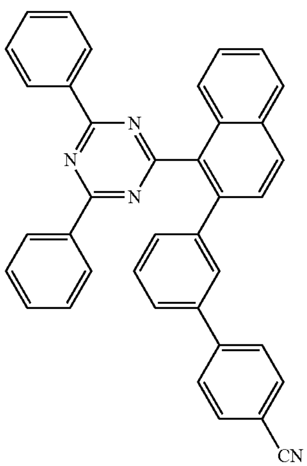
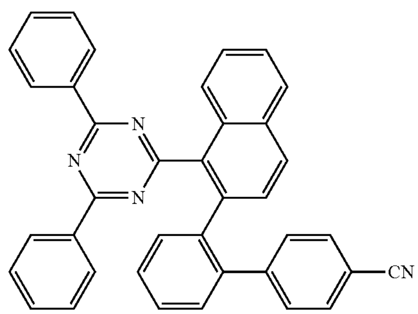
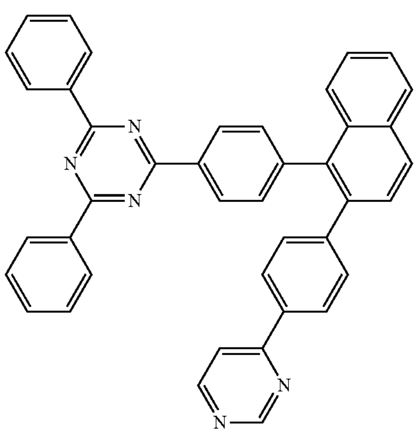
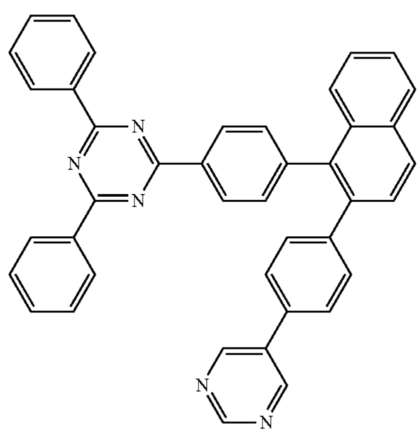

-continued
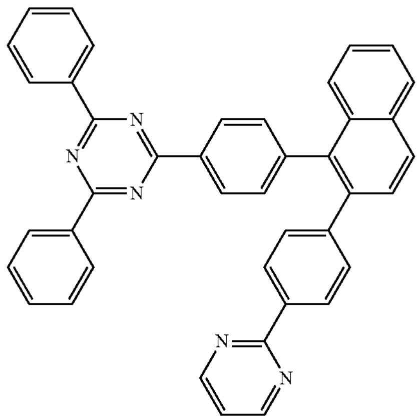
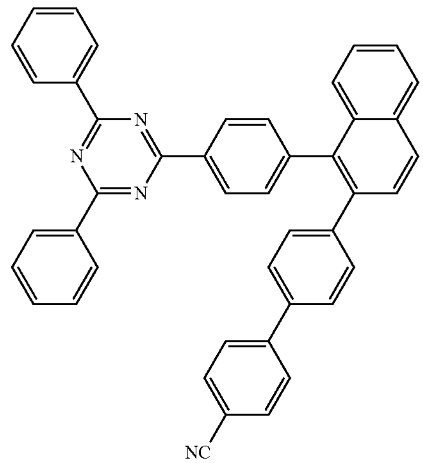
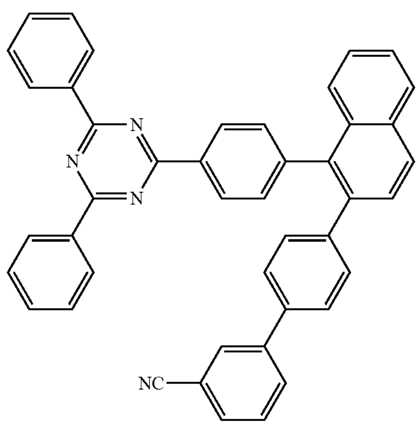
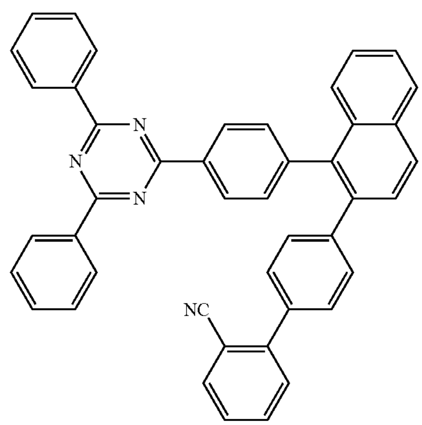
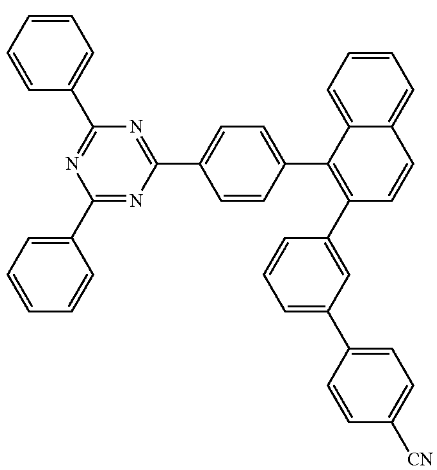
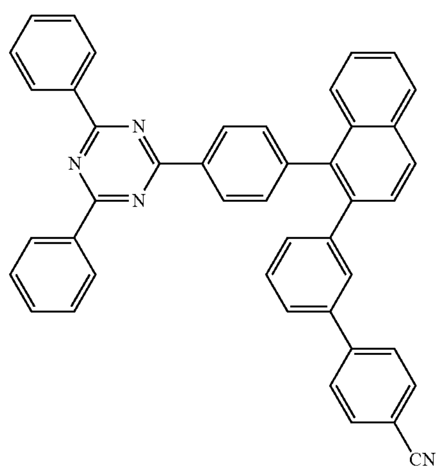
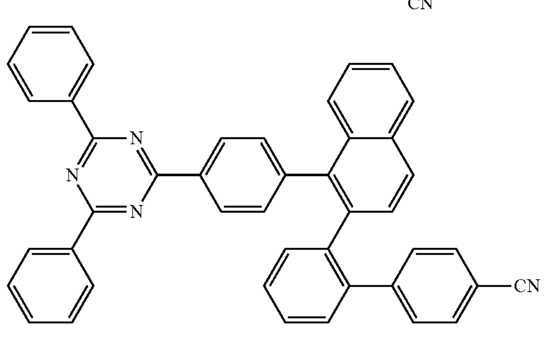
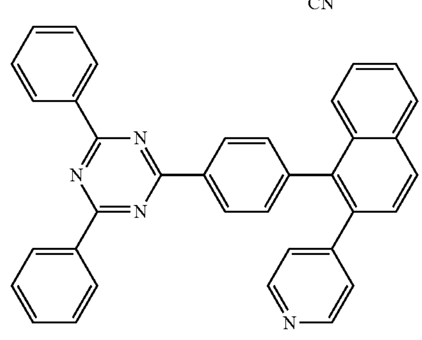

-continued
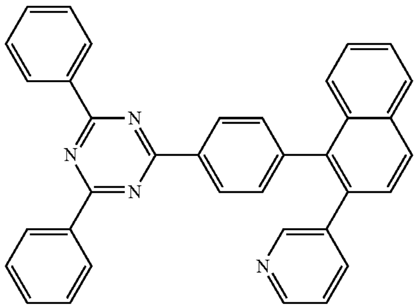
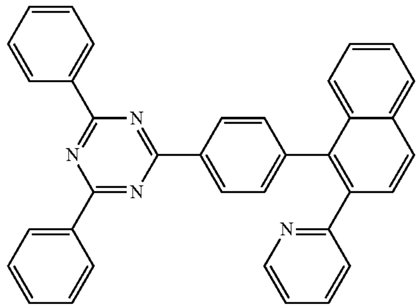
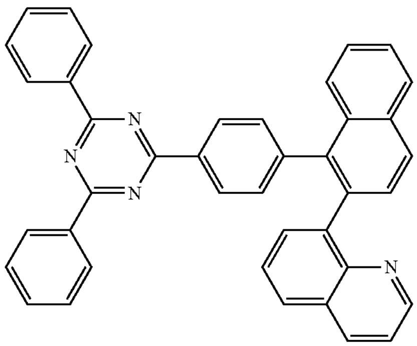
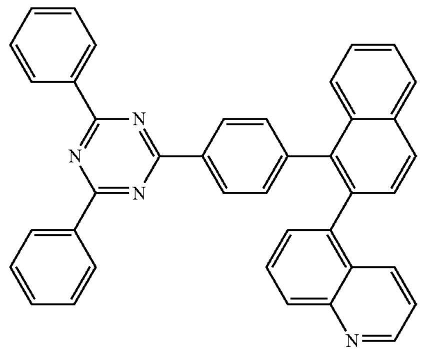
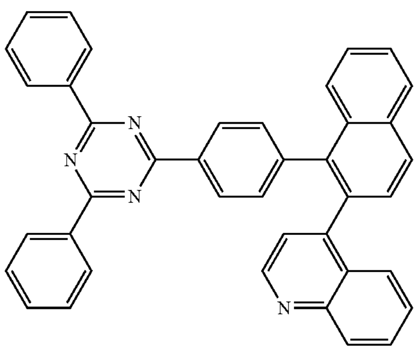
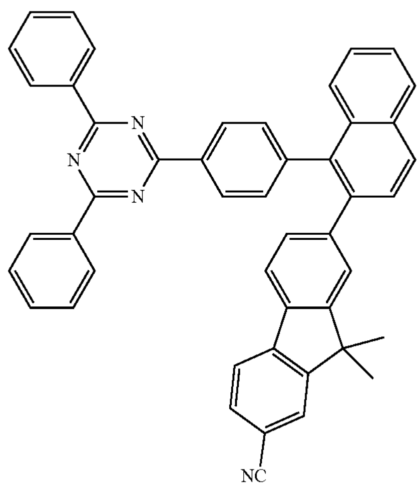
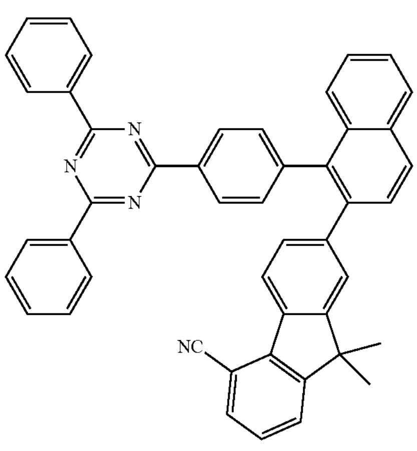
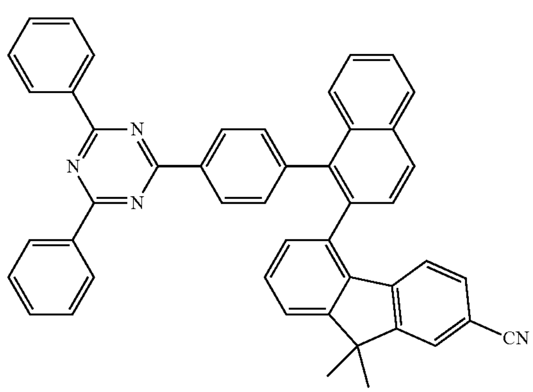

-continued
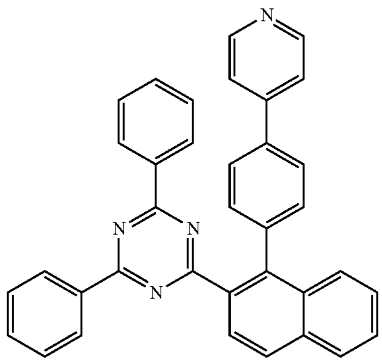
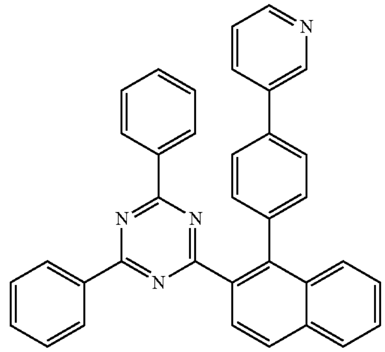
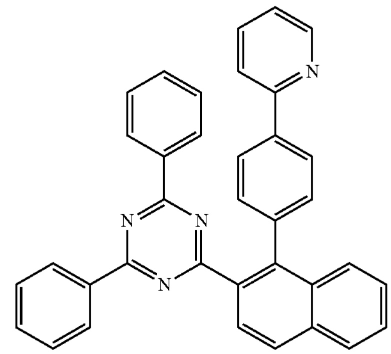
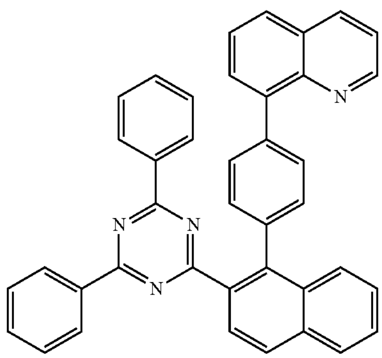
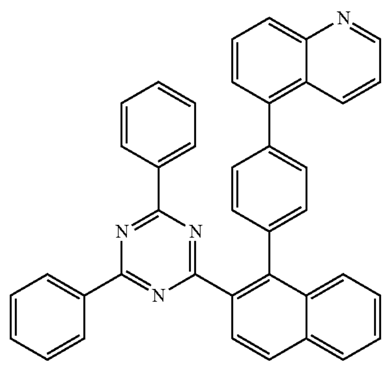
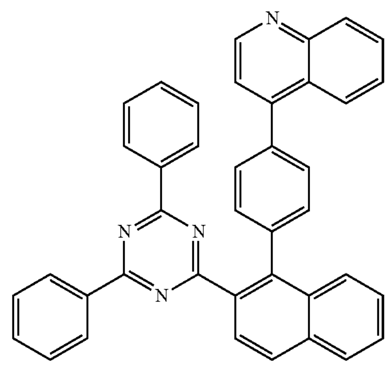
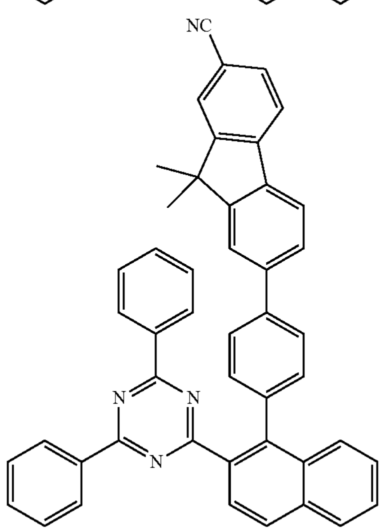
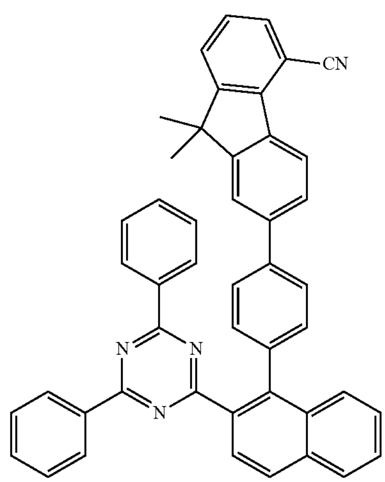
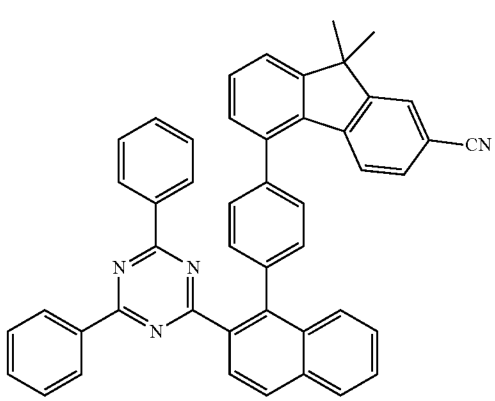
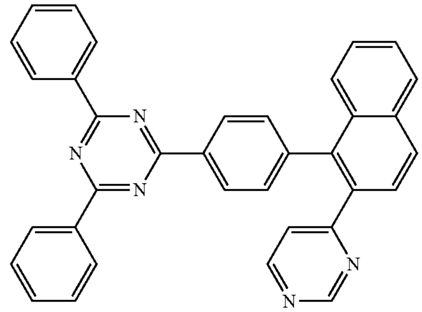

-continued
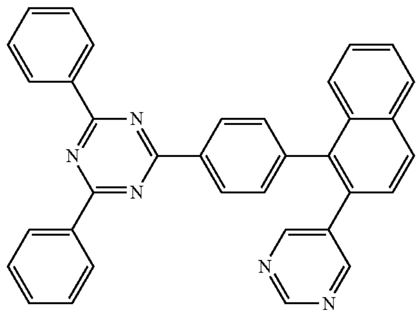
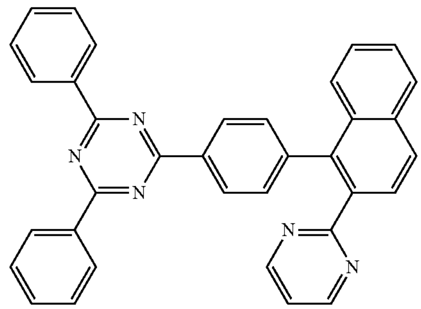
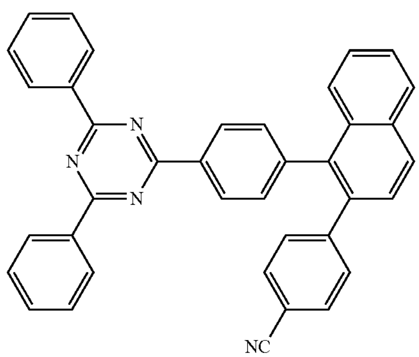
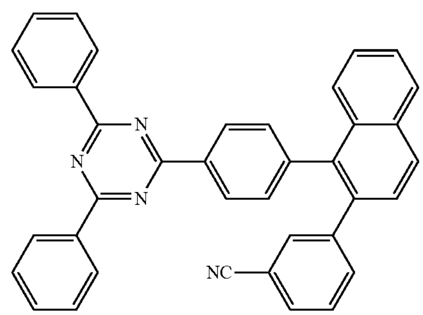
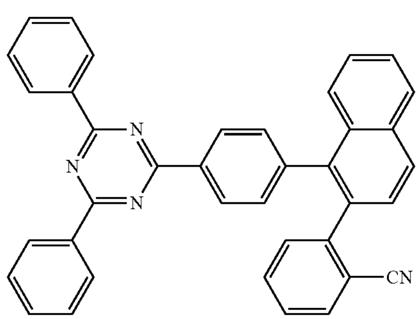
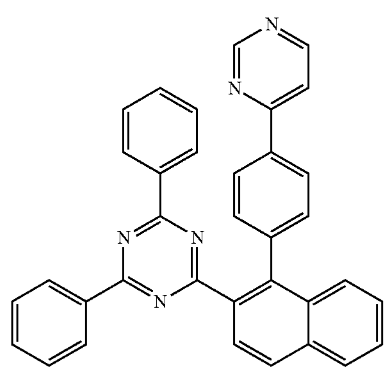
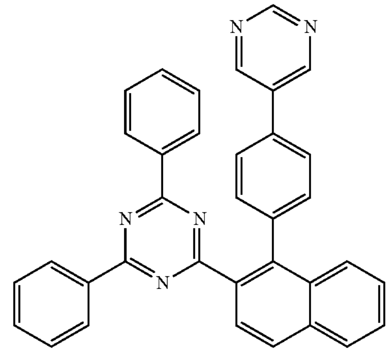
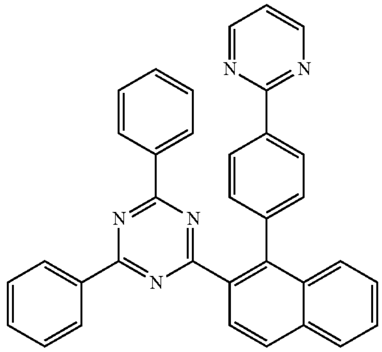
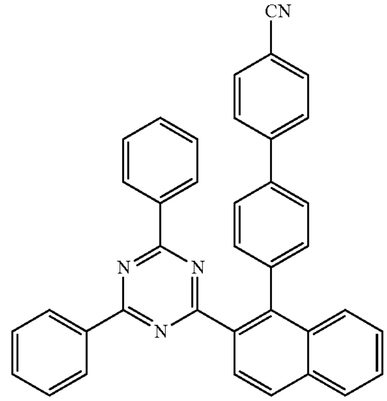
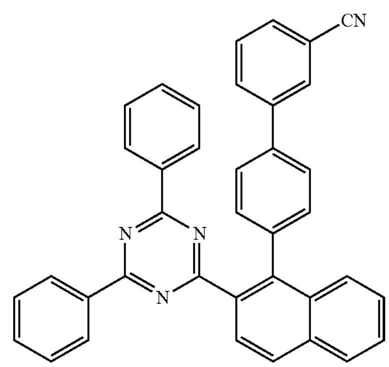

-continued
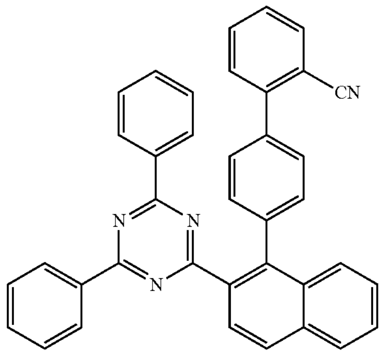
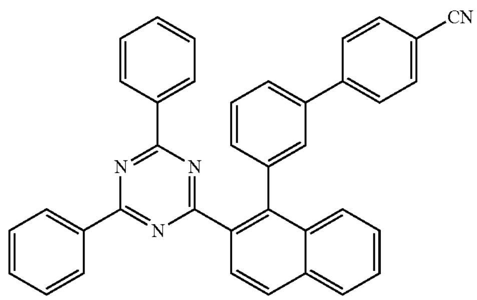
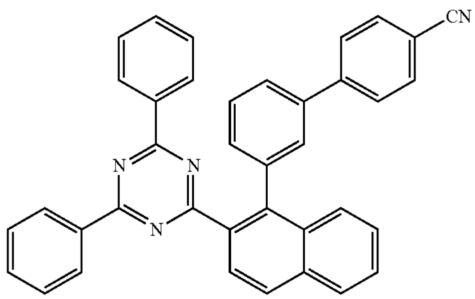
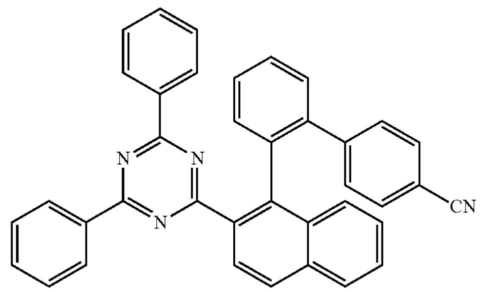
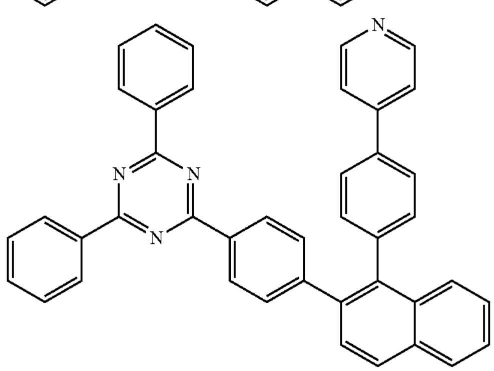
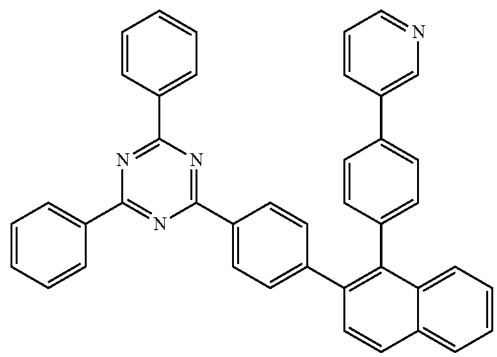
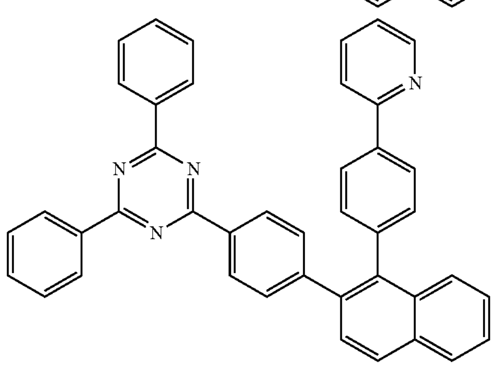
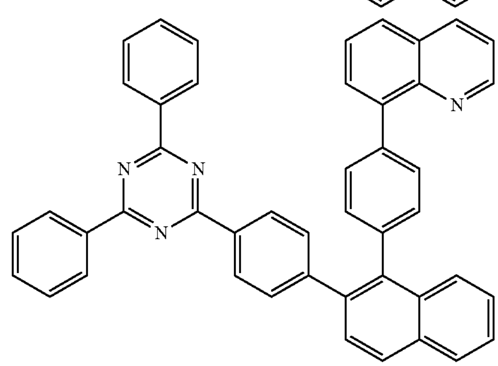
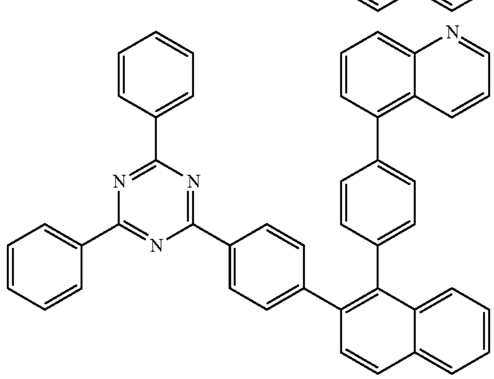
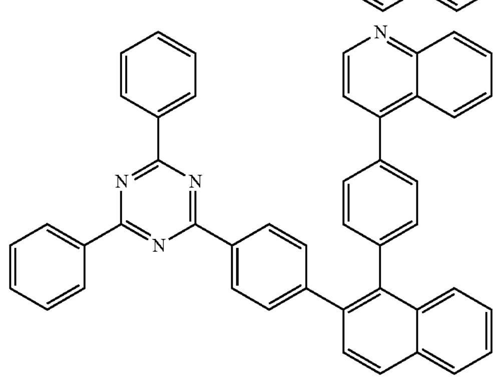

-continued
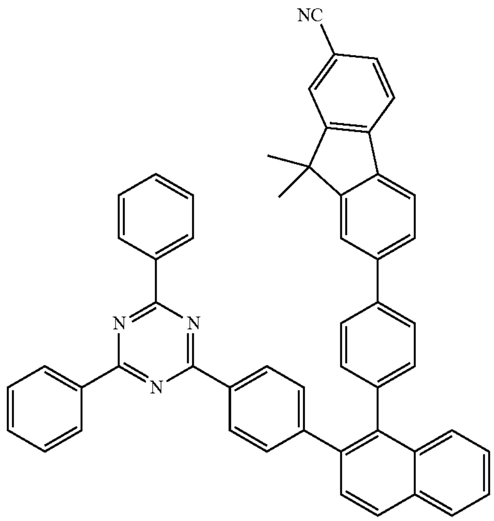
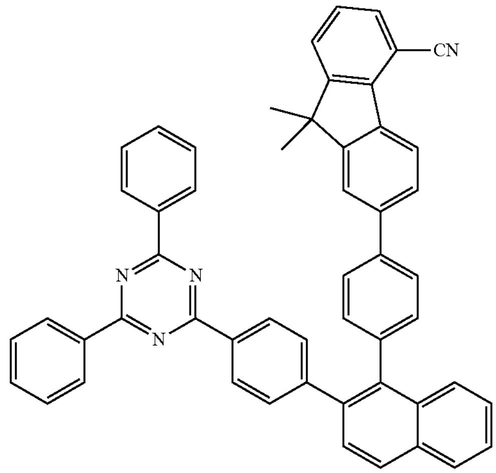
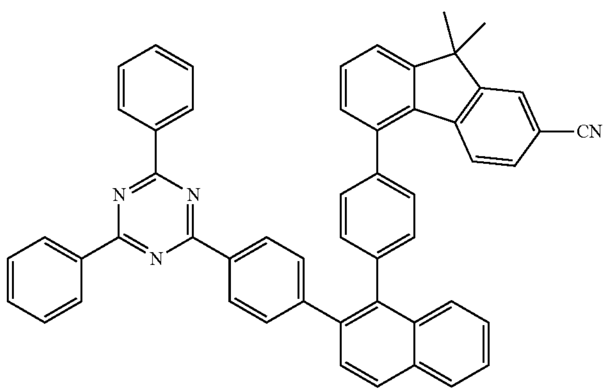
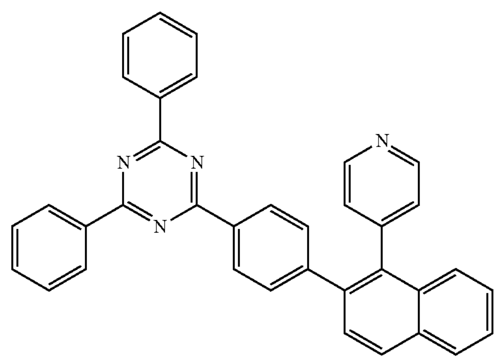
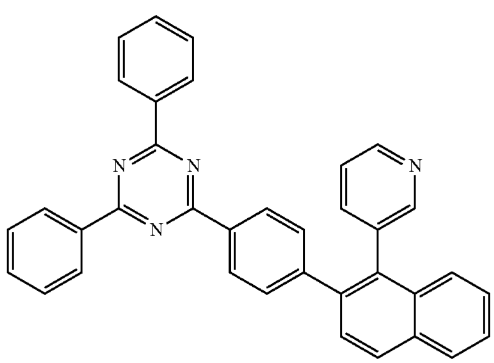
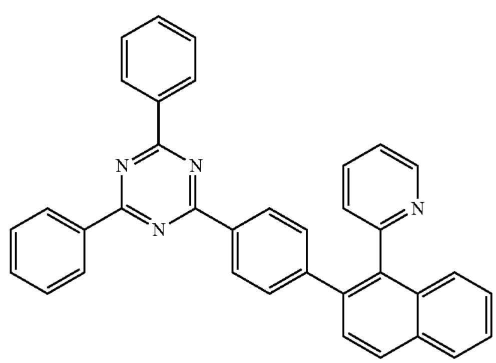
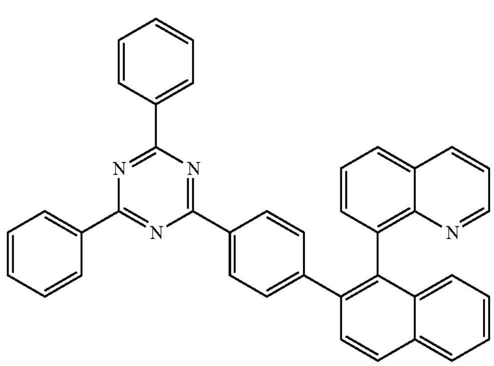
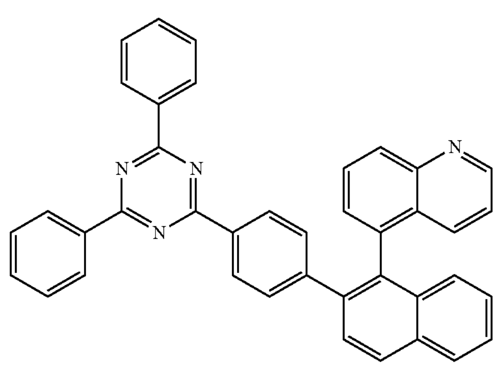

-continued
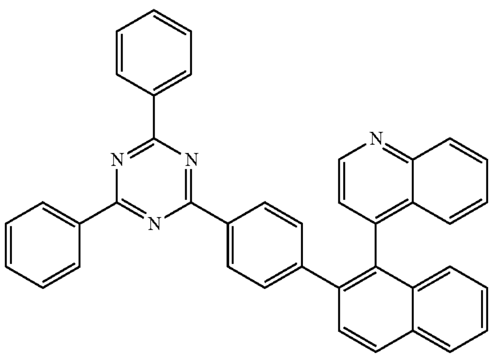
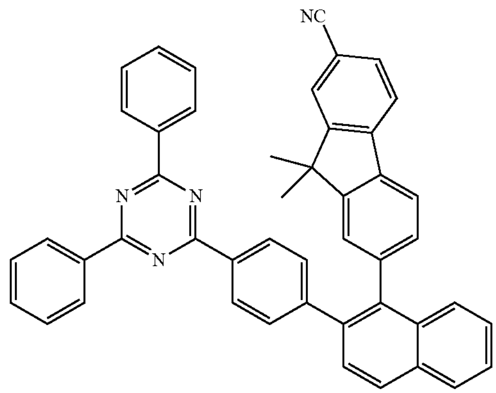
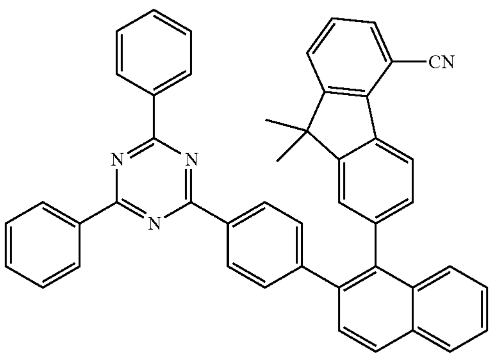
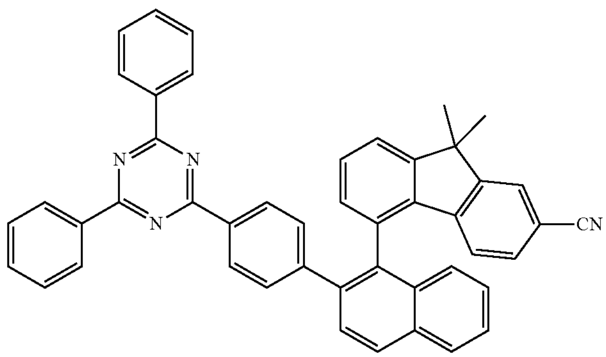
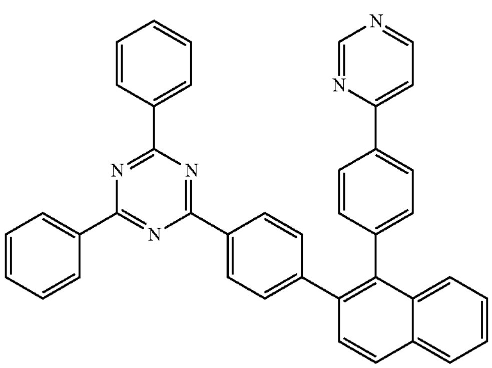
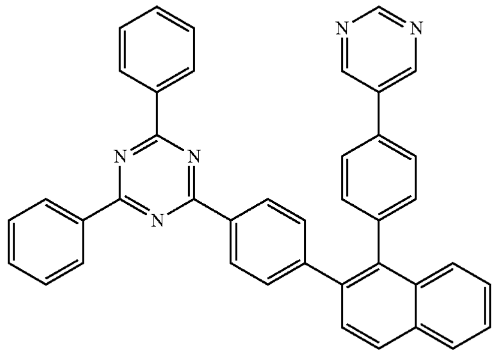
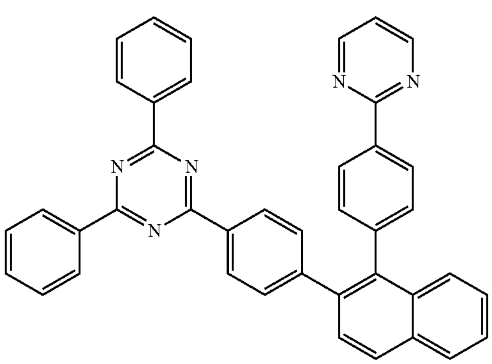
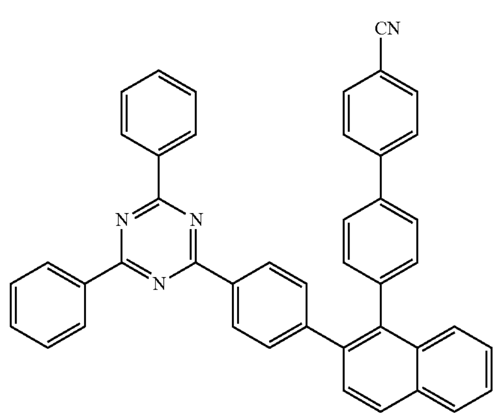

-continued
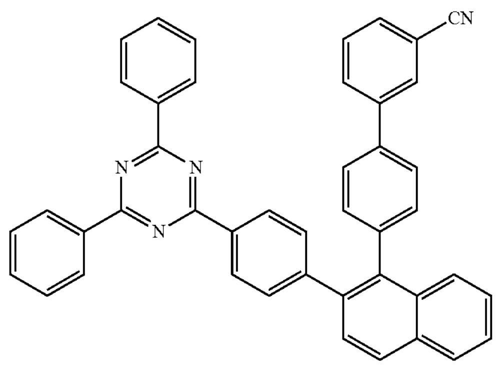
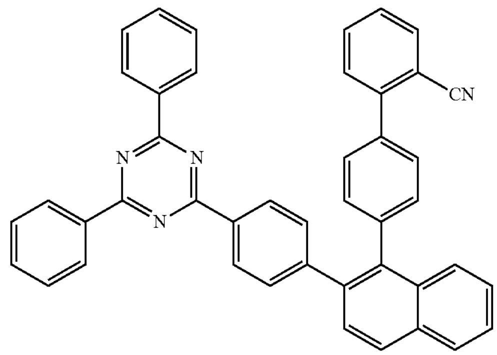
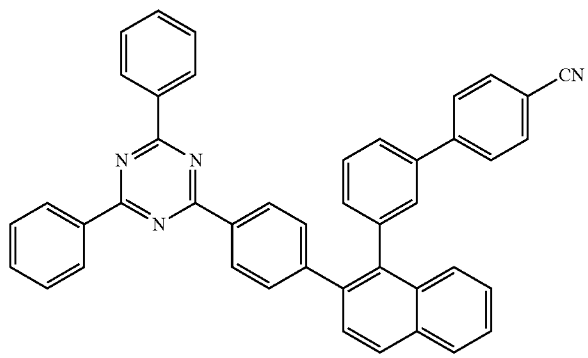
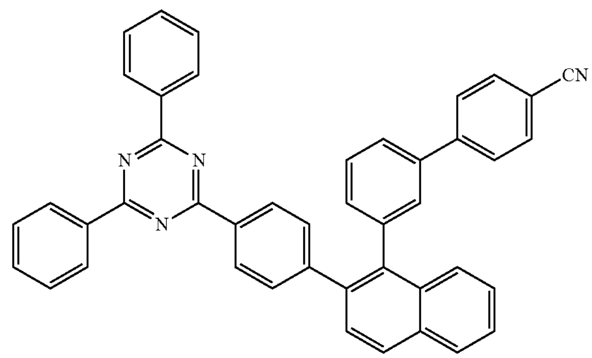
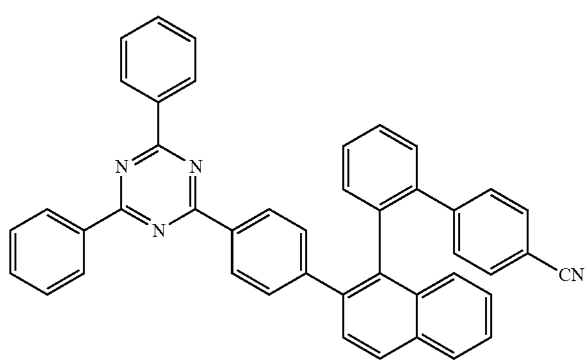
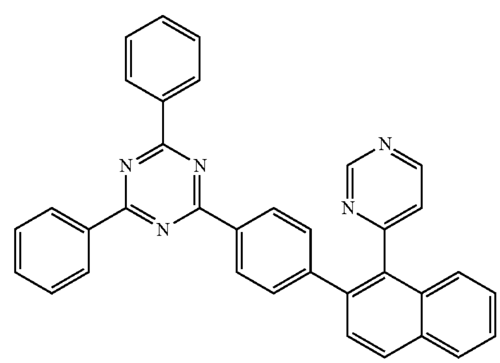
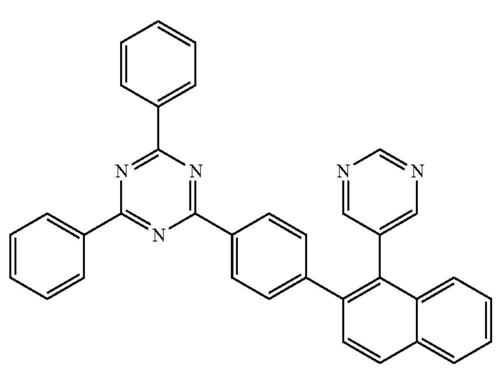
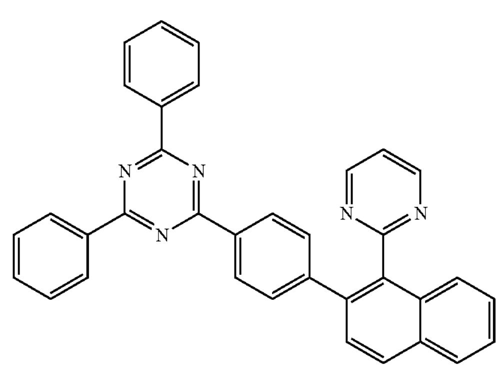

-continued
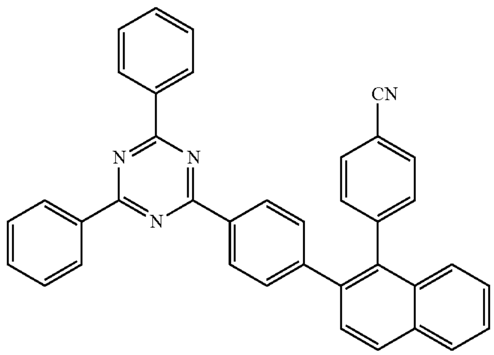
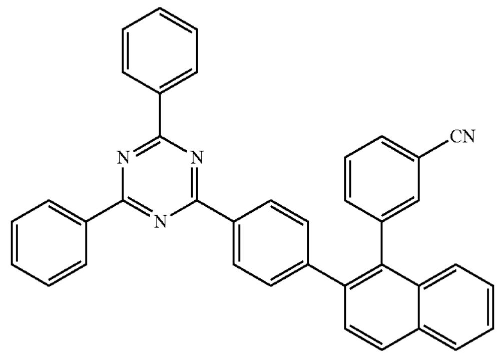
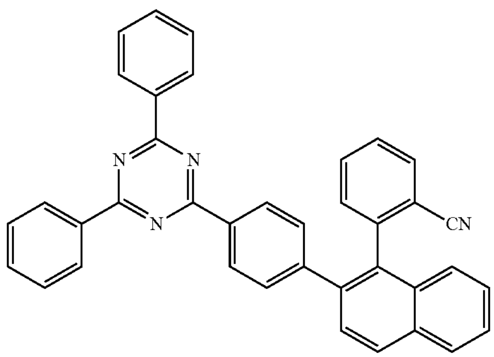
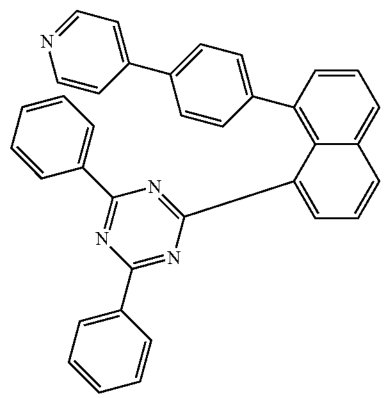
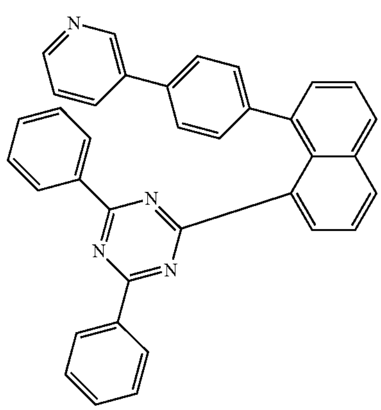
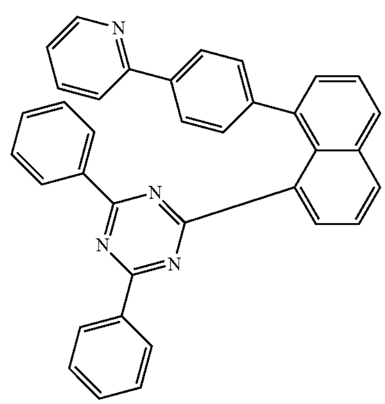
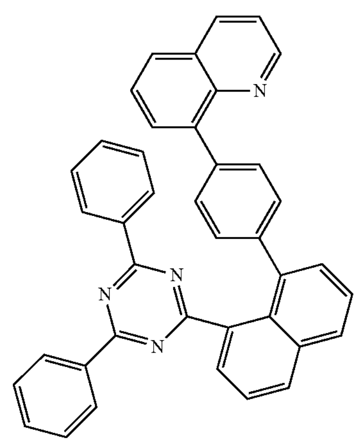
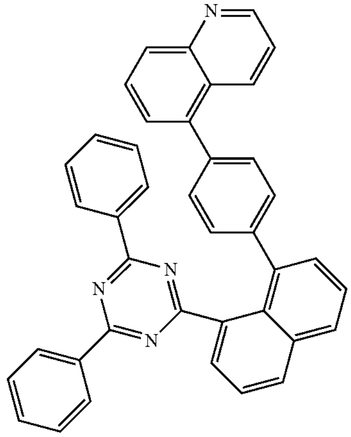
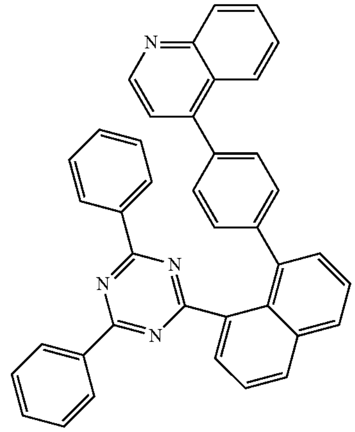

-continued
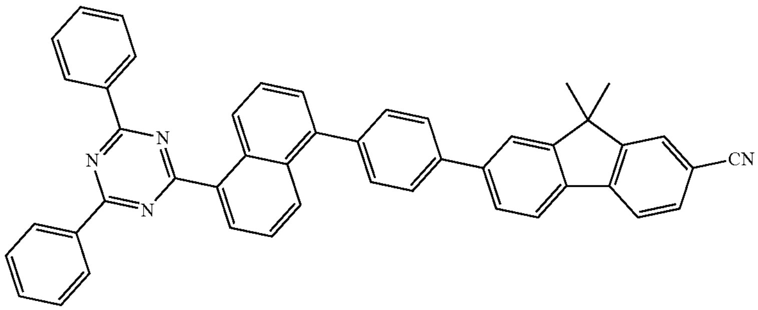
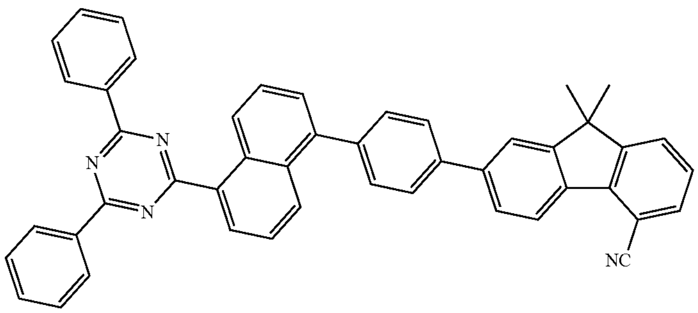
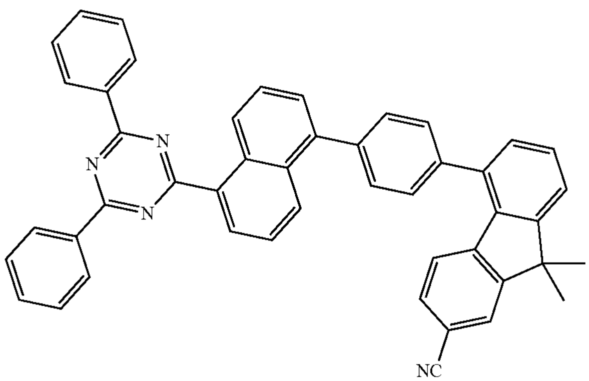
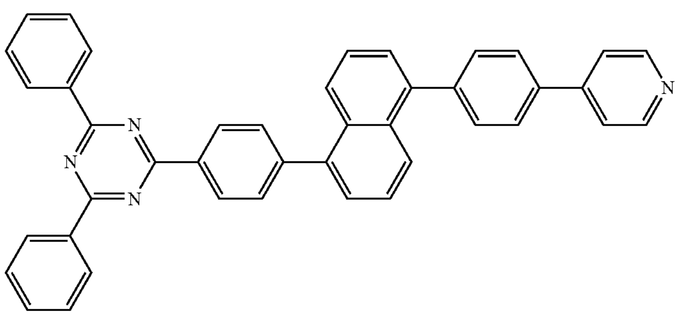
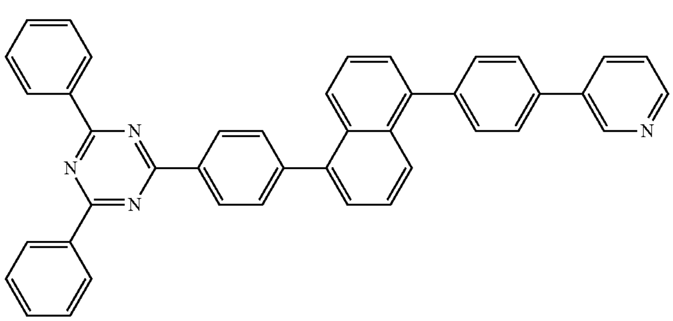

-continued
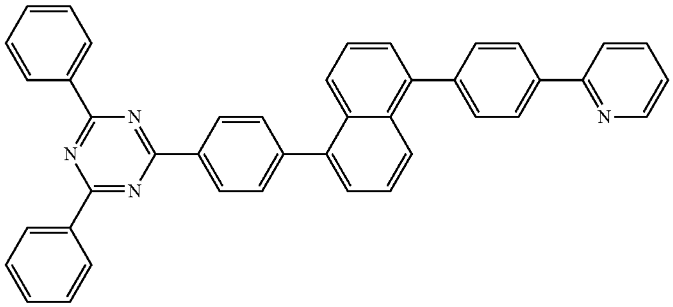
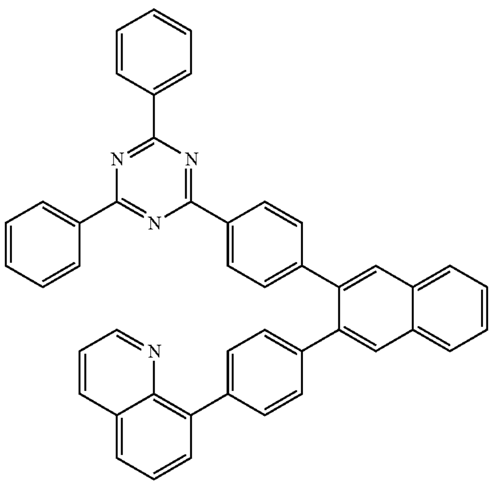
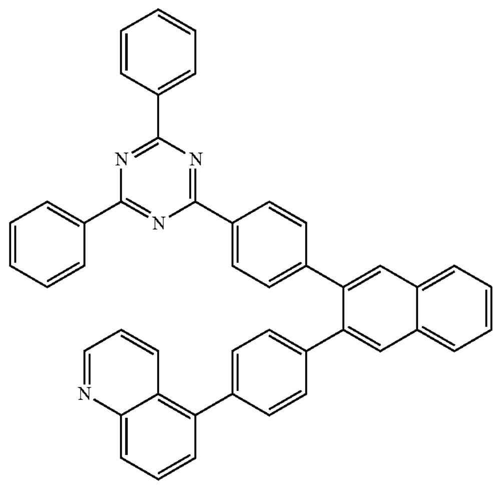
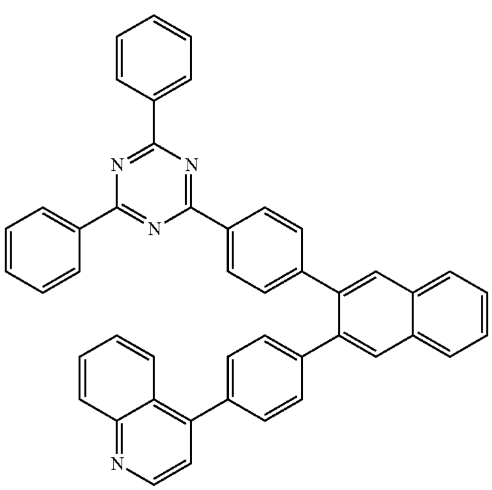
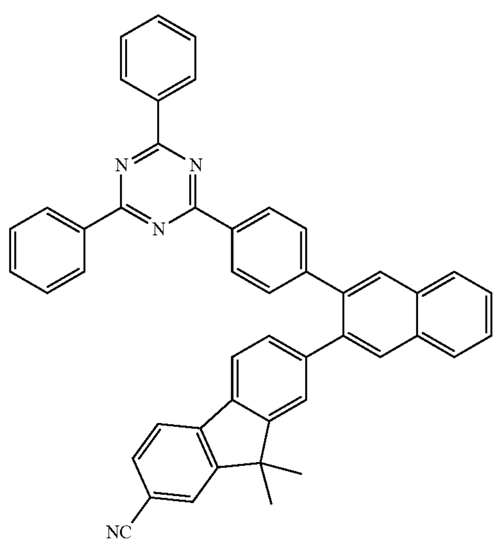

-continued
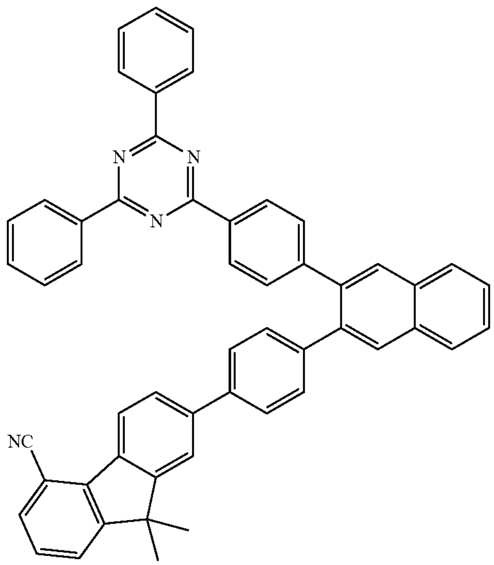
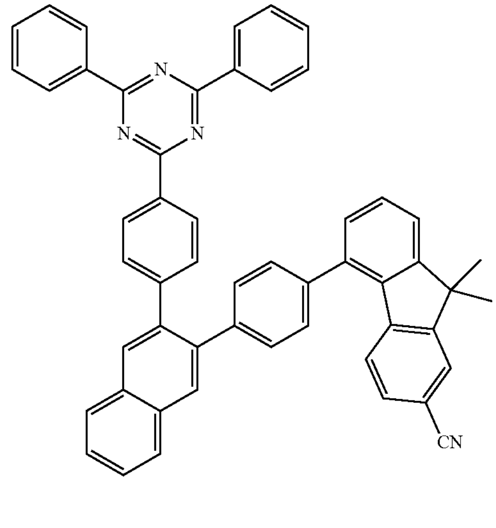
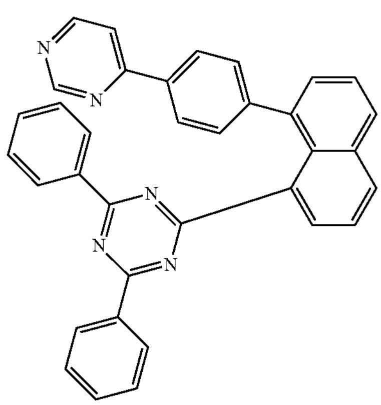
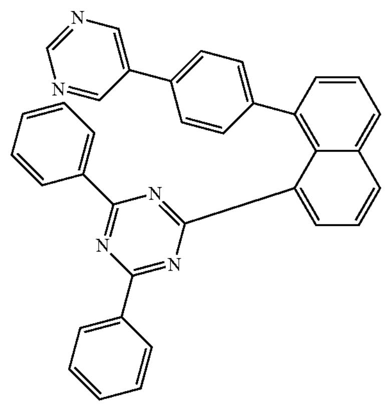
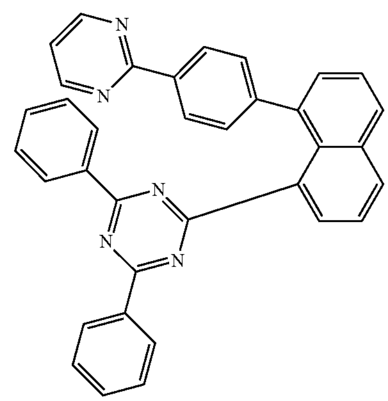
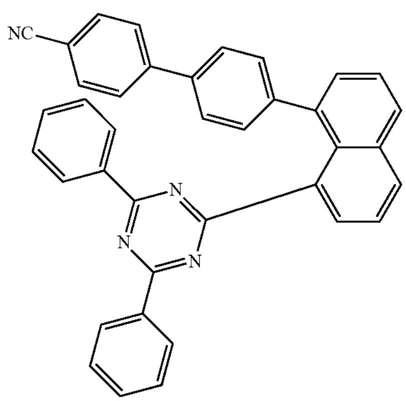
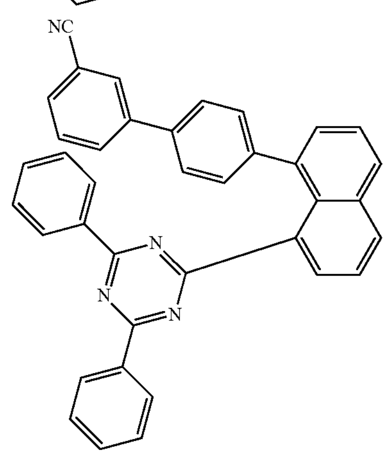
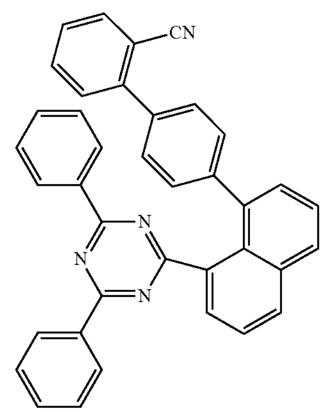
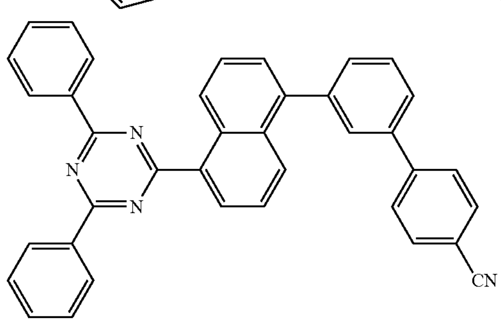
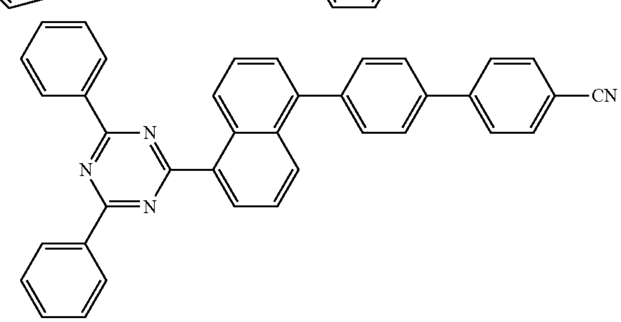

-continued
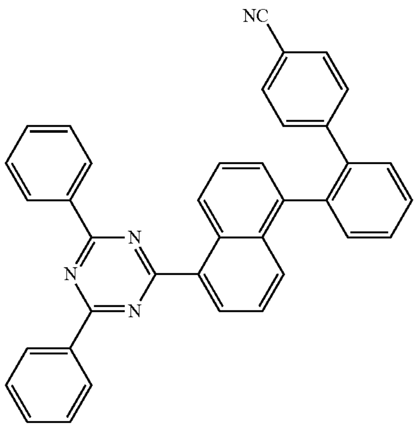
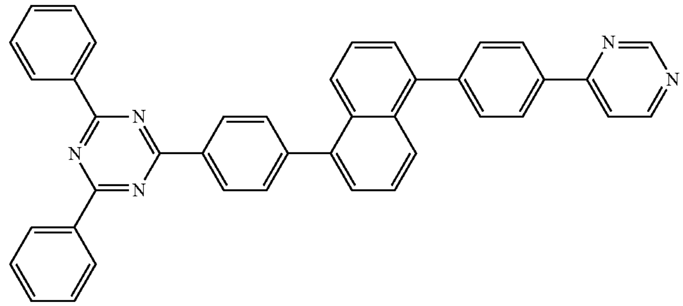
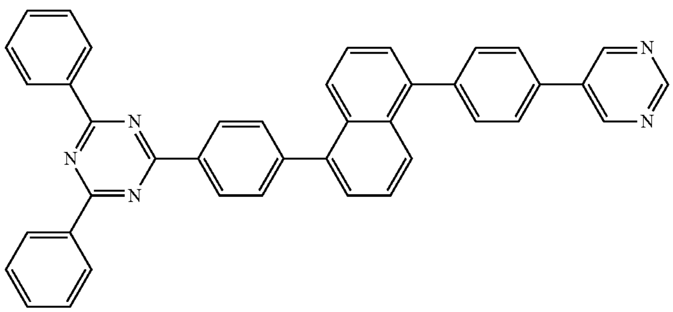
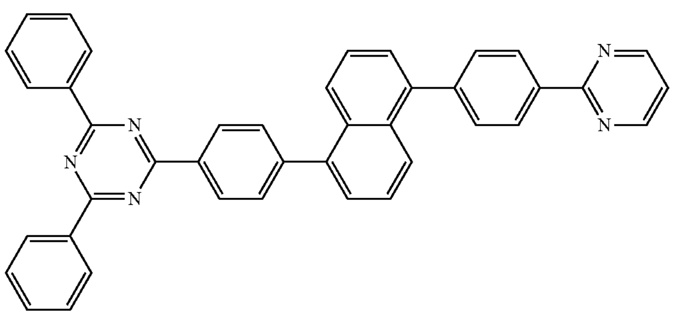
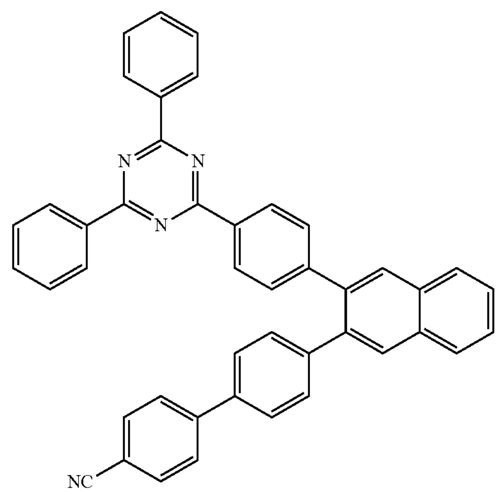
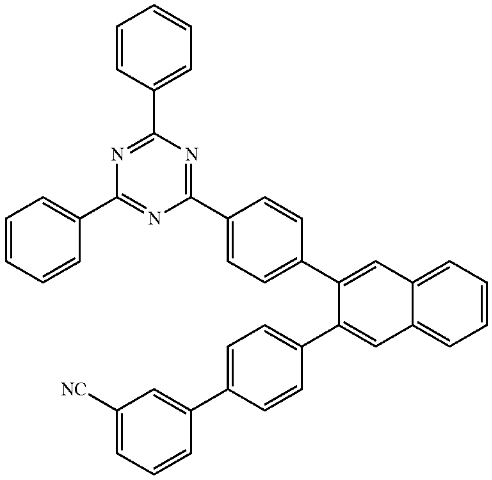
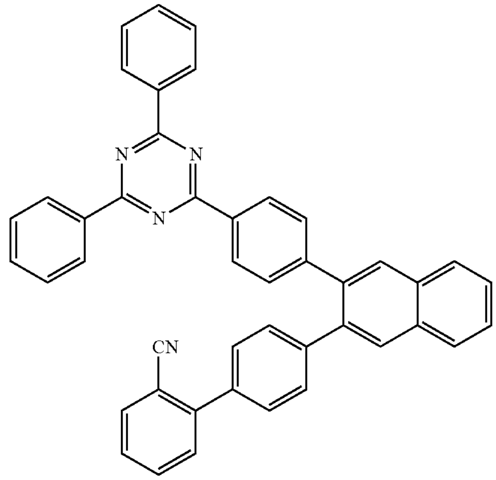

-continued
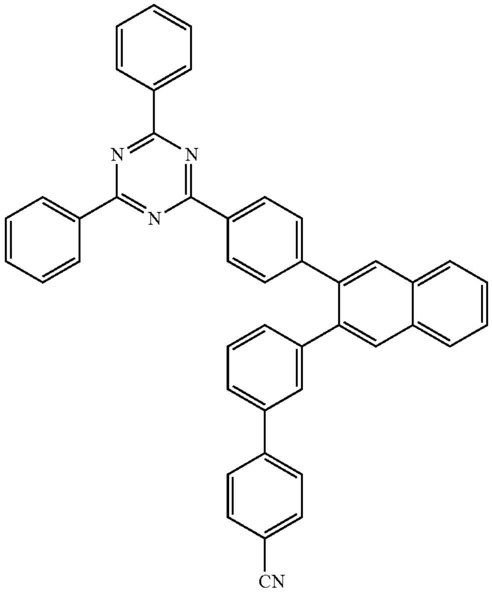
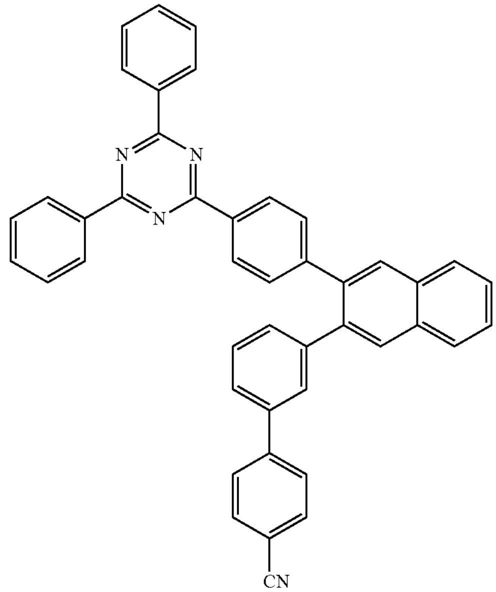
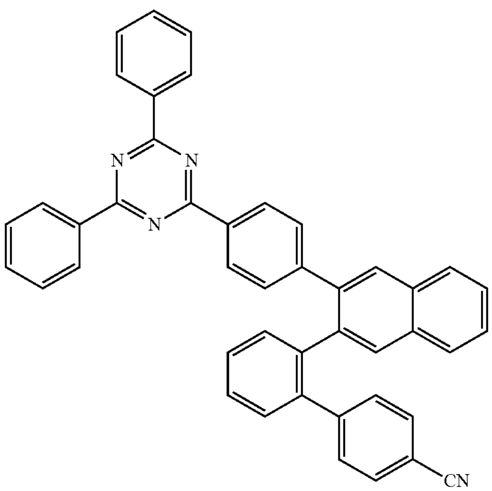
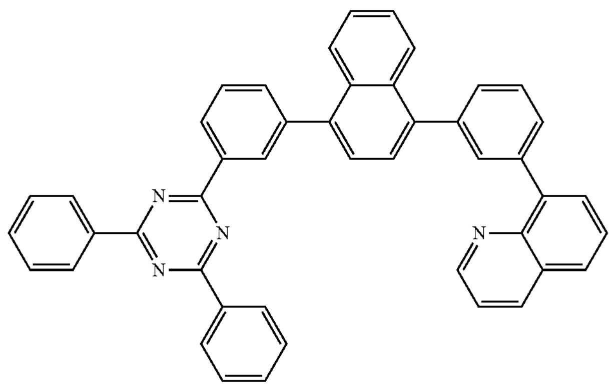
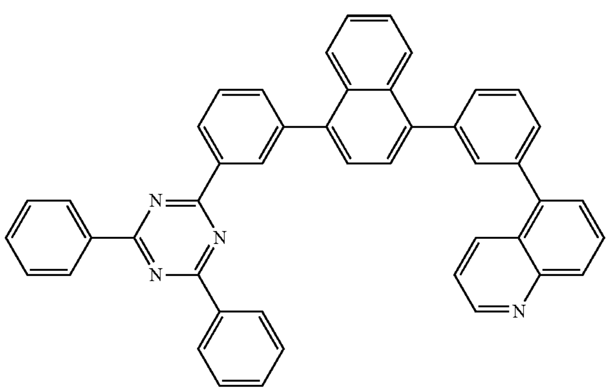

-continued
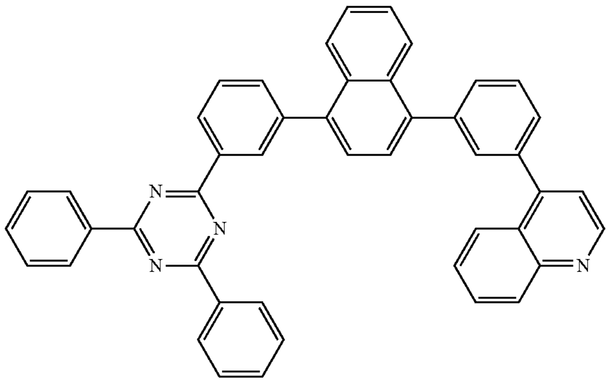
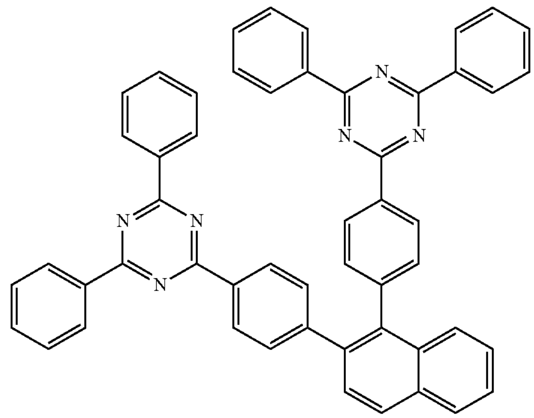
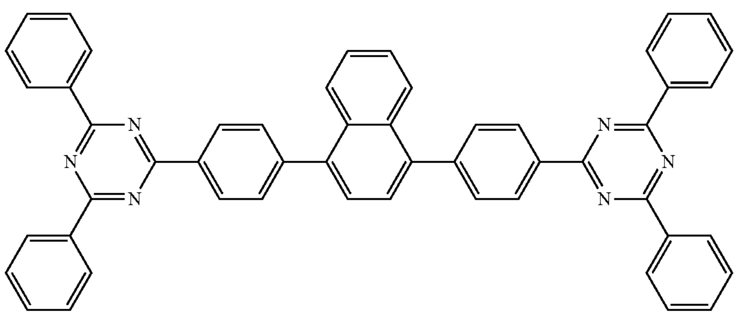
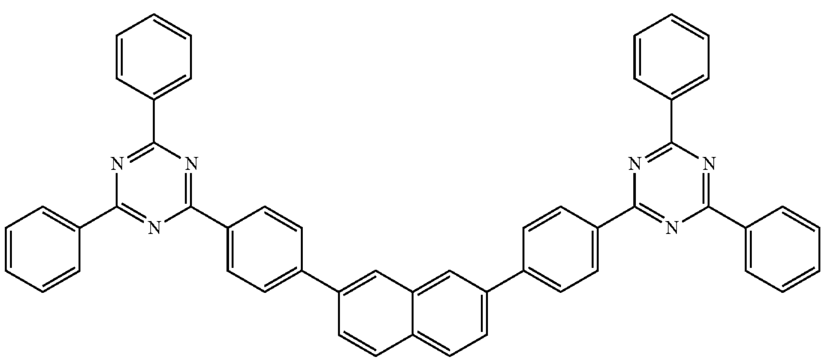
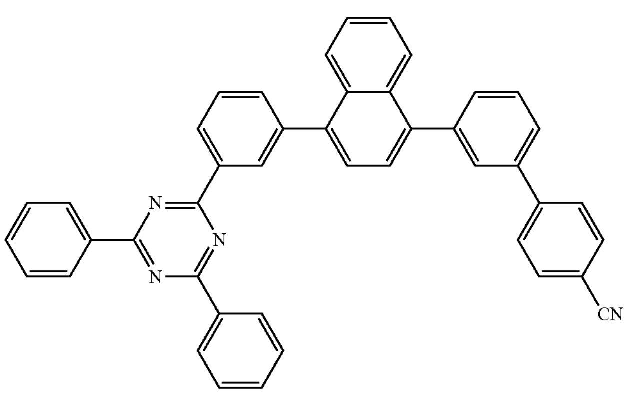

-continued
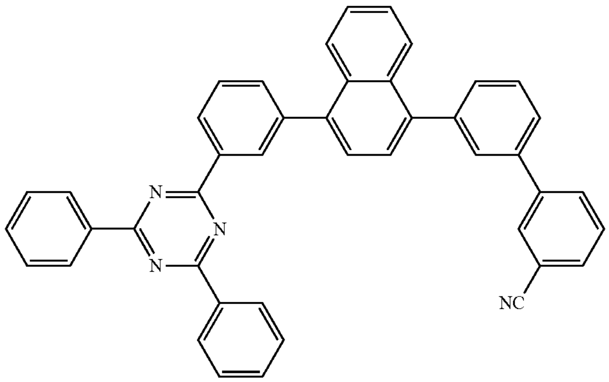
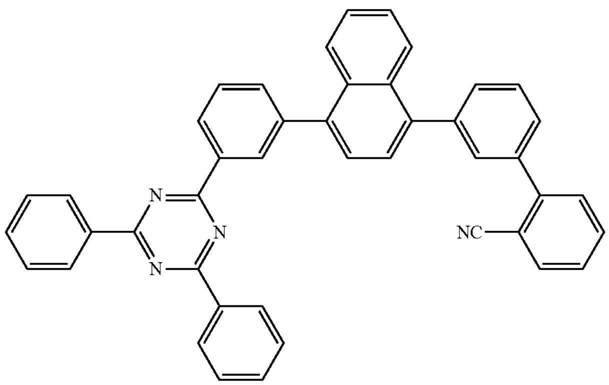
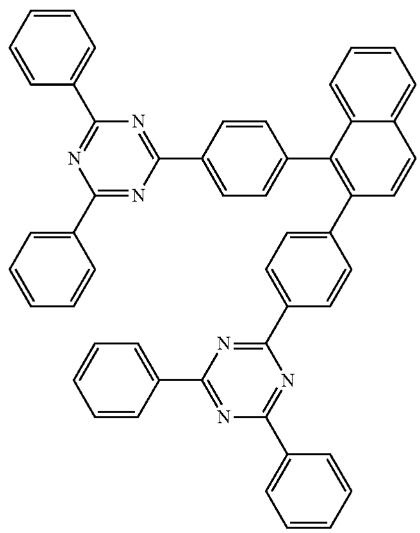
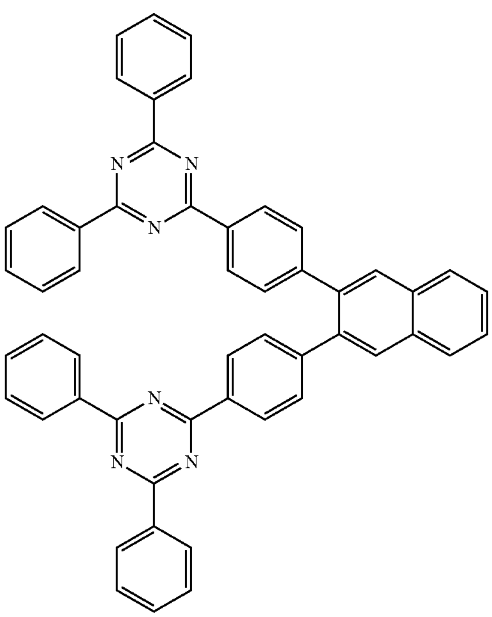
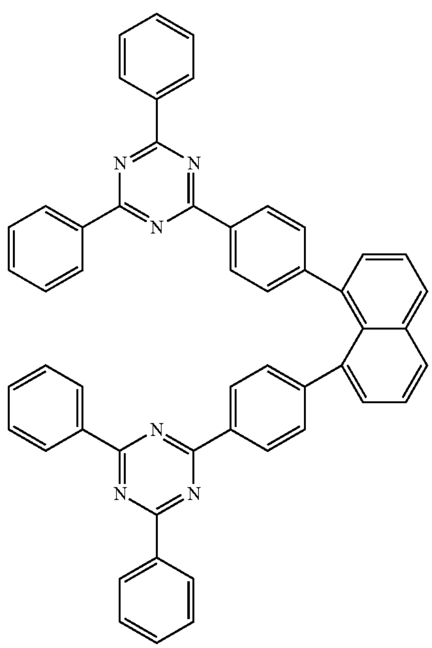

-continued
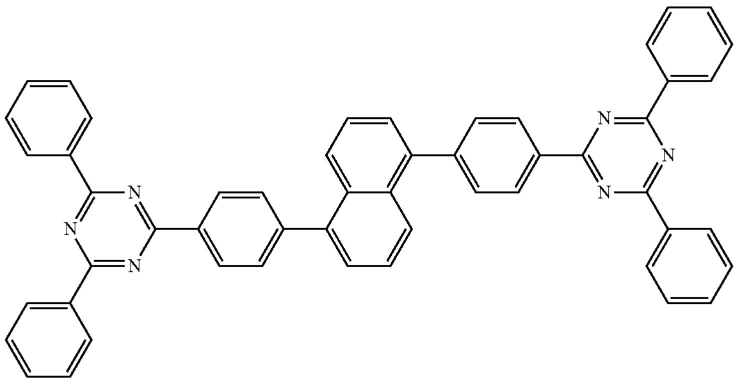
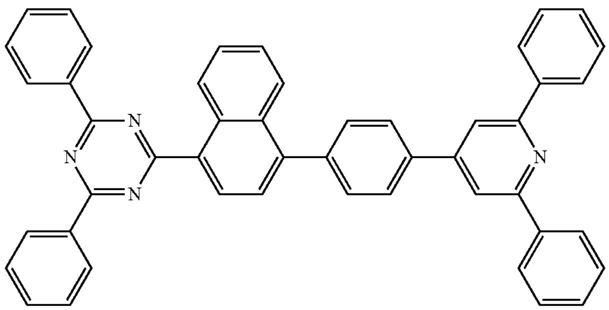
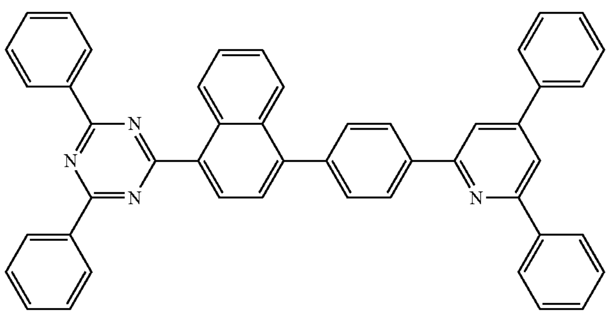
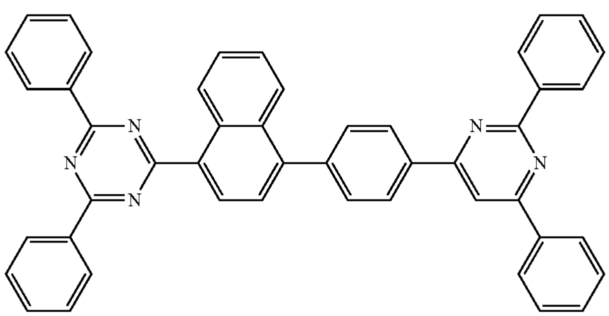
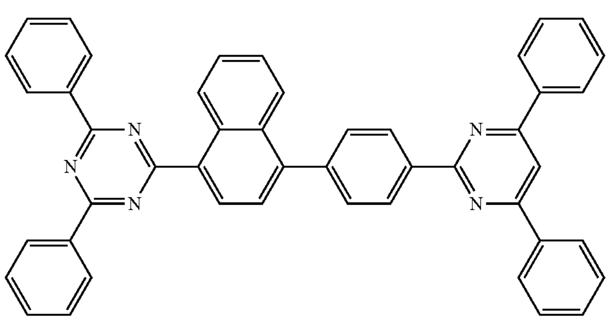

-continued
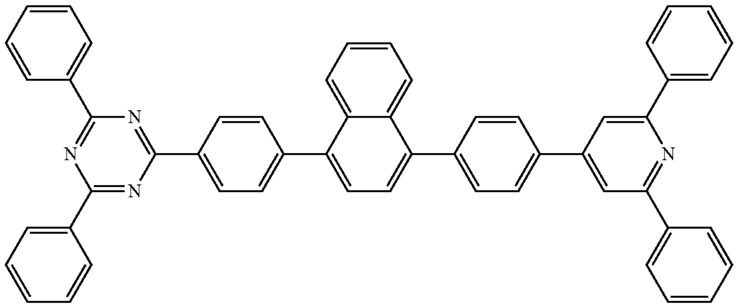
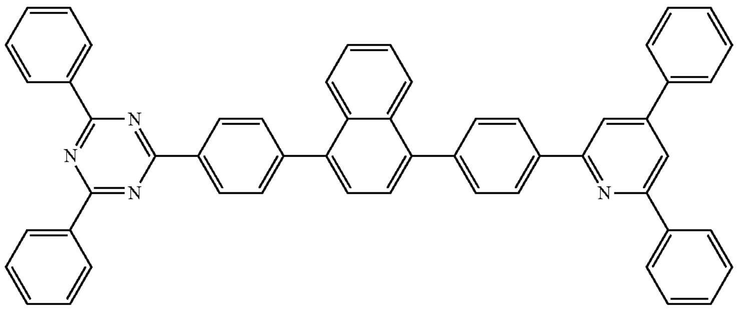
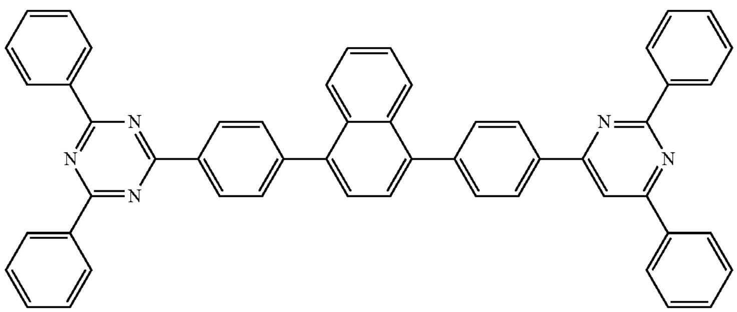
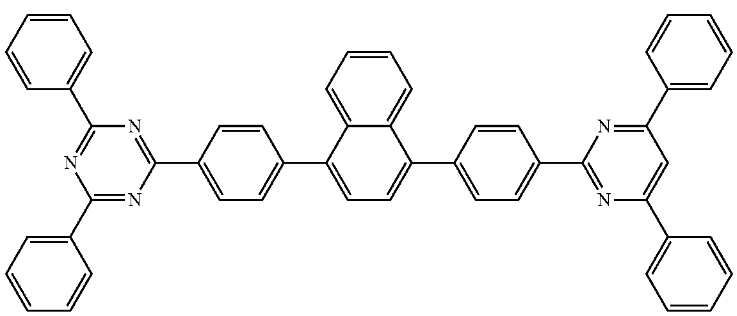
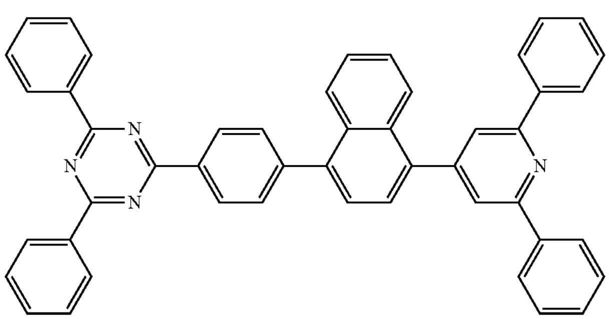

-continued
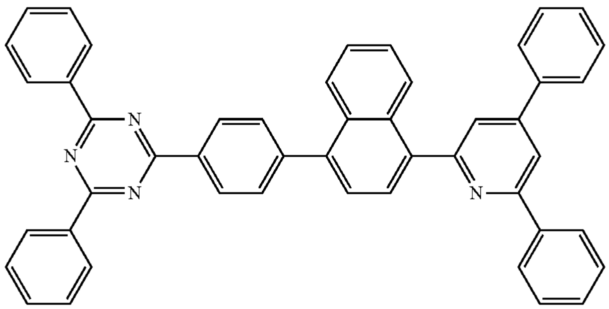
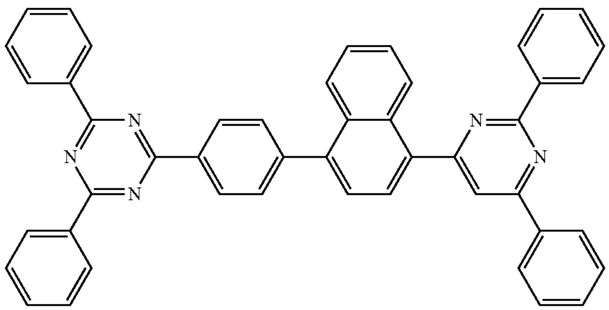
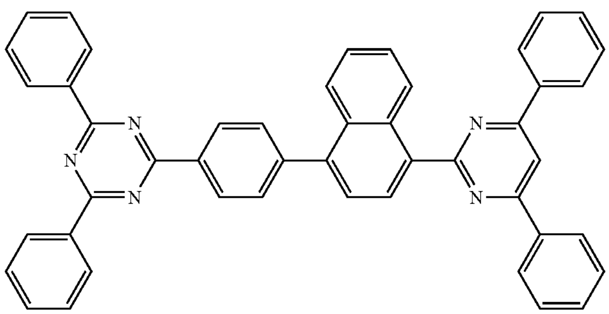
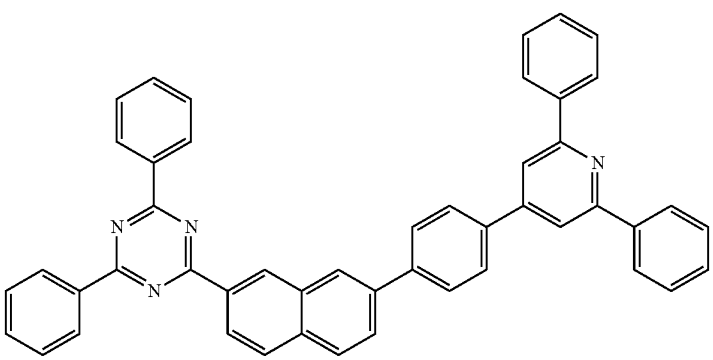
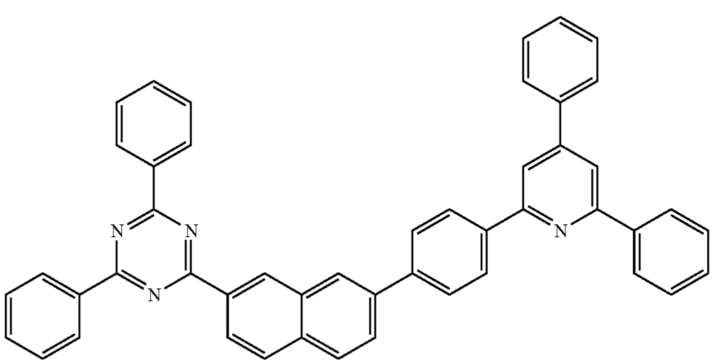

-continued
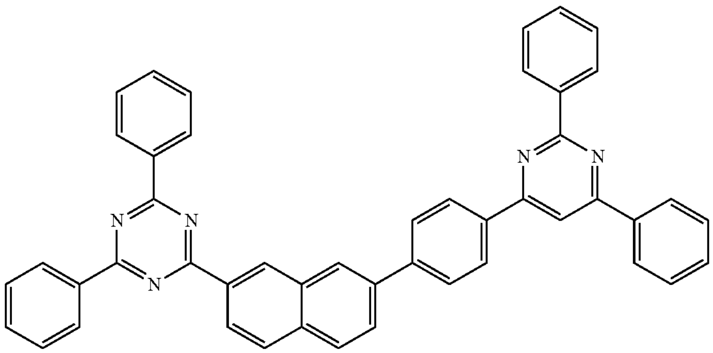
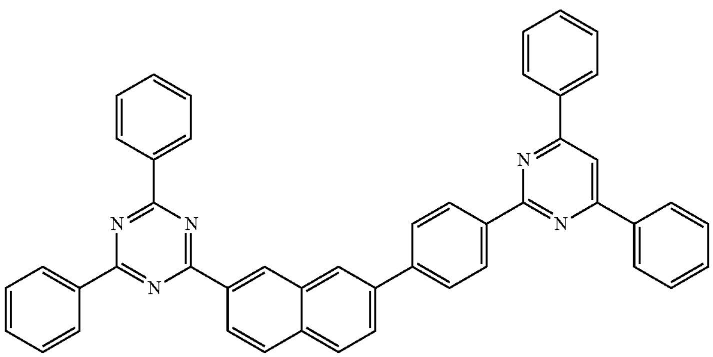
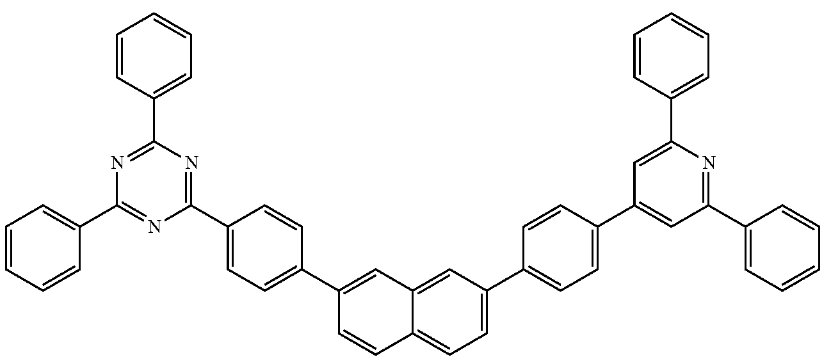
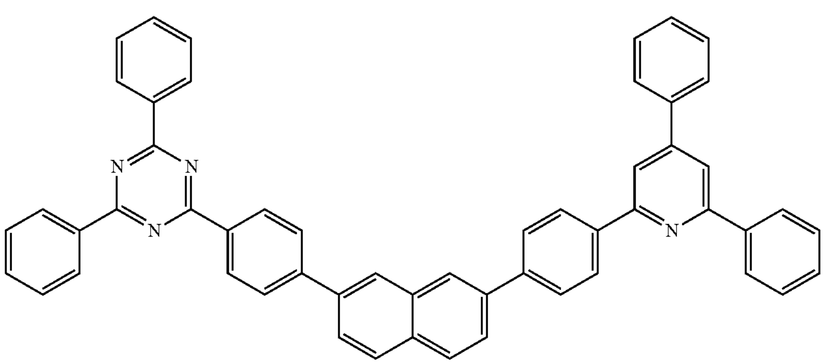

-continued
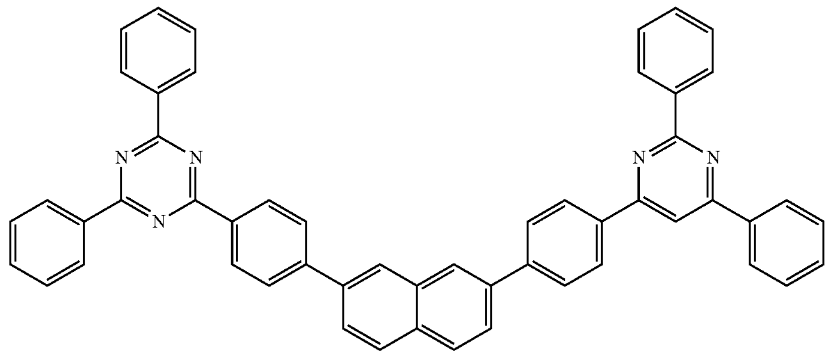
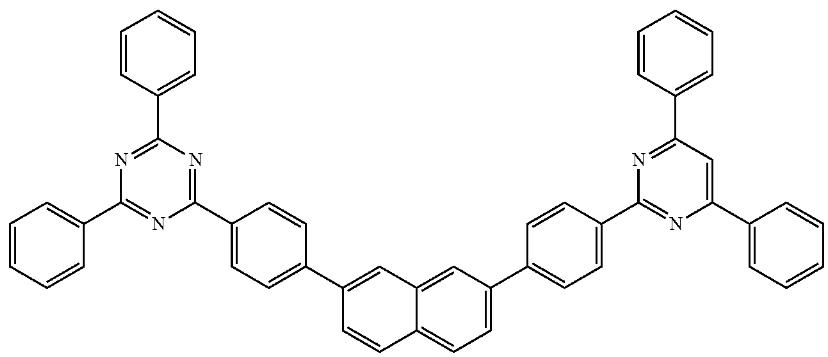
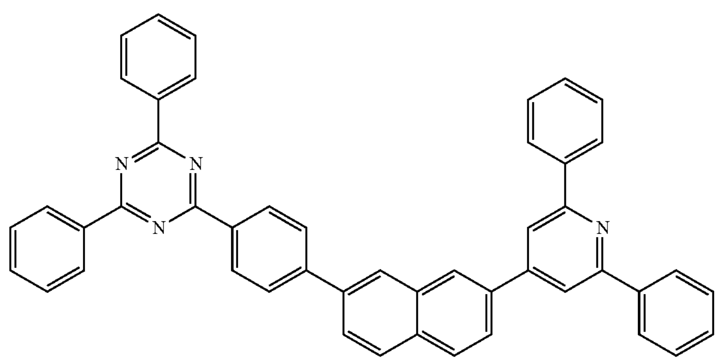
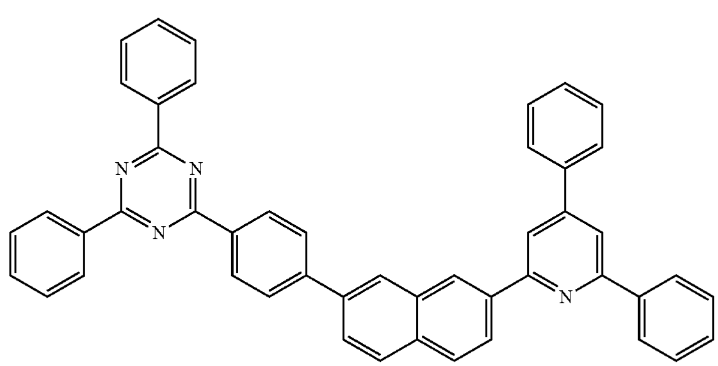

-continued
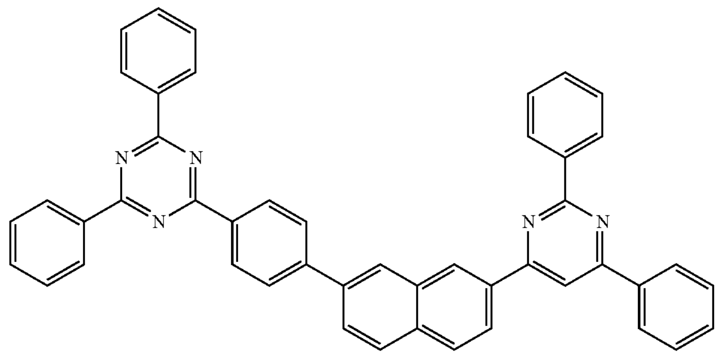
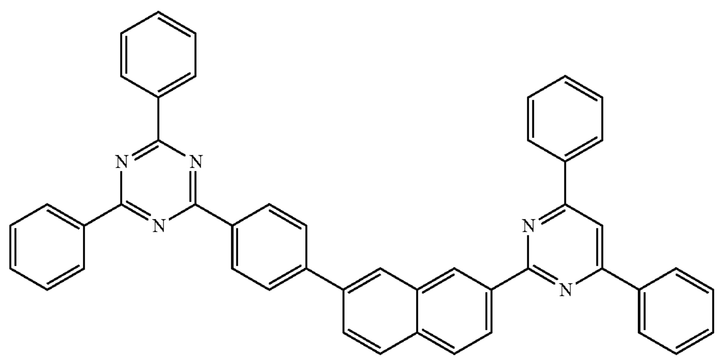
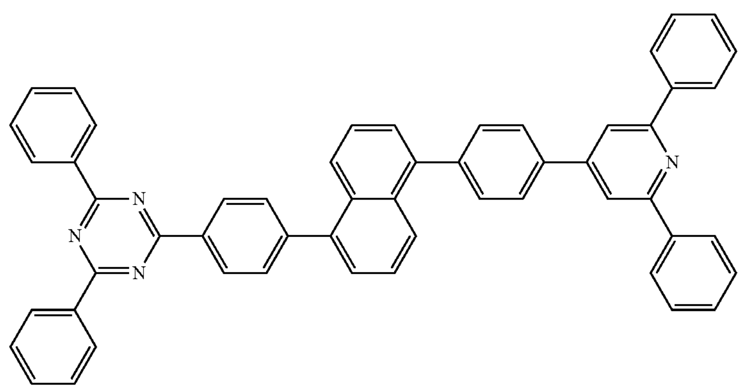
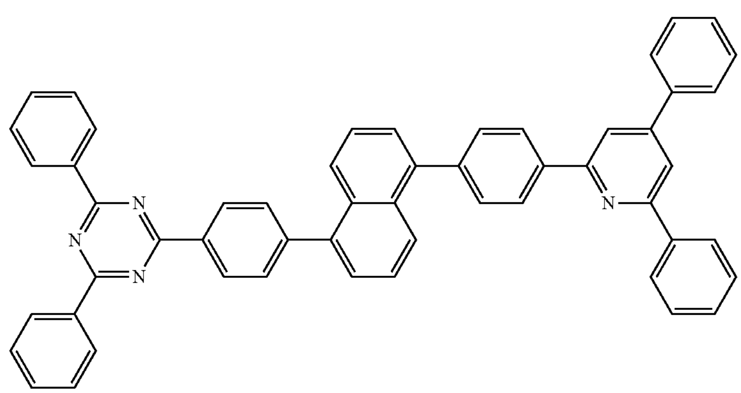

-continued
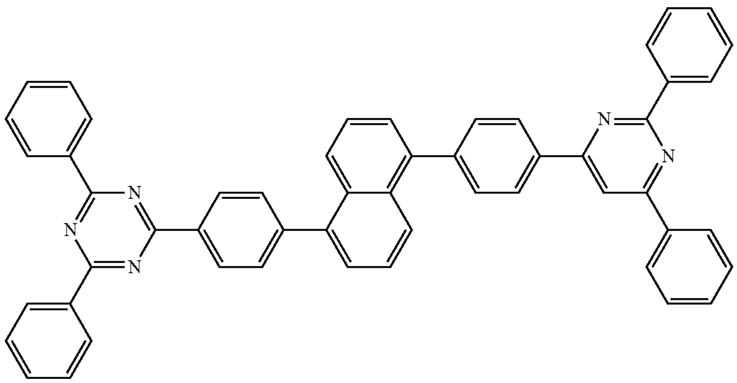
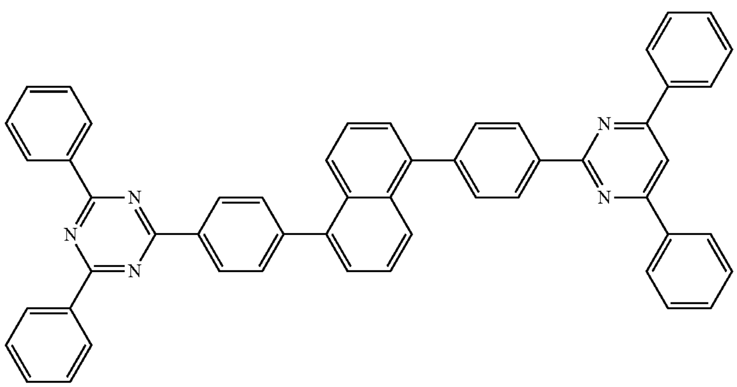
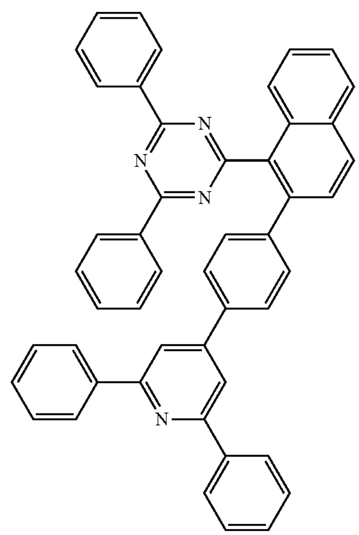
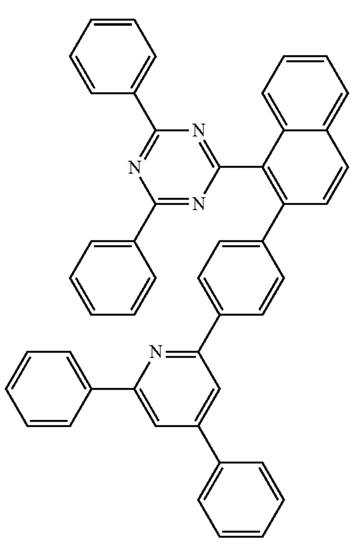
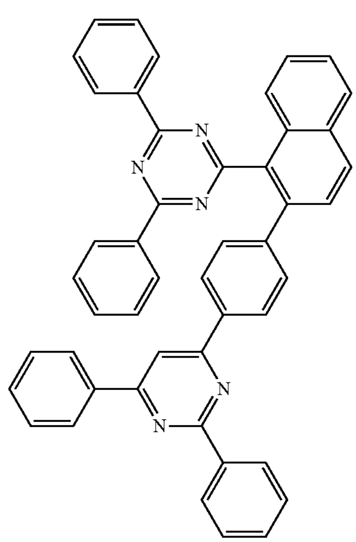
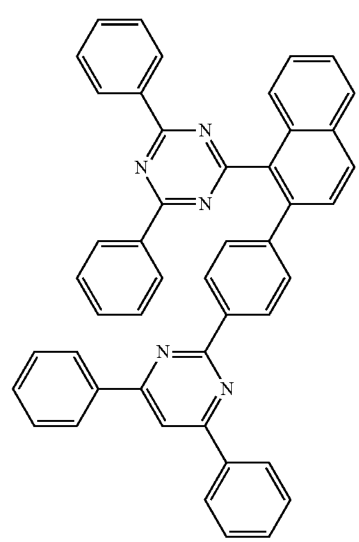

-continued
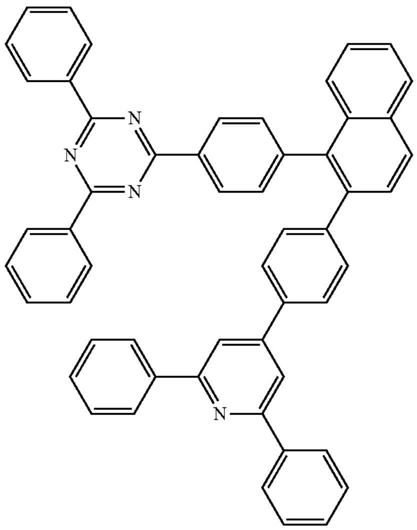
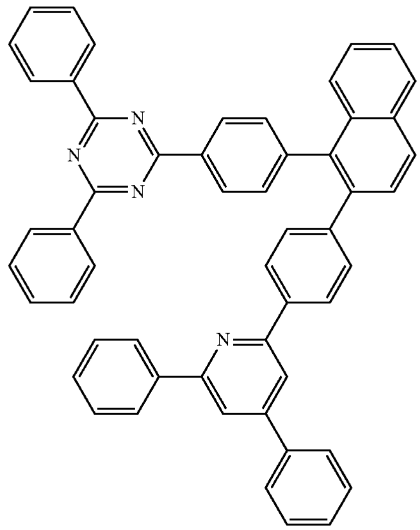
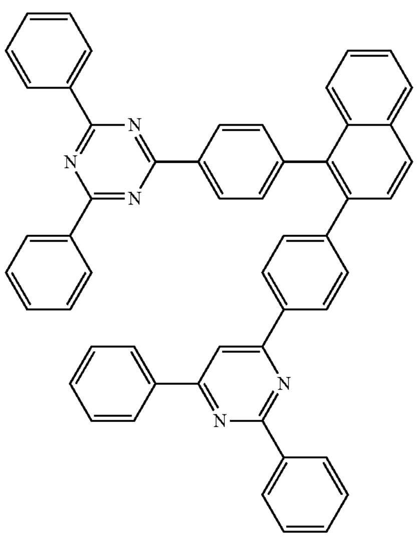
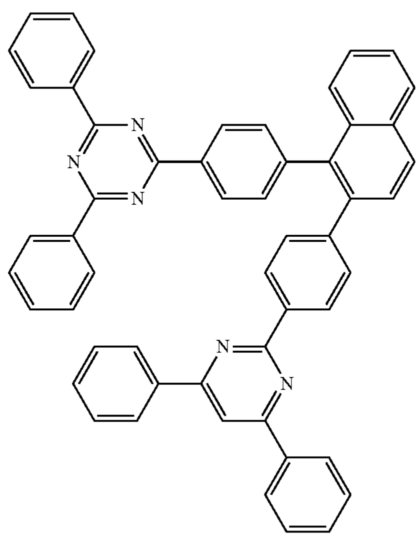
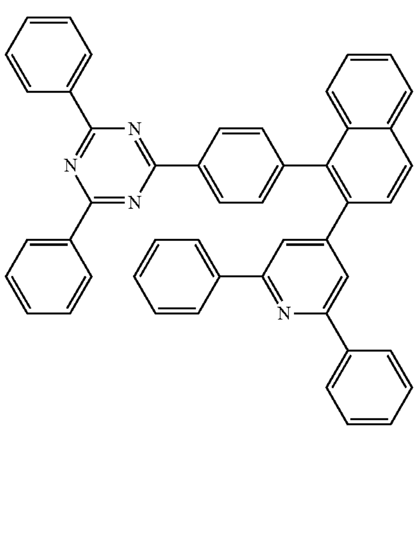
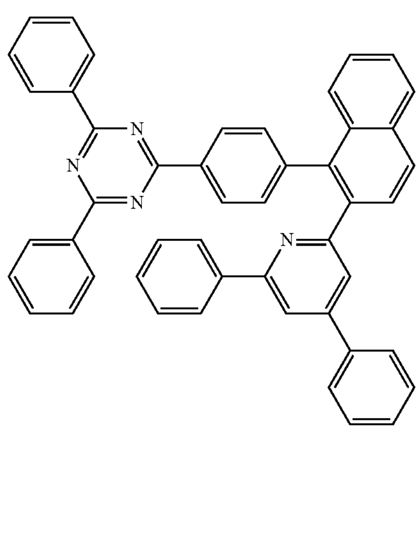

-continued
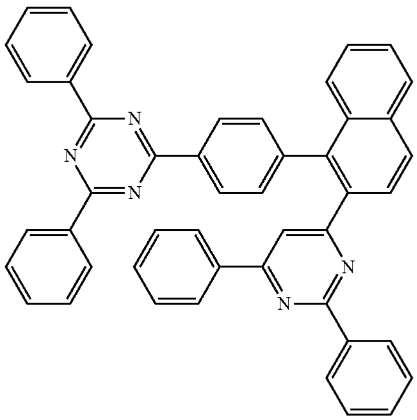
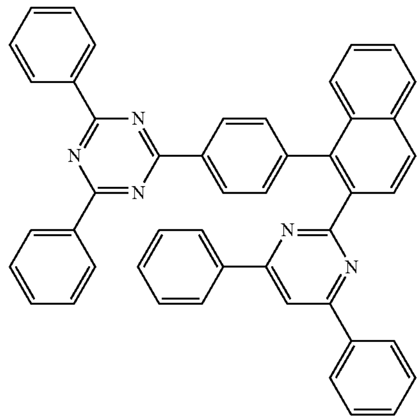
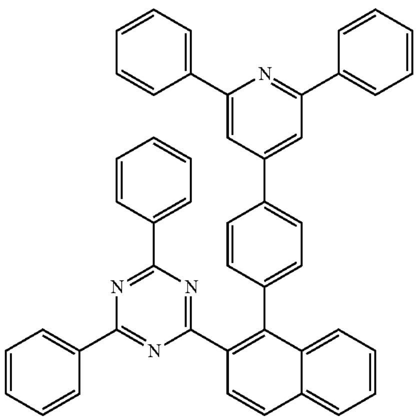
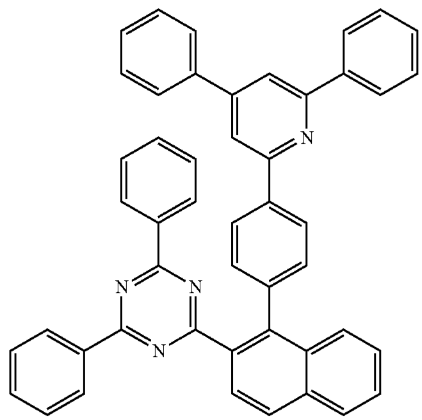
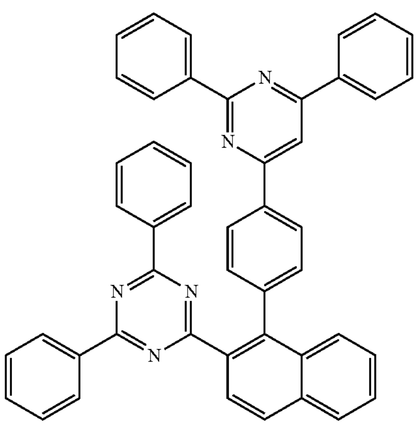
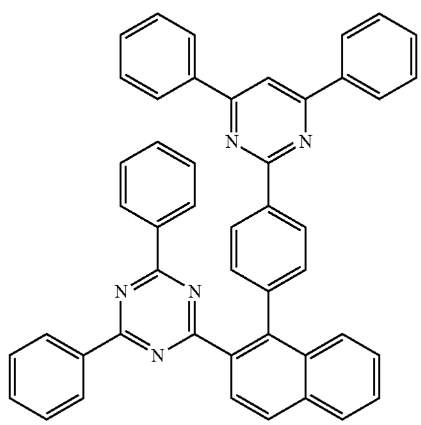
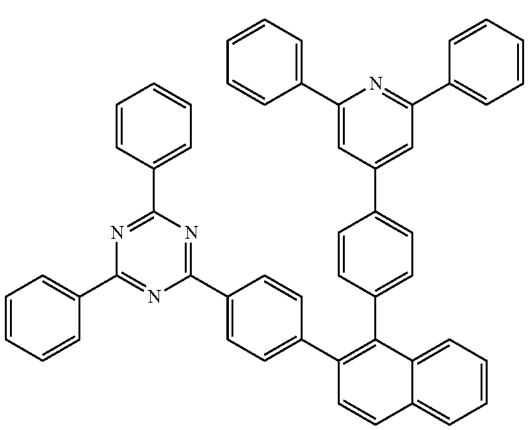
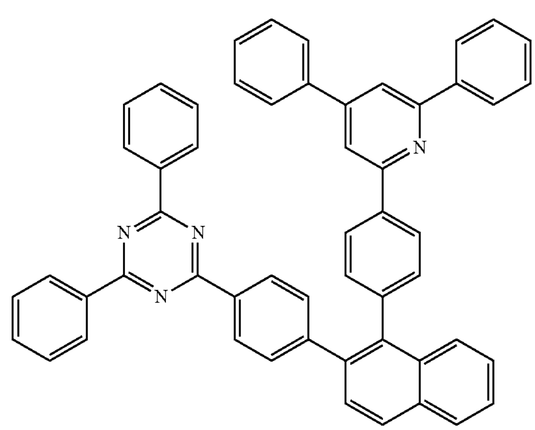

-continued
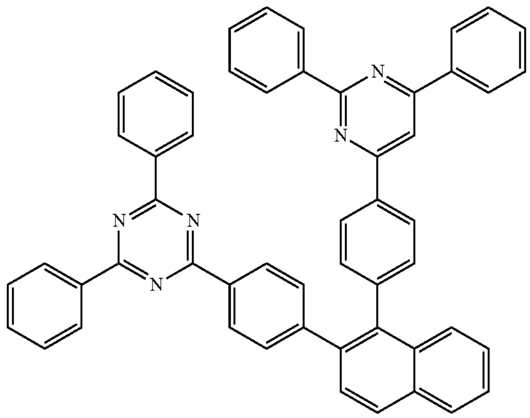
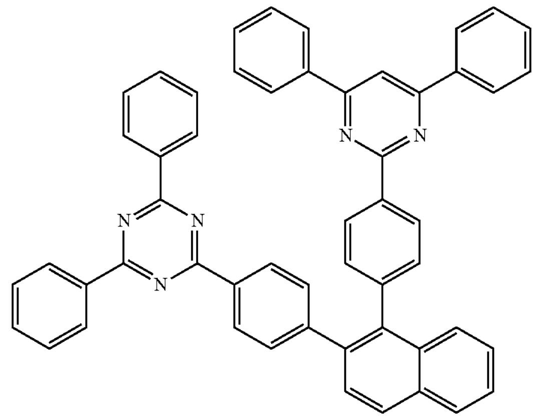
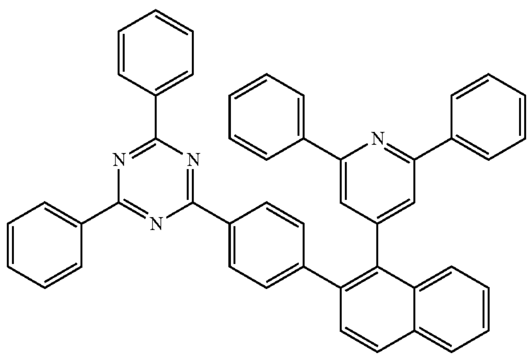
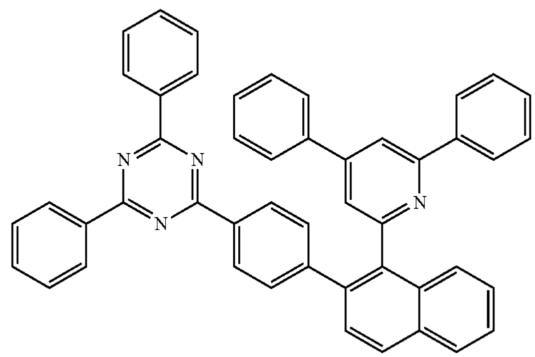
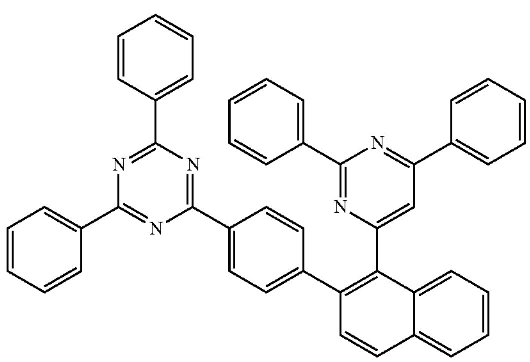
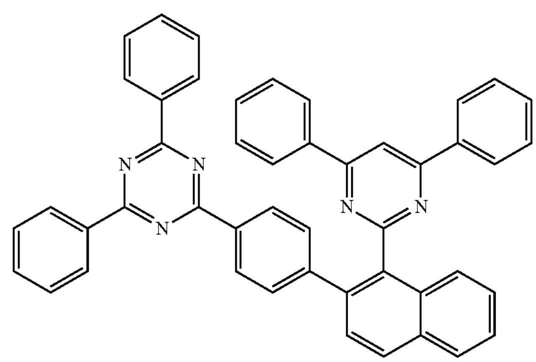
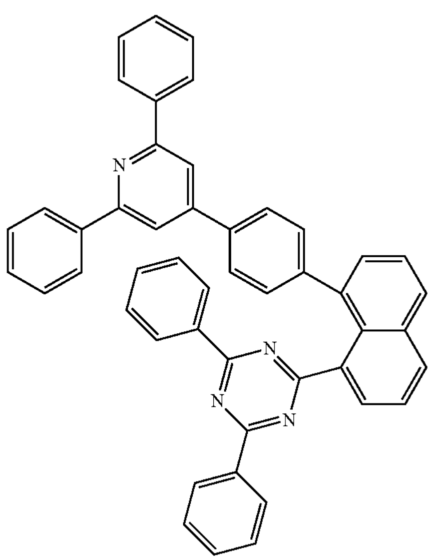
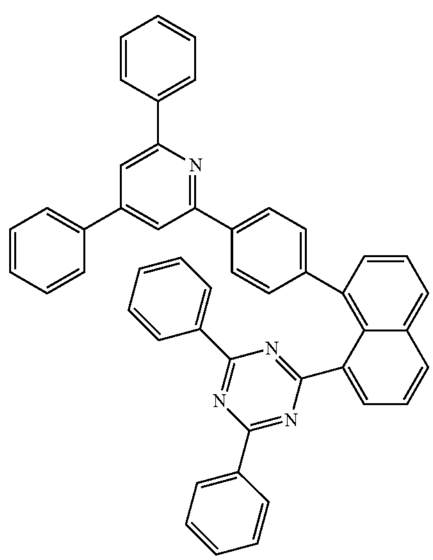

-continued

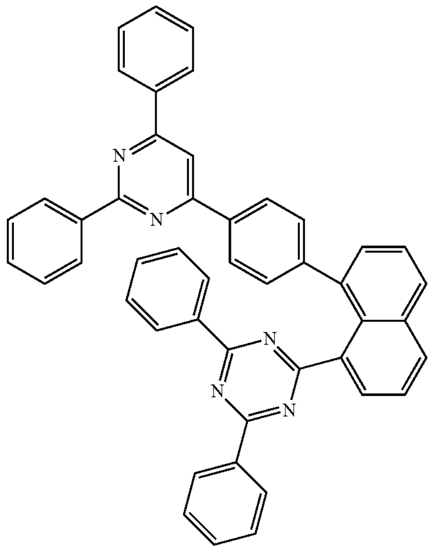

and

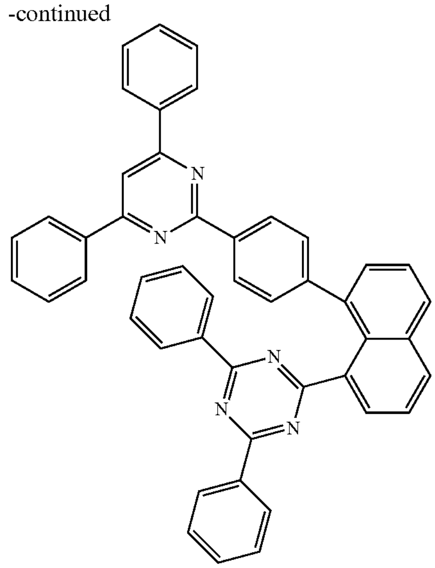

13. The organic light emitting device of claim 1, wherein the electron transport region includes an electron transport layer, and the electron transport layer includes the compound represented by Chemical Formula 2.

14. The organic light emitting device of claim 1, wherein the electron transport region includes an electron transport layer and a hole blocking layer, and the hole blocking layer includes a compound represented by Chemical Formula 2.

15. The organic light emitting device of claim 14, wherein the light emitting layer and the hole blocking layer are positioned adjacent to each other.

* * * * *